(12) United States Patent
Shishido et al.

(10) Patent No.: US 9,449,543 B2
(45) Date of Patent: Sep. 20, 2016

(54) DISPLAY DEVICE AND DRIVING METHOD OF DISPLAY DEVICE

(71) Applicant: Semiconductor Energy Laboratory Co., Ltd., Atsugi-shi, Kanagawa-ken (JP)

(72) Inventors: Hideaki Shishido, Kanagawa (JP); Hajime Kimura, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/172,958

(22) Filed: Feb. 5, 2014

(65) Prior Publication Data
US 2014/0152712 A1 Jun. 5, 2014

Related U.S. Application Data

(62) Division of application No. 11/427,427, filed on Jun. 29, 2006, now abandoned.

(30) Foreign Application Priority Data

Jul. 4, 2005 (JP) .................... 2005-194699

(51) Int. Cl.
G09G 3/30 (2006.01)
G09G 3/20 (2006.01)
G09G 3/32 (2016.01)
H01L 27/32 (2006.01)

(52) U.S. Cl.
CPC .......... *G09G 3/2003* (2013.01); *G09G 3/3233* (2013.01); *G09G 3/2029* (2013.01);
(Continued)

(58) Field of Classification Search
CPC ............. G09G 3/2074; G09G 3/3208; G09G 3/3225; G09G 2300/0443
USPC .......................................................... 345/76
See application file for complete search history.

(56) References Cited

U.S. PATENT DOCUMENTS 5,764,216 A 6/1998 Tanaka et al.
5,986,640 A 11/1999 Baldwin et al.
(Continued)

FOREIGN PATENT DOCUMENTS

CN 1551083 A 12/2004
CN 1605092 A 4/2005
(Continued)

OTHER PUBLICATIONS

Kang, K et al., "A New 42-in. AC PDP Using MAoD II Driving Scheme,", SID Digest '01 : SID International Symposium Digest of Technical Papers, 2001, vol. 32, pp. 1130-1133.
(Continued)

*Primary Examiner* — Jason Mandeville
(74) *Attorney, Agent, or Firm* — Fish & Richardson P.C.

(57) ABSTRACT

It is an object of the present invention to reduce a cause of pseudo contour when display is performed with a time gray scale method. According to the present invention, one pixel is divided into m sub-pixels so that an area ratio of each sub-pixel becomes $2^0:2^1:2^2: \ldots :2^{m-3}:2^{m-2}:2^{m-1}$ (m is an integer number of m≥2), and one frame is divided into n sub-frames so that a ratio of a lighting period in each sub-frame becomes $2^0:2^m:2^{2m}: \ldots :2^{(n-3)m}:2^{(n-2)m}:2^{(n-1)m}$ (n is an integer number of n≥2). Then, a gray scale is expressed by controlling a manner of lighting in each of the m sub-pixels in each of the n sub-frames.

8 Claims, 71 Drawing Sheets

(52) U.S. Cl.
CPC .......... *G09G3/2033* (2013.01); *G09G 3/2074* (2013.01); *G09G 3/2077* (2013.01); *G09G 2300/0426* (2013.01); *G09G 2300/0452* (2013.01); *G09G 2300/0814* (2013.01); *G09G 2300/0842* (2013.01); *G09G 2310/0205* (2013.01); *G09G 2310/0221* (2013.01); *G09G 2310/0251* (2013.01); *G09G 2310/0262* (2013.01); *G09G 2320/0214* (2013.01); *G09G 2320/0261* (2013.01); *G09G 2320/0266* (2013.01); *G09G 2320/0276* (2013.01); *H01L 27/3211* (2013.01); *H01L 27/3213* (2013.01)

(56) References Cited

U.S. PATENT DOCUMENTS

| | | | |
|---|---|---|---|
| 6,016,133 A | 1/2000 | Nito et al. | |
| 6,088,012 A | 7/2000 | Shigeta et al. | |
| 6,144,364 A | 11/2000 | Otobe et al. | |
| 6,160,532 A | 12/2000 | Kaburagi et al. | |
| 6,222,512 B1 | 4/2001 | Tajima et al. | |
| 6,225,750 B1* | 5/2001 | Kimura | 315/169.3 |
| 6,249,265 B1 | 6/2001 | Tajima et al. | |
| 6,292,159 B1 | 9/2001 | Someya et al. | |
| 6,310,588 B1 | 10/2001 | Kawahara et al. | |
| 6,335,778 B1 | 1/2002 | Kubota et al. | |
| 6,366,025 B1 | 4/2002 | Yamada | |
| 6,388,389 B2* | 5/2002 | Kimura | G09G 3/2074 315/169.3 |
| 6,417,835 B1 | 7/2002 | Otobe et al. | |
| 6,448,960 B1 | 9/2002 | Shigeta | |
| 6,462,735 B2 | 10/2002 | Naito | |
| 6,466,285 B1 | 10/2002 | Ichikawa | |
| 6,469,450 B2* | 10/2002 | Kimura | G09G 3/2074 315/169.1 |
| 6,518,941 B1 | 2/2003 | Kimura | |
| 6,529,213 B1* | 3/2003 | Kimura | 345/696 |
| 6,563,486 B2 | 5/2003 | Otobe et al. | |
| 6,611,108 B2* | 8/2003 | Kimura | 315/169.3 |
| 6,646,625 B1 | 11/2003 | Shigeta et al. | |
| 6,697,127 B2 | 2/2004 | Suzuki | |
| 6,791,576 B1 | 9/2004 | Lin | |
| 6,795,063 B2 | 9/2004 | Endo et al. | |
| 6,801,180 B2* | 10/2004 | Matsueda | 345/92 |
| 6,867,761 B2 | 3/2005 | Matsueda | |
| 6,873,320 B2 | 3/2005 | Nakamura | |
| 6,888,318 B2 | 5/2005 | Childs | |
| 6,909,413 B2 | 6/2005 | Nanno et al. | |
| 6,965,365 B2 | 11/2005 | Nakamura | |
| 6,989,845 B1 | 1/2006 | Okamoto et al. | |
| 7,049,991 B2 | 5/2006 | Kimura | |
| 7,053,868 B1 | 5/2006 | Kojima et al. | |
| 7,067,983 B2 | 6/2006 | Ozawa et al. | |
| 7,071,911 B2 | 7/2006 | Inukai | |
| 7,081,899 B2 | 7/2006 | Shimazaki et al. | |
| 7,081,906 B2 | 7/2006 | Kim et al. | |
| 7,084,848 B2 | 8/2006 | Senda et al. | |
| 7,095,395 B2 | 8/2006 | Bu | |
| 7,173,612 B2 | 2/2007 | Nanno et al. | |
| 7,180,495 B1* | 2/2007 | Matsueda | 345/98 |
| 7,248,268 B2 | 7/2007 | Brown Elliott et al. | |
| 7,297,977 B2* | 11/2007 | Hoffman et al. | 257/43 |
| 7,348,942 B2* | 3/2008 | Jo | 345/76 |
| 7,388,562 B2 | 6/2008 | Koyama et al. | |
| 7,723,721 B2 | 5/2010 | Udagawa et al. | |
| 7,982,385 B2* | 7/2011 | Kimura | H01L 27/3213 313/503 |
| 8,154,015 B2 | 4/2012 | Udagawa et al. | |
| 8,324,618 B2 | 12/2012 | Udagawa et al. | |
| 8,692,740 B2* | 4/2014 | Yoshida | G09G 3/3233 345/76 |
| 2001/0022565 A1 | 9/2001 | Kimura | |
| 2001/0045923 A1 | 11/2001 | Otobe et al. | |
| 2002/0011793 A1* | 1/2002 | Kimura | G09G 3/2074 315/160 |
| 2002/0041278 A1 | 4/2002 | Matsueda | |
| 2002/0047822 A1 | 4/2002 | Senda et al. | |
| 2002/0075211 A1 | 6/2002 | Nakamura | |
| 2002/0105280 A1* | 8/2002 | Kimura | G09G 3/2074 315/169.3 |
| 2002/0130826 A1 | 9/2002 | Otobe et al. | |
| 2002/0140364 A1* | 10/2002 | Inukai | 315/169.3 |
| 2002/0167477 A1 | 11/2002 | Tsutsui et al. | |
| 2002/0195969 A1* | 12/2002 | Kimura | G09G 3/2074 315/169.3 |
| 2003/0030601 A1 | 2/2003 | Komiya | |
| 2003/0071772 A1 | 4/2003 | Kimura | |
| 2003/0111964 A1 | 6/2003 | Childs | |
| 2003/0197709 A1 | 10/2003 | Shimazaki et al. | |
| 2004/0021677 A1 | 2/2004 | Sasaki et al. | |
| 2004/0179005 A1* | 9/2004 | Jo | 345/211 |
| 2004/0263434 A1 | 12/2004 | Otobe et al. | |
| 2005/0225563 A1 | 10/2005 | Brown Elliott et al. | |
| 2006/0152439 A1 | 7/2006 | Kojima et al. | |
| 2006/0221007 A1* | 10/2006 | Kim | G09G 3/3225 345/76 |
| 2007/0046591 A1 | 3/2007 | Shishido et al. | |
| 2007/0075627 A1* | 4/2007 | Kimura | H01L 27/3213 313/503 |
| 2007/0279344 A1 | 12/2007 | Kimura et al. | |
| 2011/0141164 A1* | 6/2011 | Kimura | G09G 3/3241 345/690 |
| 2013/0087775 A1 | 4/2013 | Udagawa et al. | |

FOREIGN PATENT DOCUMENTS

| | | |
|---|---|---|
| EP | 0893916 A2 | 1/1999 |
| EP | 0949603 A1 | 10/1999 |
| EP | 0982708 A1 | 3/2000 |
| EP | 1045274 A2 | 10/2000 |
| EP | 1085495 A2 | 3/2001 |
| EP | 1193675 A2 | 4/2002 |
| EP | 1231593 A2 | 8/2002 |
| EP | 1310997 A2 | 5/2003 |
| JP | 04077783 A | 3/1992 |
| JP | 2639311 A | 8/1997 |
| JP | 10-307561 A | 11/1998 |
| JP | 11-073158 A | 3/1999 |
| JP | 2903984 A | 6/1999 |
| JP | 2000-206922 A | 7/2000 |
| JP | 2000-217125 A | 8/2000 |
| JP | 3075335 A | 8/2000 |
| JP | 2000-356781 A | 12/2000 |
| JP | 3486884 A | 1/2001 |
| JP | 2001-042790 A | 2/2001 |
| JP | 2001-125526 A | 5/2001 |
| JP | 2001-324958 A | 11/2001 |
| JP | 2002-152552 A | 5/2002 |
| JP | 2002-175040 A | 6/2002 |
| JP | 2002-175045 A | 6/2002 |
| JP | 2002-268600 A | 9/2002 |
| JP | 2002-278478 A | 9/2002 |
| JP | 3322809 A | 9/2002 |
| JP | 2002-333870 A | 11/2002 |
| JP | 2003-029708 A | 1/2003 |
| JP | 3365630 A | 1/2003 |
| JP | 2003-168109 A | 6/2003 |
| JP | 2003-208110 A | 7/2003 |
| JP | 3489884 A | 1/2004 |
| JP | 3497020 A | 2/2004 |
| JP | 3585369 A | 11/2004 |
| JP | 2005-024805 A | 1/2005 |
| WO | 03/052729 A1 | 6/2003 |

OTHER PUBLICATIONS

Office Action, Chinese Patent Application No. 200610106201.5, dated Apr. 13, 2011, 15 pages with full English translation.
Office Action, Chinese Patent Application No. 200610106201.5, dated Jul. 17, 2009, 9 pages with full English translation.

* cited by examiner

Fig.1

| glay-scale level | SF1 (1) | | SF2 (4) | |
|---|---|---|---|---|
| | SP1 (1) | SP2 (2) | SP1 (1) | SP2 (2) |
| | 1 | 2 | 4 | 8 |
| 0 | × | × | × | × |
| 1 | ○ | × | × | × |
| 2 | × | ○ | × | × |
| 3 | ○ | ○ | × | × |
| 4 | × | × | ○ | × |
| 5 | ○ | × | ○ | × |
| 6 | × | ○ | ○ | × |
| 7 | ○ | ○ | ○ | × |
| 8 | × | × | × | ○ |
| 9 | ○ | × | × | ○ |
| 10 | × | ○ | × | ○ |
| 11 | ○ | ○ | × | ○ |
| 12 | × | × | ○ | ○ |
| 13 | ○ | × | ○ | ○ |
| 14 | × | ○ | ○ | ○ |
| 15 | ○ | ○ | ○ | ○ |

- sub-frame lighting period
- area of sub-pixels
- light-emitting intensity

○ : lighting
× : non-lighting

○ : lighting

× : non-lighting

○ : lighting

× : non-lighting

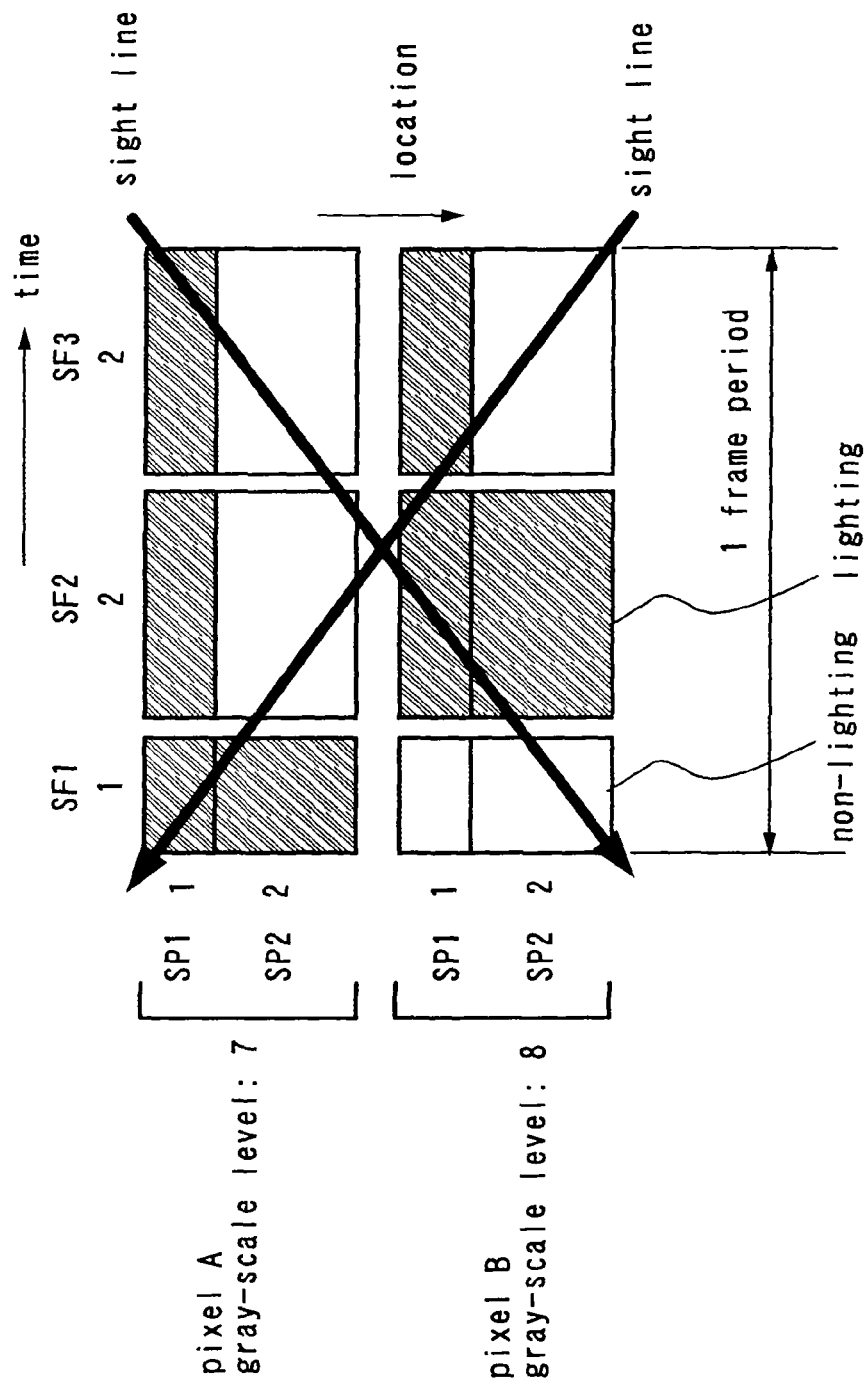

Fig.7

| | SF1 | | SF2 | | SF3 | |
|---|---|---|---|---|---|---|
| | 1 | | 4 | | 16 | |
| | SP1 | SP2 | SP1 | SP2 | SP1 | SP2 |
| | 1 | 2 | 1 | 2 | 1 | 2 |
| | 1 | 2 | 4 | 8 | 16 | 32 |
| 0 | × | × | × | × | × | × |
| 1 | ○ | × | × | × | × | × |
| 2 | × | ○ | × | × | × | × |
| 3 | ○ | ○ | × | × | × | × |
| 4 | × | × | ○ | × | × | × |
| 5 | ○ | × | ○ | × | × | × |
| 6 | × | ○ | ○ | × | × | × |
| 7 | ○ | ○ | ○ | × | × | × |
| 8 | × | × | × | ○ | × | × |
| 9 | ○ | × | × | ○ | × | × |
| 10 | × | ○ | × | ○ | × | × |
| 11 | ○ | ○ | × | ○ | × | × |
| 12 | × | × | ○ | ○ | × | × |
| 13 | ○ | × | ○ | ○ | × | × |
| 14 | × | ○ | ○ | ○ | × | × |
| 15 | ○ | ○ | ○ | ○ | × | × |
| 16 | × | × | × | × | ○ | × |
| 17 | ○ | × | × | × | ○ | × |
| 18 | × | ○ | × | × | ○ | × |
| 19 | ○ | ○ | × | × | ○ | × |
| 20 | × | × | ○ | × | ○ | × |
| 21 | ○ | × | ○ | × | ○ | × |
| 22 | × | ○ | ○ | × | ○ | × |
| 23 | ○ | ○ | ○ | × | ○ | × |
| 24 | × | × | × | ○ | ○ | × |
| 25 | ○ | × | × | ○ | ○ | × |
| 26 | × | ○ | × | ○ | ○ | × |
| 27 | ○ | ○ | × | ○ | ○ | × |
| 28 | × | × | ○ | ○ | ○ | × |
| 29 | ○ | × | ○ | ○ | ○ | × |
| 30 | × | ○ | ○ | ○ | ○ | × |
| 31 | ○ | ○ | ○ | ○ | ○ | × |
| 32 | × | × | × | × | × | ○ |
| 33 | ○ | × | × | × | × | ○ |
| 34 | × | ○ | × | × | × | ○ |
| 35 | ○ | ○ | × | × | × | ○ |
| 36 | × | × | ○ | × | × | ○ |
| 37 | ○ | × | ○ | × | × | ○ |
| 38 | × | ○ | ○ | × | × | ○ |
| 39 | ○ | ○ | ○ | × | × | ○ |
| 40 | × | × | × | ○ | × | ○ |
| 41 | ○ | × | × | ○ | × | ○ |
| 42 | × | ○ | × | ○ | × | ○ |
| 43 | ○ | ○ | × | ○ | × | ○ |
| 44 | × | × | ○ | ○ | × | ○ |
| 45 | ○ | × | ○ | ○ | × | ○ |
| 46 | × | ○ | ○ | ○ | × | ○ |
| 47 | ○ | ○ | ○ | ○ | × | ○ |
| 48 | × | × | × | × | ○ | ○ |
| 49 | ○ | × | × | × | ○ | ○ |
| 50 | × | ○ | × | × | ○ | ○ |
| 51 | ○ | ○ | × | × | ○ | ○ |
| 52 | × | × | ○ | × | ○ | ○ |
| 53 | ○ | × | ○ | × | ○ | ○ |
| 54 | × | ○ | ○ | × | ○ | ○ |
| 55 | ○ | ○ | ○ | × | ○ | ○ |
| 56 | × | × | × | ○ | ○ | ○ |
| 57 | ○ | × | × | ○ | ○ | ○ |
| 58 | × | ○ | × | ○ | ○ | ○ |
| 59 | ○ | ○ | × | ○ | ○ | ○ |
| 60 | × | × | ○ | ○ | ○ | ○ |
| 61 | ○ | × | ○ | ○ | ○ | ○ |
| 62 | × | ○ | ○ | ○ | ○ | ○ |
| 63 | ○ | ○ | ○ | ○ | ○ | ○ |

○ : lighting
× : non-lighting

Fig. 9

○ : lighting
× : non-lighting

| | SF1 | | SF2 | | SF3 | | SF4 | |
|---|---|---|---|---|---|---|---|---|
| | 1 | | 4 | | 8 | | 8 | |
| | SP1 | SP2 | SP1 | SP2 | SP1 | SP2 | SP1 | SP2 |
| | 1 | 2 | 1 | 2 | 1 | 2 | 1 | 2 |
| | 1 | 2 | 4 | 8 | 8 | 16 | 8 | 16 |
| 0 | × | × | × | × | × | × | × | × |
| 1 | ○ | × | × | × | × | × | × | × |
| 2 | × | ○ | × | × | × | × | × | × |
| 3 | ○ | ○ | × | × | × | × | × | × |
| 4 | × | × | ○ | × | × | × | × | × |
| 5 | ○ | × | ○ | × | × | × | × | × |
| 6 | × | ○ | ○ | × | × | × | × | × |
| 7 | ○ | ○ | ○ | × | × | × | × | × |
| 8 | × | × | × | ○ | × | × | × | × |
| 9 | ○ | × | × | ○ | × | × | × | × |
| 10 | × | ○ | × | ○ | × | × | × | × |
| 11 | ○ | ○ | × | ○ | × | × | × | × |
| 12 | × | × | ○ | ○ | × | × | × | × |
| 13 | ○ | × | ○ | ○ | × | × | × | × |
| 14 | × | ○ | ○ | ○ | × | × | × | × |
| 15 | ○ | ○ | ○ | ○ | × | × | × | × |
| 16 | × | × | × | × | ○ | × | ○ | × |
| 17 | ○ | × | × | × | ○ | × | ○ | × |
| 18 | × | ○ | × | × | ○ | × | ○ | × |
| 19 | ○ | ○ | × | × | ○ | × | ○ | × |
| 20 | × | × | ○ | × | ○ | × | ○ | × |
| 21 | ○ | × | ○ | × | ○ | × | ○ | × |
| 22 | × | ○ | ○ | × | ○ | × | ○ | × |
| 23 | ○ | ○ | ○ | × | ○ | × | ○ | × |
| 24 | × | × | × | ○ | ○ | × | ○ | × |
| 25 | ○ | × | × | ○ | ○ | × | ○ | × |
| 26 | × | ○ | × | ○ | ○ | × | ○ | × |
| 27 | ○ | ○ | × | ○ | ○ | × | ○ | × |
| 28 | × | × | ○ | ○ | ○ | × | ○ | × |
| 29 | ○ | × | ○ | ○ | ○ | × | ○ | × |
| 30 | × | ○ | ○ | ○ | ○ | × | ○ | × |
| 31 | ○ | ○ | ○ | ○ | ○ | × | ○ | × |
| 32 | × | × | × | × | × | ○ | × | ○ |
| 33 | ○ | × | × | × | × | ○ | × | ○ |
| 34 | × | ○ | × | × | × | ○ | × | ○ |
| 35 | ○ | ○ | × | × | × | ○ | × | ○ |
| 36 | × | × | ○ | × | × | ○ | × | ○ |
| 37 | ○ | × | ○ | × | × | ○ | × | ○ |
| 38 | × | ○ | ○ | × | × | ○ | × | ○ |
| 39 | ○ | ○ | ○ | × | × | ○ | × | ○ |
| 40 | × | × | × | ○ | × | ○ | × | ○ |
| 41 | ○ | × | × | ○ | × | ○ | × | ○ |
| 42 | × | ○ | × | ○ | × | ○ | × | ○ |
| 43 | ○ | ○ | × | ○ | × | ○ | × | ○ |
| 44 | × | × | ○ | ○ | × | ○ | × | ○ |
| 45 | ○ | × | ○ | ○ | × | ○ | × | ○ |
| 46 | × | ○ | ○ | ○ | × | ○ | × | ○ |
| 47 | ○ | ○ | ○ | ○ | × | ○ | × | ○ |
| 48 | × | × | × | × | ○ | ○ | ○ | ○ |
| 49 | ○ | × | × | × | ○ | ○ | ○ | ○ |
| 50 | × | ○ | × | × | ○ | ○ | ○ | ○ |
| 51 | ○ | ○ | × | × | ○ | ○ | ○ | ○ |
| 52 | × | × | ○ | × | ○ | ○ | ○ | ○ |
| 53 | ○ | × | ○ | × | ○ | ○ | ○ | ○ |
| 54 | × | ○ | ○ | × | ○ | ○ | ○ | ○ |
| 55 | ○ | ○ | ○ | × | ○ | ○ | ○ | ○ |
| 56 | × | × | × | ○ | ○ | ○ | ○ | ○ |
| 57 | ○ | × | × | ○ | ○ | ○ | ○ | ○ |
| 58 | × | ○ | × | ○ | ○ | ○ | ○ | ○ |
| 59 | ○ | ○ | × | ○ | ○ | ○ | ○ | ○ |
| 60 | × | × | ○ | ○ | ○ | ○ | ○ | ○ |
| 61 | ○ | × | ○ | ○ | ○ | ○ | ○ | ○ |
| 62 | × | ○ | ○ | ○ | ○ | ○ | ○ | ○ |
| 63 | ○ | ○ | ○ | ○ | ○ | ○ | ○ | ○ |

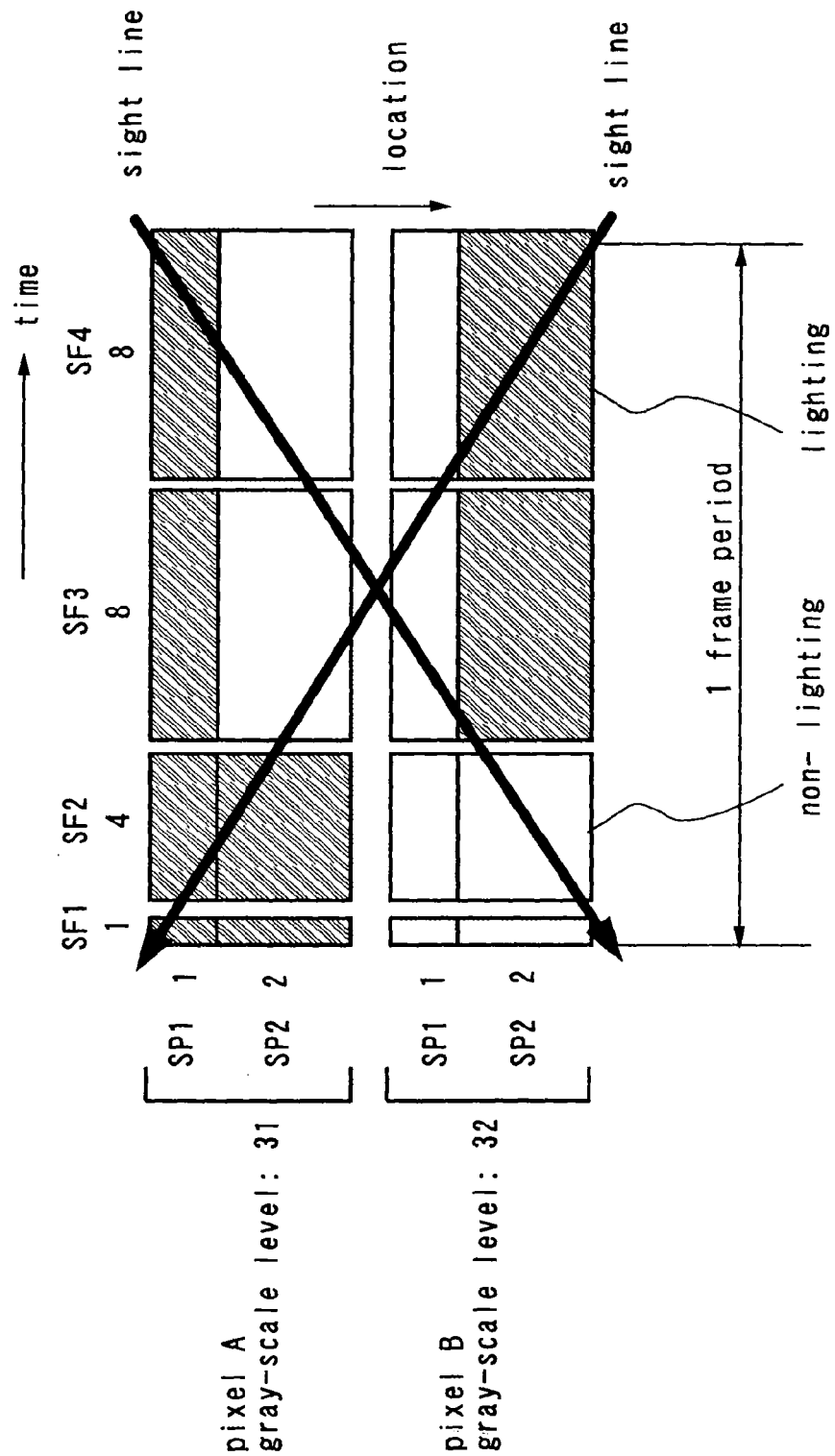

Fig. 11

○ : lighting
× : non-lighting

| | SF1 | | SF2 | | SF3 | | SF4 | |
|---|---|---|---|---|---|---|---|---|
| | 1 | | 4 | | 8 | | 8 | |
| | SP1 | SP2 | SP1 | SP2 | SP1 | SP2 | SP1 | SP2 |
| | 1 | 2 | 1 | 2 | 1 | 2 | 1 | 2 |
| | 1 | 2 | 4 | 8 | 8 | 16 | 8 | 16 |
| 0 | × | × | × | × | × | × | × | × |
| 1 | ○ | × | × | × | × | × | × | × |
| 2 | × | ○ | × | × | × | × | × | × |
| 3 | ○ | ○ | × | × | × | × | × | × |
| 4 | × | × | ○ | × | × | × | × | × |
| 5 | ○ | × | ○ | × | × | × | × | × |
| 6 | × | ○ | ○ | × | × | × | × | × |
| 7 | ○ | ○ | ○ | × | × | × | × | × |
| 8 | × | × | × | ○ | × | × | × | × |
| 9 | ○ | × | × | ○ | × | × | × | × |
| 10 | × | ○ | × | ○ | × | × | × | × |
| 11 | ○ | ○ | × | ○ | × | × | × | × |
| 12 | × | × | ○ | ○ | × | × | × | × |
| 13 | ○ | × | ○ | ○ | × | × | × | × |
| 14 | × | ○ | ○ | ○ | × | × | × | × |
| 15 | ○ | ○ | ○ | ○ | × | × | × | × |
| 16 | × | × | × | × | ○ | × | ○ | × |
| 17 | ○ | × | × | × | ○ | × | ○ | × |
| 18 | × | ○ | × | × | ○ | × | ○ | × |
| 19 | ○ | ○ | × | × | ○ | × | ○ | × |
| 20 | × | × | ○ | × | ○ | × | ○ | × |
| 21 | ○ | × | ○ | × | ○ | × | ○ | × |
| 22 | × | ○ | ○ | × | ○ | × | ○ | × |
| 23 | ○ | ○ | ○ | × | ○ | × | ○ | × |
| 24 | × | × | × | ○ | ○ | × | ○ | × |
| 25 | ○ | × | × | ○ | ○ | × | ○ | × |
| 26 | × | ○ | × | ○ | ○ | × | ○ | × |
| 27 | ○ | ○ | × | ○ | ○ | × | ○ | × |
| 28 | × | × | ○ | ○ | ○ | × | ○ | × |
| 29 | ○ | × | ○ | ○ | ○ | × | ○ | × |
| 30 | × | ○ | ○ | ○ | ○ | × | ○ | × |
| 31 | ○ | ○ | ○ | ○ | ○ | × | ○ | × |
| 32 | × | × | × | × | ○ | ○ | ○ | × |
| 33 | ○ | × | × | × | × | ○ | × | ○ |
| 34 | × | ○ | × | × | × | ○ | × | ○ |
| 35 | ○ | ○ | × | × | × | ○ | × | ○ |
| 36 | × | × | ○ | × | × | ○ | × | ○ |
| 37 | ○ | × | ○ | × | × | ○ | × | ○ |
| 38 | × | ○ | ○ | × | × | ○ | × | ○ |
| 39 | ○ | ○ | ○ | × | × | ○ | × | ○ |
| 40 | × | × | × | ○ | × | ○ | × | ○ |
| 41 | ○ | × | × | ○ | × | ○ | × | ○ |
| 42 | × | ○ | × | ○ | × | ○ | × | ○ |
| 43 | ○ | ○ | × | ○ | × | ○ | × | ○ |
| 44 | × | × | ○ | ○ | × | ○ | × | ○ |
| 45 | ○ | × | ○ | ○ | × | ○ | × | ○ |
| 46 | × | ○ | ○ | ○ | × | ○ | × | ○ |
| 47 | ○ | ○ | ○ | ○ | × | ○ | × | ○ |
| 48 | × | × | × | × | ○ | ○ | ○ | ○ |
| 49 | ○ | × | × | × | ○ | ○ | ○ | ○ |
| 50 | × | ○ | × | × | ○ | ○ | ○ | ○ |
| 51 | ○ | ○ | × | × | ○ | ○ | ○ | ○ |
| 52 | × | × | ○ | × | ○ | ○ | ○ | ○ |
| 53 | ○ | × | ○ | × | ○ | ○ | ○ | ○ |
| 54 | × | ○ | ○ | × | ○ | ○ | ○ | ○ |
| 55 | ○ | ○ | ○ | × | ○ | ○ | ○ | ○ |
| 56 | × | × | × | ○ | ○ | ○ | ○ | ○ |
| 57 | ○ | × | × | ○ | ○ | ○ | ○ | ○ |
| 58 | × | ○ | × | ○ | ○ | ○ | ○ | ○ |
| 59 | ○ | ○ | × | ○ | ○ | ○ | ○ | ○ |
| 60 | × | × | ○ | ○ | ○ | ○ | ○ | ○ |
| 61 | ○ | × | ○ | ○ | ○ | ○ | ○ | ○ |
| 62 | × | ○ | ○ | ○ | ○ | ○ | ○ | ○ |
| 63 | ○ | ○ | ○ | ○ | ○ | ○ | ○ | ○ |

Fig. 13

| | SF1 | | | SF2 | | |
|---|---|---|---|---|---|---|
| | 1 | | | 8 | | |
| | SP1 | SP2 | SP3 | SP1 | SP2 | SP3 |
| | 1 | 2 | 4 | 1 | 2 | 4 |
| | 1 | 2 | 4 | 8 | 16 | 32 |
| 0 | × | × | × | × | × | × |
| 1 | ○ | × | × | × | × | × |
| 2 | × | ○ | × | × | × | × |
| 3 | ○ | ○ | × | × | × | × |
| 4 | × | × | ○ | × | × | × |
| 5 | ○ | × | ○ | × | × | × |
| 6 | × | ○ | ○ | × | × | × |
| 7 | ○ | ○ | ○ | × | × | × |
| 8 | × | × | × | ○ | × | × |
| 9 | ○ | × | × | ○ | × | × |
| 10 | × | ○ | × | ○ | × | × |
| 11 | ○ | ○ | × | ○ | × | × |
| 12 | × | × | ○ | ○ | × | × |
| 13 | ○ | × | ○ | ○ | × | × |
| 14 | × | ○ | ○ | ○ | × | × |
| 15 | ○ | ○ | ○ | ○ | × | × |
| 16 | × | × | × | × | ○ | × |
| 17 | ○ | × | × | × | ○ | × |
| 18 | × | ○ | × | × | ○ | × |
| 19 | ○ | ○ | × | × | ○ | × |
| 20 | × | × | ○ | × | ○ | × |
| 21 | ○ | × | ○ | × | ○ | × |
| 22 | × | ○ | ○ | × | ○ | × |
| 23 | ○ | ○ | ○ | × | ○ | × |
| 24 | × | × | × | ○ | ○ | × |
| 25 | ○ | × | × | ○ | ○ | × |
| 26 | × | ○ | × | ○ | ○ | × |
| 27 | ○ | ○ | × | ○ | ○ | × |
| 28 | × | × | ○ | ○ | ○ | × |
| 29 | ○ | × | ○ | ○ | ○ | × |
| 30 | × | ○ | ○ | ○ | ○ | × |
| 31 | ○ | ○ | ○ | ○ | ○ | × |
| 32 | × | × | × | × | × | ○ |
| 33 | ○ | × | × | × | × | ○ |
| 34 | × | ○ | × | × | × | ○ |
| 35 | ○ | ○ | × | × | × | ○ |
| 36 | × | × | ○ | × | × | ○ |
| 37 | ○ | × | ○ | × | × | ○ |
| 38 | × | ○ | ○ | × | × | ○ |
| 39 | ○ | ○ | ○ | × | × | ○ |
| 40 | × | × | × | ○ | × | ○ |
| 41 | ○ | × | × | ○ | × | ○ |
| 42 | × | ○ | × | ○ | × | ○ |
| 43 | ○ | ○ | × | ○ | × | ○ |
| 44 | × | × | ○ | ○ | × | ○ |
| 45 | ○ | × | ○ | ○ | × | ○ |
| 46 | × | ○ | ○ | ○ | × | ○ |
| 47 | ○ | ○ | ○ | ○ | × | ○ |
| 48 | × | × | × | × | ○ | ○ |
| 49 | ○ | × | × | × | ○ | ○ |
| 50 | × | ○ | × | × | ○ | ○ |
| 51 | ○ | ○ | × | × | ○ | ○ |
| 52 | × | × | ○ | × | ○ | ○ |
| 53 | ○ | × | ○ | × | ○ | ○ |
| 54 | × | ○ | ○ | × | ○ | ○ |
| 55 | ○ | ○ | ○ | × | ○ | ○ |
| 56 | × | × | × | ○ | ○ | ○ |
| 57 | ○ | × | × | ○ | ○ | ○ |
| 58 | × | ○ | × | ○ | ○ | ○ |
| 59 | ○ | ○ | × | ○ | ○ | ○ |
| 60 | × | × | ○ | ○ | ○ | ○ |
| 61 | ○ | × | ○ | ○ | ○ | ○ |
| 62 | × | ○ | ○ | ○ | ○ | ○ |
| 63 | ○ | ○ | ○ | ○ | ○ | ○ |

○ : lighting

× : non-lighting

Fig. 15

| | SF1 | | | SF2 | | | SF3 | | |
|---|---|---|---|---|---|---|---|---|---|
| | 1 | | | 4 | | | 4 | | |
| | SP1 | SP2 | SP3 | SP1 | SP2 | SP3 | SP1 | SP2 | SP3 |
| | 1 | 2 | 4 | 1 | 2 | 4 | 1 | 2 | 4 |
| | 1 | 2 | 4 | 4 | 8 | 16 | 4 | 8 | 16 |
| 0 | × | × | × | × | × | × | × | × | × |
| 1 | ○ | × | × | × | × | × | × | × | × |
| 2 | × | ○ | × | × | × | × | × | × | × |
| 3 | ○ | ○ | × | × | × | × | × | × | × |
| 4 | × | × | ○ | × | × | × | × | × | × |
| 5 | ○ | × | ○ | × | × | × | × | × | × |
| 6 | × | ○ | ○ | × | × | × | × | × | × |
| 7 | ○ | ○ | ○ | × | × | × | × | × | × |
| 8 | × | × | × | ○ | × | × | ○ | × | × |
| 9 | ○ | × | × | ○ | × | × | ○ | × | × |
| 10 | × | ○ | × | ○ | × | × | ○ | × | × |
| 11 | ○ | ○ | × | ○ | × | × | ○ | × | × |
| 12 | × | × | ○ | ○ | × | × | ○ | × | × |
| 13 | ○ | × | ○ | ○ | × | × | ○ | × | × |
| 14 | × | ○ | ○ | ○ | × | × | ○ | × | × |
| 15 | ○ | ○ | ○ | ○ | × | × | ○ | × | × |
| 16 | × | × | × | × | ○ | × | × | ○ | × |
| 17 | ○ | × | × | × | ○ | × | × | ○ | × |
| 18 | × | ○ | × | × | ○ | × | × | ○ | × |
| 19 | ○ | ○ | × | × | ○ | × | × | ○ | × |
| 20 | × | × | ○ | × | ○ | × | × | ○ | × |
| 21 | ○ | × | ○ | × | ○ | × | × | ○ | × |
| 22 | × | ○ | ○ | × | ○ | × | × | ○ | × |
| 23 | ○ | ○ | ○ | × | ○ | × | × | ○ | × |
| 24 | × | × | × | ○ | ○ | × | ○ | ○ | × |
| 25 | ○ | × | × | ○ | ○ | × | ○ | ○ | × |
| 26 | × | ○ | × | ○ | ○ | × | ○ | ○ | × |
| 27 | ○ | ○ | × | ○ | ○ | × | ○ | ○ | × |
| 28 | × | × | ○ | ○ | ○ | × | ○ | ○ | × |
| 29 | ○ | × | ○ | ○ | ○ | × | ○ | ○ | × |
| 30 | × | ○ | ○ | ○ | ○ | × | ○ | ○ | × |
| 31 | ○ | ○ | ○ | ○ | ○ | × | ○ | ○ | × |
| 32 | × | × | × | × | × | ○ | × | × | ○ |
| 33 | ○ | × | × | × | × | ○ | × | × | ○ |
| 34 | × | ○ | × | × | × | ○ | × | × | ○ |
| 35 | ○ | ○ | × | × | × | ○ | × | × | ○ |
| 36 | × | × | ○ | × | × | ○ | × | × | ○ |
| 37 | ○ | × | ○ | × | × | ○ | × | × | ○ |
| 38 | × | ○ | ○ | × | × | ○ | × | × | ○ |
| 39 | ○ | ○ | ○ | × | × | ○ | × | × | ○ |
| 40 | × | × | × | ○ | × | ○ | ○ | × | ○ |
| 41 | ○ | × | × | ○ | × | ○ | ○ | × | ○ |
| 42 | × | ○ | × | ○ | × | ○ | ○ | × | ○ |
| 43 | ○ | ○ | × | ○ | × | ○ | ○ | × | ○ |
| 44 | × | × | ○ | ○ | × | ○ | ○ | × | ○ |
| 45 | ○ | × | ○ | ○ | × | ○ | ○ | × | ○ |
| 46 | × | ○ | ○ | ○ | × | ○ | ○ | × | ○ |
| 47 | ○ | ○ | ○ | ○ | × | ○ | ○ | × | ○ |
| 48 | × | × | × | × | ○ | ○ | × | ○ | ○ |
| 49 | ○ | × | × | × | ○ | ○ | × | ○ | ○ |
| 50 | × | ○ | × | × | ○ | ○ | × | ○ | ○ |
| 51 | ○ | ○ | × | × | ○ | ○ | × | ○ | ○ |
| 52 | × | × | ○ | × | ○ | ○ | × | ○ | ○ |
| 53 | ○ | × | ○ | × | ○ | ○ | × | ○ | ○ |
| 54 | × | ○ | ○ | × | ○ | ○ | × | ○ | ○ |
| 55 | ○ | ○ | ○ | × | ○ | ○ | × | ○ | ○ |
| 56 | × | × | × | ○ | ○ | ○ | ○ | ○ | ○ |
| 57 | ○ | × | × | ○ | ○ | ○ | ○ | ○ | ○ |
| 58 | × | ○ | × | ○ | ○ | ○ | ○ | ○ | ○ |
| 59 | ○ | ○ | × | ○ | ○ | ○ | ○ | ○ | ○ |
| 60 | × | × | ○ | ○ | ○ | ○ | ○ | ○ | ○ |
| 61 | ○ | × | ○ | ○ | ○ | ○ | ○ | ○ | ○ |
| 62 | × | ○ | ○ | ○ | ○ | ○ | ○ | ○ | ○ |
| 63 | ○ | ○ | ○ | ○ | ○ | ○ | ○ | ○ | ○ |

○ : lighting

× : non-lighting

Fig. 17

|  | SF1 | | | SF2 | | | SF3 | | |
|---|---|---|---|---|---|---|---|---|---|
|  | 1 | | | 4 | | | 4 | | |
|  | SP1 | SP2 | SP3 | SP1 | SP2 | SP3 | SP1 | SP2 | SP3 |
|  | 1 | 2 | 4 | 1 | 2 | 4 | 1 | 2 | 4 |
|  | 1 | 2 | 4 | 4 | 8 | 16 | 4 | 8 | 16 |
| 0 | × | × | × | × | × | × | × | × | × |
| 1 | ○ | × | × | × | × | × | × | × | × |
| 2 | × | ○ | × | × | × | × | × | × | × |
| 3 | ○ | ○ | × | × | × | × | × | × | × |
| 4 | × | × | ○ | × | × | × | × | × | × |
| 5 | ○ | × | ○ | × | × | × | × | × | × |
| 6 | × | ○ | ○ | × | × | × | × | × | × |
| 7 | ○ | ○ | ○ | × | × | × | × | × | × |
| 8 | × | × | × | ○ | × | × | ○ | × | × |
| 9 | ○ | × | × | ○ | × | × | ○ | × | × |
| 10 | × | ○ | × | ○ | × | × | ○ | × | × |
| 11 | ○ | ○ | × | ○ | × | × | ○ | × | × |
| 12 | × | × | ○ | ○ | × | × | ○ | × | × |
| 13 | ○ | × | ○ | ○ | × | × | ○ | × | × |
| 14 | × | ○ | ○ | ○ | × | × | ○ | × | × |
| 15 | ○ | ○ | ○ | ○ | × | × | ○ | × | × |
| 16 | × | × | × | × | ○ | × | × | ○ | × |
| 17 | ○ | × | × | × | ○ | × | × | ○ | × |
| 18 | × | ○ | × | × | ○ | × | × | ○ | × |
| 19 | ○ | ○ | × | × | ○ | × | × | ○ | × |
| 20 | × | × | ○ | × | ○ | × | × | ○ | × |
| 21 | ○ | × | ○ | × | ○ | × | × | ○ | × |
| 22 | × | ○ | ○ | × | ○ | × | × | ○ | × |
| 23 | ○ | ○ | ○ | × | ○ | × | × | ○ | × |
| 24 | × | × | × | ○ | ○ | × | ○ | ○ | × |
| 25 | ○ | × | × | ○ | ○ | × | ○ | ○ | × |
| 26 | × | ○ | × | ○ | ○ | × | ○ | ○ | × |
| 27 | ○ | ○ | × | ○ | ○ | × | ○ | ○ | × |
| 28 | × | × | ○ | ○ | ○ | × | ○ | ○ | × |
| 29 | ○ | × | ○ | ○ | ○ | × | ○ | ○ | × |
| 30 | × | ○ | ○ | ○ | ○ | × | ○ | ○ | × |
| 31 | ○ | ○ | ○ | ○ | ○ | × | ○ | ○ | × |
| 32 | × | × | × | ○ | × | ○ | ○ | ○ | × |
| 33 | ○ | × | × | × | × | ○ | × | × | ○ |
| 34 | × | ○ | × | × | × | ○ | × | × | ○ |
| 35 | ○ | ○ | × | × | × | ○ | × | × | ○ |
| 36 | × | × | ○ | × | × | ○ | × | × | ○ |
| 37 | ○ | × | ○ | × | × | ○ | × | × | ○ |
| 38 | × | ○ | ○ | × | × | ○ | × | × | ○ |
| 39 | ○ | ○ | ○ | × | × | ○ | × | × | ○ |
| 40 | × | × | × | ○ | × | ○ | ○ | × | ○ |
| 41 | ○ | × | × | ○ | × | ○ | ○ | × | ○ |
| 42 | × | ○ | × | ○ | × | ○ | ○ | × | ○ |
| 43 | ○ | ○ | × | ○ | × | ○ | ○ | × | ○ |
| 44 | × | × | ○ | ○ | × | ○ | ○ | × | ○ |
| 45 | ○ | × | ○ | ○ | × | ○ | ○ | × | ○ |
| 46 | × | ○ | ○ | ○ | × | ○ | ○ | × | ○ |
| 47 | ○ | ○ | ○ | ○ | × | ○ | ○ | × | ○ |
| 48 | × | × | × | × | ○ | ○ | × | ○ | ○ |
| 49 | ○ | × | × | × | ○ | ○ | × | ○ | ○ |
| 50 | × | ○ | × | × | ○ | ○ | × | ○ | ○ |
| 51 | ○ | ○ | × | × | ○ | ○ | × | ○ | ○ |
| 52 | × | × | ○ | × | ○ | ○ | × | ○ | ○ |
| 53 | ○ | × | ○ | × | ○ | ○ | × | ○ | ○ |
| 54 | × | ○ | ○ | × | ○ | ○ | × | ○ | ○ |
| 55 | ○ | ○ | ○ | × | ○ | ○ | × | ○ | ○ |
| 56 | × | × | × | ○ | ○ | ○ | ○ | ○ | ○ |
| 57 | ○ | × | × | ○ | ○ | ○ | ○ | ○ | ○ |
| 58 | × | ○ | × | ○ | ○ | ○ | ○ | ○ | ○ |
| 59 | ○ | ○ | × | ○ | ○ | ○ | ○ | ○ | ○ |
| 60 | × | × | ○ | ○ | ○ | ○ | ○ | ○ | ○ |
| 61 | ○ | × | ○ | ○ | ○ | ○ | ○ | ○ | ○ |
| 62 | × | ○ | ○ | ○ | ○ | ○ | ○ | ○ | ○ |
| 63 | ○ | ○ | ○ | ○ | ○ | ○ | ○ | ○ | ○ |

○ : lighting
× : non-lighting

Fig. 19

| | SF1 | | SF2 | | SF3 | | SF4 | | SF5 | |
|---|---|---|---|---|---|---|---|---|---|---|
| | 1 | | 4 | | 16 | | 32 | | 32 | |
| | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| | 1 | 2 | 4 | 8 | 16 | 32 | 32 | 64 | 32 | 64 |
| 0 | × | × | × | × | × | × | × | × | × | × |
| 1 | ○ | × | × | × | × | × | × | × | × | × |
| 2 | × | ○ | × | × | × | × | × | × | × | × |
| 3 | ○ | ○ | × | × | × | × | × | × | × | × |
| 4 | × | × | ○ | × | × | × | × | × | × | × |
| 5 | ○ | × | ○ | × | × | × | × | × | × | × |
| 6 | × | ○ | ○ | × | × | × | × | × | × | × |
| 7 | ○ | ○ | ○ | × | × | × | × | × | × | × |
| 8 | × | × | × | ○ | × | × | × | × | × | × |
| 9 | ○ | × | × | ○ | × | × | × | × | × | × |
| 10 | × | ○ | × | ○ | × | × | × | × | × | × |
| 11 | ○ | ○ | × | ○ | × | × | × | × | × | × |
| 12 | × | × | ○ | ○ | × | × | × | × | × | × |
| 13 | ○ | × | ○ | ○ | × | × | × | × | × | × |
| 14 | × | ○ | ○ | ○ | × | × | × | × | × | × |
| 15 | ○ | ○ | ○ | ○ | × | × | × | × | × | × |
| 16 | × | × | × | × | ○ | × | × | × | × | × |
| 17 | ○ | × | × | × | ○ | × | × | × | × | × |
| 18 | × | ○ | × | × | ○ | × | × | × | × | × |
| 19 | ○ | ○ | × | × | ○ | × | × | × | × | × |
| 20 | × | × | ○ | × | ○ | × | × | × | × | × |
| 21 | ○ | × | ○ | × | ○ | × | × | × | × | × |
| 22 | × | ○ | ○ | × | ○ | × | × | × | × | × |
| 23 | ○ | ○ | ○ | × | ○ | × | × | × | × | × |
| 24 | × | × | × | ○ | ○ | × | × | × | × | × |
| 25 | ○ | × | × | ○ | ○ | × | × | × | × | × |
| 26 | × | ○ | × | ○ | ○ | × | × | × | × | × |
| 27 | ○ | ○ | × | ○ | ○ | × | × | × | × | × |
| 28 | × | × | ○ | ○ | ○ | × | × | × | × | × |
| 29 | ○ | × | ○ | ○ | ○ | × | × | × | × | × |
| 30 | × | ○ | ○ | ○ | ○ | × | × | × | × | × |
| 31 | ○ | ○ | ○ | ○ | ○ | × | × | × | × | × |
| 32 | × | × | × | × | × | ○ | × | × | × | × |
| 33 | ○ | × | × | × | × | ○ | × | × | × | × |
| 34 | × | ○ | × | × | × | ○ | × | × | × | × |
| 35 | ○ | ○ | × | × | × | ○ | × | × | × | × |
| 36 | × | × | ○ | × | × | ○ | × | × | × | × |
| 37 | ○ | × | ○ | × | × | ○ | × | × | × | × |
| 38 | × | ○ | ○ | × | × | ○ | × | × | × | × |
| 39 | ○ | ○ | ○ | × | × | ○ | × | × | × | × |
| 40 | × | × | × | ○ | × | ○ | × | × | × | × |
| 41 | ○ | × | × | ○ | × | ○ | × | × | × | × |
| 42 | × | ○ | × | ○ | × | ○ | × | × | × | × |
| 43 | ○ | ○ | × | ○ | × | ○ | × | × | × | × |
| 44 | × | × | ○ | ○ | × | ○ | × | × | × | × |
| 45 | ○ | × | ○ | ○ | × | ○ | × | × | × | × |
| 46 | × | ○ | ○ | ○ | × | ○ | × | × | × | × |
| 47 | ○ | ○ | ○ | ○ | × | ○ | × | × | × | × |
| 48 | × | × | × | × | ○ | ○ | × | × | × | × |
| 49 | ○ | × | × | × | ○ | ○ | × | × | × | × |
| 50 | × | ○ | × | × | ○ | ○ | × | × | × | × |
| 51 | ○ | ○ | × | × | ○ | ○ | × | × | × | × |
| 52 | × | × | ○ | × | ○ | ○ | × | × | × | × |
| 53 | ○ | × | ○ | × | ○ | ○ | × | × | × | × |
| 54 | × | ○ | ○ | × | ○ | ○ | × | × | × | × |
| 55 | ○ | ○ | ○ | × | ○ | ○ | × | × | × | × |
| 56 | × | × | × | ○ | ○ | ○ | × | × | × | × |
| 57 | ○ | × | × | ○ | ○ | ○ | × | × | × | × |
| 58 | × | ○ | × | ○ | ○ | ○ | × | × | × | × |
| 59 | ○ | ○ | × | ○ | ○ | ○ | × | × | × | × |
| 60 | × | × | ○ | ○ | ○ | ○ | × | × | × | × |
| 61 | ○ | × | ○ | ○ | ○ | ○ | × | × | × | × |
| 62 | × | ○ | ○ | ○ | ○ | ○ | × | × | × | × |
| 63 | ○ | ○ | ○ | ○ | ○ | ○ | × | × | × | × |

○ : lighting

× : non-lighting

Fig. 20

| glay scale level (5-bit gray scales with gamma correction) | 6-bit gray scales | SF1 = 1 | | SF2 = 4 | | SF3 = 16 | |
|---|---|---|---|---|---|---|---|
| | | SP1 = 1 | SP2 = 2 | SP1 = 1 | SP2 = 2 | SP1 = 1 | SP2 = 2 |
| | | 1 | 2 | 4 | 8 | 16 | 32 |
| 0 | 0 | × | × | × | × | × | × |
| 1 | 0 | × | × | × | × | × | × |
| 2 | 0 | × | × | × | × | × | × |
| 3 | 0 | × | × | × | × | × | × |
| 4 | 1 | ○ | × | × | × | × | × |
| 5 | 1 | ○ | × | × | × | × | × |
| 6 | 2 | × | ○ | × | × | × | × |
| 7 | 2 | × | ○ | × | × | × | × |
| 8 | 3 | ○ | ○ | × | × | × | × |
| 9 | 4 | × | × | ○ | × | × | × |
| 10 | 5 | ○ | × | ○ | × | × | × |
| 11 | 6 | × | ○ | ○ | × | × | × |
| 12 | 8 | × | × | × | ○ | × | × |
| 13 | 9 | ○ | × | × | ○ | × | × |
| 14 | 11 | ○ | ○ | × | ○ | × | × |
| 15 | 13 | ○ | × | ○ | ○ | × | × |
| 16 | 15 | ○ | ○ | ○ | ○ | × | × |
| 17 | 17 | ○ | × | × | × | ○ | × |
| 18 | 19 | ○ | ○ | × | × | ○ | × |
| 19 | 21 | ○ | × | ○ | × | ○ | × |
| 20 | 24 | × | × | × | ○ | ○ | × |
| 21 | 27 | ○ | ○ | × | ○ | ○ | × |
| 22 | 30 | × | ○ | ○ | ○ | ○ | × |
| 23 | 33 | ○ | × | × | × | × | ○ |
| 24 | 36 | × | × | ○ | × | × | ○ |
| 25 | 39 | ○ | ○ | ○ | × | × | ○ |
| 26 | 43 | ○ | ○ | × | ○ | × | ○ |
| 27 | 46 | × | ○ | ○ | ○ | × | ○ |
| 28 | 50 | × | ○ | × | × | ○ | ○ |
| 29 | 54 | × | × | ○ | × | ○ | ○ |
| 30 | 59 | ○ | ○ | × | ○ | ○ | ○ |
| 31 | 63 | ○ | ○ | ○ | ○ | ○ | ○ |

○ : lighting
× : non-lighting

Fig. 22

5-bit gray scales with gamma correction 6-bit gray scales

| glay-scale level | | SF1 1 | | SF2 4 | | SF3 16 | |
|---|---|---|---|---|---|---|---|
| | | SP1 1 | SP2 2 | SP1 1 | SP2 2 | SP1 1 | SP2 2 |
| | | 1 | 2 | 4 | 8 | 16 | 32 |
| 0 | 0 | × | × | × | × | × | × |
| 1 | 1 | ○ | × | × | × | × | × |
| 2 | 2 | × | ○ | × | × | × | × |
| 3 | 3 | ○ | ○ | × | × | × | × |
| 4 | 4 | × | × | ○ | × | × | × |
| 5 | 5 | ○ | × | ○ | × | × | × |
| 6 | 6 | × | ○ | ○ | × | × | × |
| 7 | 7 | ○ | ○ | ○ | × | × | × |
| 8 | 8 | × | × | × | ○ | × | × |
| 9 | 9 | ○ | × | × | ○ | × | × |
| 10 | 10 | × | ○ | × | ○ | × | × |
| 11 | 11 | ○ | ○ | × | ○ | × | × |
| 12 | 12 | × | × | ○ | ○ | × | × |
| 13 | 13 | ○ | × | ○ | ○ | × | × |
| 14 | 14 | × | ○ | ○ | ○ | × | × |
| 15 | 15 | ○ | ○ | ○ | ○ | × | × |
| 16 | 16 | × | × | × | × | ○ | × |
| 17 | 17 | ○ | × | × | × | ○ | × |
| 18 | 19 | ○ | ○ | × | × | ○ | × |
| 19 | 21 | ○ | × | ○ | × | ○ | × |
| 20 | 24 | × | × | × | ○ | ○ | × |
| 21 | 27 | ○ | ○ | × | ○ | ○ | × |
| 22 | 30 | × | ○ | ○ | ○ | ○ | × |
| 23 | 33 | ○ | × | × | × | × | ○ |
| 24 | 36 | × | × | ○ | × | × | ○ |
| 25 | 39 | ○ | ○ | ○ | × | × | ○ |
| 26 | 43 | ○ | ○ | × | ○ | × | ○ |
| 27 | 46 | × | ○ | ○ | ○ | × | ○ |
| 28 | 50 | × | ○ | × | × | ○ | ○ |
| 29 | 54 | × | ○ | ○ | × | ○ | ○ |
| 30 | 59 | ○ | ○ | × | ○ | ○ | ○ |
| 31 | 63 | ○ | ○ | ○ | ○ | ○ | ○ |

○ : lighting

× : non-lighting

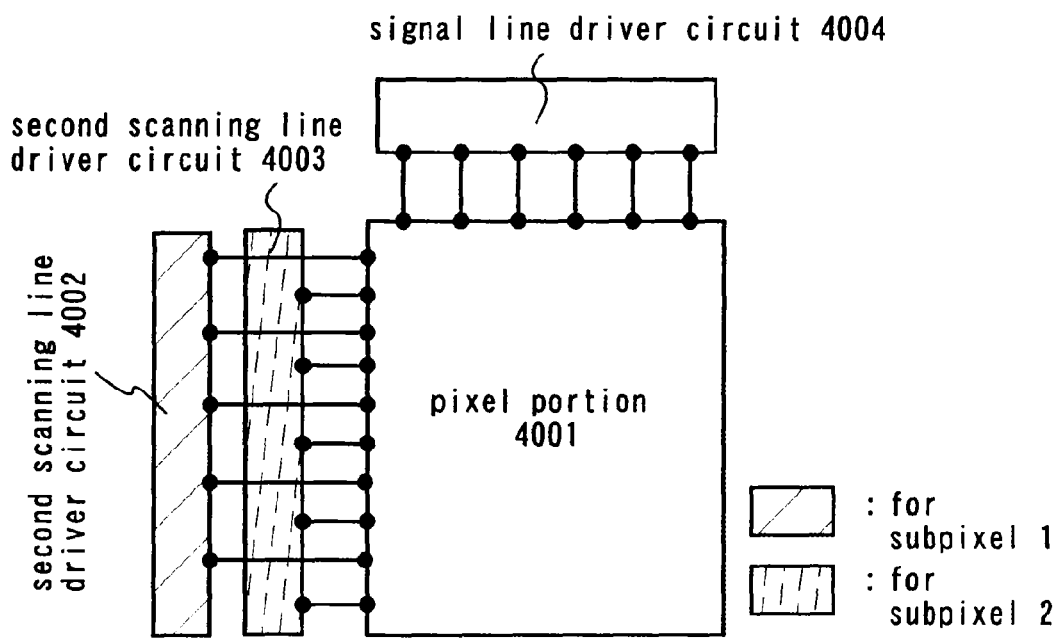
Fig. 40 A
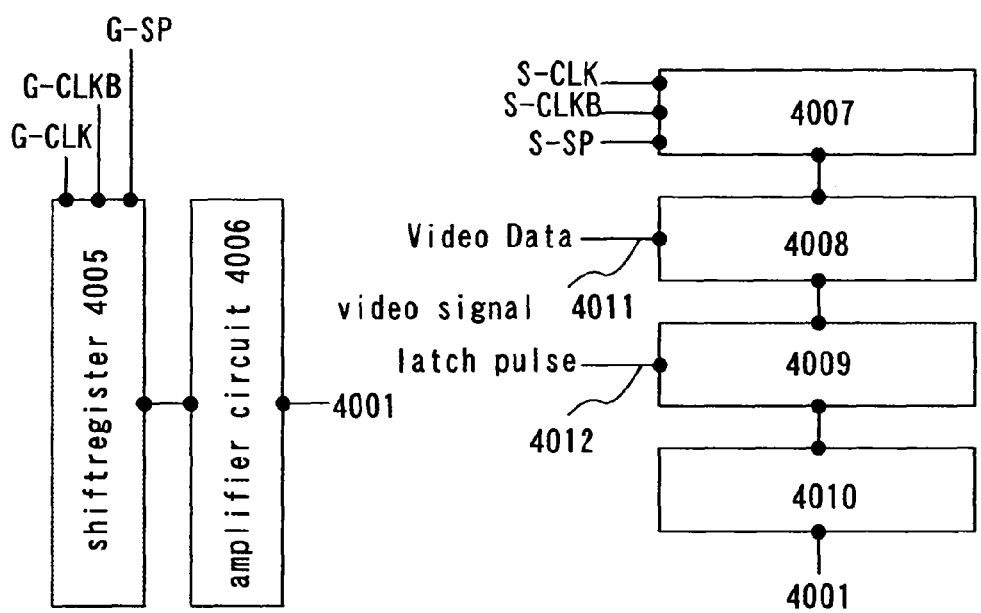
Fig. 40 B
Fig. 40 C

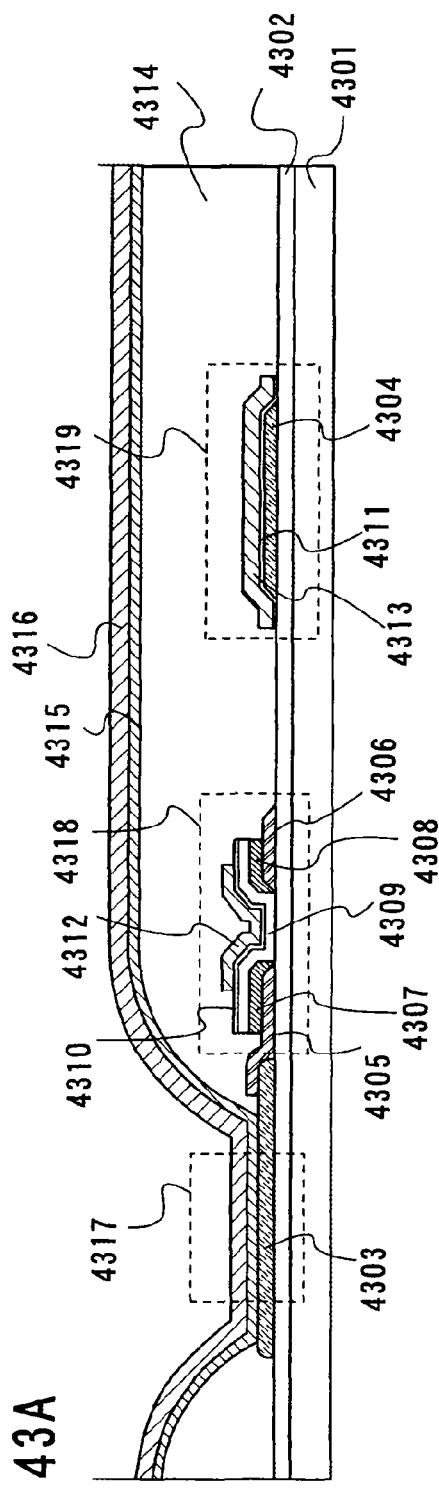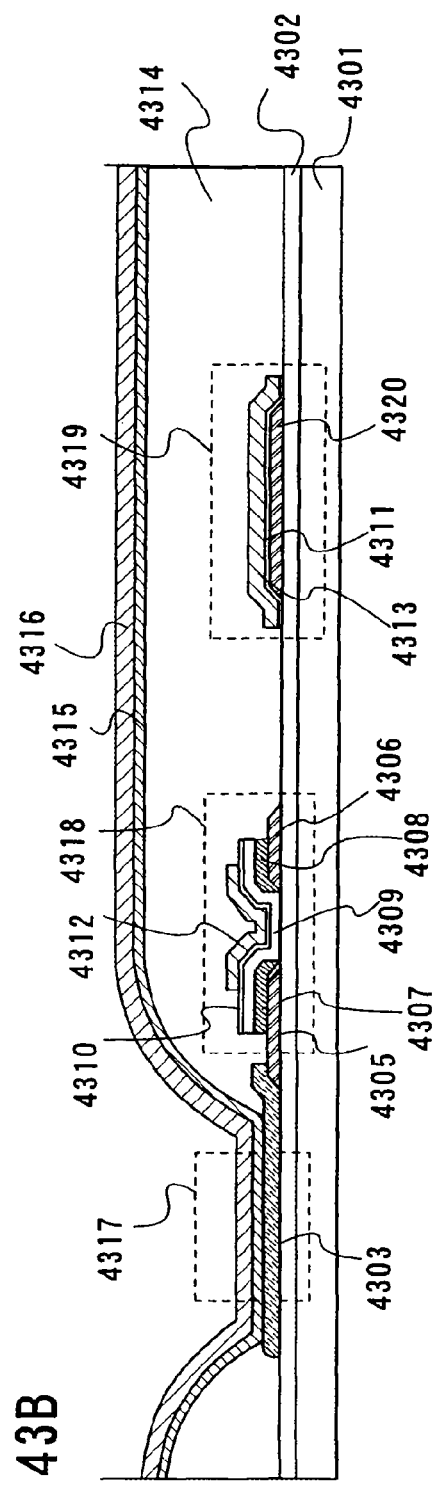
Fig. 43A
Fig. 43B

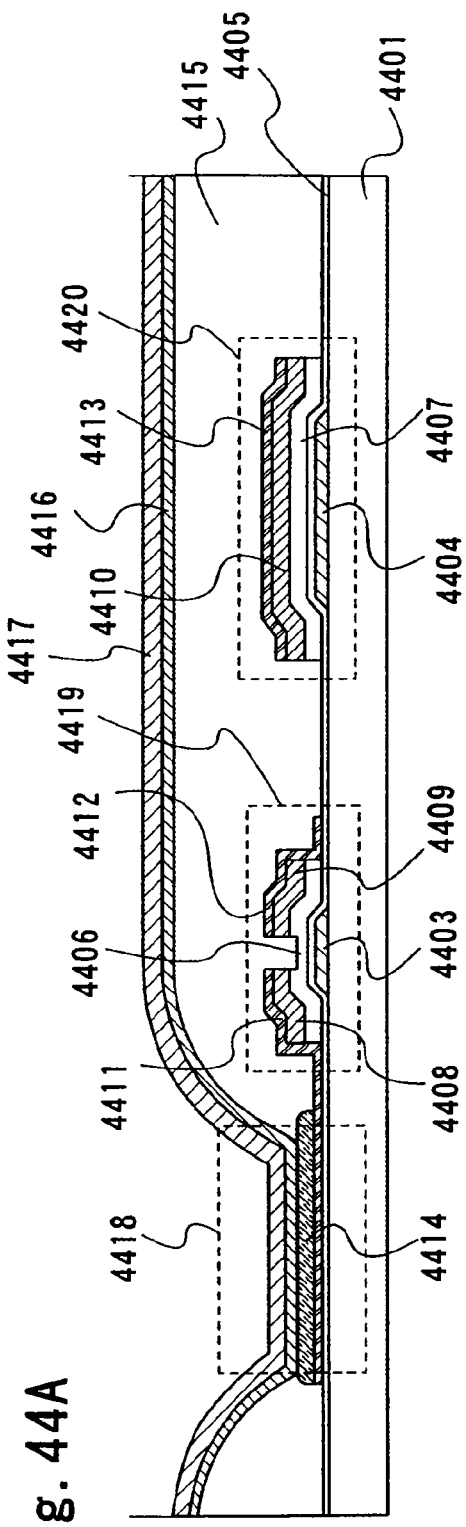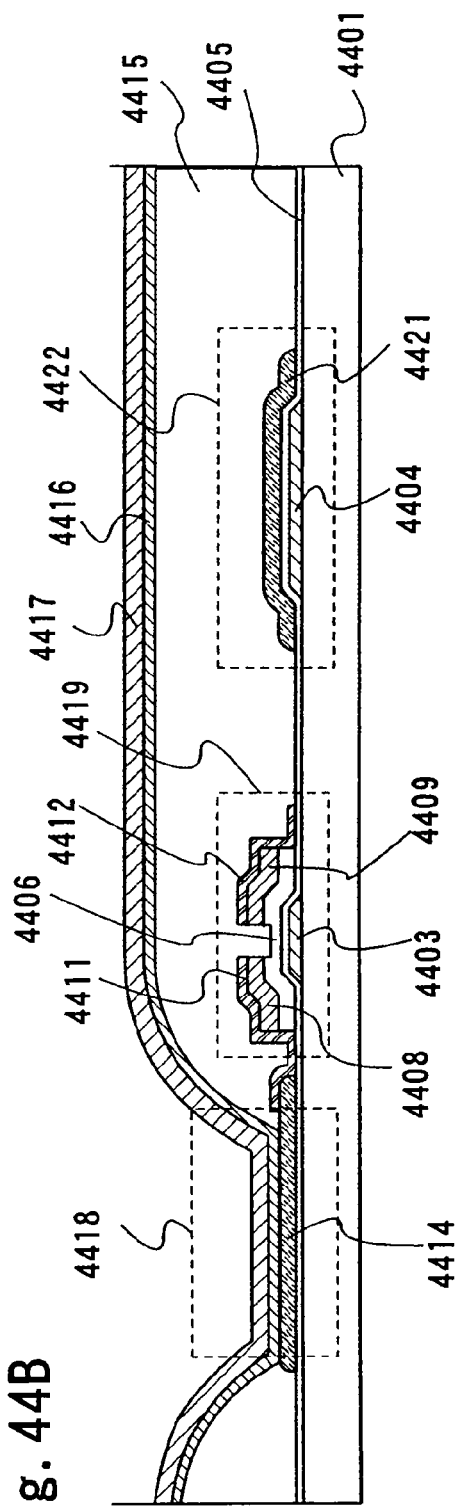

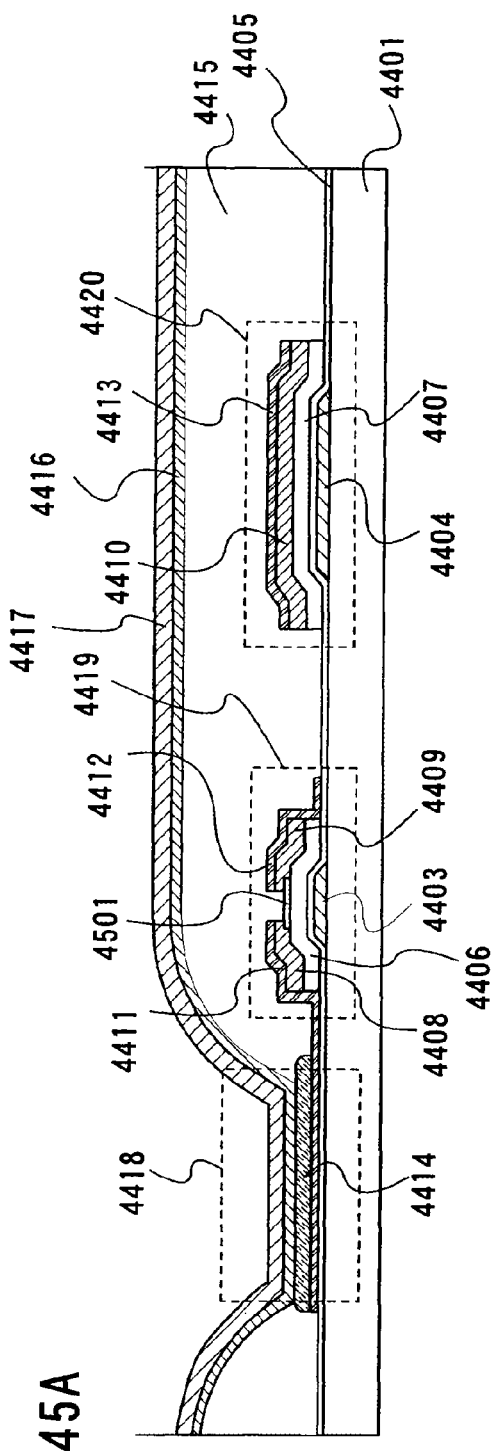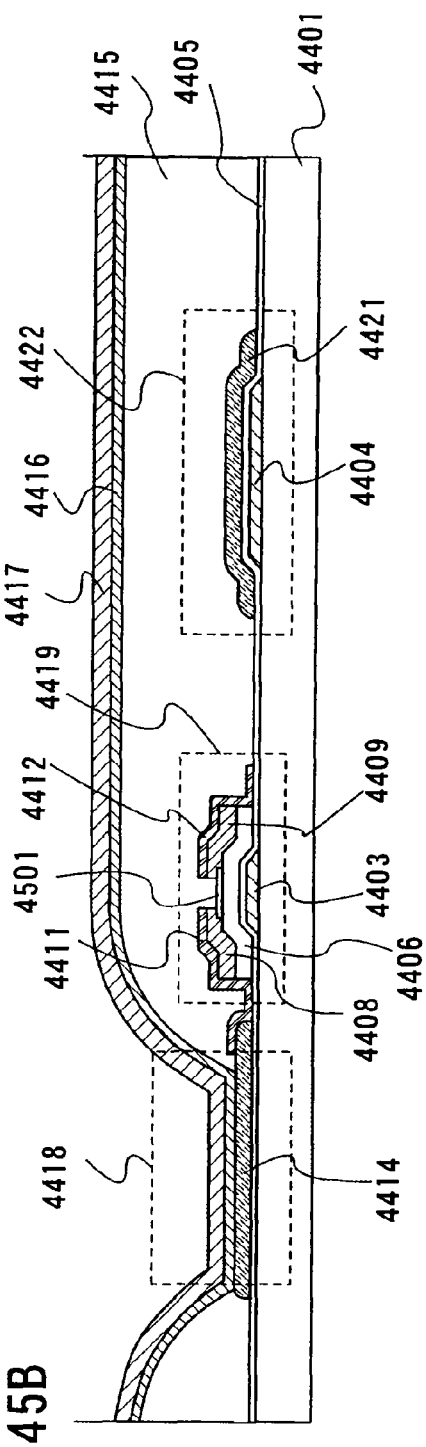
Fig. 45A
Fig. 45B

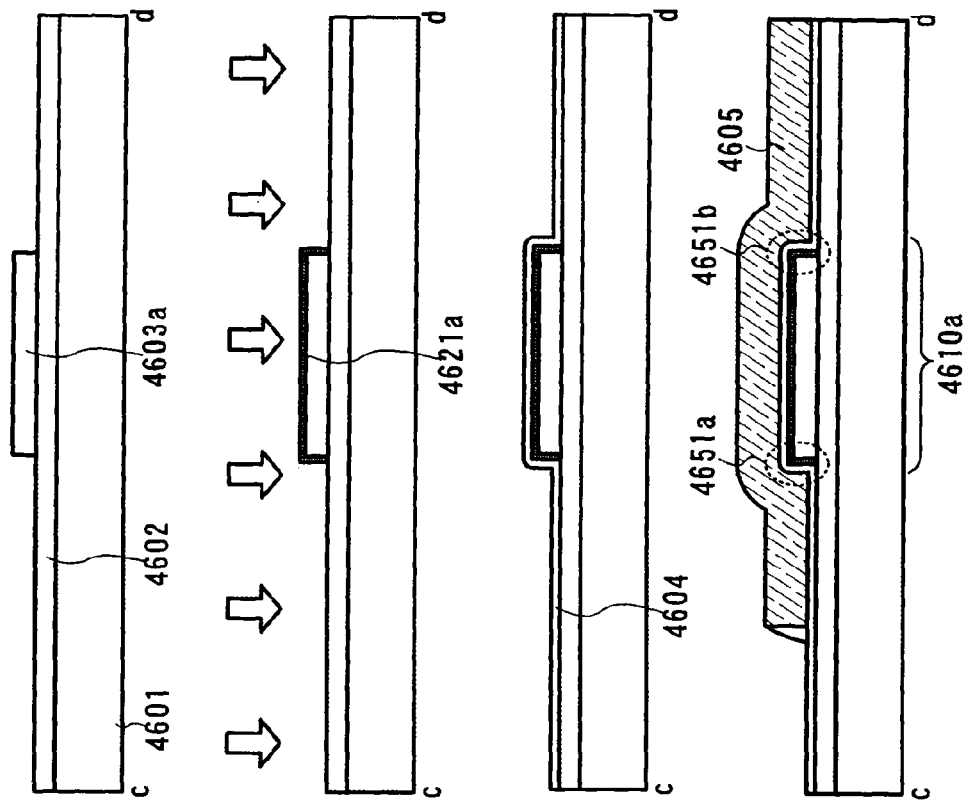
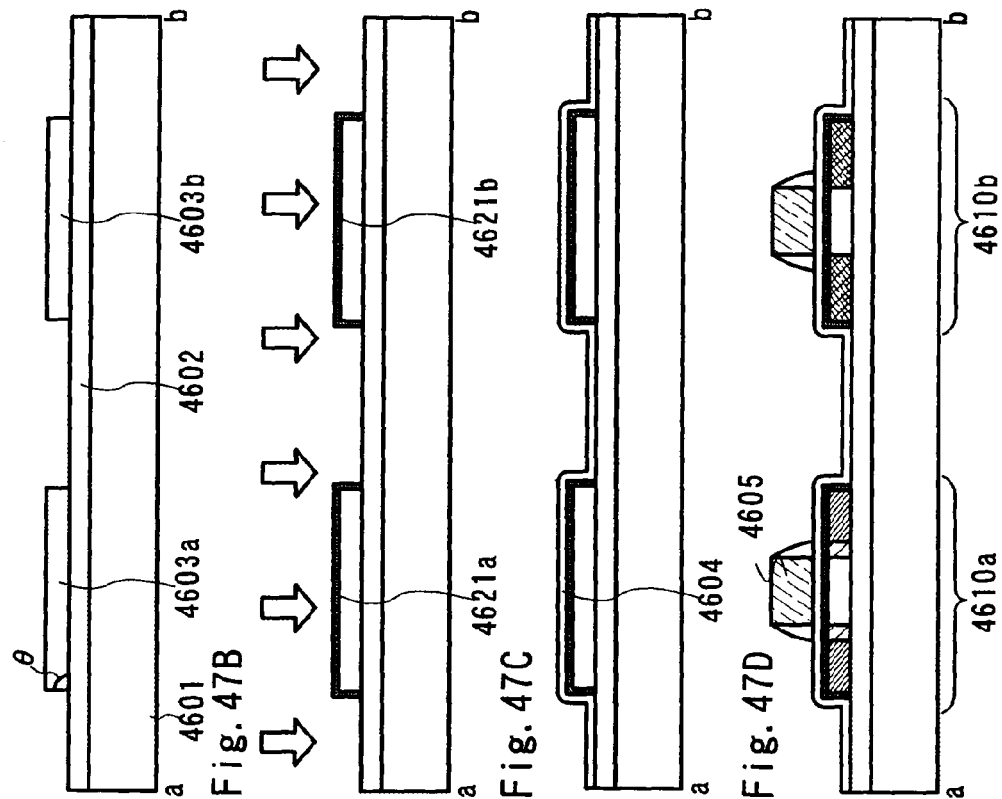
Fig. 47A, Fig. 47B, Fig. 47C, Fig. 47D

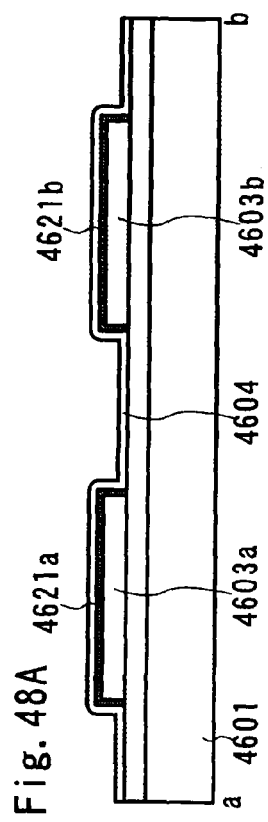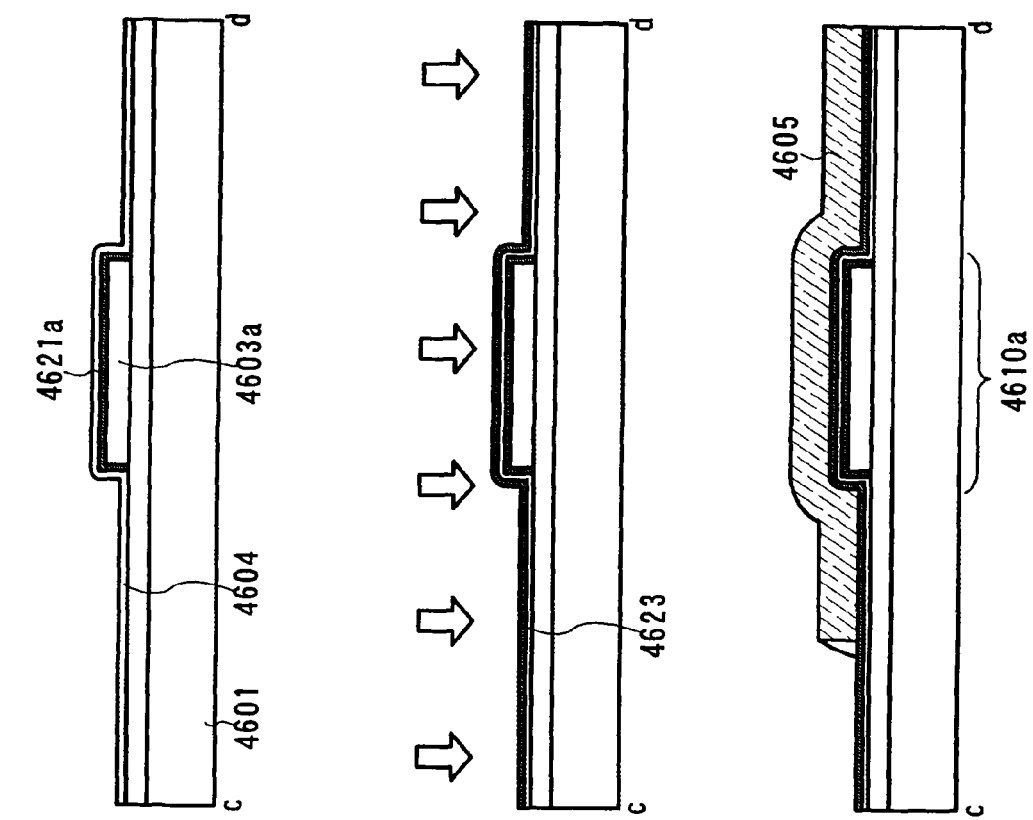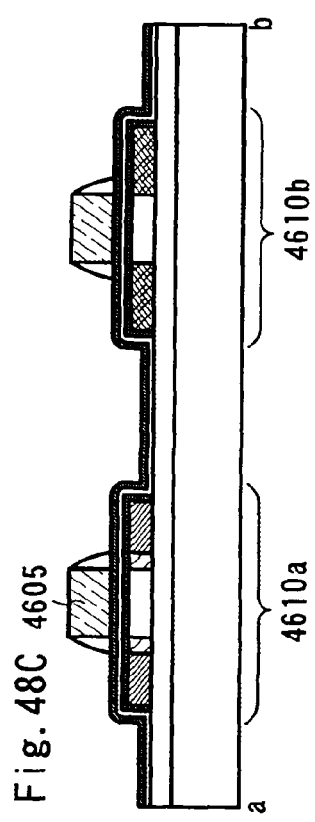

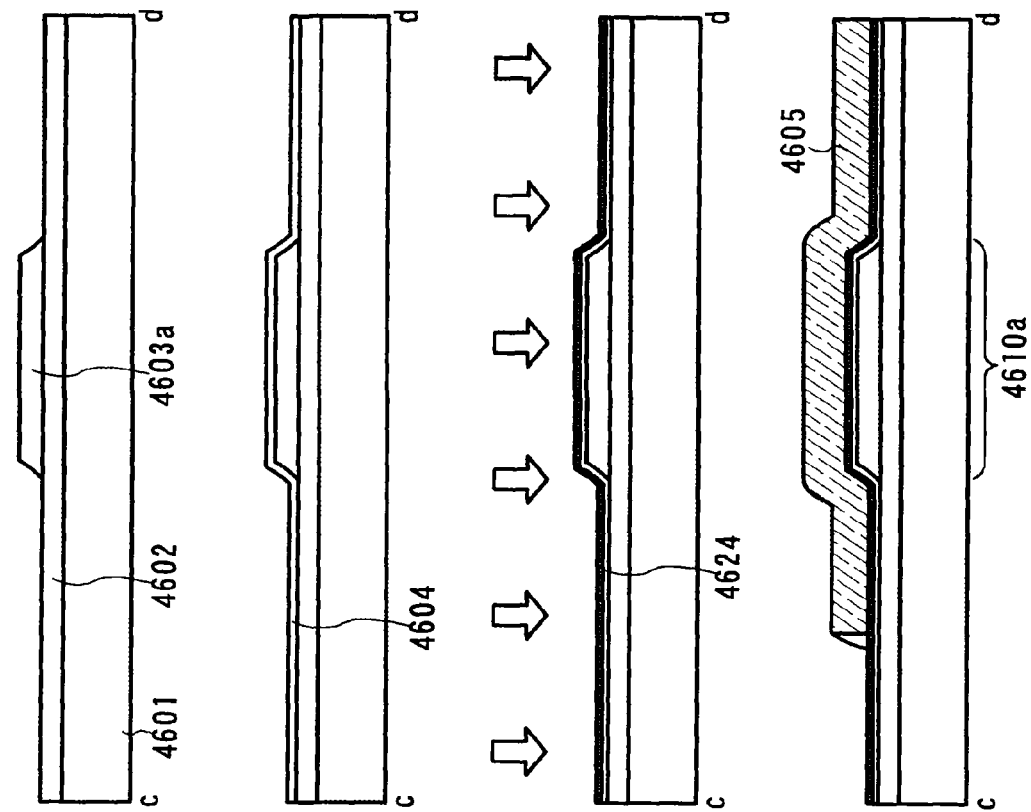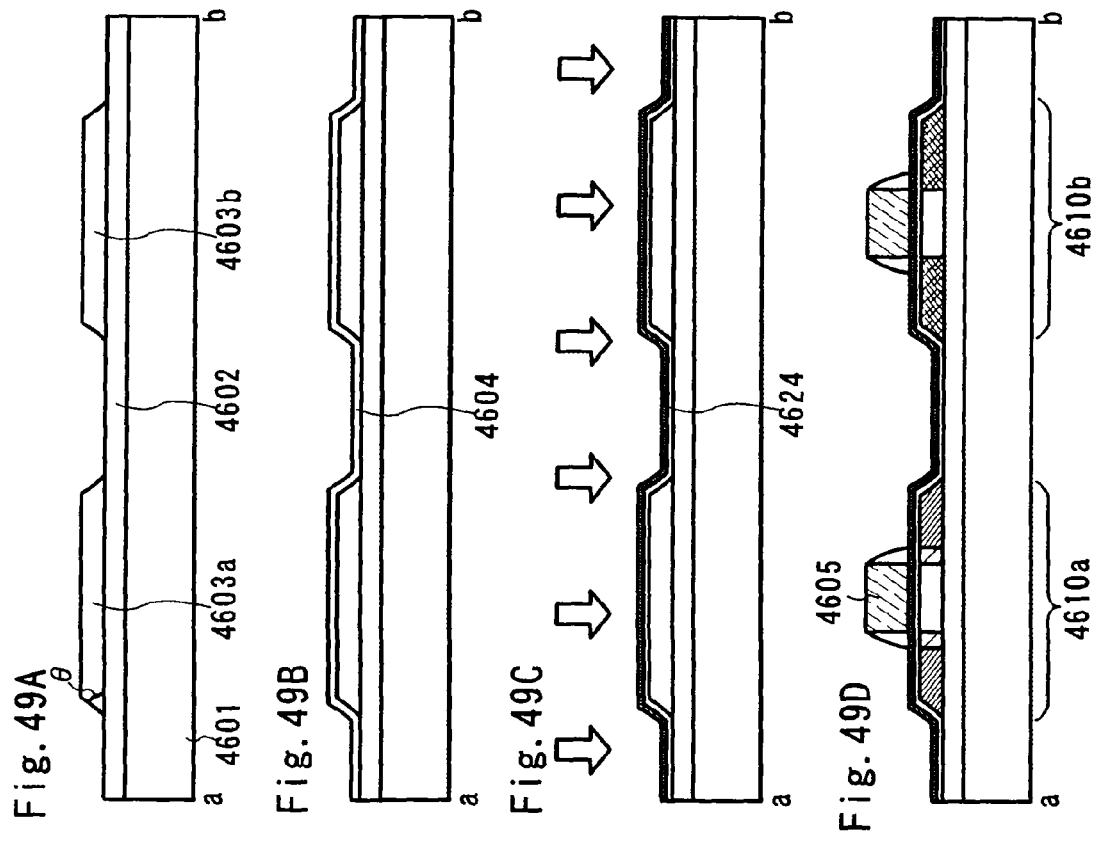

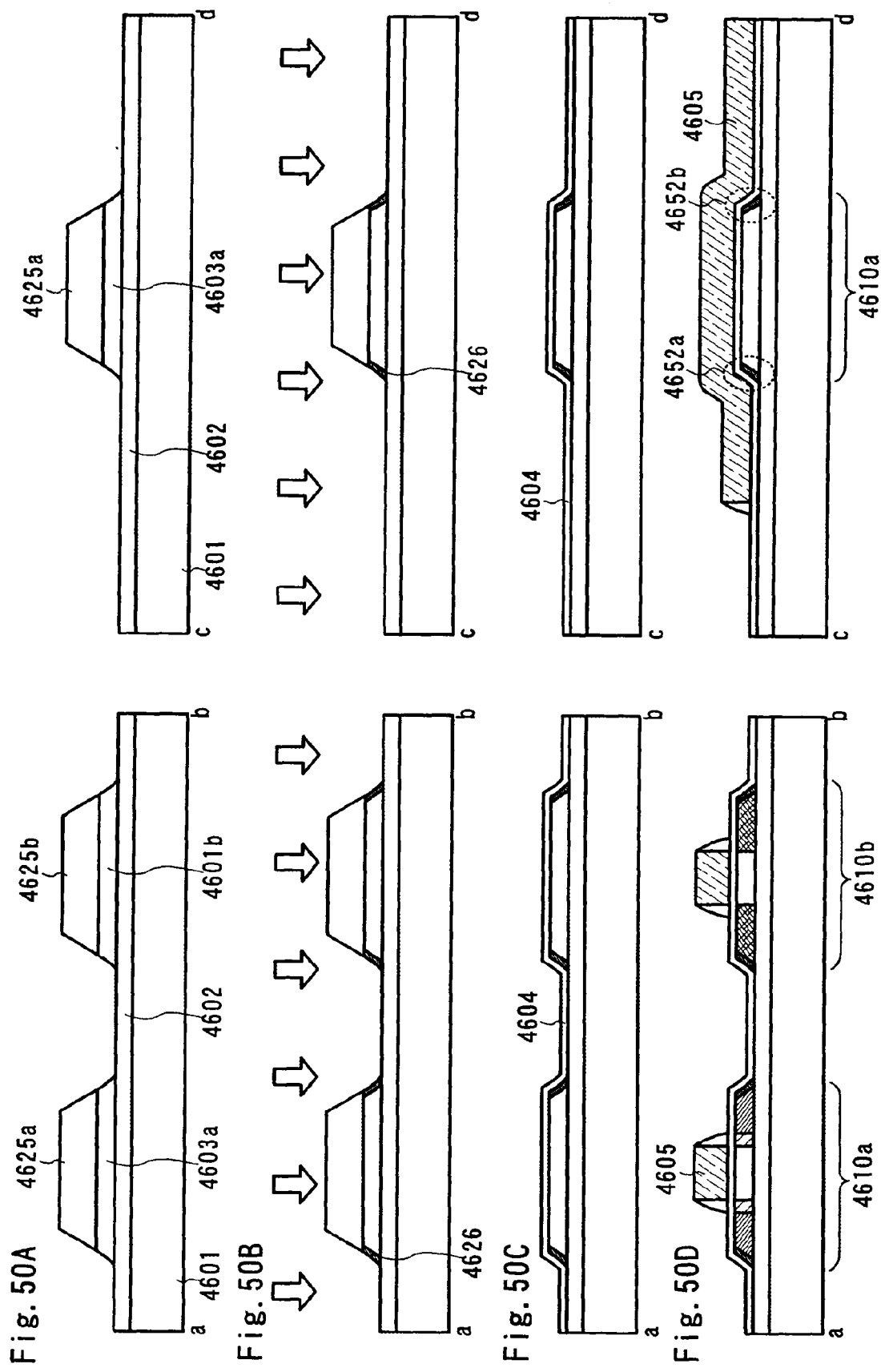

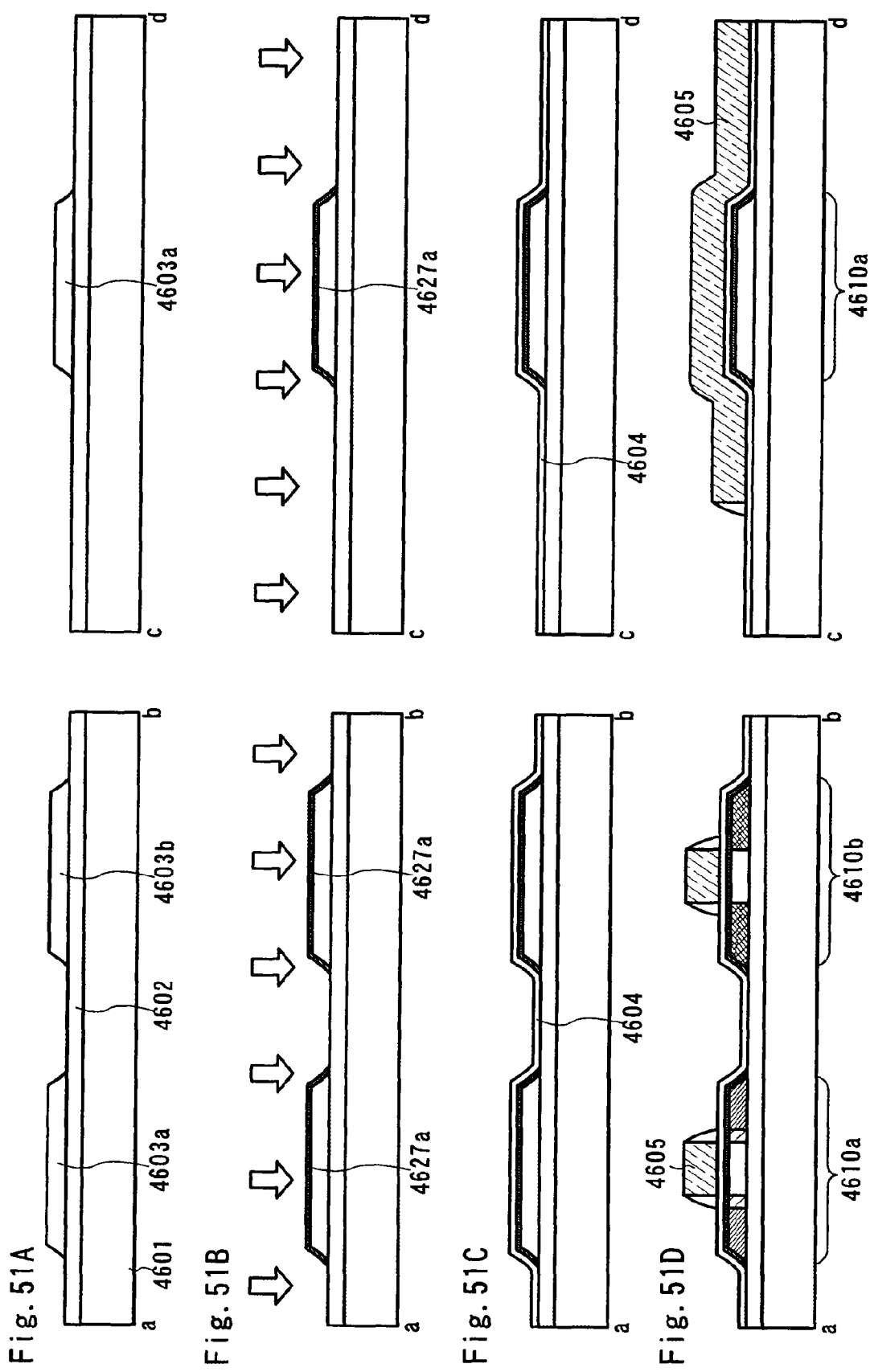

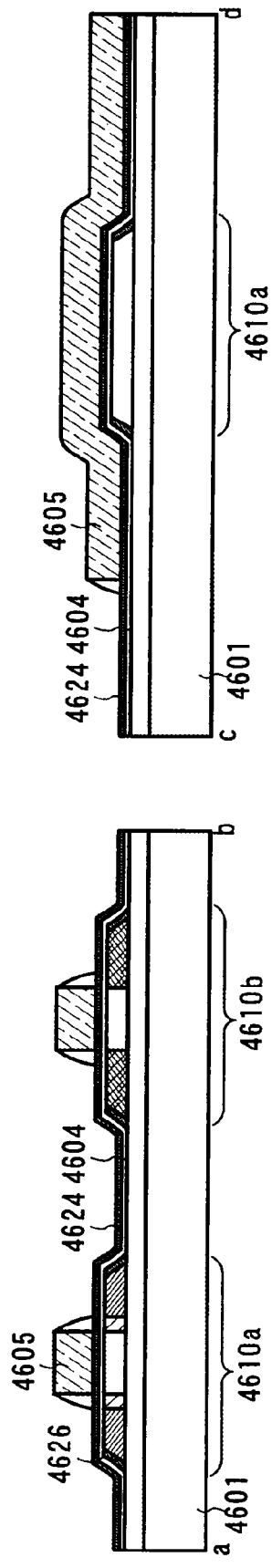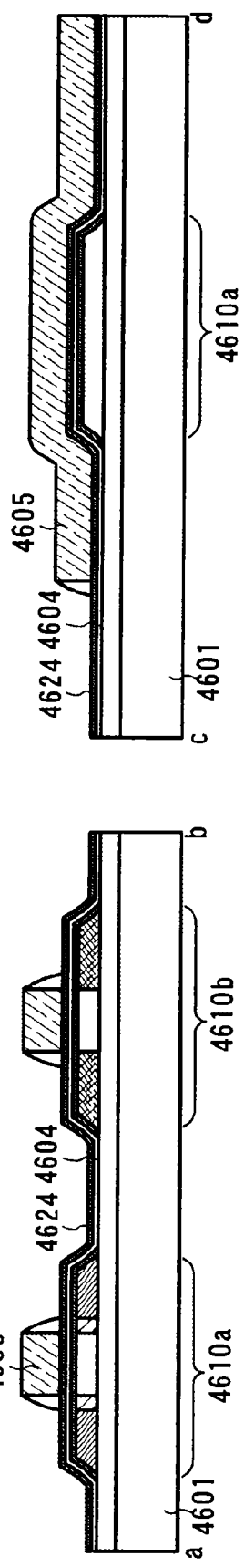

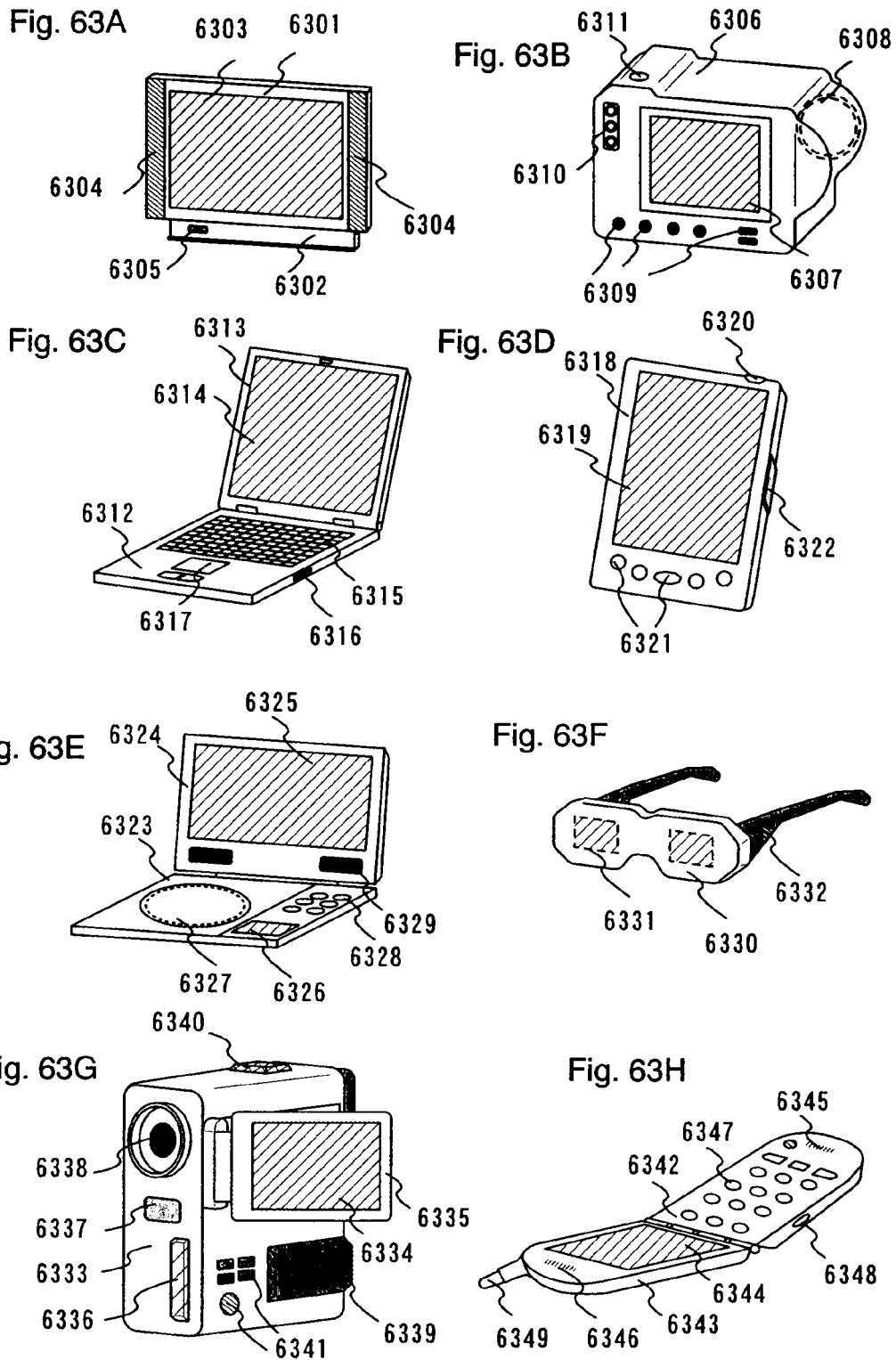

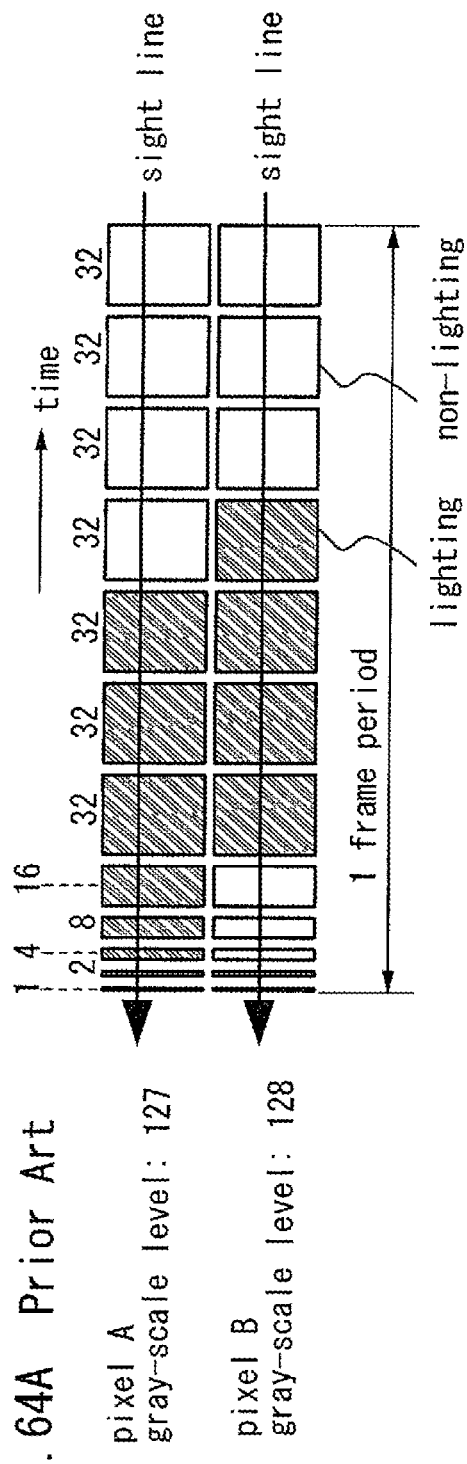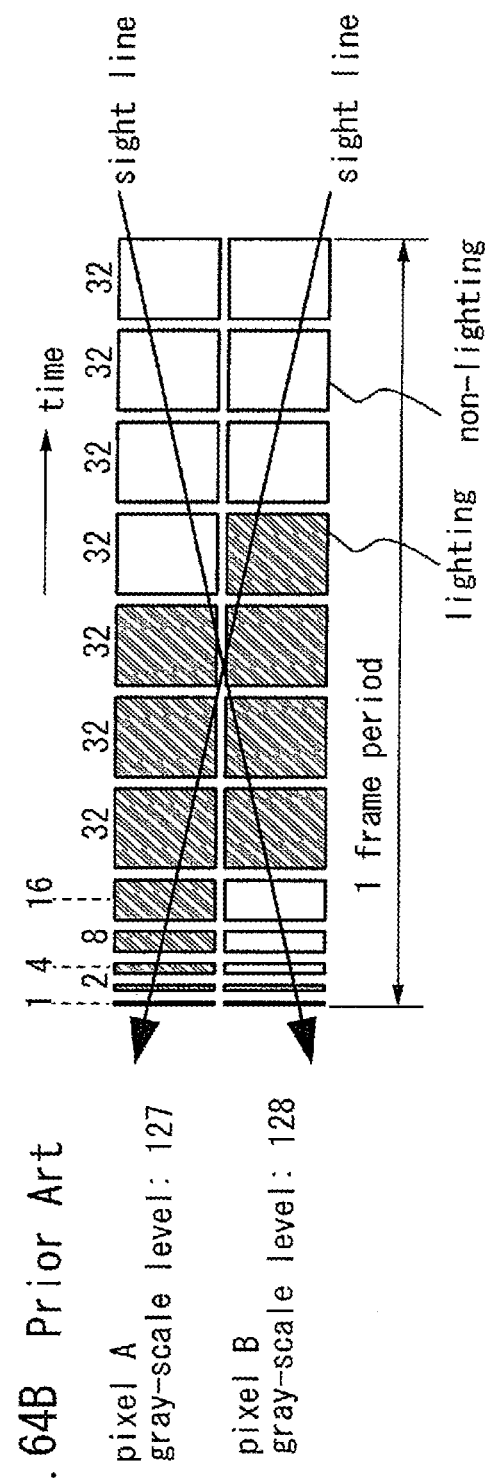

Fig. 66

○ : lighting
× : non-lighting

| | SF1 | | SF2 | | SF3 | | SF4 | | SF5 | |
|---|---|---|---|---|---|---|---|---|---|---|
| | 1 | | 4 | | 16 | | 32 | | 32 | |
| | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| | 1 | 2 | 4 | 8 | 16 | 32 | 32 | 64 | 32 | 64 |
| 64  | × | × | × | × | × | × | ○ | × | ○ | × |
| 65  | ○ | × | × | × | × | × | ○ | × | ○ | × |
| 66  | × | ○ | × | × | × | × | ○ | × | ○ | × |
| 67  | ○ | ○ | × | × | × | × | ○ | × | ○ | × |
| 68  | × | × | ○ | × | × | × | ○ | × | ○ | × |
| 69  | ○ | × | ○ | × | × | × | ○ | × | ○ | × |
| 70  | × | ○ | ○ | × | × | × | ○ | × | ○ | × |
| 71  | ○ | ○ | ○ | × | × | × | ○ | × | ○ | × |
| 72  | × | × | × | ○ | × | × | ○ | × | ○ | × |
| 73  | ○ | × | × | ○ | × | × | ○ | × | ○ | × |
| 74  | × | ○ | × | ○ | × | × | ○ | × | ○ | × |
| 75  | ○ | ○ | × | ○ | × | × | ○ | × | ○ | × |
| 76  | × | × | ○ | ○ | × | × | ○ | × | ○ | × |
| 77  | ○ | × | ○ | ○ | × | × | ○ | × | ○ | × |
| 78  | × | ○ | ○ | ○ | × | × | ○ | × | ○ | × |
| 79  | ○ | ○ | ○ | ○ | × | × | ○ | × | ○ | × |
| 80  | × | × | × | × | ○ | × | ○ | × | ○ | × |
| 81  | ○ | × | × | × | ○ | × | ○ | × | ○ | × |
| 82  | × | ○ | × | × | ○ | × | ○ | × | ○ | × |
| 83  | ○ | ○ | × | × | ○ | × | ○ | × | ○ | × |
| 84  | × | × | ○ | × | ○ | × | ○ | × | ○ | × |
| 85  | ○ | × | ○ | × | ○ | × | ○ | × | ○ | × |
| 86  | × | ○ | ○ | × | ○ | × | ○ | × | ○ | × |
| 87  | ○ | ○ | ○ | × | ○ | × | ○ | × | ○ | × |
| 88  | × | × | × | ○ | ○ | × | ○ | × | ○ | × |
| 89  | ○ | × | × | ○ | ○ | × | ○ | × | ○ | × |
| 90  | × | ○ | × | ○ | ○ | × | ○ | × | ○ | × |
| 91  | ○ | ○ | × | ○ | ○ | × | ○ | × | ○ | × |
| 92  | × | × | ○ | ○ | ○ | × | ○ | × | ○ | × |
| 93  | ○ | × | ○ | ○ | ○ | × | ○ | × | ○ | × |
| 94  | × | ○ | ○ | ○ | ○ | × | ○ | × | ○ | × |
| 95  | ○ | ○ | ○ | ○ | ○ | × | ○ | × | ○ | × |
| 96  | × | × | × | × | × | ○ | ○ | × | ○ | × |
| 97  | ○ | × | × | × | × | ○ | ○ | × | ○ | × |
| 98  | × | ○ | × | × | × | ○ | ○ | × | ○ | × |
| 99  | ○ | ○ | × | × | × | ○ | ○ | × | ○ | × |
| 100 | × | × | ○ | × | × | ○ | ○ | × | ○ | × |
| 101 | ○ | × | ○ | × | × | ○ | ○ | × | ○ | × |
| 102 | × | ○ | ○ | × | × | ○ | ○ | × | ○ | × |
| 103 | ○ | ○ | ○ | × | × | ○ | ○ | × | ○ | × |
| 104 | × | × | × | ○ | × | ○ | ○ | × | ○ | × |
| 105 | ○ | × | × | ○ | × | ○ | ○ | × | ○ | × |
| 106 | × | ○ | × | ○ | × | ○ | ○ | × | ○ | × |
| 107 | ○ | ○ | × | ○ | × | ○ | ○ | × | ○ | × |
| 108 | × | × | ○ | ○ | × | ○ | ○ | × | ○ | × |
| 109 | ○ | × | ○ | ○ | × | ○ | ○ | × | ○ | × |
| 110 | × | ○ | ○ | ○ | × | ○ | ○ | × | ○ | × |
| 111 | ○ | ○ | ○ | ○ | × | ○ | ○ | × | ○ | × |
| 112 | × | × | × | × | ○ | ○ | ○ | × | ○ | × |
| 113 | ○ | × | × | × | ○ | ○ | ○ | × | ○ | × |
| 114 | × | ○ | × | × | ○ | ○ | ○ | × | ○ | × |
| 115 | ○ | ○ | × | × | ○ | ○ | ○ | × | ○ | × |
| 116 | × | × | ○ | × | ○ | ○ | ○ | × | ○ | × |
| 117 | ○ | × | ○ | × | ○ | ○ | ○ | × | ○ | × |
| 118 | × | ○ | ○ | × | ○ | ○ | ○ | × | ○ | × |
| 119 | ○ | ○ | ○ | × | ○ | ○ | ○ | × | ○ | × |
| 120 | × | × | × | ○ | ○ | ○ | ○ | × | ○ | × |
| 121 | ○ | × | × | ○ | ○ | ○ | ○ | × | ○ | × |
| 122 | × | ○ | × | ○ | ○ | ○ | ○ | × | ○ | × |
| 123 | ○ | ○ | × | ○ | ○ | ○ | ○ | × | ○ | × |
| 124 | × | × | ○ | ○ | ○ | ○ | ○ | × | ○ | × |
| 125 | ○ | × | ○ | ○ | ○ | ○ | ○ | × | ○ | × |
| 126 | × | ○ | ○ | ○ | ○ | ○ | ○ | × | ○ | × |
| 127 | ○ | ○ | ○ | ○ | ○ | ○ | ○ | × | ○ | × |

Fig. 67

| | SF1 | | SF2 | | SF3 | | SF4 | | SF5 | |
|---|---|---|---|---|---|---|---|---|---|---|
| | 1 | | 4 | | 16 | | 32 | | 32 | |
| | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| | 1 | 2 | 4 | 8 | 16 | 32 | 32 | 64 | 32 | 64 |
| 128 | × | × | × | × | × | × | × | ○ | × | ○ |
| 129 | ○ | × | × | × | × | × | × | ○ | × | ○ |
| 130 | × | ○ | × | × | × | × | × | ○ | × | ○ |
| 131 | ○ | ○ | × | × | × | × | × | ○ | × | ○ |
| 132 | × | × | ○ | × | × | × | × | ○ | × | ○ |
| 133 | ○ | × | ○ | × | × | × | × | ○ | × | ○ |
| 134 | × | ○ | ○ | × | × | × | × | ○ | × | ○ |
| 135 | ○ | ○ | ○ | × | × | × | × | ○ | × | ○ |
| 136 | × | × | × | ○ | × | × | × | ○ | × | ○ |
| 137 | ○ | × | × | ○ | × | × | × | ○ | × | ○ |
| 138 | × | ○ | × | ○ | × | × | × | ○ | × | ○ |
| 139 | ○ | ○ | × | ○ | × | × | × | ○ | × | ○ |
| 140 | × | × | ○ | ○ | × | × | × | ○ | × | ○ |
| 141 | ○ | × | ○ | ○ | × | × | × | ○ | × | ○ |
| 142 | × | ○ | ○ | ○ | × | × | × | ○ | × | ○ |
| 143 | ○ | ○ | ○ | ○ | × | × | × | ○ | × | ○ |
| 144 | × | × | × | × | ○ | × | × | ○ | × | ○ |
| 145 | ○ | × | × | × | ○ | × | × | ○ | × | ○ |
| 146 | × | ○ | × | × | ○ | × | × | ○ | × | ○ |
| 147 | ○ | ○ | × | × | ○ | × | × | ○ | × | ○ |
| 148 | × | × | ○ | × | ○ | × | × | ○ | × | ○ |
| 149 | ○ | × | ○ | × | ○ | × | × | ○ | × | ○ |
| 150 | × | ○ | ○ | × | ○ | × | × | ○ | × | ○ |
| 151 | ○ | ○ | ○ | × | ○ | × | × | ○ | × | ○ |
| 152 | × | × | × | ○ | ○ | × | × | ○ | × | ○ |
| 153 | ○ | × | × | ○ | ○ | × | × | ○ | × | ○ |
| 154 | × | ○ | × | ○ | ○ | × | × | ○ | × | ○ |
| 155 | ○ | ○ | × | ○ | ○ | × | × | ○ | × | ○ |
| 156 | × | × | ○ | ○ | ○ | × | × | ○ | × | ○ |
| 157 | ○ | × | ○ | ○ | ○ | × | × | ○ | × | ○ |
| 158 | × | ○ | ○ | ○ | ○ | × | × | ○ | × | ○ |
| 159 | ○ | ○ | ○ | ○ | ○ | × | × | ○ | × | ○ |
| 160 | × | × | × | × | × | ○ | × | ○ | × | ○ |
| 161 | ○ | × | × | × | × | ○ | × | ○ | × | ○ |
| 162 | × | ○ | × | × | × | ○ | × | ○ | × | ○ |
| 163 | ○ | ○ | × | × | × | ○ | × | ○ | × | ○ |
| 164 | × | × | ○ | × | × | ○ | × | ○ | × | ○ |
| 165 | ○ | × | ○ | × | × | ○ | × | ○ | × | ○ |
| 166 | × | ○ | ○ | × | × | ○ | × | ○ | × | ○ |
| 167 | ○ | ○ | ○ | × | × | ○ | × | ○ | × | ○ |
| 168 | × | × | × | ○ | × | ○ | × | ○ | × | ○ |
| 169 | ○ | × | × | ○ | × | ○ | × | ○ | × | ○ |
| 170 | × | ○ | × | ○ | × | ○ | × | ○ | × | ○ |
| 171 | ○ | ○ | × | ○ | × | ○ | × | ○ | × | ○ |
| 172 | × | × | ○ | ○ | × | ○ | × | ○ | × | ○ |
| 173 | ○ | × | ○ | ○ | × | ○ | × | ○ | × | ○ |
| 174 | × | ○ | ○ | ○ | × | ○ | × | ○ | × | ○ |
| 175 | ○ | ○ | ○ | ○ | × | ○ | × | ○ | × | ○ |
| 176 | × | × | × | × | ○ | ○ | × | ○ | × | ○ |
| 177 | ○ | × | × | × | ○ | ○ | × | ○ | × | ○ |
| 178 | × | ○ | × | × | ○ | ○ | × | ○ | × | ○ |
| 179 | ○ | ○ | × | × | ○ | ○ | × | ○ | × | ○ |
| 180 | × | × | ○ | × | ○ | ○ | × | ○ | × | ○ |
| 181 | ○ | × | ○ | × | ○ | ○ | × | ○ | × | ○ |
| 182 | × | ○ | ○ | × | ○ | ○ | × | ○ | × | ○ |
| 183 | ○ | ○ | ○ | × | ○ | ○ | × | ○ | × | ○ |
| 184 | × | × | × | ○ | ○ | ○ | × | ○ | × | ○ |
| 185 | ○ | × | × | ○ | ○ | ○ | × | ○ | × | ○ |
| 186 | × | ○ | × | ○ | ○ | ○ | × | ○ | × | ○ |
| 187 | ○ | ○ | × | ○ | ○ | ○ | × | ○ | × | ○ |
| 188 | × | × | ○ | ○ | ○ | ○ | × | ○ | × | ○ |
| 189 | ○ | × | ○ | ○ | ○ | ○ | × | ○ | × | ○ |
| 190 | × | ○ | ○ | ○ | ○ | ○ | × | ○ | × | ○ |
| 191 | ○ | ○ | ○ | ○ | ○ | ○ | × | ○ | × | ○ |

○ : lighting
× : non-lighting

Fig. 68

| | SF1 | | SF2 | | SF3 | | SF4 | | SF5 | |
| | 1 | | 4 | | 16 | | 32 | | 32 | |
| | SP1 | SP2 | SP1 | SP2 | SP1 | SP2 | SP1 | SP2 | SP1 | SP2 |
| | 1 | 2 | 1 | 2 | 1 | 2 | 1 | 2 | 1 | 2 |
| | 1 | 2 | 4 | 8 | 16 | 32 | 32 | 64 | 32 | 64 |
|---|---|---|---|---|---|---|---|---|---|---|
| 192 | × | × | × | × | × | × | ○ | ○ | ○ | ○ |
| 193 | ○ | × | × | × | × | × | ○ | ○ | ○ | ○ |
| 194 | × | ○ | × | × | × | × | ○ | ○ | ○ | ○ |
| 195 | ○ | ○ | × | × | × | × | ○ | ○ | ○ | ○ |
| 196 | × | × | ○ | × | × | × | ○ | ○ | ○ | ○ |
| 197 | ○ | × | ○ | × | × | × | ○ | ○ | ○ | ○ |
| 198 | × | ○ | ○ | × | × | × | ○ | ○ | ○ | ○ |
| 199 | ○ | ○ | ○ | × | × | × | ○ | ○ | ○ | ○ |
| 200 | × | × | × | ○ | × | × | ○ | ○ | ○ | ○ |
| 201 | ○ | × | × | ○ | × | × | ○ | ○ | ○ | ○ |
| 202 | × | ○ | × | ○ | × | × | ○ | ○ | ○ | ○ |
| 203 | ○ | ○ | × | ○ | × | × | ○ | ○ | ○ | ○ |
| 204 | × | × | ○ | ○ | × | × | ○ | ○ | ○ | ○ |
| 205 | ○ | × | ○ | ○ | × | × | ○ | ○ | ○ | ○ |
| 206 | × | ○ | ○ | ○ | × | × | ○ | ○ | ○ | ○ |
| 207 | ○ | ○ | ○ | ○ | × | × | ○ | ○ | ○ | ○ |
| 208 | × | × | × | × | ○ | × | ○ | ○ | ○ | ○ |
| 209 | ○ | × | × | × | ○ | × | ○ | ○ | ○ | ○ |
| 210 | × | ○ | × | × | ○ | × | ○ | ○ | ○ | ○ |
| 211 | ○ | ○ | × | × | ○ | × | ○ | ○ | ○ | ○ |
| 212 | × | × | ○ | × | ○ | × | ○ | ○ | ○ | ○ |
| 213 | ○ | × | ○ | × | ○ | × | ○ | ○ | ○ | ○ |
| 214 | × | ○ | ○ | × | ○ | × | ○ | ○ | ○ | ○ |
| 215 | ○ | ○ | ○ | × | ○ | × | ○ | ○ | ○ | ○ |
| 216 | × | × | × | ○ | ○ | × | ○ | ○ | ○ | ○ |
| 217 | ○ | × | × | ○ | ○ | × | ○ | ○ | ○ | ○ |
| 218 | × | ○ | × | ○ | ○ | × | ○ | ○ | ○ | ○ |
| 219 | ○ | ○ | × | ○ | ○ | × | ○ | ○ | ○ | ○ |
| 220 | × | × | ○ | ○ | ○ | × | ○ | ○ | ○ | ○ |
| 221 | ○ | × | ○ | ○ | ○ | × | ○ | ○ | ○ | ○ |
| 222 | × | ○ | ○ | ○ | ○ | × | ○ | ○ | ○ | ○ |
| 223 | ○ | ○ | ○ | ○ | ○ | × | ○ | ○ | ○ | ○ |
| 224 | × | × | × | × | × | ○ | ○ | ○ | ○ | ○ |
| 225 | ○ | × | × | × | × | ○ | ○ | ○ | ○ | ○ |
| 226 | × | ○ | × | × | × | ○ | ○ | ○ | ○ | ○ |
| 227 | ○ | ○ | × | × | × | ○ | ○ | ○ | ○ | ○ |
| 228 | × | × | ○ | × | × | ○ | ○ | ○ | ○ | ○ |
| 229 | ○ | × | ○ | × | × | ○ | ○ | ○ | ○ | ○ |
| 230 | × | ○ | ○ | × | × | ○ | ○ | ○ | ○ | ○ |
| 231 | ○ | ○ | ○ | × | × | ○ | ○ | ○ | ○ | ○ |
| 232 | × | × | × | ○ | × | ○ | ○ | ○ | ○ | ○ |
| 233 | ○ | × | × | ○ | × | ○ | ○ | ○ | ○ | ○ |
| 234 | × | ○ | × | ○ | × | ○ | ○ | ○ | ○ | ○ |
| 235 | ○ | ○ | × | ○ | × | ○ | ○ | ○ | ○ | ○ |
| 236 | × | × | ○ | ○ | × | ○ | ○ | ○ | ○ | ○ |
| 237 | ○ | × | ○ | ○ | × | ○ | ○ | ○ | ○ | ○ |
| 238 | × | ○ | ○ | ○ | × | ○ | ○ | ○ | ○ | ○ |
| 239 | ○ | ○ | ○ | ○ | × | ○ | ○ | ○ | ○ | ○ |
| 240 | × | × | × | × | ○ | ○ | ○ | ○ | ○ | ○ |
| 241 | ○ | × | × | × | ○ | ○ | ○ | ○ | ○ | ○ |
| 242 | × | ○ | × | × | ○ | ○ | ○ | ○ | ○ | ○ |
| 243 | ○ | ○ | × | × | ○ | ○ | ○ | ○ | ○ | ○ |
| 244 | × | × | ○ | × | ○ | ○ | ○ | ○ | ○ | ○ |
| 245 | ○ | × | ○ | × | ○ | ○ | ○ | ○ | ○ | ○ |
| 246 | × | ○ | ○ | × | ○ | ○ | ○ | ○ | ○ | ○ |
| 247 | ○ | ○ | ○ | × | ○ | ○ | ○ | ○ | ○ | ○ |
| 248 | × | × | × | ○ | ○ | ○ | ○ | ○ | ○ | ○ |
| 249 | ○ | × | × | ○ | ○ | ○ | ○ | ○ | ○ | ○ |
| 250 | × | ○ | × | ○ | ○ | ○ | ○ | ○ | ○ | ○ |
| 251 | ○ | ○ | × | ○ | ○ | ○ | ○ | ○ | ○ | ○ |
| 252 | × | × | ○ | ○ | ○ | ○ | ○ | ○ | ○ | ○ |
| 253 | ○ | × | ○ | ○ | ○ | ○ | ○ | ○ | ○ | ○ |
| 254 | × | ○ | ○ | ○ | ○ | ○ | ○ | ○ | ○ | ○ |
| 255 | ○ | ○ | ○ | ○ | ○ | ○ | ○ | ○ | ○ | ○ |

○ : lighting

× : non-lighting

DISPLAY DEVICE AND DRIVING METHOD OF DISPLAY DEVICE

CROSS-REFERENCE TO RELATED APPLICATIONS

This application is a divisional of U.S. application Ser. No. 11/427,427, filed Jun. 29, 2006, now pending, which claims the benefit of a foreign priority application filed in Japan as Serial No. 2005-194699 on Jul. 4, 2005, both of which are incorporated by reference.

BACKGROUND OF THE INVENTION

1. Field of the Invention

The present invention relates to a display device and a driving method thereof. In particular, the present invention relates to a display device to which an area gray scale method is applied and a driving method thereof.

2. Description of the Related Art

In recent years, a so-called self-luminous type display device having a pixel that is formed of a light-emitting element such as a light-emitting diode (LED) has been attracting attention. As a light-emitting element used for such a self-luminous type display device, an organic light-emitting diode (OLED) (also called an organic EL element, an electro luminescence: EL element, and the like) has been drawing attention and used for an EL display (for example, an organic EL display or the like). Since a light-emitting element such as an OLED is a self-luminous type, it has advantages such as higher visibility of pixels than that of a liquid crystal display, and fast response without requiring a backlight. The luminance of a light-emitting element is controlled by a current value flowing through the light-emitting element.

As a driving method for controlling a light-emitting gray scale of such a display device, there are a digital gray scale method and an analog gray scale method. In accordance with the digital gray scale method, a light-emitting element is turned on/off in a digital manner to express a gray scale. Meanwhile, the analog gray scale method includes a method for controlling the light-emitting intensity of a light-emitting element in an analog manner and a method for controlling the light-emitting time of a light-emitting element in an analog manner.

In the case of the digital gray scale method, there are only two states: a light-emitting state and a non-light-emitting state. Therefore, only two gray scales can be expressed if nothing is done. Accordingly, another method is used in combination to achieve multiple gray scales. An area gray scale method and a time gray scale method are often used as a method for multiple gray scales.

The area gray scale method is a method for expressing a gray scale by controlling an area of a lighting portion. In other words, gray scale display is performed by dividing one pixel into a plurality of sub-pixels and controlling the number or area of lighting sub-pixels (for example, see Reference 1: Japanese Patent Application Laid-Open No. H11-73158 and Reference 2: Japanese Patent Application Laid-Open No. 2001-125526). The number of the sub-pixels cannot be increased; therefore, it is difficult to realize high definition and multiple gray scales. This can be given as a disadvantage of the area gray scale method.

The time gray scale method is a method for expressing a gray scale by controlling the length of a light-emitting period or the frequency of light emission. In other words, one frame is divided into a plurality of sub-frames, each of which is weighted with respect to the number of light emissions and a light-emitting period, and then the total weight (the sum of the frequency of light emission and the sum of the light-emitting time) is differentiated for each gray scale, thereby expressing a gray scale. It is known that display failure such as a pseudo contour (or a false contour) may occur when such a time gray scale method is used and a measures against the failure is considered (for example, see Reference 3: Patent Publication No. 2903984, Reference 4: Patent Publication No. 3075335, Reference 5: Patent Publication No. 2639311, Reference 6: Patent Publication No. 3322809, Reference 7: Japanese Patent Application Laid-Open No. H10-307561, Reference 8: Patent Publication No. 3585369, and Reference 9: Patent Publication No. 3489884).

Although various methods for reducing pseudo contour have been conventionally suggested, a sufficient effect for reducing pseudo contour has not been obtained yet and further improvement has been urged.

For example, it is found that a pseudo contour cannot always be prevented by focusing attention on certain two pixels in accordance with a halftone display method in Reference 4. As a specific example, it is assumed that a gray scale level of 127 is expressed in a pixel A and a gray scale level of 128 is expressed in a pixel B adjacent to the pixel A. A light-emitting state and a non-light-emitting state in each sub-frame of this case are shown in FIGS. 64A to 64B. For example, FIG. 64A shows a case where one sees only the pixel A or the pixel B without turning one's eyes away. A pseudo contour is not caused in this case. This is because the sum is taken with respect to the luminance of the place where one's eyes pass; therefore, one's eyes sense the luminance. Thus, eyes sense the gray scale level of the pixel A to be 127 (=1+2+4+8+16+32+32+32), and eyes sense the gray scale level of the pixel B to be 128 (=32+32+32+32). In other words, eyes sense an accurate gray scale.

On the other hand, FIG. 64B shows a case where eyes move from the pixel A to the pixel B or from the pixel B to the pixel A. In this case, eyes sometimes sense the gray scale level to be 96 (=32+32+32), and sometimes sense the gray scale level to be 159 (=1+2+4+8+16+32+32+32+32) in accordance with eyes' movement. Although the eyes are expected to sense the gray scale levels to be 127 and 128, they sense the gray scale levels to be 96 or 159. Consequently, a pseudo contour is caused.

FIGS. 64A to 64B show a case of 8-bit gray scales (256 gray scales). Next, FIG. 65 shows a case of 4-bit gray scales (16 gray scales). In this case also, eyes sometimes sense the gray scale level to be 4 (=4), and sometimes sense the gray scale level to be 11 (=1+2+4+4) in accordance with eyes' movement. Although the eyes are expected to sense gray scale levels to be 7 and 8, they sense the gray scale levels to be 4 or 11. Consequently, a pseudo contour is caused.

SUMMARY OF THE INVENTION

In view of such problems, it is an object of the present invention to provide a display device composed of few sub-frames and that can reduce a pseudo contour, where multiple gray scales are possible as well, and a driving method using the display device.

According to one aspect of the present invention, a method for driving a display device, where a pixel including m (m is an integer number of m≥2) sub-pixels provided with a light-emitting element is arranged in a plurality of pieces, includes the steps of having an area ratio of the m sub-pixels $2^0:2^1:2^2: \ldots :2^{m-3}:2^{m-2}:2^{m-1}$; dividing one frame into n (n is an integer number of n≥2) sub-frames in each of the m sub-pixels; and having a ratio in a length of a lighting period of the n sub-frames $2^0:2^m:2^{2m}: \ldots :2^{(n-3)m}:2^{(n-2)m}:2^{(n-1)m}$, where a gray scale of the pixel is expressed by controlling the sum of a lighting period of the sub-frame when the m sub-pixels are in a lighting state, in each of the n sub-frames.

Here, it is also possible to select dividing at least one sub-frame of the n sub-frames into two sub-frames each having a lighting period that is half the length of the sub-frame. In addition, the sub-frame further dividing the lighting period may be a sub-frame having a longest lighting period in the n sub-frames. Moreover, the n sub-frames may be arranged in an ascending order or a descending order.

According to the present invention, a kind of transistor that can be applied is not limited. Therefore, a thin film transistor (TFT) using a non-single crystalline semiconductor film typified by amorphous silicon or polycrystalline silicon, a MOS transistor which is formed using a semiconductor substrate or an SOI substrate, a junction transistor, a bipolar transistor, a transistor using an organic semiconductor or a carbon nanotube, a transistor using a compound semiconductor such as ZnO, a-InGaZnO, SiGe, or GaAs, or other transistors can be applied. In addition, a kind of substrate where a transistor is disposed is not limited; therefore, a transistor can be disposed over a single-crystalline substrate, an SOI substrate, a glass substrate, or a plastic substrate.

In this specification, "being connected" is synonymous with being electrically connected. Therefore, in a structure disclosed by the present invention, in addition to a predetermined connection relation, other elements that enable electrical connection therebetween (for example, another element or switch) may also be disposed.

Note that, as for a switch shown in the present invention, switches of various modes can be used. As an example, there is an electrical switch, a mechanical switch, or the like. In other words, the switches are not particularly limited as long as current flow can be controlled and various switches can be used. For example, the switches may be a transistor, a diode (a PN diode, a PIN diode, a Schottky diode, a transistor connected as a diode, or the like) or a logic circuit that is a combination thereof. Thus, in a case of using a transistor as the switch, the transistor operates as a mere switch; therefore, the polarity (conductivity type) of the transistor is not particularly limited. However, in a case where lower off-current is desired, it is desirable to use a transistor having a polarity with lower off-current. As the transistor with low off-current, a transistor provided with an LDD region, a transistor having a multi-gate structure, or the like can be used. In addition, it is desirable to use an N-channel transistor when a transistor to be operated as a switch operates in a state where potential of a source terminal thereof is close to a lower potential side power supply (such as Vss, GND, or 0 V), whereas it is desirable to use a P-channel transistor when a transistor operates in a state where potential of a source terminal thereof is close to a higher potential side power supply (such as Vdd). This is because the absolute value of a gate-source voltage can be increased, and the transistor easily operates as a switch. Note that the switch may be of a CMOS type using both the N-channel transistor and the P-channel transistor. When the CMOS-type switch is employed, voltage outputted through the switch (that is, voltage inputted into the switch) may be high or low with respect to the outputted voltage and the switch can be operated appropriately even when the situation is changed.

Note that, according to the present invention, a semiconductor device refers to a device having a circuit including a semiconductor element (a transistor, a diode, or the like). In addition, a semiconductor device may also refer to devices in general that can function by utilizing semiconductor characteristics. Moreover, a display device refers to a device having a display element (a liquid crystal element, a light-emitting element, or the like). Note that a display device may also refer to a display panel body where a plurality of pixels, including a display element such as a liquid crystal element or an EL element, or a peripheral driver circuit for driving these pixels is formed over a substrate. Further, a display device may also include one with a flexible printed circuit (FPC) or a printed wiring board (PWB).

Note that, in this specification, a gate refers to the whole of a gate electrode and a gate wiring (also referred to as a gate line, a gate signal line, or the like), or part thereof. The gate electrode refers to a semiconductor to form a channel region, an LDD (Lightly Doped Drain) region, or the like, and a portion of a conductive film which is overlapped through a gate insulating film. The gate wiring refers to a wiring to connect between gate electrodes of each pixel or to connect to a wiring different from the gate electrode.

However, there is a portion that serves as a gate electrode and a gate wiring. Such a region may be referred to as a gate electrode or a gate wiring. In other words, there is a region where a gate electrode and a gate wiring cannot be distinguished apparently. For example, when there is a channel region to overlap with a gate wiring that is arranged by being extended, the region serves as a gate wiring as well as a gate electrode. Thus, such a region may be referred to as a gate electrode or a gate wiring.

In addition, a region formed from the same material as the gate electrode and connected to the gate electrode may also be referred to as a gate electrode. In the same manner, a region formed from the same material as the gate wiring and connected to the gate wiring may also be referred to as a gate wiring. In such a region, in a strict sense, there is a case where the region is not overlapped with a channel region or a function to connect to another gate electrode is lacked. However, with relation to a manufacturing margin or the like, there is a region formed from the same material as the gate electrode or the gate wiring and connected to the gate electrode or the gate wiring. Thus, such a region may also be referred to as a gate electrode or a gate wiring.

Moreover, for example, a gate electrode of one transistor and a gate electrode of another transistor in a multi-gate transistor are connected to a conductive film formed from the same material as the gate electrode in many cases. Since such a region is a region to connect the gate electrode and the gate electrode to each other, the region may also be referred to as a gate wiring; however, since the multi-gate transistor can be regarded as one transistor, the multi-gate transistor may also be referred to as a gate electrode. In other words, those formed from the same material as the gate electrode or the gate wiring and arranged by being connected thereto may also be referred to as a gate electrode or a gate wiring. Further, for example, a portion of a conductive film which is connected to the gate electrode or the gate wiring may also be referred to as a gate electrode or a gate wiring.

Note that a gate terminal refers to part of a region of a gate electrode or a region electrically connected to the gate electrode.

Note that a source refers to the whole of a source region, a source electrode, and a source wiring (also referred to as a source line, a source signal line, or the like), or part thereof.

The source region refers to a semiconductor region where a P-type impurity (boron or gallium) or an N-type impurity (phosphorus or arsenic) is contained much. Therefore, the source region does not include a region where a P-type impurity or an N-type impurity is slightly contained, that is, a so-called an LDD (Lightly Doped Drain) region. The source electrode is formed from a material different from the source region, which refers to a portion of a conductive layer which is arranged by being electrically connected to the source region. However, the source electrode may include the source region to be referred to as a source electrode. The source wiring refers to a wiring to connect between source electrodes of each pixel or to connect a wiring different from the source electrode.

However, there is a portion that serves as a source electrode and a source wiring. Such a region may be referred to as a source electrode or a source wiring. In other words, there is a region where a source electrode and a source wiring cannot be distinguished apparently. For example, when there is a source region to overlap with a source wiring that is arranged by being extended, the region serves as a source wiring as well as a source electrode. Thus, such a region may be referred to as a source electrode or a source wiring.

In addition, a region formed from the same material as the source electrode and connected to the source electrode or a portion to connect a source electrode and a source electrode to each other may also be referred to as a source electrode. In addition, a portion overlapped with a source region may also be referred to as a source electrode. In the same manner, a region formed from the same material as the source wiring and connected to the source wiring may also be referred to as a source wiring. In such a region, in a strict sense, there is a case where a function to connect to another gate electrode is lacked. However, with relation to a manufacturing margin or the like, there is a region formed from the same material as the source electrode or the source wiring and connected to the source electrode or a source wiring. Thus, such a region may also be referred to as a source electrode or a source wiring.

Moreover, for example, a portion of a conductive film where the source electrode and the source wiring are connected may also referred to as a source wiring.

Note that a source terminal refers to part of a source region, a source electrode, or a region electrically connected to the source electrode.

Note that a drain is the same as the source.

Note that it is structurally difficult to distinguish between a source and a drain of a transistor. Further, there is also a case where potential levels may be interchanged depending on a circuit operation. Therefore, in this specification, the source and the drain are not specified in particular, which are referred to as a first electrode and a second electrode. For example, when the first electrode is a source, the second electrode refers to a drain, whereas, when the first electrode is a drain, the second electrode refers to a source.

Note that, according to the present invention, the description of "being formed over a certain object" does not necessarily refer to "being in direct contact with the certain object." This includes a case where there is no direct contact, that is, a case where another object is sandwiched therebetween. Therefore, for example, a case where a layer B is formed over a layer A includes a case where the layer B is formed on the layer A to be in direct contact therewith and a case where another layer (for example, a layer C, a layer D, or the like) is formed on the layer A to be in direct contact therewith and the layer B is formed thereon to be in direct contact therewith. In addition, the same can also be said for the description of "above a certain object," which does not necessarily refer to "being in direct contact with the certain object," and a case where another object is sandwiched therebetween is included. Therefore, for example, a case where a layer B is formed above a layer A includes a case where the layer B is formed on the layer A to be in direct contact therewith and a case where another layer (for example, a layer C, a layer D, or the like) is formed on the layer A to be in direct contact therewith and the layer B is formed thereon to be in direct contact therewith. Note that the same can also be said for the description of "under a certain object" or "below a certain object," which includes a case where there is direct contact and there is no direct contact.

Note that, according to the present invention, one pixel shows one color element. Therefore, in a case of a color display device including color elements of R (red), G (green), and B (blue), a minimum unit of an image includes three pixels of R, G, and B. Note that the color element is not limited to three colors and three or more colors may be used, or a color other than RGB may also be used. For example, RGBW may be employed by adding white (W). In addition, RGB may be added with one or more of yellow, cyan, magenta, and the like, for example. Moreover, for example, as for at least one color of RGB, a similar color may be added. For example, R, G, B1, and B2 may be used. Both B1 and B2 are blue but have a different wavelength. By using such a color element, it is possible to perform display that is much similar to the real and to reduce power consumption.

Note that, according to the present invention, a pixel includes a case where pixels are arranged in matrix. Herein, "pixels are arranged in matrix" includes a case of a so-called lattice arrangement in which a perpendicular stripe and a horizontal stripe are combined with each other, a case where dots of three color elements have a so-called delta arrangement when full color display is performed using three color elements (for example, R, G, and B), and further a case of Bayer arrangement.

Note that, in this specification, a light-emitting element will be explained by giving an organic EL element as an example. However, the content of the present invention can also be applied to other than a display device using an organic EL element. For example, the present invention can be applied to a display device using a display medium in which contrast varies by an electromagnetic action, such as an EL element (such as an organic EL element, an inorganic EL element, or an EL element containing an organic material and an inorganic material), an electron-emitting element, a liquid crystal element, electronic ink, a grating light valve (GLV), a plasma display (PDP), a digital micromirror device (DMD), a piezoelectric element, or a carbon nanotube. Note that an EL display is used as a display device using the EL element, a field emission display (FED), an SED (Surface-conduction Electron-emitter Display) type flat display, or the like is used as a display device using the electron-emitting element, a liquid crystal display, a transmissive liquid crystal display, a semi-transmissive liquid crystal display, or a reflective liquid crystal display is used as a display device using the liquid crystal element, and an electronic paper is used as a display device using the electronic ink.

According to the present invention, it is possible to reduce a pseudo contour and to perform multiple gray scales as well by combining an area gray scale method and a time gray scale method. Therefore, it becomes possible to improve display quality and to view a clear image. In addition, it is possible to improve a duty ratio (a ratio of a lighting period per one frame), and voltage applied to a light-emitting element is reduced. Thus, power consumption can be reduced, and deterioration of the light-emitting element can be suppressed.

BRIEF DESCRIPTION OF DRAWINGS

In the accompanying drawings:

FIG. 1 is a view showing one example of a selection method of a sub-frame and a sub-pixel by a driving method according to the present invention;

FIG. 6 is a view showing a cause that a pseudo contour is decreased in a driving method according to the present invention;

FIG. 7 is a view showing one example of a selection method of a sub-frame and a sub-pixel by a driving method according to the present invention;

FIG. 9 is a view showing one example of a selection method of a sub-frame and a sub-pixel by a driving method according to the present invention;

FIG. 10 is a view showing a cause that a pseudo contour is decreased in a driving method according to the present invention;

FIG. 11 is a view showing one example of a selection method of a sub-frame and a sub-pixel by a driving method according to the present invention;

FIG. 13 is a view showing one example of a selection method of a sub-frame and a sub-pixel by a driving method according to the present invention;

FIG. 15 is a view showing one example of a selection method of a sub-frame and a sub-pixel by a driving method according to the present invention;

FIG. 17 is a view showing one example of a selection method of a sub-frame and a sub-pixel by a driving method according to the present invention;

FIG. 19 is a view showing one example of a selection method of a sub-frame and a sub-pixel by a driving method according to the present invention;

FIG. 20 is a view showing one example of a selection method of a sub-frame and a sub-pixel in a case of performing gamma correction by a driving method according to the present invention;

FIG. 22 is a view showing one example of a selection method of a sub-frame and a sub-pixel in a case of performing gamma correction by a driving method according to the present invention;

FIGS. 40A to 40C are diagrams each showing one example of a display device using a driving method according to the present invention;

FIGS. 43A and 43B are views each showing a cross-sectional structure of a transistor used for a display device according to the present invention;

FIGS. 44A and 44B are views each showing a cross-sectional structure of a transistor used for a display device according to the present invention;

FIGS. 45A and 45B are views each showing a cross-sectional structure of a transistor used for a display device according to the present invention;

FIGS. 47A to 47D are views explaining a manufacturing method of a transistor used for a display device according to the present invention;

FIGS. 48A to 48C are views explaining a manufacturing method of a transistor used for a display device according to the present invention;

FIGS. 49A to 49D are views explaining a manufacturing method of a transistor used for a display device according to the present invention;

FIGS. 50A to 50D are views explaining a manufacturing method of a transistor used for a display device according to the present invention;

FIGS. 51A to 51 D are views explaining a manufacturing method of a transistor used for a display device according to the present invention;

FIGS. 52A and 52B are views explaining a manufacturing method of a transistor used for a display device according to the present invention;

FIGS. 63A to 63H are views each showing one example of an electronic device to which a driving method according to the present invention is applied;

FIGS. 64A and 64B are diagrams each showing a cause that a pseudo contour is caused in a conventional driving method;

FIG. 66 is a view showing one example of a selection method of a sub-frame and a sub-pixel by a driving method according to the present invention;

FIG. 67 is a view showing one example of a selection method of a sub-frame and a sub-pixel by a driving method according to the present invention;

FIG. 68 is a view showing one example of a selection method of a sub-frame and a sub-pixel by a driving method according to the present invention;

DETAILED DESCRIPTION OF THE INVENTION

Figure 2:
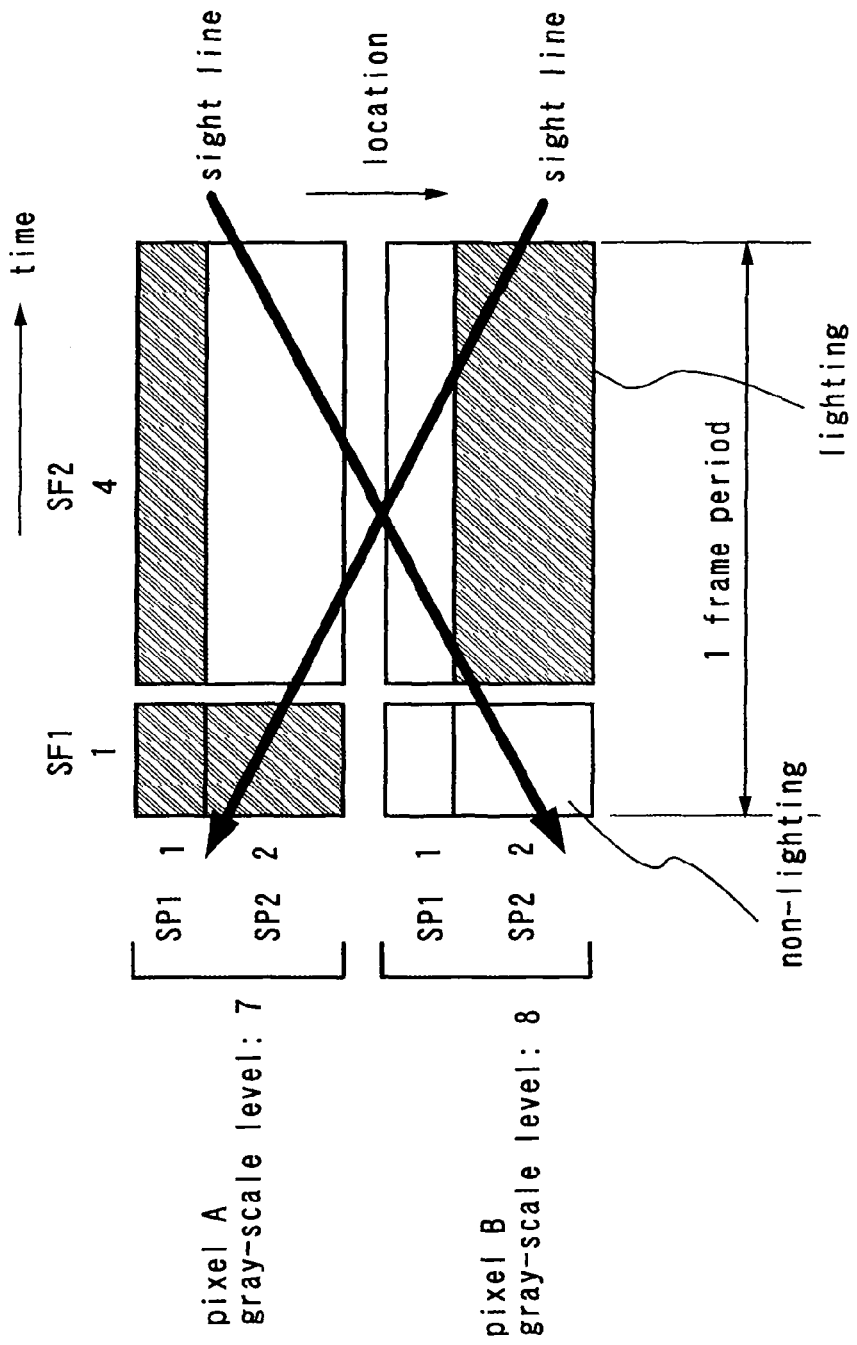
FIG. 2 is a view showing a cause that a pseudo contour is decreased in a driving method according to the present invention.

Embodiment modes of the present invention will be explained below with reference to the drawings. However, it is to be easily understood that various changes and modifications will be apparent to those skilled in the art. Therefore, unless such changes and modifications depart from the scope of the present invention, they should be construed as being included therein.

(Embodiment Mode 1)

This embodiment mode will explain an example of applying a driving method of the present invention to a case of 4-bit display (16 gray scales) and a case of 6-bit display (64 gray scales).

The driving method of this embodiment mode is combined with an area gray scale method by which gray scale display is performed by dividing one pixel into a plurality of sub-pixels and controlling the number or area of lighting sub-pixels and a time gray scale method by which gray scale display is performed by dividing one frame into a plurality of sub-frames, each of which is weighted with respect to the number of light emissions and a light-emitting period, and then the total weight is differentiated for each gray scale. In other words, one pixel is divided into m (m is an integer number of m≥2) of sub-pixels to have an area ratio of the m sub-pixels $2^0:2^1:2^2: \ldots :2^{m-3}:2^{m-2}:2^{m-1}$. In addition, one frame is divided into n (n is an integer number of n≥2) of sub-frames to have a ratio in a length of a lighting period of the n sub-frames $2^0:2^m:2^{2m}: \ldots :2^{(n-3)m}:2^{(n-2)m}:2^{(n-1)m}$. Then, gray scale is expressed by controlling a manner of lighting in each of the m sub-pixels in each of the n sub-frames.

First, a case of 4-bit gray scales (16 gray scales) is considered. Initially, a display method of each gray scale, that is, how each sub-pixel is lighted in each sub-frame corresponded a gray scale will be explained. This embodiment mode will be explained by giving, as an example, a case where one pixel is divided into two sub-pixels (SP1 and SP2) so that an area ratio of each sub-pixel becomes 1:2 and one frame is divided into two sub-frames (SF1 and SF2) so that a ratio of a lighting period in each sub-frame becomes 1:4. Note that m corresponds to 2 and n corresponds to 2 in this example.

Here, FIG. 1 shows a display method of each gray scale in a case where the sub-pixels respectively have the following area: SP1=1 and SP2=2, and the sub-frames respectively have the following lighting periods: SF1=1 and SF2=4. Note that, as a way to see FIG. 1, FIG. 1 shows that the sub-pixels, which are lighted in each sub-frame, are indicated by ○ marks whereas the sub-pixels, which are not lighted in each sub-frame, are indicated by x marks.

In this embodiment mode, it is considered that a product of an area of each sub-pixel and a lighting period of each sub-frame is substantial light-emitting intensity. For example, in a case where only the sub-pixel 1 (SP1) is lighted in the sub-frame 1 (SF1), the area of the sub-pixel 1 is 1; therefore, the light-emitting intensity becomes 1. In addition, in a case where only the sub-pixel 2 (SP2) is lighted, the area of the sub-pixel 2 is 2; therefore, the light-emitting intensity becomes 2. On the other hand, in a case where only the sub-pixel 1 is lighted in the sub-frame 2 (SF2), the area of the sub-pixel 1 is 1; however, the lighting period of the sub-frame 2 is four times as long as that of the sub-frame 1; therefore, the light-emitting intensity becomes 4. In addition, in a case where only the sub-pixel 2 is lighted, the area of the sub-pixel 2 is 2; however, the lighting period of the sub-frame 2 is four times as long as that of the sub-frame 1; therefore, the light-emitting intensity becomes 8. Accordingly, with a combination of an area of the sub-pixels and a lighting period of the sub-frames, different light-emitting intensity can be made, with which the gray scale is displayed.

For example, in a case of displaying a gray scale level of 1, the sub-pixel 1 is lighted in the sub-frame 1. In a case of displaying a gray scale level of 2, the sub-pixel 2 is lighted in the sub-frame 1. In a case of displaying a gray scale level of 3, the sub-pixels 1 and 2 are lighted in the sub-frame 1. In a case of displaying a gray scale level of 6, the sub-pixel 2 is lighted in the sub-frame 1 and the sub-pixel 1 is lighted in the sub-frame 2. Each sub-pixel that is lighted in each sub-frame is selected as well as for the other gray scale levels.

As described above, it is possible to display the 4-bit gray scales (16 gray scales) by selecting the sub-pixel that is lighted in each sub-frame.

With the driving method of this embodiment mode, pseudo contour can be reduced. For example, it is assumed that a gray-scale level of 7 is displayed in a pixel A while a gray-scale level of 8 is displayed in a pixel B in FIG. 2, which shows the lighting/non-lighting states of each sub-pixel in each sub-frame of this case. Here, for example, if the sight line moves, human eyes perceive that the gray-scale level is 8 (=8) or 10 (=2+8) sometimes, depending on the movement of the sight line. It is proved that the gray scale levels, which are originally supposed to be perceived as 7 and 8, are perceived as 8 or 10, which causes pseudo contour. However, a gray scale gap is reduced compared with a conventional driving method; thus, pseudo contour is reduced.

Note that a length of a lighting period in each sub-frame is assumed as 1 and 4; however, the present invention is not limited thereto. In addition, the division number of the sub-frames is assumed as 2; however, the present invention is not limited thereto.

For example, generally, at least one of the n sub-frames may be further divided into two sub-frames each having a lighting period that is half of a lighting period of the sub-frame. In particular, as a sub-frame that further divides a lighting period, a sub-frame having the longest lighting period among the n of the sub-frames may be selected.

Figure 3:
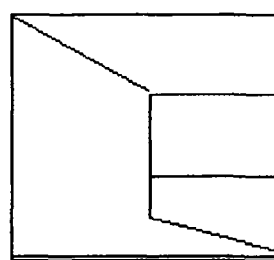
FIG. 3 is a view showing one example of a selection method of a sub-frame and a sub-pixel by a driving method according to the present invention.

In other words, in the case of 4-bit gray scales (16 gray scales), the sub-frame 2 having the longest lighting period 4 in FIG. 1 may be divided into two sub-frames each having the lighting period 2 which is half of the lighting period 4. Thus, FIG. 3 shows an example that one pixel is divided into two sub-pixels (SP1 and SP2) so that an area ratio of each sub-pixel becomes 1:2 and one frame is divided into three sub-frames (SF1, SF2, and SF3) so that a ratio of a lighting period in each sub-frame becomes 1:2. Here, the sub-pixels respectively have the following area: SP1=1 and SP2=2, and the sub-frames respectively have the following lighting periods: SF1=1, SF2=2, and SF3=2.

In FIG. 3, in a case where only the sub-pixel 1 (SP1) is lighted in the sub-frame 1 (SF1), the area of the sub-pixel 1 is 1; therefore, the light-emitting intensity becomes 1. In addition, in a case where only the sub-pixel 2 (SP2) is lighted, the area of the sub-pixel 2 is 2; therefore, the light-emitting intensity becomes 2. On the other hand, in a case where only the sub-pixel 1 is lighted in the sub-frame 2 (SF2) and 3 (SF3), the area of the sub-pixel 1 is 1; however, the lighting periods of the sub-frame 2 and 3 (SF3) are twice that of the sub-frame 1; therefore, the light-emitting intensity becomes 2. In addition, in a case where only the sub-pixel 2 is lighted, the area of the sub-pixel 2 is 2; however, the lighting periods of the sub-frame 2 and 3 (SF3) are twice that of the sub-frame 1; therefore, the light-emitting intensity becomes 4. Accordingly, with a combination of an area of the sub-pixels and a lighting period of the sub-frames, different light-emitting intensity can be made, with which the 4-bit gray scales (16 gray scales) are expressed.

Figure 4:
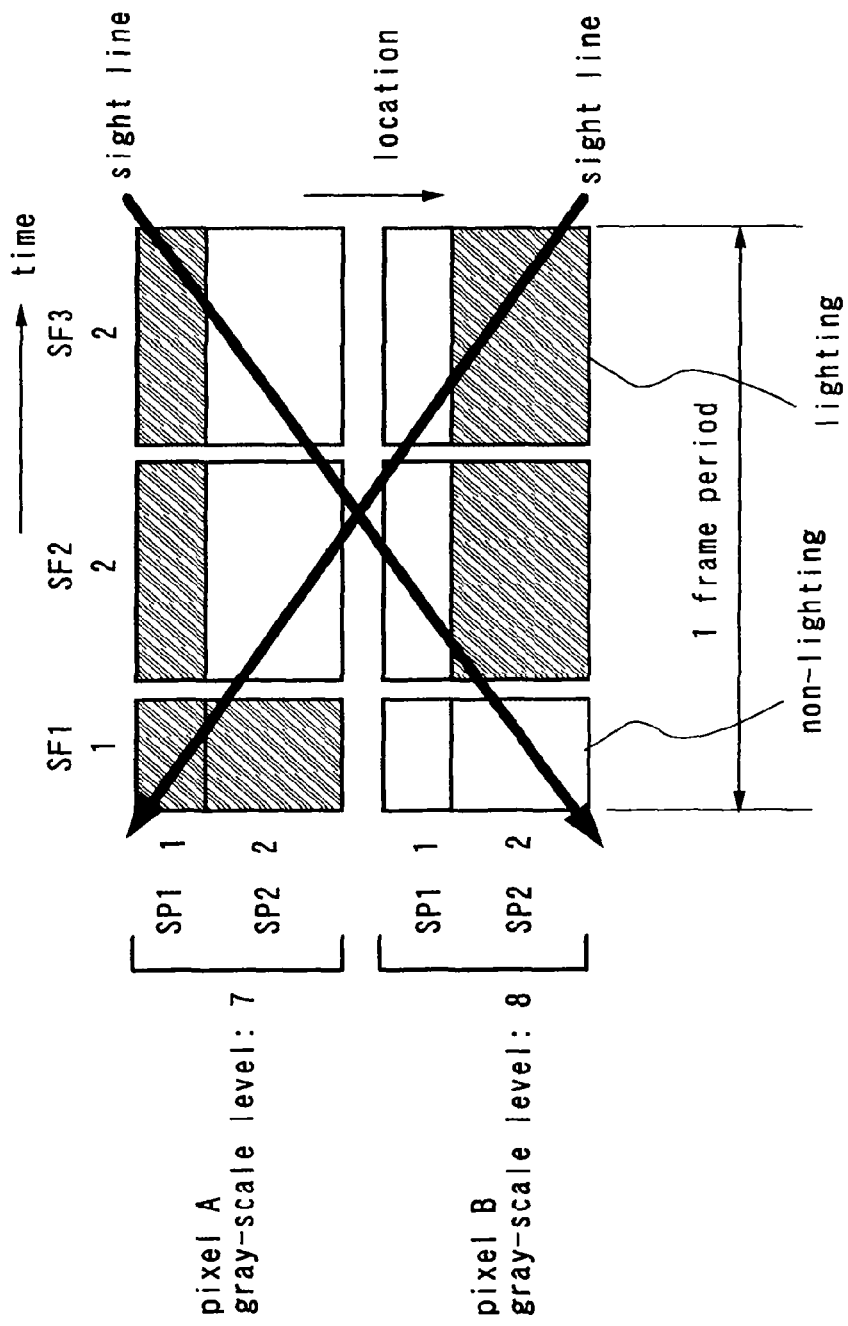
FIG. 4 is a view showing a cause that a pseudo contour is decreased in a driving method according to the present invention.

With the driving method as in FIG. 3, pseudo contour can be reduced. For example, it is assumed that a gray-scale level of 7 is displayed in a pixel A while a gray-scale level of 8 is displayed in a pixel B in FIG. 4, which shows the lighting/non-lighting states of each sub-pixel in each sub-frame of this case. Here, for example, if the sight line moves, human eyes perceive that the gray-scale level is 6 (=4+2) or 7 (=1+2+4) sometimes, depending on the movement of the sight line. It is proved that the gray scale levels, which are originally supposed to be perceived as 7 and 8, are perceived as 6 or 7, which causes pseudo contour. However, a small gray scale gap is reduced compared with a conventional driving method; thus, pseudo contour is reduced.

By reducing a length of a lighting period of each sub-frame or increasing the division number of each sub-frame, in this manner, human eyes will be subjected to tricks as if a gray scale gap, in a case where the sight line moves, is reduced. Therefore, this has a profound effect on reducing pseudo contour. Note that the sub-frame where a lighting period is further divided is not limited to a sub-frame having the longest lighting period. However, in particular, it is desirable to further divide the sub-frame having the longest lighting period into two sub-frames each having a lighting period which is half of the lighting period because this has a profound effect on reducing pseudo contour.

Note that, by reducing a length of a lighting period of each sub-frame or increasing the division number of each sub-frame, a selection method of a sub-pixel in each sub-frame for displaying the same gray scale level is increased. Therefore, the selection method of each sub-pixel in each sub-frame is not limited thereto. For example, in a case of displaying a gray scale level of 8, in FIG. 3, the sub-pixel 2 is lighted in the sub-frames 2 and 3; however, the sub-pixels 1 and 2 may be lighted in the sub-frame 2 and the sub-pixel 1 may be lighted in the sub-frame 3. This case is shown in FIG. 5.

Figure 5:
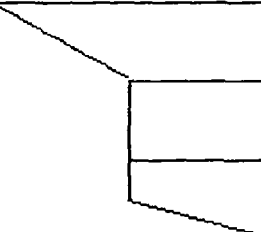
FIG. 5 is a view showing one example of a selection method of a sub-frame and a sub-pixel by a driving method according to the present invention.

Note that, with the driving method as in FIG. 5, pseudo contour can be reduced. For example, it is assumed that a gray-scale level of 7 is displayed in a pixel A while a gray-scale level of 8 is displayed in a pixel B in FIG. 6, which shows the lighting/non-lighting states of each sub-pixel in each sub-frame of this case. Here, for example, if the sight line moves, human eyes perceive that the gray-scale level is 7 (=1+2+2+2) or 8 (=4+2+2) sometimes, depending on the movement of the sight line. It is proved that the gray scale levels, which are originally supposed to be perceived as 7 and 8, are perceived precisely. Therefore, pseudo contour is reduced compared with a conventional driving method.

Accordingly, it is possible to have a profound effect on reducing pseudo contour by selectively changing a selection method of a sub-pixel in each sub-frame for gray scale levels which are especially likely to cause pseudo contour.

Note that a sequential order of a lighting period in each sub-frame is not limited thereto. For example, in FIG. 5, the sub-pixels respectively have the following lighting periods: SF1=1, SF2=2, and SF3=2; however, the following lighting periods may also be employed: SF1=2, SF2=1, and SF3=2; or SF1=2, SF 2=2, and SF3=1. Note that it is desirable that the sequential order of the lighting period of each sub-frame is an ascending order or a descending order of the lighting period. This is because it is possible to reduce a gray scale gap compared with a conventional method when the sight line moves and to reduce pseudo contour compared with a conventional method by having the lighting period of each sub-frame an ascending order or a descending order.

Note that the length of the lighting period is to be appropriately changed depending on total gray scale levels (the number of bits), the number of total sub-frames, or the like. Thus, there is a possibility that the length of periods that are actually lighting (for example, what μs the length is) may be changed even when the lighting periods are the same, if total gray scale levels (the number of bits) or the number of sub-frames is changed.

Note that a lighting period is to be used in a case of continuous lighting and lighting frequency is to be used in a case where a switch is turned on and off repeatedly in a certain period. A typical display using the lighting frequency is a plasma display, and a typical display using the lighting period is an organic EL display.

Note that, although the number of sub-pixels is two in this embodiment mode, the present invention is not limited thereto. For example, one pixel may be divided into three sub-pixels. In addition, although an area ratio of each sub-pixel is 1:2, the present invention is not limited thereto. For example, one pixel may be divided into sub-pixels with an area ratio of 1:4, 1:8, or 1:2:4.

For example, when an area ratio of each sub-pixel is 1:1, the same light-emitting intensity is obtained even when light emission of either sub-pixel is made in the same sub-frame. Therefore, in displaying the same gray scale level, light emission of which sub-pixel is to be made may be switched. Accordingly, it is possible to prevent light emission only in specific sub-pixels by being gathered thereto and to prevent an image sticking of a pixel.

Note that it is possible to display much more gray scales with a few sub-pixels and a few sub-frames by having an area ratio of m (m is an integer number of m≥2) of sub-pixels $2^0:2^1:2^2:\ldots:2^{m-3}:2^{m-2}:2^{m-1}$ and having a lighting period of n (n is an integer number of n≥2) of sub-frames $2^0:2^m:2^{2m}:\ldots:2^{(n-3)m}:2^{(n-2)m}:2^{(n-1)m}$. In addition, since a rate of changing the gray scale that can be displayed by this method is constant, it is possible to display a more smooth gray scale and to improve an image quality.

Next, a case of 6-bit gray scales (64 gray scales) is considered. This embodiment mode will be explained by giving, as an example, a case where one pixel is divided into two sub-pixels (SP1 and SP2) so that an area ratio of each sub-pixel becomes 1:2 and one frame is divided into three sub-frames (SF1, SF2, and SF3) so that a ratio of a lighting period in each sub-frame becomes 1:4:16. Note that m corresponds to 2 and n corresponds to 2 in this example.

Here, FIG. 7 shows a display method of each gray scale in a case where the sub-pixels respectively have the following area: SP1=1 and SP=2, and the sub-frames respectively have the following lighting periods: SF1=1, SF2=4, and SF3=16.

In a case where only the sub-pixel 1 (SP1) is lighted in the sub-frame 1 (SF1), the area of the sub-pixel 1 is 1; therefore, the light-emitting intensity becomes 1. In addition, in a case where only the sub-pixel 2 (SP2) is lighted, the area of the sub-pixel 2 is 2; therefore, the light-emitting intensity becomes 2. On the other hand, in a case where only the sub-pixel 1 is lighted in the sub-frame 2 (SF2), the area of the sub-pixel 1 is 1; however, the lighting period of the sub-frame 2 is four times as long as that of the sub-frame 1; therefore, the light-emitting intensity becomes 4. In addition, in a case where only the sub-pixel 2 is lighted, the area of the sub-pixel 2 is 2; however, the lighting period of the sub-frame 2 is four times as long as that of the sub-frame 1; therefore, the light-emitting intensity becomes 8. In the same manner, in a case where only the sub-pixel 1 is lighted in the sub-frame 3 (SF3), the area of the sub-pixel 1 is 1; however, the lighting period of the sub-frame 3 is sixteen times as long as that of the sub-frame 1; therefore, the light-emitting intensity becomes 16. In addition, in a case where only the sub-pixel 2 is lighted, the area of the sub-pixel 2 is 2; however, the lighting period of the sub-frame 3 is sixteen times as long as that of the sub-frame 1; therefore, the light-emitting intensity becomes 32. Accordingly, with a combination of an area of the sub-pixels and a lighting period of the sub-frames, different light-emitting intensity can be made, with which the 6-bit gray scales (64 gray scales) are expressed.

Figure 8:
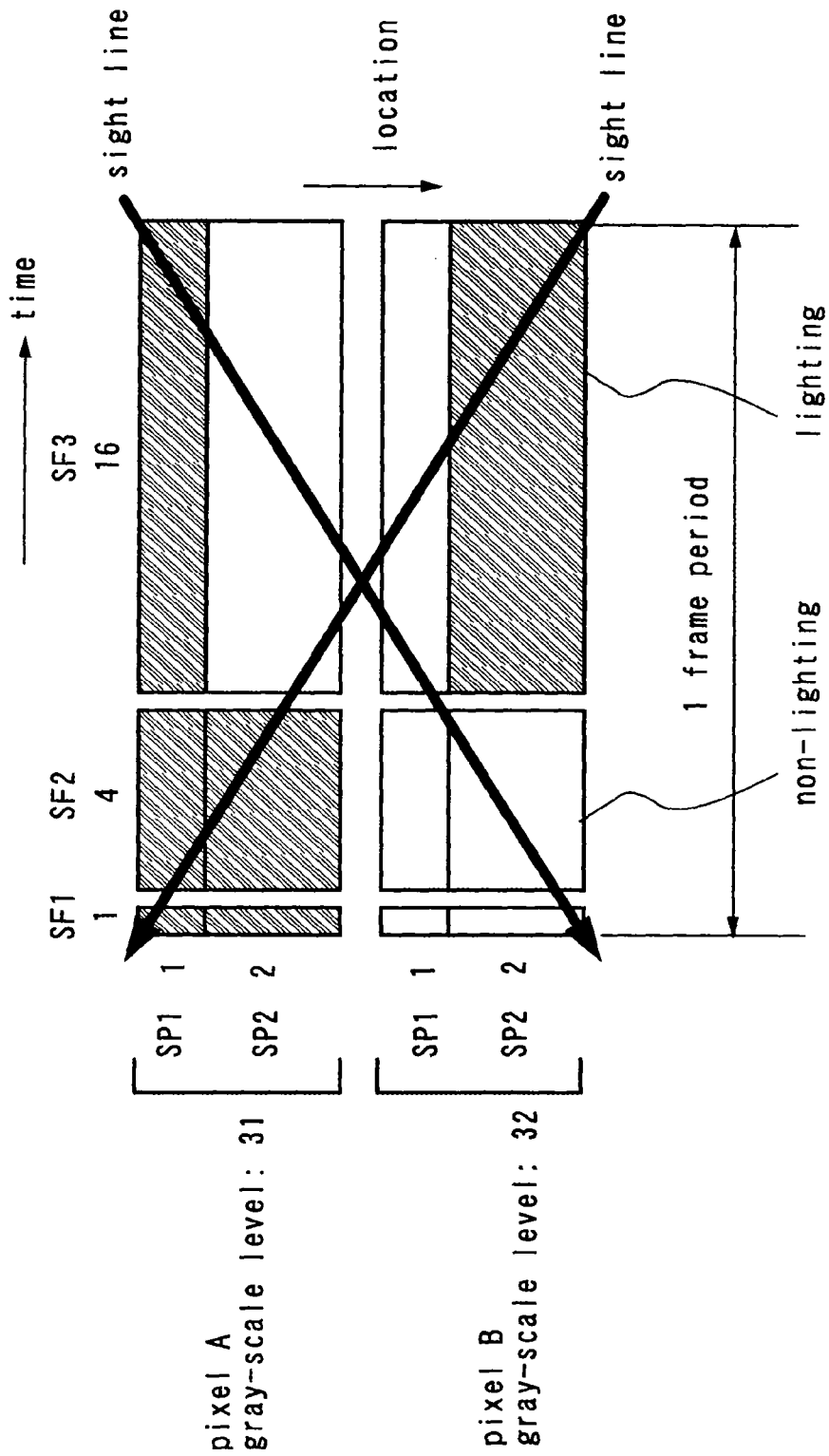
FIG. 8 is a view showing a cause that a pseudo contour is decreased in a driving method according to the present invention.

With the driving method according to the present invention, pseudo contour can be reduced. For example, it is assumed that a gray-scale level of 31 is displayed in a pixel A while a gray-scale level of 32 is displayed in a pixel B in FIG. 8, which shows the lighting/non-lighting states of each sub-pixel in each sub-frame of this case. Here, for example, if the sight line moves, human eyes perceive that the gray-scale level is 16 (=16) or 45 (=1+4+8+32) sometimes, depending on the movement of the sight line. It is proved that the gray scale levels, which are originally supposed to be perceived as 31 and 32, are perceived as 16 or 45, which causes pseudo contour. However, a small gray scale gap is reduced compared with a conventional driving method; thus, pseudo contour is reduced.

Note that a length of a lighting period in each sub-frame is assumed as 1, 4, and 16; however, the present invention is not limited thereto. In addition, the division number of the sub-frames is assumed as 3; however, the present invention is not limited thereto.

For example, the sub-frame 3 having the longest lighting period 16 in FIG. 7 may be divided into two sub-frames each having the lighting period 8 which is half of the lighting period 16. Thus, FIG. 9 shows an example that one pixel is divided into two sub-pixels (SP1 and SP2) so that an area ratio of each sub-pixel becomes 1:2 and one frame is divided into four sub-frames (SF1, SF2, SF3, and SF4) so that a ratio of a lighting period in each sub-frame becomes 1:4:8:8. Here, the sub-pixels respectively have the following area: SP1=1 and SP2=2, and the sub-frames respectively have the following lighting periods: SF1=1, SF2=4, SF3=8, and SF4=8.

In FIG. 9, in a case where only the sub-pixel 1 (SP1) is lighted in the sub-frame 1 (SF1), the area of the sub-pixel 1 is 1; therefore, the light-emitting intensity becomes 1. In addition, in a case where only the sub-pixel 2 (SP2) is lighted, the area of the sub-pixel 2 is 2; therefore, the light-emitting intensity becomes 2. On the other hand, in a case where only the sub-pixel 1 is lighted in the sub-frame 2 (SF2), the area of the sub-pixel 1 is 1; however, the lighting period of the sub-frame 2 is four times as long as that of the sub-frame 1; therefore, the light-emitting intensity becomes 4. In addition, in a case where only the sub-pixel 2 is lighted, the area of the sub-pixel 2 is 2; however, the lighting period of the sub-frame 2 is four times as long as that of the sub-frame 1; therefore, the light-emitting intensity becomes 8. In the same manner, in a case where only the sub-pixel 1 is lighted in the sub-frame 3 (SF3) and 4 (SF4), the area of the sub-pixel 1 is 1; however, the lighting periods of the sub-frames 3 and 4 are eight times as long as that of the sub-frame 1; therefore, the light-emitting intensity becomes 8. In addition, in a case where only the sub-pixel 2 is lighted, the area of the sub-pixel 2 is 2; however, the lighting periods of the sub-frames 3 and 4 are eight times as long as that of the sub-frame 1; therefore, the light-emitting intensity becomes 16. Accordingly, with a combination of an area of the sub-pixels and a lighting period of the sub-frames, different light-emitting intensity can be made, with which the 6-bit gray scales (64 gray scales) are expressed.

With the driving method as in FIG. 9, pseudo contour can be reduced. For example, it is assumed that a gray-scale level of 31 is displayed in a pixel A while a gray-scale level of 32 is displayed in a pixel B in FIG. 10, which shows the lighting/non-lighting states of each sub-pixel in each sub-frame of this case. Here, for example, if the sight line moves, human eyes perceive that the gray-scale level is 24 (=16+8) or 29 (=1+4+8+16) sometimes, depending on the movement of the sight line. It is proved that the gray scale levels, which are originally supposed to be perceived as 31 and 32, are perceived as 24 or 29, which causes pseudo contour. However, a small gray scale gap is reduced compared with a conventional driving method; thus, pseudo contour is reduced.

By reducing a length of a lighting period of each sub-frame or increasing the division number of each sub-frame, in this manner, human eyes will be subjected to tricks as if a gray scale gap, in a case where the sight line moves, is reduced. Therefore, this has a profound effect on reducing pseudo contour. Note that the sub-frame where a lighting period is further divided is not limited to a sub-frame having the longest lighting period. However, in particular, it is desirable to further divide the sub-frame having the longest lighting period into two sub-frames each having a lighting period which is half of the lighting period because this has a profound effect on reducing pseudo contour.

Note that, by reducing a length of a lighting period of each sub-frame or increasing the division number of each sub-frame, a selection method of a sub-pixel in each sub-frame for displaying the same gray scale level is increased. Therefore, the selection method of each sub-pixel in each sub-frame is not limited thereto. For example, in a case of displaying a gray scale level of 32, in FIG. 9, the sub-pixel 2 is lighted in the sub-frame 3 and 4; however, the sub-pixels 1 and 2 may be lighted in the sub-frame 3 and the sub-pixel 1 may be lighted in the sub-frame 4. This case is shown in FIG. 11.

Figure 12:
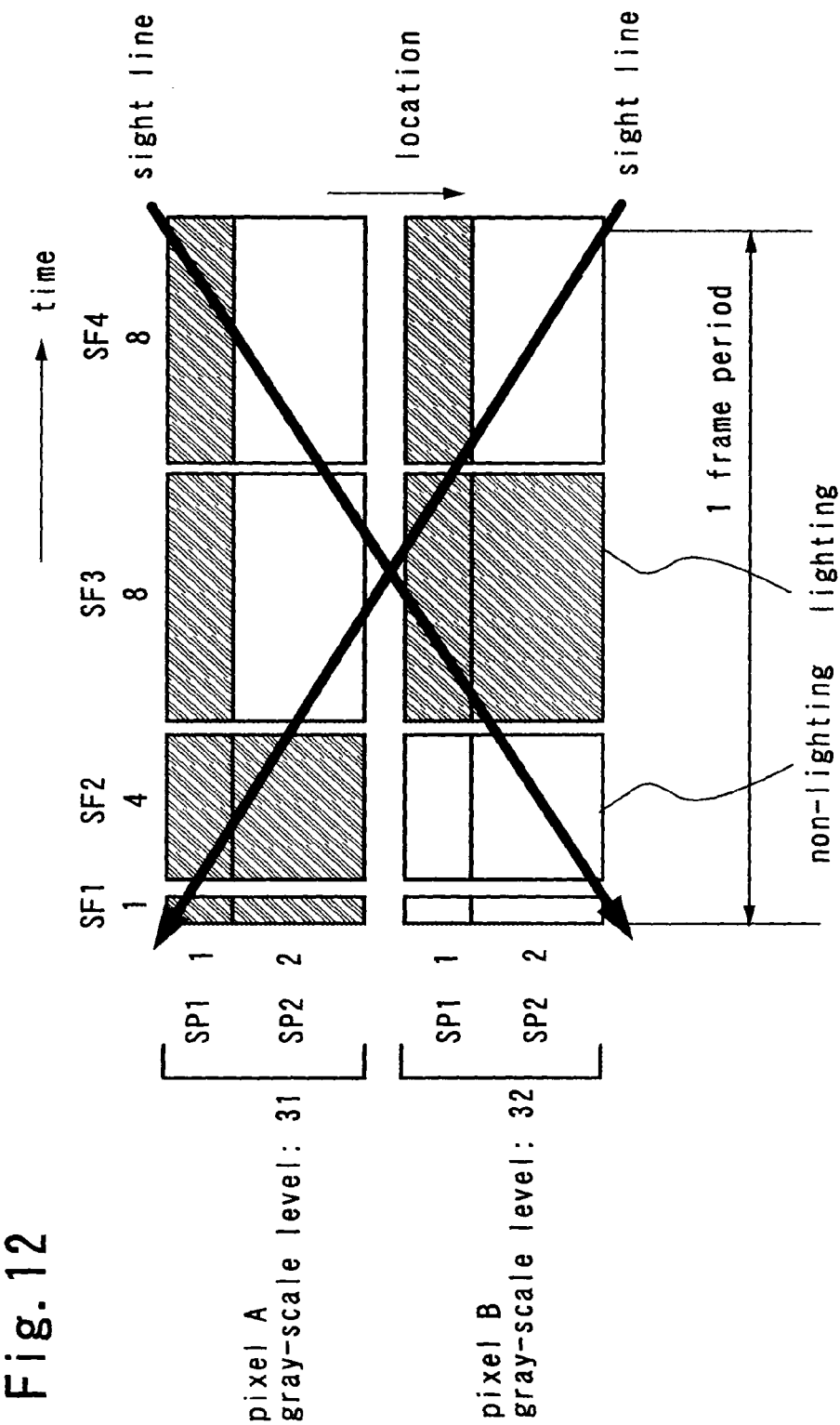
FIG. 12 is a view showing a cause that a pseudo contour is decreased in a driving method according to the present invention.

With the driving method as in FIG. 11, pseudo contour can be reduced. For example, it is assumed that a gray-scale level of 31 is displayed in a pixel A while a gray-scale level of 32 is displayed in a pixel B in FIG. 12, which shows the lighting/non-lighting states of each sub-pixel in each sub-frame of this case. Here, for example, if the sight line moves, human eyes perceive that the gray-scale level is 29 (=1+4+8+8+8) or 32 (=16+8+8) sometimes, depending on the movement of the sight line. It is proved that the gray scale levels, which are originally supposed to be perceived as 31 and 32, are perceived as 29 or 32, which causes pseudo contour. However, a small gray scale gap is reduced compared with a conventional driving method; thus, pseudo contour is reduced.

Accordingly, it is possible to have a profound effect on reducing pseudo contour by selectively changing a selection method of a sub-pixel in each sub-frame for gray scale levels which are especially likely to cause a pseudo contour.

Note that the number of sub-pixels is assumed as 2; however, the present invention is not limited thereto. In addition, an area ratio of each sub-pixel is assumed as 1:2; however, the present invention is not limited thereto.

For example, FIG. 13 shows an example that one pixel is divided into three sub-pixels (SP1, SP2, and SP3) so that an area ratio of each sub-pixel becomes 1:2:4 and one frame is divided into two sub-frames (SF1 and SF2) so that a ratio of a lighting period in each sub-frame becomes 1:8. Here, the sub-pixels respectively have the following area: SP1=1, SP=2, and SP3=4, and the sub-frames respectively have the following lighting periods: SF1=1, SF2=8. Note that m corresponds to 3 and n corresponds to 2 in this example.

In FIG. 13, in a case where only the sub-pixel 1 (SP1) is lighted in the sub-frame 1 (SF1), the area of the sub-pixel 1 is 1; therefore, the light-emitting intensity becomes 1. In addition, in a case where only the sub-pixel 2 (SP2) is lighted, the area of the sub-pixel 2 is 2; therefore, the light-emitting intensity becomes 2. Moreover, in a case where only the sub-pixel 3 (SP3) is lighted, the area of the sub-pixel 3 is 4; therefore, the light-emitting intensity becomes 4. On the other hand, in a case where only the sub-pixel 1 is lighted in the sub-frame 2 (SF2), the area of the sub-pixel 1 is 1; however, the lighting period of the sub-frame 2 is eight times as long as that of the sub-frame 1; therefore, the light-emitting intensity becomes 8. In addition, in a case where only the sub-pixel 2 is lighted, the area of the sub-pixel 2 is 2; however, the lighting period of the sub-frame 2 is eight times as long as that of the sub-frame 1; therefore, the light-emitting intensity becomes 16. Moreover, in a case where only the sub-pixel 3 is lighted, the area of the sub-pixel 3 is 4; however, the lighting period of the sub-frame 2 is eight times as long as that of the sub-frame 1; therefore, the light-emitting intensity becomes 32. Accordingly, with a combination of an area of the sub-pixels and a lighting period of the sub-frames, different light-emitting intensity can be made, with which the 6-bit gray scales (64 gray scales) are expressed.

Figure 14:
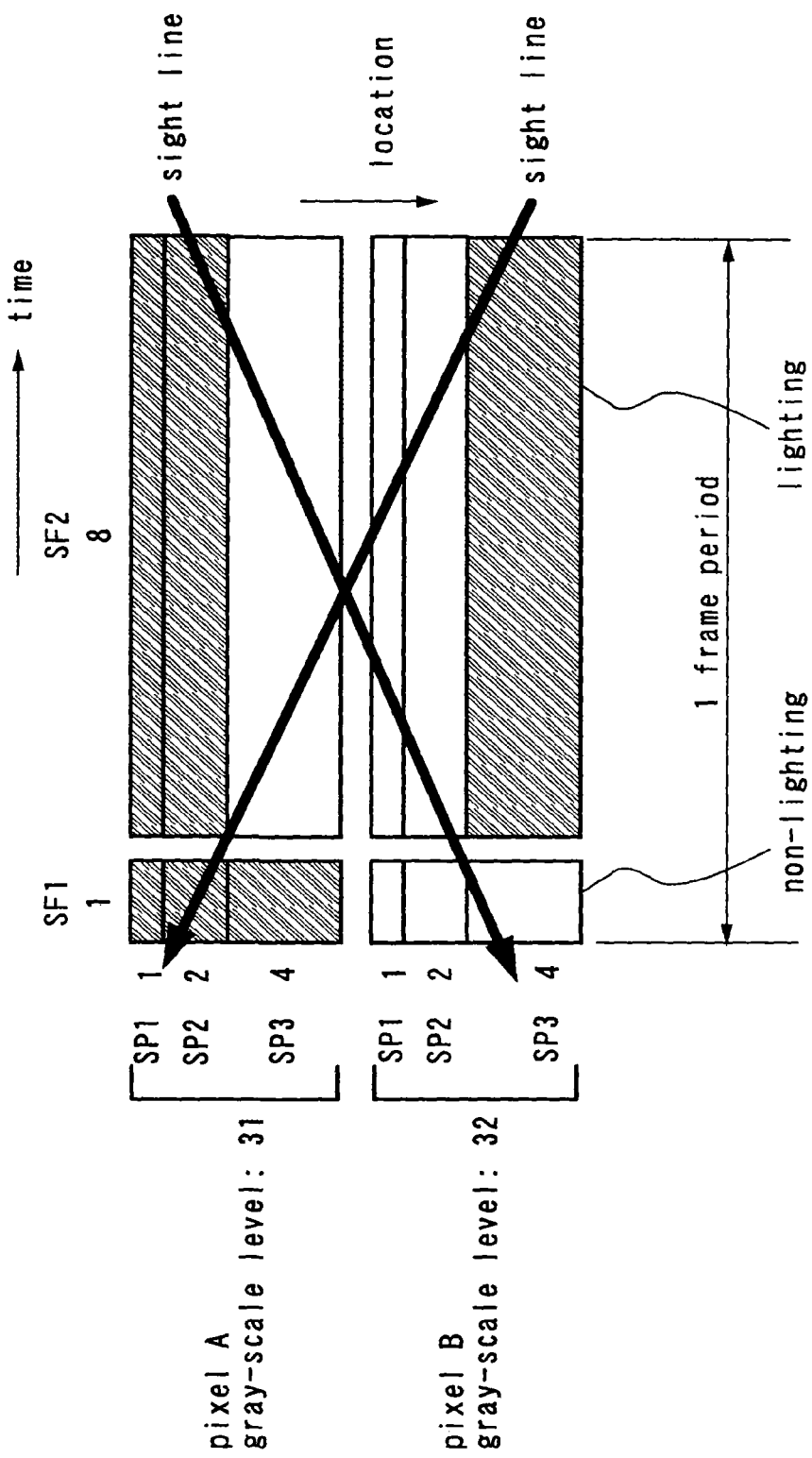
FIG. 14 is a view showing a cause that a pseudo contour is decreased in a driving method according to the present invention.

With the driving method as in FIG. 13, pseudo contour can be reduced. For example, it is assumed that a gray-scale level of 31 is displayed in a pixel A while a gray-scale level of 32 is displayed in a pixel B in FIG. 14, which shows the lighting/non-lighting states of each sub-pixel in each sub-frame of this case. Here, for example, if the sight line moves, human eyes perceive that the gray-scale level is 16 (=16) or 36 (=4+32) sometimes, depending on the movement of the sight line. It is proved that the gray scale levels, which are originally supposed to be perceived as 31 and 32, are perceived as 16 or 36, which causes pseudo contour. However, a small gray scale gap is reduced compared with a conventional driving method; thus, pseudo contour is reduced.

In addition, the sub-frame 2 having the longest lighting period 8 in FIG. 13 may be divided into two sub-frames each having the lighting period 4 which is half of the lighting period 8. Thus, FIG. 15 shows an example that one pixel is divided into three sub-pixels (SP1, SP2, and SP3) so that an area ratio of each sub-pixel becomes 1:2:4 and one frame is divided into three sub-frames (SF1, SF2, and SF3) so that a ratio of a lighting period in each sub-frame becomes 1:4:4. Here, the sub-pixels respectively have the following area: SP1=1, SP2=2, and SP3=4, and the sub-frames respectively have the following lighting periods: SF1=1, SF2=4, SF3=4.

In FIG. 15, in a case where only the sub-pixel 1 (SP1) is lighted in the sub-frame 1 (SF1), the area of the sub-pixel 1 is 1; therefore, the light-emitting intensity becomes 1. In addition, in a case where only the sub-pixel 2 (SP2) is lighted, the area of the sub-pixel 2 is 2; therefore, the light-emitting intensity becomes 2. Moreover, in a case where only the sub-pixel 3 (SP3) is lighted, the area of the sub-pixel 3 is 4; therefore, the light-emitting intensity becomes 4. On the other hand, in a case where only the sub-pixel 1 is lighted in the sub-frame 2 (SF2) and 3 (SF3), the area of the sub-pixel 1 is 1; however, the lighting period of the sub-frame 2 is four times as long as that of the sub-frame 1; therefore, the light-emitting intensity becomes 4. In addition, in a case where only the sub-pixel 2 is lighted, the area of the sub-pixel 2 is 2; however, the lighting period of the sub-frame 2 is four times as long as that of the sub-frame 1; therefore, the light-emitting intensity becomes 8. Moreover, in a case where only the sub-pixel 3 is lighted, the area of the sub-pixel 3 is 4; however, the lighting period of the sub-frame 2 is four times as long as that of the sub-frame 1; therefore, the light-emitting intensity becomes 16. Accordingly, with a combination of an area of the sub-pixels and a lighting period of the sub-frames, different light-emitting intensity can be made, with which the 6-bit gray scales (64 gray scales) are expressed.

Figure 16:
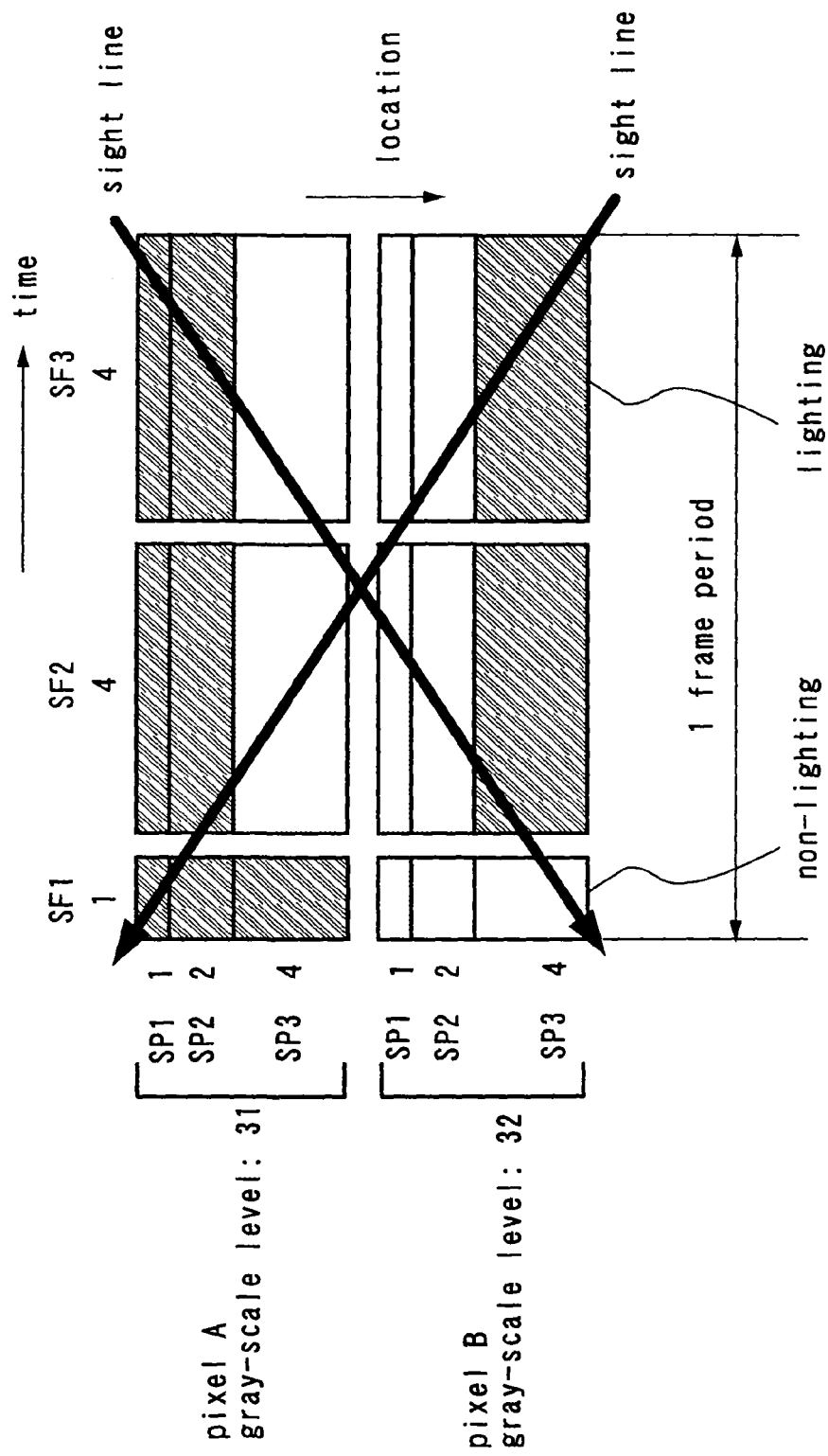
FIG. 16 is a view showing a cause that a pseudo contour is decreased in a driving method according to the present invention.

With the driving method as in FIG. 15, pseudo contour can be reduced. For example, it is assumed that a gray-scale level of 31 is displayed in a pixel A while a gray-scale level of 32 is displayed in a pixel B in FIG. 16, which shows the lighting/non-lighting states of each sub-pixel in each sub-frame of this case. Here, for example, if the sight line moves, human eyes perceive that the gray-scale level is 27 (=1+2+ 8+16) or 28 (=16+8+4) sometimes, depending on the movement of the sight line. It is proved that the gray scale levels, which are originally supposed to be perceived as 31 and 32, are perceived as 27 or 28, which causes pseudo contour. However, a small gray scale gap is reduced compared with a conventional driving method; thus, pseudo contour is reduced.

By reducing a length of a lighting period of each sub-frame or increasing the division number of each sub-frame, in this manner, human eyes will be subjected to tricks as if a gray scale gap, in a case where the sight line moves, is reduced. Therefore, this has a profound effect on reducing pseudo contour. Note that the sub-frame where a lighting period is further divided is not limited to a sub-frame having the longest lighting period. However, in particular, it is desirable to further divide the sub-frame having the longest lighting period into two sub-frames each having a lighting period which is half of the lighting period because this has a profound effect on reducing pseudo contour.

Note that, by reducing a length of a lighting period of each sub-frame or increasing the division number of each sub-frame, a selection method of a sub-pixel in each sub-frame for displaying the same gray scale level is increased. Therefore, the selection method of each sub-pixel in each sub-frame is not limited thereto. For example, in a case of displaying a gray scale level of 32, in FIG. 15, the sub-pixel 3 is lighted in the sub-frame 2 and 3; however, the sub-pixels 1 and 3 may be lighted in the sub-frame 2 and the sub-pixels 1 and 2 may be lighted in the sub-frame 3. This case is shown in FIG. 17.

Figure 18:
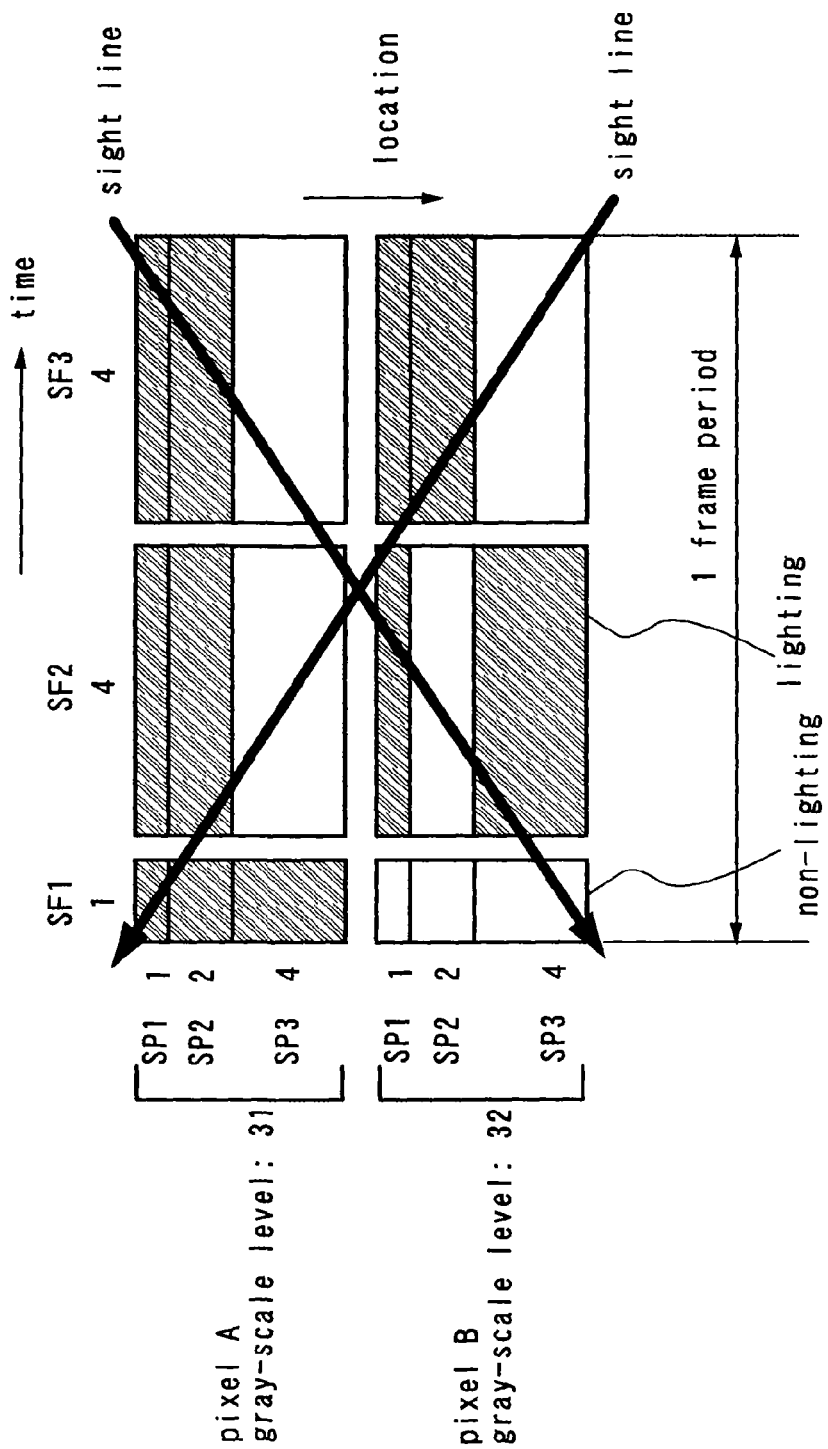
FIG. 18 is a view showing a cause that a pseudo contour is decreased in a driving method according to the present invention.

With the driving method as in FIG. 17, pseudo contour can be reduced. For example, it is assumed that a gray-scale level of 31 is displayed in a pixel A while a gray-scale level of 32 is expressed in a pixel B in FIG. 18, which shows the lighting/non-lighting states of each sub-pixel in each sub-frame of this case. Here, for example, if the sight line moves, human eyes perceive that the gray-scale level is 27 (=1+2+ 8+4+4+8) or 32 (=16+4+8+4) sometimes, depending on the movement of the sight line. It is proved that the gray scale levels, which are originally supposed to be perceived as 31 and 32, are perceived as 27 or 32, which causes pseudo contour. However, a small gray scale gap is reduced compared with a conventional driving method; thus, pseudo contour is reduced.

Accordingly, it is possible to have a profound effect on reducing pseudo contour by selectively changing a selection method of a sub-pixel in each sub-frame for gray scale levels which are especially likely to cause a pseudo contour.

Note that correspondences of areas and numbers of the sub-pixels are not limited thereto. For example, in FIG. 15, the sub-pixels respectively have the following areas: SP1=1, SP2=2, and SP3=4; however, the following areas may also be employed: SP1=1, SP2=4, and SP3=2; SP1=2, SP2=1, and SP3=4; or SP1=4, SP2=2, and SP3=1.

Accordingly, by using the driving method according to the present invention, it is possible to reduce pseudo contour without increasing the number of sub-frames and to display with a higher gray scale level. In addition, since it is possible to reduce the number of sub-frames compared with conventional time gray scale method, a long lighting period of each sub-frame can be provided. Accordingly, it is possible to improve a duty ratio, and voltage applied to a light-emitting element is reduced. Thus, power consumption can be reduced, and there will be few deterioration of a light-emitting element.

Note that a selection method of a sub-pixel in each sub-frame may be changed in terms of time or a place in a certain gray scale. In other words, a selection method of a sub-pixel in each sub-frame may be changed depending on times or a selection method of a sub-pixel in each sub-frame may be changed depending on pixels. Further, the selection method of a sub-pixel in each sub-frame may also be changed depending on times and pixels.

For example, in expressing a certain gray scale, different selection methods of sub-pixels may be used in odd-numbered frames and even-numbered frames. For example, in a case of 6-bit gray scales (64 gray scales), gray scales may be expressed by a selection method of sub-pixels shown in FIG. 15 in odd-numbered frames whereas gray scales may be expressed by a selection method of sub-pixels shown in FIG. 17 in even-numbered frames. Accordingly, it is possible to reduce pseudo contour by changing the selection method of sub-pixels between the odd-numbered frames and even-numbered frames in expressing a gray-scale level which is likely to cause pseudo contour.

Although the selection method of sub-frames is changed for the gray scale levels which are especially likely to cause pseudo contour, the selection method of sub-pixels may be changed for an arbitrary gray-scale level.

Alternatively, the selection method of a sub-pixel in each sub-frame may be changed between the case of displaying pixels in odd-numbered rows and pixels in even-numbered rows in order to express a certain gray scale. Further alternatively, the selection method of a sub-pixel in each sub-frame may be changed between the case of displaying pixels in odd-numbered columns and pixels in even-numbered columns in order to express a certain gray scale.

In addition, the division number or a ratio of the lighting periods of the sub-frames may be changed in odd-numbered frames and even-numbered frames in order to express a certain gray scale. For example, in a case of 6-bit gray scales (64 gray scales), gray scales may be expressed by a selection method of sub-pixels as in FIG. 13, where a ratio of the lighting periods of sub-frames is 1:8, in odd-numbered frames whereas gray scales may be expressed by a selection method of sub-pixels as in FIG. 15, where a ratio of the lighting periods of sub-frames is 1:4:4, in even-numbered frames.

Note that a sequential order of a lighting period in each sub-frame may be changed depending on times. For example, a sequential order of lighting periods in sub-frames may be changed in the first frame and the second frame. For example, the sequential order of the lighting periods in sub-frames of pixels A and B may be changed. In addition, by combining the lighting periods in sub-frames of pixels A and B, the sequential order of the lighting periods of the sub-frames may be changed depending on times and places. For example, in FIG. 15, the sub-frames may respectively have the following lighting periods: SF1=1, SF2=4, and SF3=4 in odd-numbered frames, and the sub-frames may respectively have the following lighting periods: SF1=4, SF2=1, and SF3=4 in even-numbered frames.

Note that the 4-bit gray scales (16 gray scales) or the 6-bit gray scales (64 gray scales) is given as an example in this embodiment mode; however, a gray scale level to be displayed is not limited thereto. For example, when one pixel is divided into two sub-pixels (SP1 and SP2) so that an area ratio of each sub-pixel becomes 1:2 and one frame is divided into five sub-frames (SF1 to SF5) so that a ratio of a lighting period in each sub-frame becomes 1:4:16:32:32, it is possible to express 8-bit gray scales (256 gray scales). FIGS. 19, 66, 67, and 68 each show a selection method of a sub-pixel in each sub-frame of this case. FIG. 19 shows a selection method of a sub-pixel where gray scale levels are 0 to 63, FIG. 66 shows a selection method of a sub-pixel where gray scale levels are 64 to 127, FIG. 67 shows a selection method of a sub-pixel where gray scale levels are 128 to 191, and FIG. 68 shows a selection method of a sub-pixel where gray scale levels are 192 to 255.

Description has been made heretofore on the case where a lighting period increases in linear proportion to the increased gray scale levels. In this embodiment mode, description is made on a case of applying gamma correction. Gamma correction refers to a method of nonlinearly increasing the lighting period in accordance with the increased gray scale levels. When luminance increases linearly, it is difficult for human eyes to perceive that the luminance has become higher proportionally. It is even more difficult for human eyes to perceive the difference in luminance as the luminance becomes higher. Therefore, in order that the human eyes can perceive the difference in luminance, a lighting period is required to be lengthened in accordance with the increased gray scale levels, that is, gamma correction is required to be performed. Note that the relation between the luminance and gray scale levels in performing gamma correction can be expressed by the following Formula (1):

$$y = A \times x^{\gamma} \quad (1)$$

However, in Formula (1), A is a constant for normalizing the luminance y to be within the range of 0≦y≦1, while γ which is an exponent of the gray scale level x is a parameter indicating the degree of gamma correction.

As the simplest method, there is a method by which display is performed with preparation of a larger number of bits (gray scale levels) than the number of bits (gray scale levels) which are actually displayed. For example, in a case of displaying 6-bit gray scales (64 gray scales), display is performed with preparation of 8-bit gray scales (256 gray scales). When actually displaying an image, display is performed with 6-bit gray scales (64 gray scales) so that the luminance and gray scale levels have a nonlinear relationship. Accordingly, gamma correction can be performed.

Figure 21:
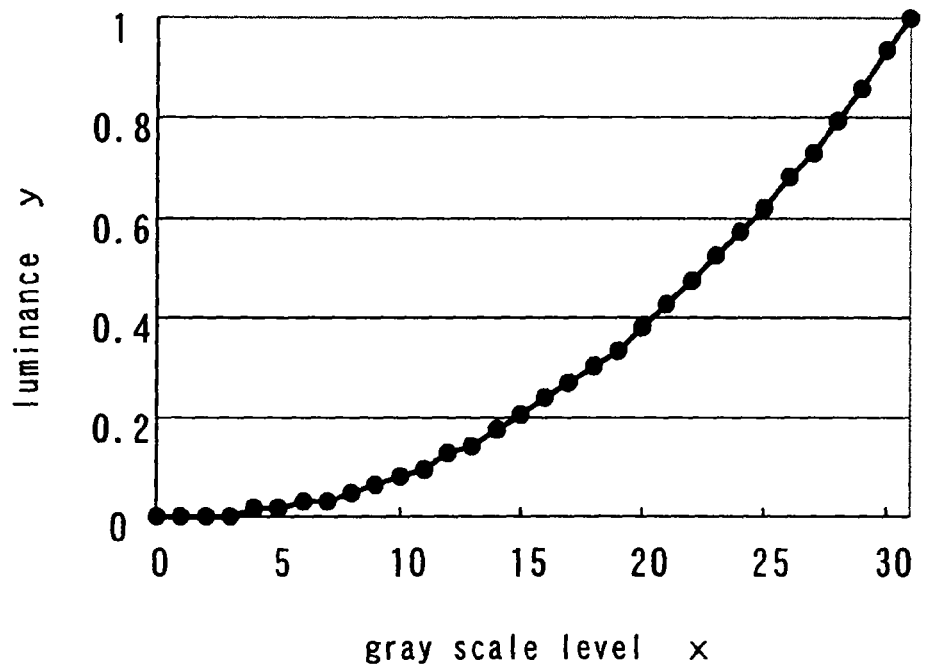
FIGS. 21A and 21B are graphs each showing a relation between a gray scale level and a luminance in a case of performing gamma correction by a driving method according to the present invention.
Figure 21:
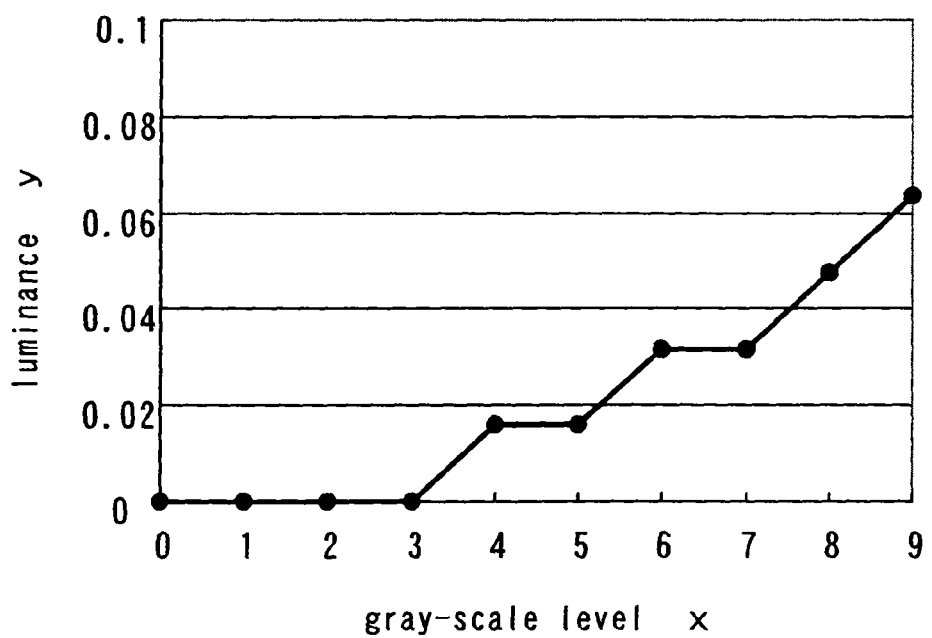

As an example, FIG. 20 shows a selection method of sub-frames in a case of displaying an image with preparation of 6-bit gray scales (64 gray scales) in order to display 5-bit gray scales (32 gray scales) by performing gamma correction. FIG. 20 shows a selection method of sub-frames in the case of displaying an image with 5-bit gray scales by performing gamma correction so that γ=2.2 is satisfied at all the gray scale levels. Note that γ=2.2 is the value which can best correct the characteristics of the human visual perception, with which human eyes can perceive the most appropriate difference in luminance even when the luminance becomes higher. With reference to FIG. 20, up to a gray-scale level of 3 in displaying 5-bit gray scales with gamma correction, display is actually performed by the selection method of sub-frames for displaying a gray-scale level of 0 in the case of 6-bit gray scales. Similarly, at a gray-scale level of 4 in displaying 5-bit gray scales with gamma correction, display is actually performed by a selection method of sub-frames for displaying a gray-scale level of 1 in the case of 6-bit gray scales, and at a gray-scale level of 6 in displaying 5 bit-gray scales with gamma correction, display is actually performed by a selection method of sub-frames for displaying a gray-scale level of 2 in the case of 6 bit-gray scales. FIGS. 21A and 21B are graphs showing the relation between the gray-scale level x and the luminance y. FIG. 21A is a graph showing the relation between the gray-scale level x and the luminance y at all gray scale levels, while FIG. 21B is a graph showing the relation between the gray-scale level x and the luminance y at low gray scale levels. In this manner, display may be performed in accordance with a correspondence table between 5-bit gray scales to be applied with gamma correction and 6-bit gray scales. Accordingly, gamma correction which can satisfy γ=2.2 can be performed.

However, as is apparent from FIG. 21B, the gray scale levels of 0 to 3, 4 to 5, and 6 to 7 are each displayed with the same luminance in the case of FIG. 20. This is because, since the gray scale levels is not enough in the case of displaying 6-bit gray scales, difference in luminance cannot be expressed fully. As a countermeasure against this, the following two methods can be considered.

The first method is a method of further increasing the number of bits which can be displayed. In other words, display is performed with preparation of not 6-bit gray scales but 7-bit or more gray scales, and preferably 8-bit or more gray scales. Consequently, a smooth image can be displayed even in the low gray scale regions.

Figure 23:
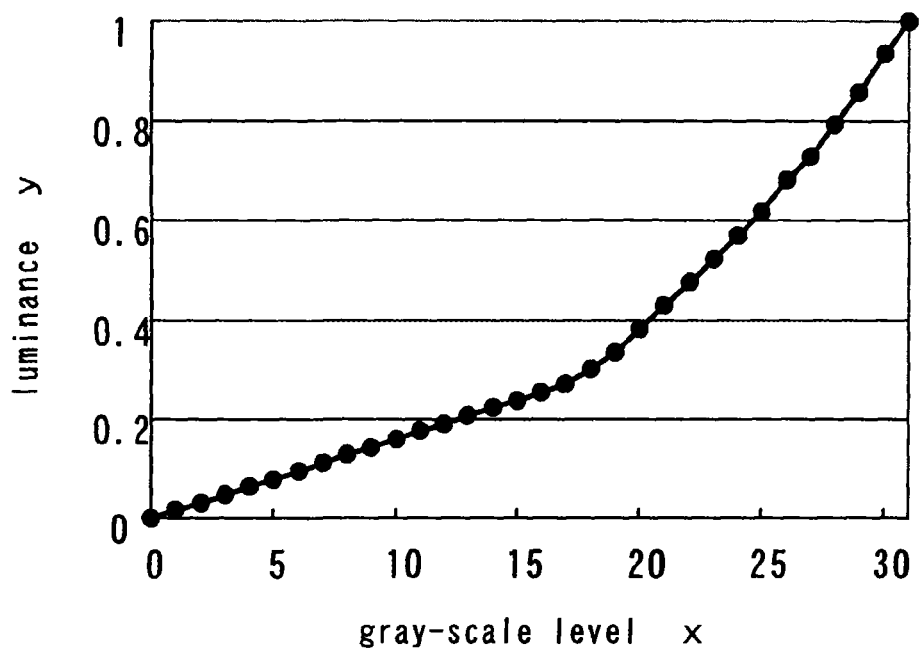
FIGS. 23A and 23B are graphs each showing a relation between a gray scale level and a luminance in a case of performing gamma correction by a driving method according to the present invention.
Figure 23:
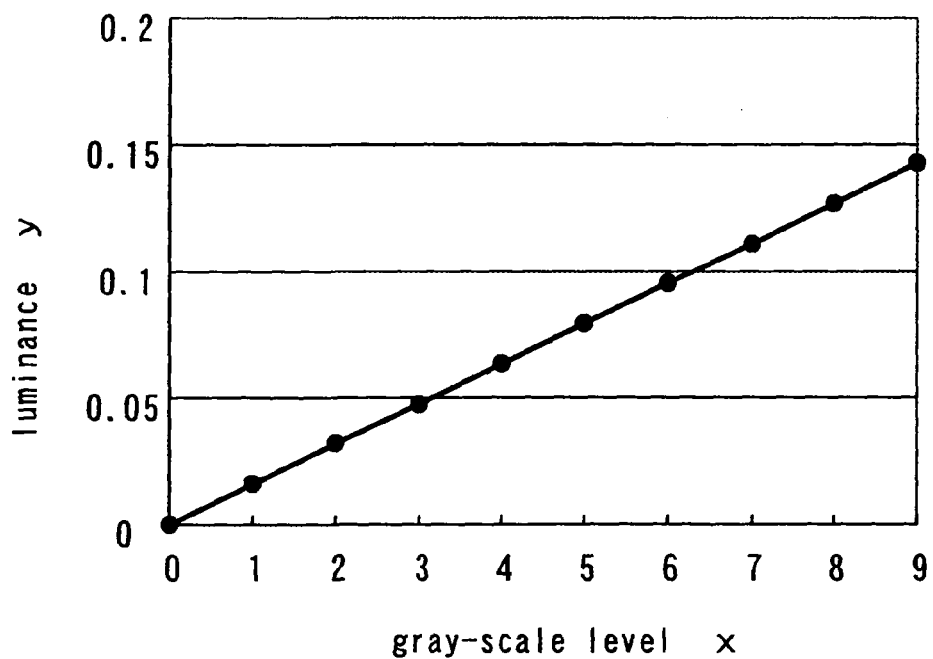

The second method is a method of displaying a smooth image by not satisfying γ=2.2 in the low gray scale regions but by linearly changing the luminance. FIG. 22 shows a selection method of sub-frames of this case. In FIG. 22, in order to display a gray scale level of up to 17, the same selection method of sub-frames is used between the cases of 5-bit gray scales and 6-bit gray scales. However, at a gray-scale level of 18 in displaying 5-bit gray scales with gamma correction, pixels are actually lighted by a selection method of sub-frames for displaying a gray-scale level of 19 in the case of 6-bit gray scales. Similarly, at a gray-scale level of 19 in displaying 5-bit gray scales with gamma correction, display is actually performed by a selection method of sub-frames for displaying a gray-scale level of 21 in the case of 6-bit gray scales, and at a gray-scale level of 20 in displaying 5-bit gray scales with gamma correction, display is actually performed by a selection method of sub-frames for displaying a gray-scale level of 24 in the case of 6-bit gray scales. FIGS. 23A and 23B show the relation between the gray-scale level x and the luminance y. FIG. 23A is a graph showing the relation between the gray-scale level x and the luminance y at all gray scale levels, while FIG. 23B is a graph showing the relation between the gray-scale level x and the luminance y at low gray scale levels. In the low gray scale regions, the luminance changes linearly. By performing such gamma correction, a smoother image can be displayed in the low gray scale regions.

In other words, by changing the luminance in linear proportion to the gray scale levels in the low gray scale regions while changing the luminance in nonlinear proportion to the gray scale levels in other gray scale regions, a smoother image can be displayed in the low gray scale regions.

Note also that the correspondence table between the 5-bit gray scales to be applied with gamma correction and the 6-bit gray scales may be appropriately modified. Thus, by modifying the correspondence table, degree of gamma correction (that is, the value of γ) can be easily changed. Accordingly, the present invention is not limited to γ=2.2.

Moreover, the present invention is not particularly limited to the number of bits (for example, p bits, where p is an integer) to be actually displayed, and the number of bits to be applied with gamma correction (for example, q bits, where q is an integer). In the case of displaying bits by performing gamma correction, the number of bits (p) is desirably set as large as possible in order to express gray scales smoothly. However, if the number p is set too large, a problem may arise such that the number of sub-frames is increased accordingly. Thus, the relation between the number of bits (q) and (p) desirably satisfies $q+2 \leq p \leq q+5$. Accordingly, gray scales can be smoothly expressed while suppressing the number of sub-frames.

(Embodiment Mode 2)

This embodiment mode will describe an example of a timing chart. This embodiment mode will be explained by giving, as an example, a case (FIG. 7) where one pixel is divided into two sub-pixels (SP1 and SP2) so that an area ratio of each sub-pixel becomes 1:2 and one frame is divided into three sub-frames (SF1, SF2, and SF3) so that a ratio of a lighting period in each sub-frame becomes 1:4:16.

Here, the sub-pixels respectively have the following area: SP1=1 and SP2=2, and the sub-frames respectively have the following lighting periods: SF1=1, SF2=4, and SF3=16.

Figure 24:
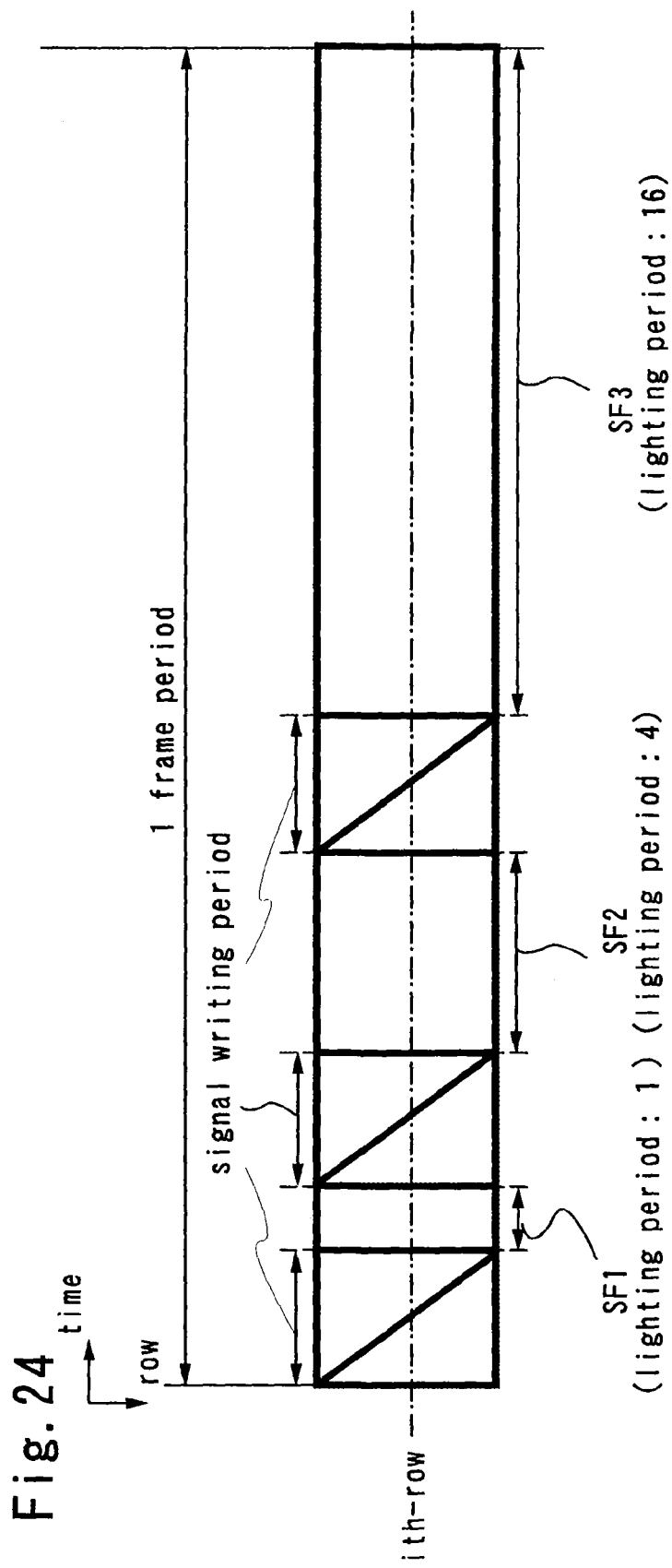
FIG. 24 is a diagram showing one example of a timing chart in a case where a period where signal is written to a pixel and a lighting period are separated.

First, FIG. 24 shows a timing chart in the case where a period where a signal is written to a pixel and a lighting period where are separated.

Note that a timing chart is a diagram showing light emission of a pixel in one frame, and a horizontal indicates a time whereas a vertical direction indicates a row where pixels are arranged.

First, signals for one screen are inputted to all pixels in a signal writing period. During this period, pixels are not lighted. After the signal writing period, a lighting period starts and pixels are lighted. The length of the lighting period at this time is 1. Next, a subsequent sub-frame starts and signals for one screen are inputted to all pixels in a signal writing period. During this period, pixels are not lighted. After the signal writing period, a lighting period starts and pixels is lighted. The length of the lighting period at this time is 4.

By repeating similar operations, the lengths of the lighting periods are arranged in the order of 1, 4, and 16.

Such a driving method where a period in which a signal is written to a pixel and a lighting period are separated is preferably applied to a plasma display. Note that, in a case where the driving method is used for a plasma display, an initialization operation and the like are required, which are omitted here for simplicity.

In addition, this driving method is also preferably applied to an EL display (an organic EL display, an inorganic EL display, a display formed of elements including an inorganic substance and an organic substance, or the like), a field emission display, a display using a Digital Micromirror Device (DMD), or the like.

Figure 25:
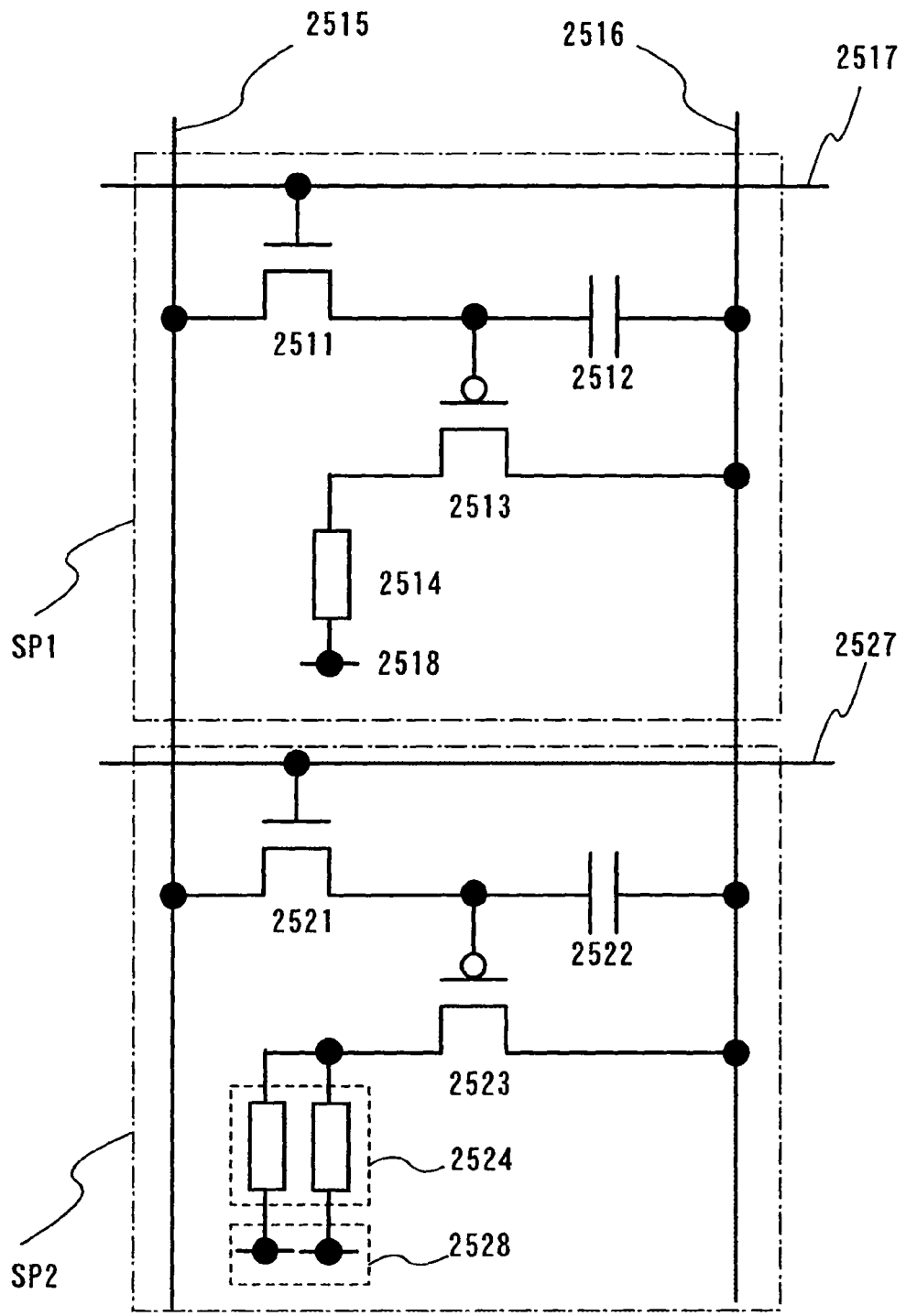
FIG. 25 is a diagram showing one example of a pixel configuration in a case where a period where signal is written to a pixel and a lighting period are separated.

FIG. 25 shows a pixel configuration of this case. FIG. 25 is a configuration example of a case where a plurality of scanning lines is provided and of which scanning lines is selected is controlled so that the number of light-emitting elements lighted is changed to express a gray scale. Note that an area of each sub-pixel is expressed by the number of the light-emitting element in FIG. 25. Therefore, there is one light-emitting element in the sub-pixel 1 and two light-emitting elements in the sub-pixel 2.

First, a pixel configuration shown in FIG. 25 will be explained. The sub-pixel 1 includes a first select transistor 2511, a first driving transistor 2513, a first holding capacitor 2512, a signal line 2515, a first power supply line 2516, a first scanning line 2517, a first light-emitting element 2514, and a second power supply line 2518.

In the first select transistor 2511, a gate electrode is connected to the first scanning line 2517, a first electrode is connected to the signal line 2515, and a second electrode is connected to a second electrode of the first holding capacitor 2512 and a gate electrode of the first driving transistor 2513. A first electrode of the first holding capacitor 2512 is connected to the first power supply line 2516. In the first driving transistor 2513, a first electrode is connected to the first power supply line 2516, and a second electrode is connected to a first electrode of the first light-emitting element 2514. A second electrode of the first light-emitting element 2514 is connected to the second power supply line 2518.

The sub-pixel 2 includes a second select transistor 2521, a second driving transistor 2523, a second holding capacitor 2522, the signal line 2515, the first power supply line 2516, a second scanning line 2527, a second light-emitting element 2524, and a third power supply line 2518. Note that connections of each element and wiring of the sub-pixel 2 is the same as those of the sub-pixel 1; thus, the explanation is omitted.

Next, an operation of the pixel shown in FIG. 25 will be explained. Here, an operation of the sub-pixel 1 will be explained. The first scanning line 2517 is selected by increasing potential of the first scanning line 2517, the first select transistor 2511 is turned on, and a signal is inputted into the first holding capacitor 2512 from the signal line 2515. Thus, in accordance with the signal, the current of the first driving transistor 2513 is controlled, and a current flows from the first power supply line 2516 to the first light-emitting element 2514. Note that an operation of the sub-pixel 2 is the same as that of the sub-pixel 1; thus, the explanation is omitted.

At this time, depending on the scanning line selected between the first and the second scanning lines, the light-emitting element lighted is changed in number. For example, when only the first scanning line 2517 is selected, only the first select transistor 2511 is turned on and the current only of the first driving transistor 2513 is controlled; therefore, only the first light-emitting element 2514 emits light. In other words, only the sub-pixel 1 emits light. On the other hand, when only the second scanning line 2527 is selected, only the second select transistor 2521 is turned on and the current only of the second driving transistor 2523 is controlled; therefore, only the second light-emitting element 2524 emits light. In other words, only the sub-pixel 2 emits light. In addition, when both the first and second scanning lines 2517 and 2527 are selected, the first and second select transistors 2511 and 2521 are turned on and the respective currents of the first and second driving transistors 2513 and 2523 are controlled; therefore, both the first and second light-emitting elements 2514 and 2524 emit light. In other words, both the sub-pixels 1 and 2 emit light.

Note that, in the signal writing period, respective potential of the second and third power supply lines 2518 and 2528 are controlled so as not to apply voltage to the light-emitting elements 2514 and 2524. For example, in a case of SP1, the second power supply line 2518 may be set in a floating state. Alternatively, the potential of the second power supply line 2518 may be made lower than the potential of the signal line 2515 by a threshold voltage of the first driving transistor 2513. Further alternatively, the potential of the second power supply line 2518 may be made equal to or higher than the that of the signal line 2515. Accordingly, the light-emitting element 2514 can be prevented from lighting in the signal writing period. Note that the same can also be said for the SP2.

Note that the second and third power supply lines 2518 and 2528 may be a different wiring or a wiring in common, respectively.

Note that, in a case of dividing one pixel into m (m is an integer number of m≥2) of sub-pixels, the number of scanning lines in one pixel may be 2 or more and m or less, and a select transistor at least in one sub-pixel of the m sub-pixels may be connected to the scanning line different from that of a select transistor in other sub-pixels in order to realize the pixel configuration shown in FIG. 25.

Figure 26:
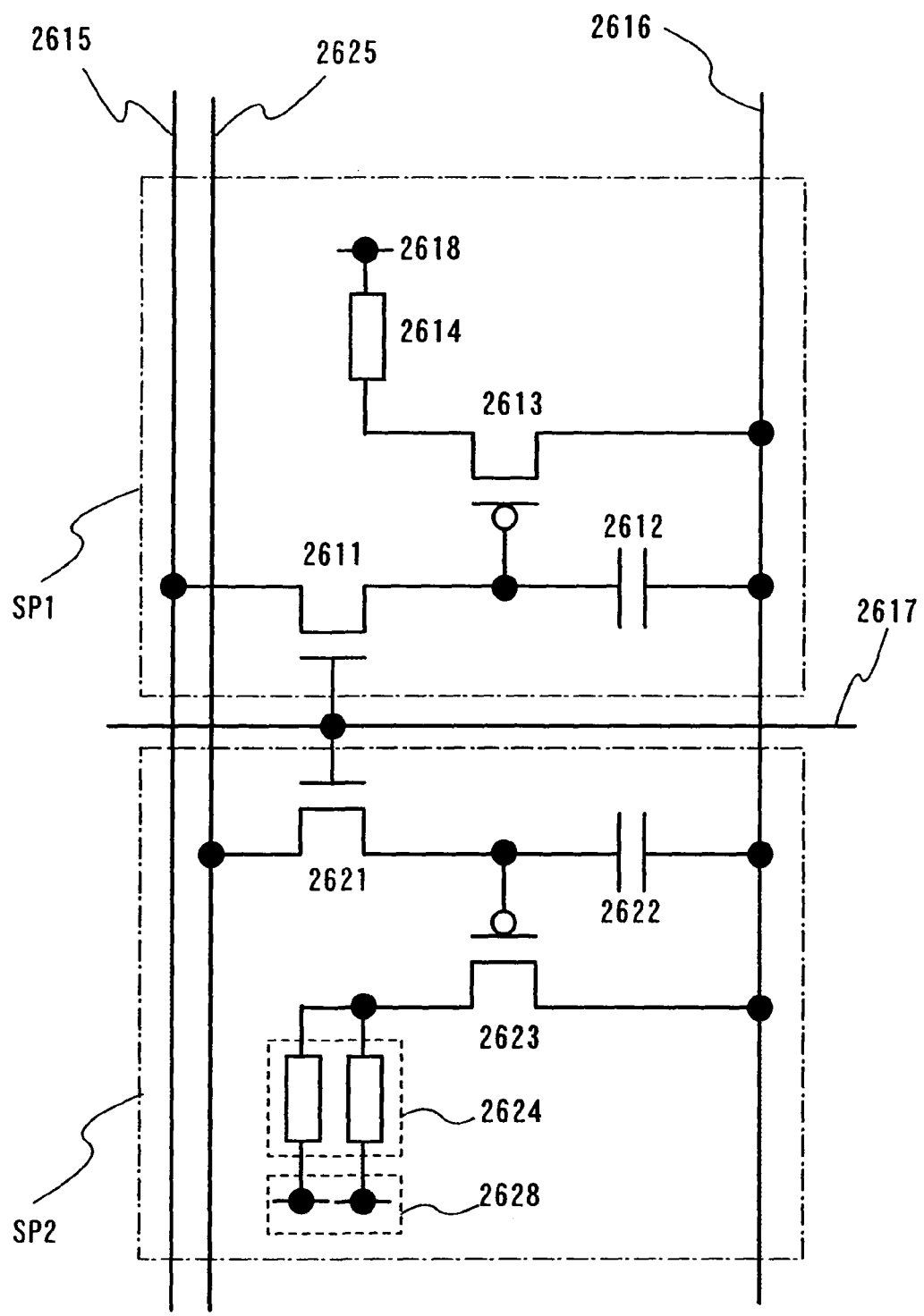
FIG. 26 is a diagram showing one example of a pixel configuration in a case where a period where signal is written to a pixel and a lighting period are separated.

Note that FIG. 25 is the configuration example of a case where a plurality of scanning lines is provided and of which scanning lines is selected is controlled so that the number of light-emitting elements lighted is changed to express a gray scale. However, it is also possible to express a gray scale by providing a plurality of signal lines and of which signal lines is selected is controlled so that the number of light-emitting elements lighted is changed. A configuration example of this case is shown in FIG. 26.

First, a pixel configuration shown in FIG. 26 will be explained. The sub-pixel 1 includes a first select transistor 2611, a first driving transistor 2613, a first holding capacitor 2612, a first signal line 2615, a first power supply line 2616, a scanning line 2617, a first light-emitting element 2614, and a second power supply line 2618.

In the first select transistor 2611, a gate is connected to the scanning line 2617, a first electrode is connected to the first signal line 2615, and a second electrode is connected to a second electrode of the first holding capacitor 2612 and a gate electrode of the first driving transistor 2613. A first electrode of the first holding capacitor 2612 is connected to the first power supply line 2616. In the first driving transistor 2613, a first electrode is connected to the first power supply line 2616, and a second electrode is connected to a first electrode of the first light-emitting element 2614. A second electrode of the first light-emitting element 2614 is connected to the second power supply line 2618.

The sub-pixel 2 includes a second select transistor 2621, a second driving transistor 2623, a second holding capacitor 2622, a second signal line 2625, the first power supply line 2616, a scanning line 2627, a second light-emitting element 2624, and a third power supply line 2628. Note that connections of each element and wiring of the sub-pixel 2 is the same as those of the sub-pixel 1; thus, the explanation is omitted.

Next, an operation of the pixel shown in FIG. 26 will be explained. Here, an operation of the sub-pixel 1 will be explained. The scanning line 2617 is selected by increasing potential of the scanning line 2617, the first select transistor 2611 is turned on, and a signal is inputted into the first holding capacitor 2612 from the first signal line 2615. Thus, in accordance with the signal, the current of the first driving transistor 2613 is controlled, and a current flows from the first power supply line 2616 to the first light-emitting element 2614. Note that an operation of the sub-pixel 2 is the same as that of the sub-pixel 1; thus, the explanation is omitted.

At this time, depending on signals inputted into the first and second signal lines 2615 and 2625, the light-emitting element lighted is changed in number. For example, when a signal of Lo is inputted into the first signal line 2615 and a signal of Hi is inputted into the second signal line 2625, only the first driving transistor 2613 is turned on; therefore, only the first light-emitting element 2614 emits light. In other words, only the sub-pixel 1 emits light. On the other hand, when a signal of Hi is inputted into the first signal line 2615 and a signal of Lo is inputted into the second signal line 2625, only the second driving transistor 2623 is turned on; therefore, only the second light-emitting element 2624 emits light. In other words, only the sub-pixel 2 emits light. In addition, when a signal of Lo is inputted into both the first and second signal lines 2615 and 2625, both the first and second driving transistors 2613 and 2623 are turned on; therefore, the first and second light-emitting elements 2614 and 2624 emit light. In other words, both the sub-pixels 1 and 2 emit light.

Note that, in a case of dividing one pixel into m (m is an integer number of m≥2) of sub-pixels, the number of signal lines in one pixel may be 2 or more and m or less, and a select transistor at least in one sub-pixel of the m sub-pixels may be connected to the signal line different from that of a select transistor in other sub-pixels in order to realize the pixel configuration shown in FIG. 26.

Figure 27:
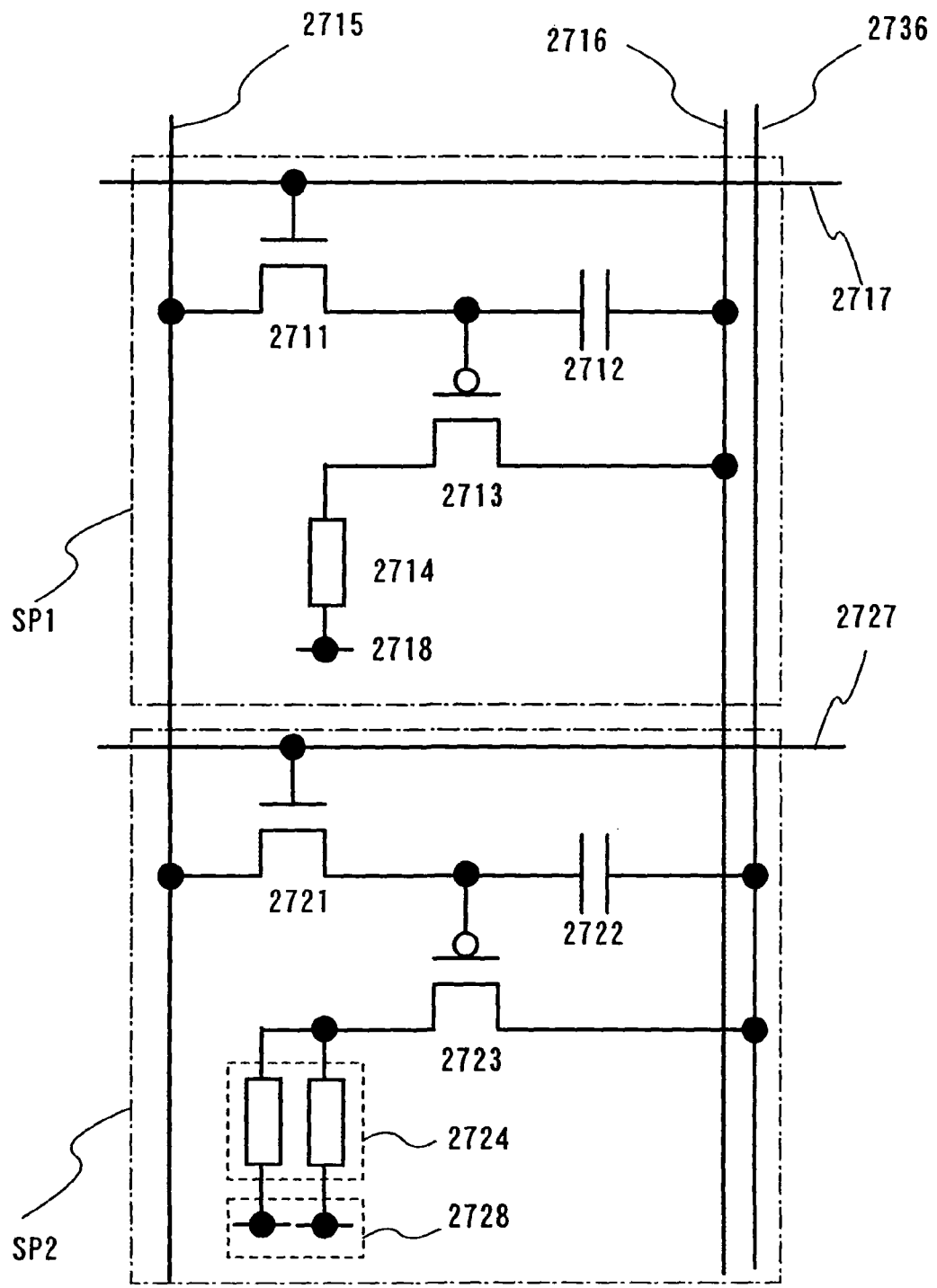
FIG. 27 is a diagram showing one example of a pixel configuration in a case where a period where signal is written to a pixel and a lighting period are separated.

Although a common power supply line (the first power supply lines 2518 and 2618) is connected to each sub-pixel in FIG. 25 and FIG. 26, a plurality of power supply lines corresponding to the first power supply lines in FIG. 25 and FIG. 26 may be provided to change a power supply voltage that is applied to each sub-pixel. For example, FIG. 27 shows a configuration example in a case where two power supply lines corresponding to the first power supply line in FIG. 25 are provided.

First, a pixel configuration shown in FIG. 27 will be explained. The sub-pixel 1 includes a first select transistor 2711, a first driving transistor 2713, a first holding capacitor 2712, a signal line 2715, a first power supply line 2716, a first scanning line 2717, a first light-emitting element 2714, and a second power supply line 2718.

In the first select transistor 2711, a gate electrode is connected to the first scanning line 2717, a first electrode is connected to the signal line 2715, and a second electrode is connected to a second electrode of the first holding capacitor 2712 and a gate electrode of the first driving transistor 2713. A first electrode of the first holding capacitor 2712 is connected to the first power supply line 2716. In the first driving transistor 2713, a first electrode is connected to the first power supply line 2716, and a second electrode is connected to a first electrode of the first light-emitting element 2714. A second electrode of the first light-emitting element 2714 is connected to the second power supply line 2718.

The sub-pixel 2 includes a second select transistor 2721, a second driving transistor 2723, a second holding capacitor 2722, the signal line 2715, a fourth power supply line 2736, a second scanning line 2727, a second light-emitting element 2724, and a third power supply line 2728. Note that connections of each element and wiring of the sub-pixel 2 is the same as those of the sub-pixel 1; thus, the explanation is omitted.

Here, it is possible to control currents that flow through the first and second light-emitting elements 2714 and 2724 by controlling voltages applied to the first and fourth power supply lines 2716 and 2736. Consequently, light-emitting intensity of each sub-pixel can be changed; thus, it is possible to express a gray scale.

Note that, in a case of dividing one pixel into m (m is an integer number of m≥2) of sub-pixels, the number of power supply lines corresponding to the first power supply lines in FIG. 25 and FIG. 26 in one pixel may be 2 or more and m or less, and a select transistor at least in one sub-pixel of the m sub-pixels may be connected to the power supply line different from that of a select transistor in other sub-pixels in order to realize the pixel configuration shown in FIG. 27.

Figure 28:
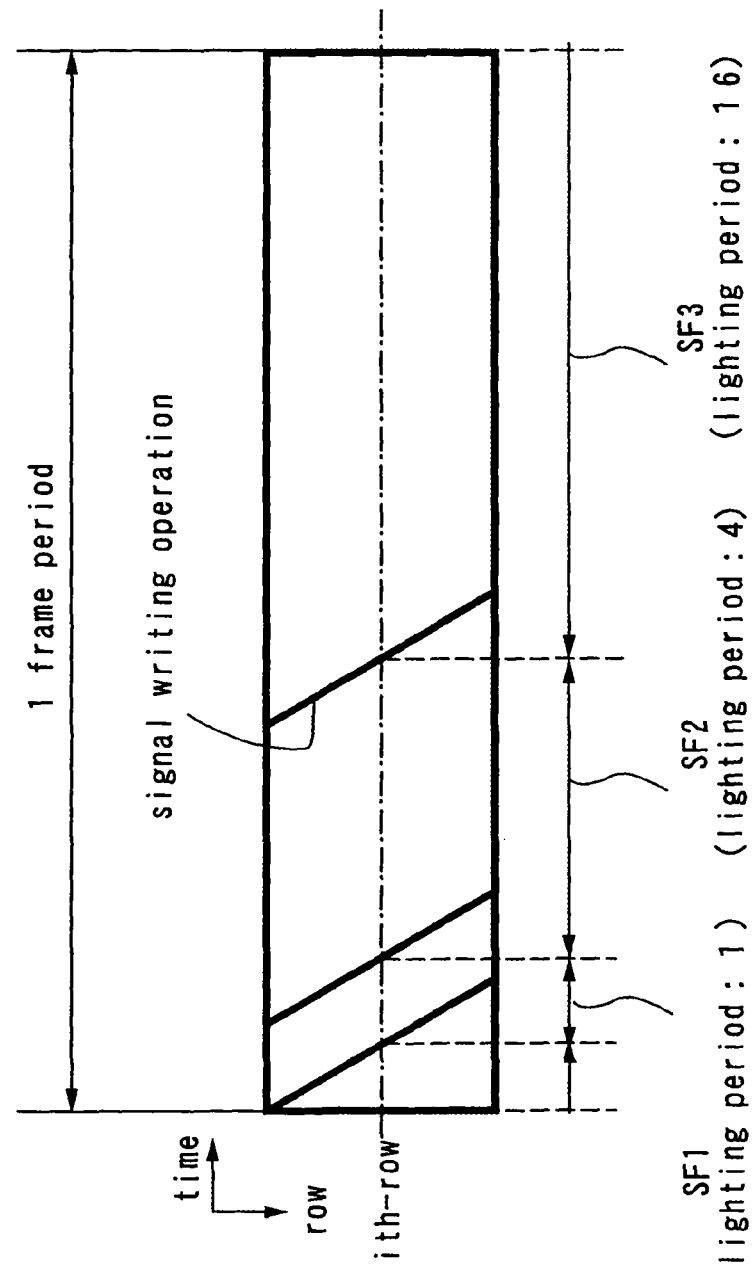
FIG. 28 is a diagram showing one example of a timing chart in a case where a period where signal is written to a pixel and a lighting period are separated.

Then, FIG. 28 shows a timing chart in a case where a period where signals are written to a pixel and a lighting period are not separated. A lighting period starts immediately after signals are written to each row.

In a certain row, after writing of signals and a predetermined lighting period are completed, a signal writing operation starts in a subsequent sub-frame. By repeating such operations, the length of the lighting periods are arranged in the order of 1, 4, and 16.

In this manner, many sub-frames can be arranged in one frame even if signals are written slowly.

Such a driving method is preferably applied to a plasma display. Note that, in a case where the driving method is used for a plasma display, an initialization operation and the like are required, which are omitted here for simplicity.

Moreover, the driving method is also preferably applied to an EL display, a field emission display, a display using a Digital Micromirror Device (DMD), or the like.

Figure 29:
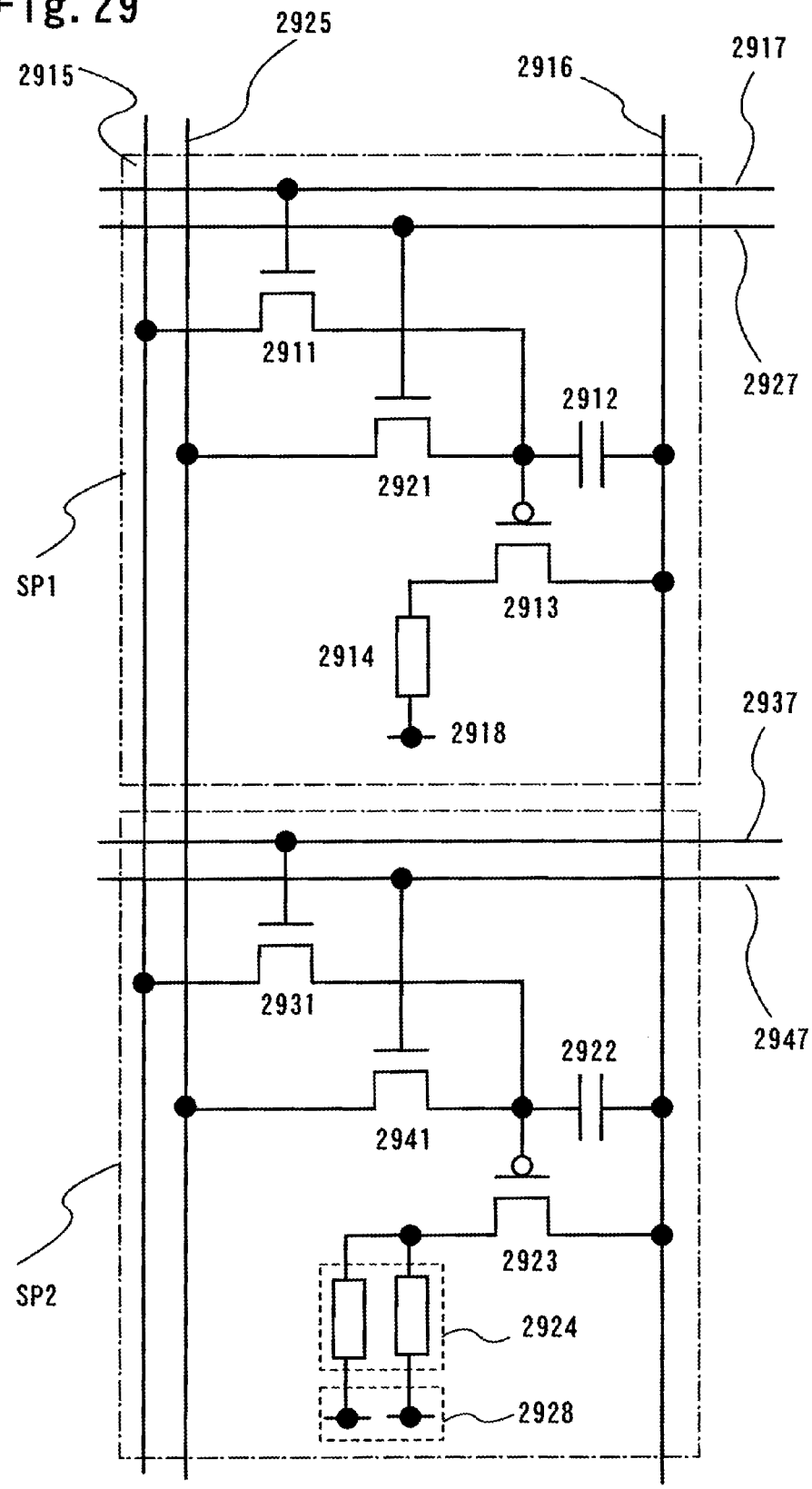
FIG. 29 is a diagram showing one example of a pixel configuration in a case where a period where signal is written to a pixel and a lighting period are separated.

Here, FIG. 29 shows a pixel configuration for realizing a driving method where a period where a signal is written to a pixel and a lighting period are not separated. Note that, in order to realize such a driving method, it is necessary that a plurality of rows can be simultaneously selected.

First, a pixel configuration shown in FIG. 29 will be explained. The sub-pixel 1 includes first and second select transistors 2911 and 2921, a first driving transistor 2913, a first holding capacitor 2912, first and second signal lines 2915 and 2925, a first power supply line 2916, first and second scanning lines 2917 and 2927, a first light-emitting element 2914, and a second power supply line 2918.

In the first select transistor 2911, a gate electrode is connected to the first scanning line 2917, a first electrode is connected to the first signal line 2915, and a second electrode is connected to a second electrode of the second select transistor 2921, a second electrode of the first holding capacitor 2912, and a gate electrode of the first driving transistor 2913. In the second select transistor 2921, a gate electrode is connected to the second scanning line 2927, and a first electrode is connected to the second signal line 2925. A first electrode of the first holding capacitor 2912 is connected to the first power supply line 2916. In the first driving transistor 2913, a first electrode is connected to the first power supply line 2916, and a second electrode is connected to a first electrode of the first light-emitting element 2914. A second electrode of the first light-emitting element 2914 is connected to the second power supply line 2918.

The sub-pixel 2 includes third and fourth select transistors 2931 and 2941, a second driving transistor 2923, a second holding capacitor 2922, the first and second signal lines 2915 and 2925, the first power supply line 2916, third and fourth scanning lines 2937 and 2947, a second light-emitting element 2924, and a third power supply line 2928. Note that connections of each element and wiring of the sub-pixel 2 is the same as those of the sub-pixel 1; thus, the explanation is omitted.

Next, an operation of the pixel shown in FIG. 29 will be explained. Here, an operation of the sub-pixel 1 will be explained. The first scanning line 2917 is selected by increasing potential of the first scanning line 2917, the first select transistor 2911 is turned on, and a signal is inputted into the first holding capacitor 2912 from the first signal line 2915. Thus, in accordance with the signal, the current of the first driving transistor 2913 is controlled, and a current flows from the first power supply line 2916 to the first light-emitting element 2914. Similarly, the second scanning line 2927 is selected by increasing potential of the second scanning line 2927, the second select transistor 2921 is turned on, and a signal is inputted into the first holding capacitor 2912 from the second signal line 2925. Thus, in accordance with the signal, the current of the first driving transistor 2913 is controlled, and a current flows from the first power supply line 2916 to the first light-emitting element 2914. Note that an operation of the sub-pixel 2 is the same as that of the sub-pixel 1; thus, the explanation is omitted.

The first and second scanning lines 2917 and 2927 can be controlled separately. Similarly, the third and fourth scanning lines 2937 and 2947 can be controlled separately. In addition, the first and second signal lines 2915 and 2925 can be controlled separately. Accordingly, signals can be inputted to pixels of two rows at the same time; thus, the driving method as shown in FIG. 28 can be achieved.

Figure 30:
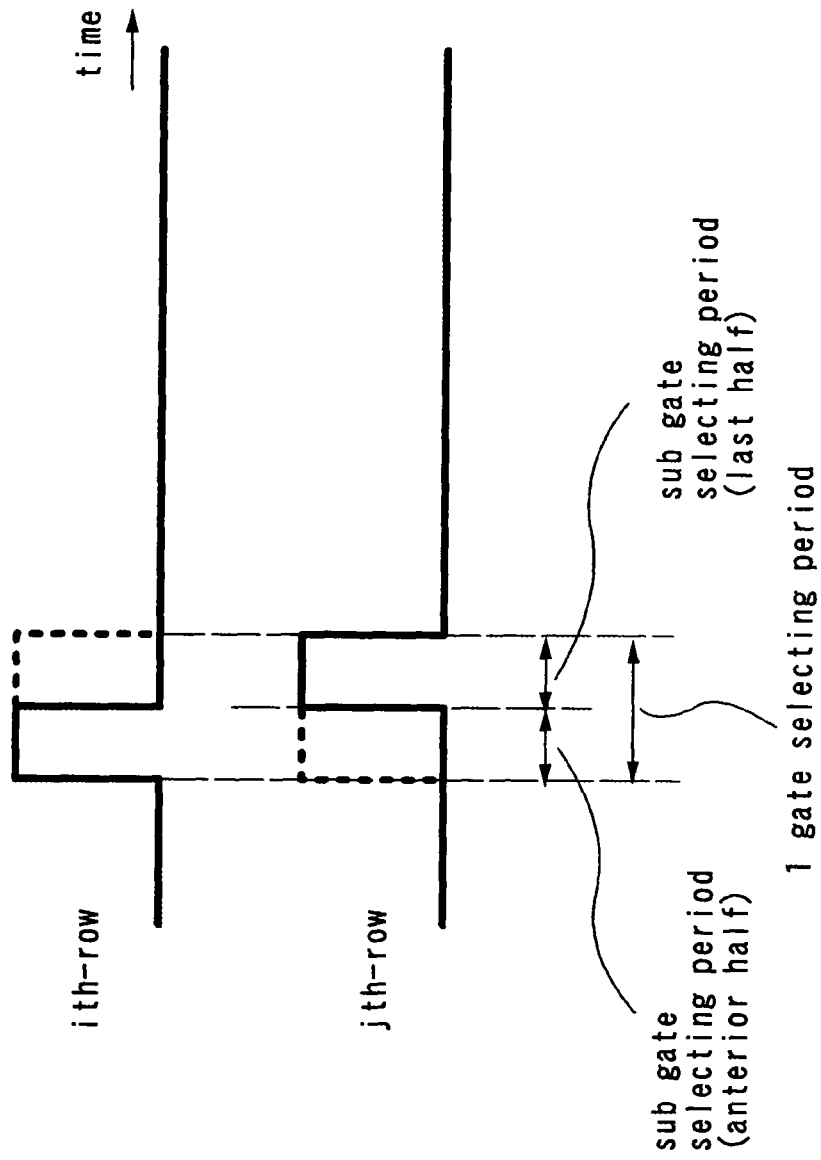
FIG. 30 is a diagram showing one example of a timing chart for selecting two rows in one gate selection period.

Note that the driving method as shown in FIG. 28 can also be achieved using the circuit in FIG. 25. FIG. 30 shows a timing chart of this case. As shown in FIG. 30, one gate selection period is divided into a plurality of sub-gate selection periods (two in FIG. 30). Each scanning line is selected in each of the sub-gate selection periods by increasing potential of each scanning line, and a corresponding signal at that time is inputted into the signal line 2515. For example, in one gate selection period, the i-th row is selected in the first half of the period and the j-th row is selected in the latter half of the period. Accordingly, an operation can be performed as if the two rows are selected at the same time in one gate selection period.

Note that details of such a driving method are mentioned in, for example, Japanese Patent Laid-Open No. 2001-324958 and the like, which can be applied in combination with the present application.

Although FIG. 29 shows an example of providing a plurality of scanning lines and signal lines, one signal line may be provided to connect the first electrodes of the first to fourth select transistors to the signal line. In addition, a plurality of power supply lines corresponding to the first power supply line in FIG. 29 may be provided.

Figure 31:
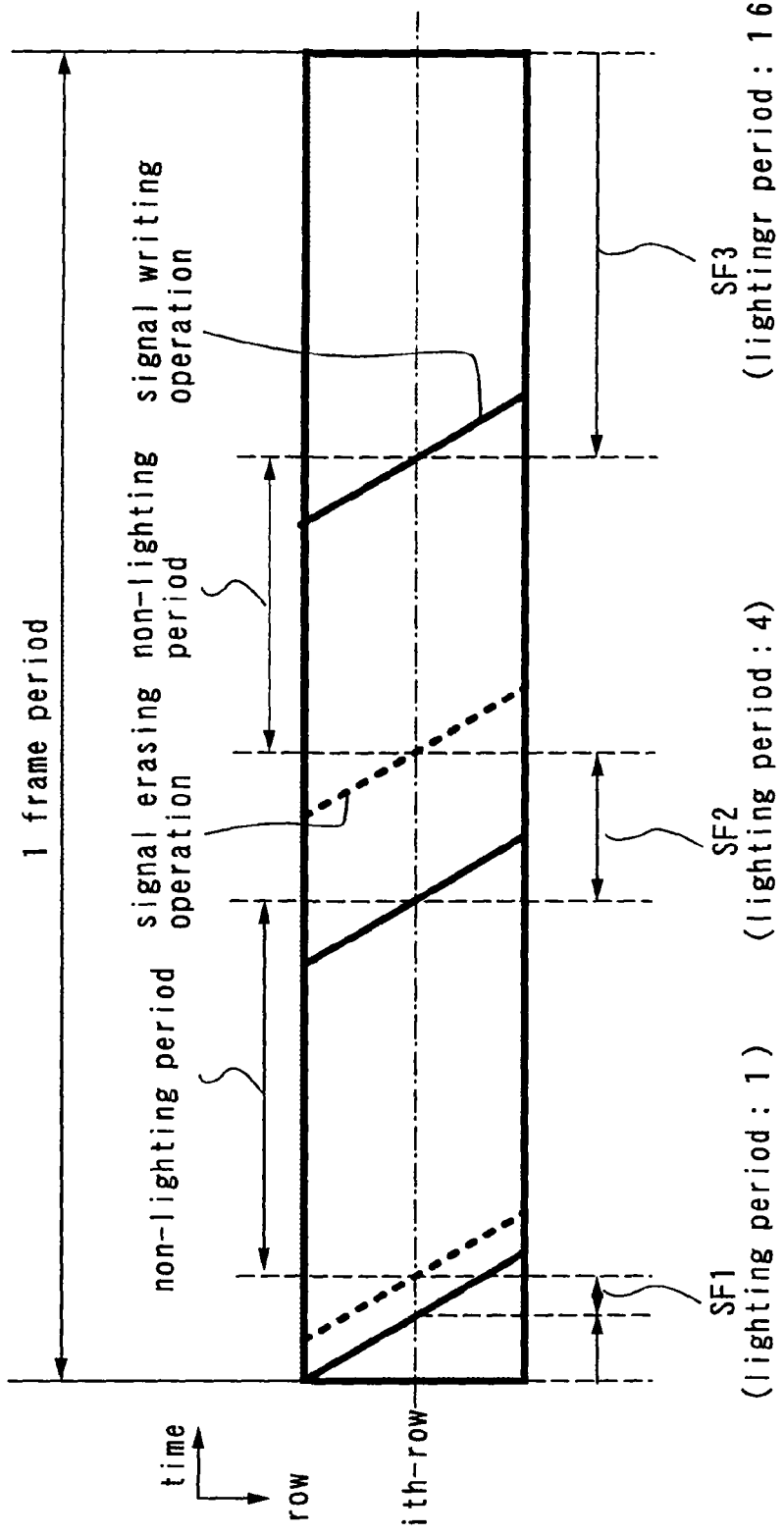
FIG. 31 is a diagram showing one example of a timing chart in a case where signals in pixels are erased.

Next, FIG. 31 shows a timing chart in a case where signals in pixels are erased. In each row, a signal writing operation is performed and the signals in the pixels are erased before a subsequent signal writing operation. In accordance with this, the length of a lighting period can be easily controlled.

In a certain row, after writing of signals and a predetermined lighting period are completed, a signal writing operation starts in a subsequent sub-frame. In a case where a lighting period is short, a signal erasing operation is performed to forcibly provide a non-light emitting state. By repeating such operations, the length of the lighting periods are arranged in the order of 1, 4, and 16.

Note that, although the signal erasing operation is performed in the case where the lighting periods are 1 and 4 in FIG. 31, the present invention is not limited thereto. The erasing operation may be performed in other lighting periods.

Accordingly, many sub-frames can be arranged in one frame even if signals are written slowly. Moreover, in the case of performing the signal erasing operation, data for erasing is not required to be obtained as well as a video signal; therefore, the driving frequency of a source driver can also be reduced.

Such a driving method is preferably applied to a plasma display. Note that, in a case where the driving method is used for a plasma display, an initialization operation and the like are required, which are omitted here for simplicity.

Moreover, the driving method is also preferably applied to an EL display, a field emission display, a display using a Digital Micromirror Device (DMD), or the like.

Figure 32:
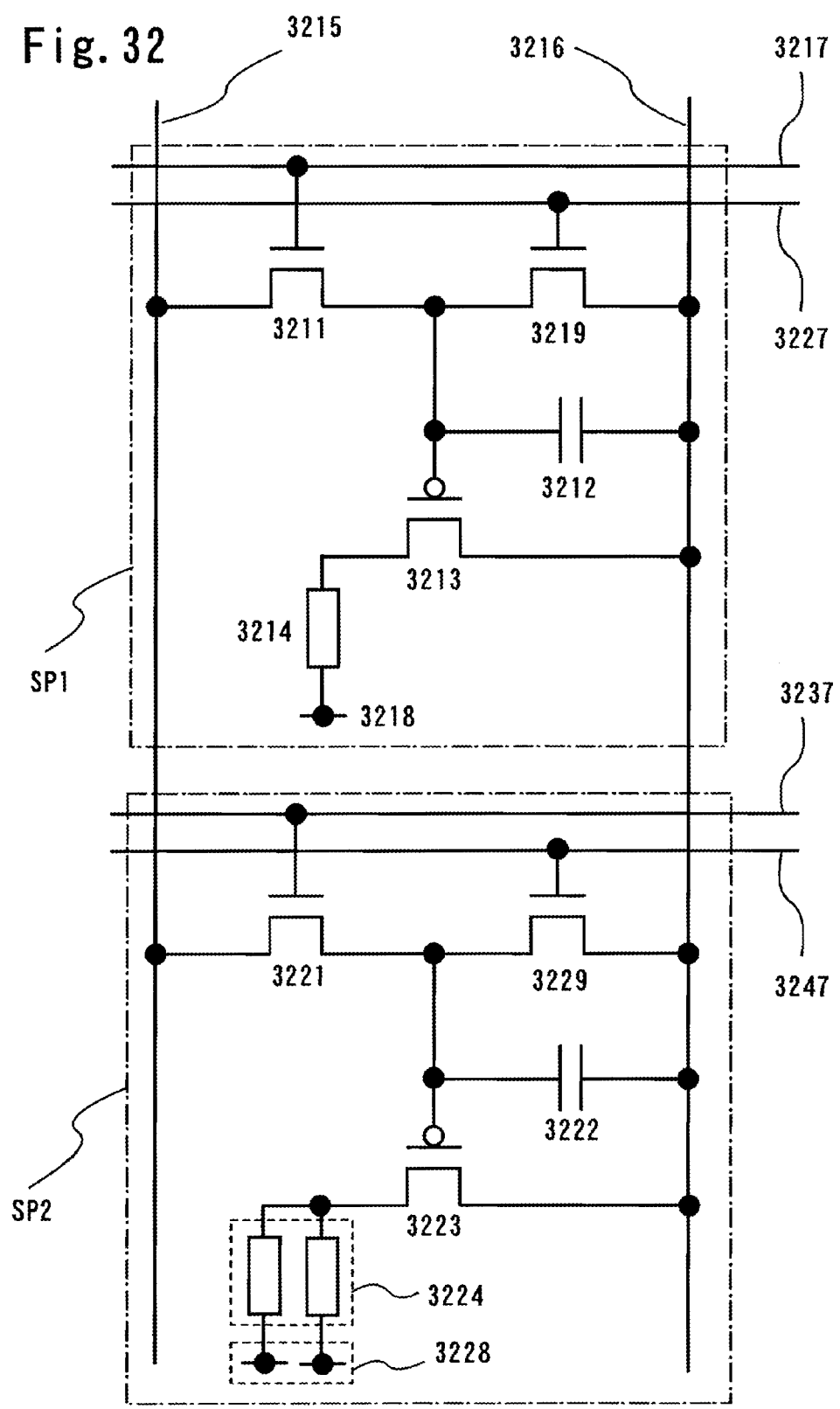
FIG. 32 is a diagram showing one example of a pixel configuration in a case where signals in pixels are erased.

Here, FIG. 32 shows a pixel configuration in a case of performing an erase operation. A pixel shown in FIG. 32 is a configuration example in a case of performing an erase operation by using an erase transistor.

First, a pixel configuration shown in FIG. 32 will be explained. The sub-pixel 1 includes a first select transistor 3211, a first driving transistor 3213, a first erase transistor 3219, a first holding capacitor 3212, a signal line 3215, a first power supply line 3216, first and second scanning lines 3217 and 3227, a first light-emitting element 3214, and a second power supply line 3218.

In the first select transistor 3211, a gate electrode is connected to the first scanning line 3217, a first electrode is connected to the signal line 3215, and a second electrode is connected to a second electrode of the first erase transistor 3219, a second electrode of the first holding capacitor 3212, and a gate electrode of the first driving transistor 3213. In the first erase transistor 3219, a gate electrode is connected to the second scanning line 3227, and a first electrode is connected to the first power supply line 3216. A first electrode of the first holding capacitor 3212 is connected to the first power supply line 3216. In the first driving transistor 3213, a first electrode is connected to the first power supply line 3216, and a second electrode is connected to a first electrode of the first light-emitting element 3214. A second electrode of the first light-emitting element 3214 is connected to the second power supply line 3218.

The sub-pixel 2 includes a second select transistor 3221, a second driving transistor 3223, a second erase transistor 3229, a second holding capacitor 3222, the signal line 3215, the first power supply line 3216, third and fourth scanning lines 3237 and 3247, a second light-emitting element 3224, and a third power supply line 3228. Note that connections of each element and wiring of the sub-pixel 2 is the same as those of the sub-pixel 1; thus, the explanation is omitted.

Next, an operation of the pixel shown in FIG. 32 will be explained. Here, an operation of the sub-pixel 1 will be explained. The first scanning line 3217 is selected by increasing potential of the first scanning line 3217, the first select transistor 3211 is turned on, and a signal is inputted into the first holding capacitor 3212 from the signal line 3215. Thus, in accordance with the signal, the current of the first driving transistor 3213 is controlled, and a current flows from the first power supply line 3216 to the first light-emitting element 3214.

In order to erase a signal, the second scanning line 3227 is selected by increasing potential of the second scanning line 3227, the first erase transistor 3219 is turned on, and the first driving transistor 3213 is turned off. Thus, no current flows through the first light-emitting element 3214. Consequently, a non-lighting period can be provided, and the length of a lighting period can be freely controlled.

Note that an operation of the sub-pixel 2 is the same as that of the sub-pixel 1; thus, the explanation is omitted.

Although the erasing transistors 3219 and 3229 are used in FIG. 32, another method may be used. This is because a non-lighting period may forcibly be provided so that no current is supplied to the light-emitting elements 3214 and 3224. Therefore, a non-lighting period may be provided by arranging a switch somewhere in a path where a current flows from the first power supply line 3216 to the second and third power supply lines 3218 and 3228 through the light-emitting elements 3214 3224, and controlling on/off of the switch. Alternatively, a gate-source voltage of the driving transistors 3213 and 3223 may be controlled to forcibly turn the driving transistors off.

Figure 33:
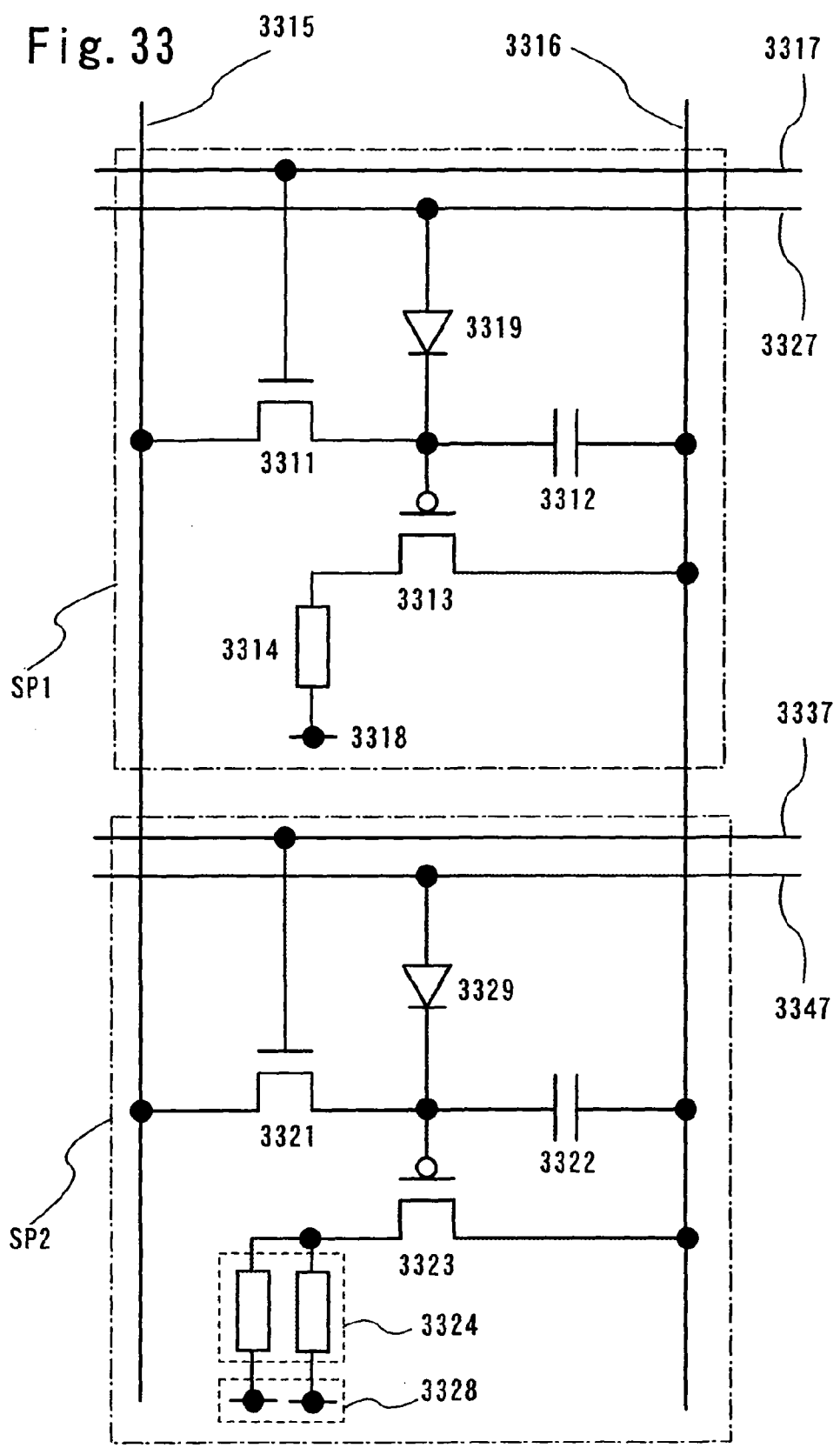
FIG. 33 is a diagram showing one example of a pixel configuration in a case where signals in pixels are erased.

Here, FIG. 33 shows an example of a pixel configuration in a case where a driving transistor is forcibly turned off. A pixel shown in FIG. 33 is a configuration example in a case where a driving transistor is forcibly turned off by using an erase diode.

First, a pixel configuration shown in FIG. 33 will be explained. The sub-pixel 1 includes a first select transistor 3311, a first driving transistor 3313, a first holding capacitor 3312, a signal line 3315, a first power supply line 3316, a first scanning line 3317, a second scanning line 3327, a first light-emitting element 3314, a second power supply line 3318, and a first erase diode 3319.

In the first select transistor 3311, a gate electrode is connected to the first scanning line 3317, a first electrode is connected to the signal line 3315, a second electrode is connected to a second electrode of the first erase diode 3319, a second electrode of the first holding capacitor 3312, and a gate electrode of the first driving transistor 3313. A first electrode of the first erase diode 3319 is connected to the second scanning line 3327. A first electrode of the first holding capacitor 3312 is connected to the first power supply line 3316. In the first driving transistor 3313, a first electrode is connected to the first power supply line 3316, and a second electrode is connected to a first electrode of the first light-emitting element 3314. A second electrode of the first light-emitting element 3314 is connected to the second power supply line 3318.

The sub-pixel 2 includes a second select transistor 3321, a second driving transistor 3323, a second holding capacitor 3322, the signal line 3315, the first power supply line 3316, third and fourth scanning lines 3337 and 3347, a second light-emitting element 3324, a third power supply line 3328, and a second erase diode 3329. Note that connections of each element and wiring of the sub-pixel 2 is the same as those of the sub-pixel 1; thus, the explanation is omitted.

Next, an operation of the pixel shown in FIG. 33 will be explained. Here, an operation of the sub-pixel 1 will be explained. The first scanning line 3317 is selected by increasing potential of the first scanning line 3317, the first select transistor 3311 is turned on, and a signal is inputted into the first holding capacitor 3312 from the signal line 3315. Thus, in accordance with the signal, the current of the first driving transistor 3313 is controlled, and a current flows from the first power supply line 3316 to the first light-emitting element 3314.

In order to erase a signal, the second scanning line 3327 is selected by increasing potential of the second scanning line 3327, the first erase diode 3319 is turned on, and a current flows from the second scanning line 3327 to the gate electrode of the first driving transistor 3313. Consequently, the first driving transistor 3313 is turned off. Thus, no current flows through the first light-emitting element 3214 from the first power supply line 3316. Consequently, a non-lighting period can be provided, and the length of a lighting period can be freely controlled.

In order to hold a signal, the second scanning line 3227 is not selected by reducing potential of the second scanning line 3327. Thus, the first erase diode 3319 is turned off and the gate potential of the first driving transistor 3313 is thus held.

Note that an operation of the sub-pixel 2 is the same as that of the sub-pixel 1; thus, the explanation is omitted.

Note that the erase diodes 3319 and 3329 may be any element as far as the erase diodes have rectifying properties. The erase diodes may be a PN diode, a PIN diode, a Schottky diode, or a zener diode.

Figure 34:
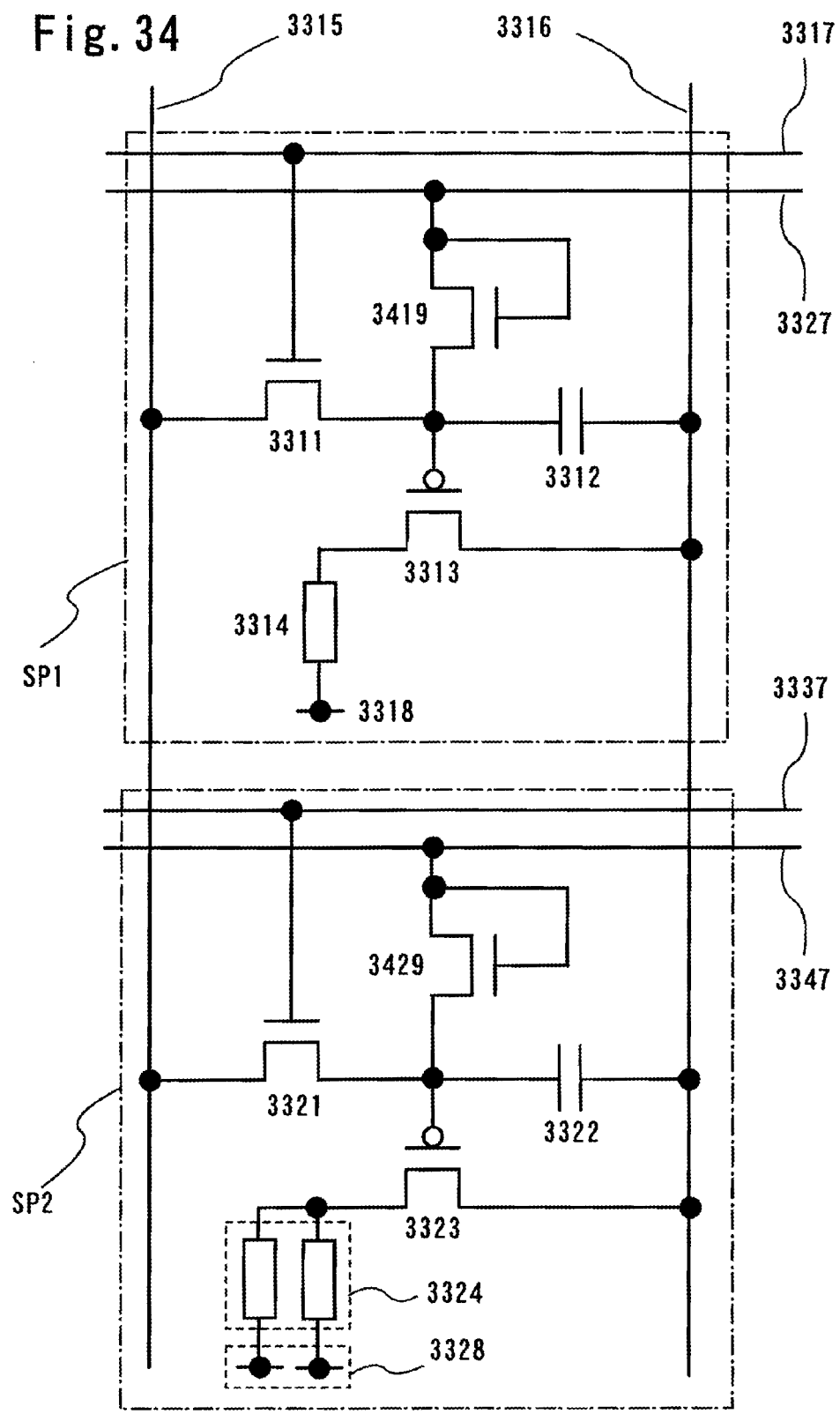
FIG. 34 is a diagram showing one example of a pixel configuration in a case where signals in pixels are erased.

In addition, a diode-connected transistor (a gate and a drain thereof are connected) may also be used. FIG. 34 shows a circuit diagram of this case. As the first and second erase diodes 3319 and 3329, diode-connected transistors 3419 and 3429 are used. Although an N-channel transistor is used as the diode-connected transistor in FIG. 34, the present invention is not limited thereto and a P-channel transistor may also be used.

Note that the driving method as shown in FIG. 31 can also be realized using the circuit in FIG. 25 as another circuit. FIG. 30 shows a timing chart of this case. As shown in FIG. 30, one gate selection period is divided into a plurality of sub-gate selection periods (two in FIG. 30). Each scanning line is selected in each of the sub-gate selection periods by increasing potential of each scanning line and a corresponding signal (a video signal and an erasing signal) at that time is inputted into the signal line 2515. For example, in a case where a signal is written to a pixel in an i-th row and the signal is erased in a pixel in a j-th row, in one gate selection period, the i-th row is selected in the first half of the sub-gate selection period and the j-th row is selected in the latter half of the sub-gate selection period. Then, when the i-th row is selected, a video signal to be inputted into the pixel in the i-th row is inputted into the signal line 2515. On the other hand, when the j-th row is selected, a signal, which turns off the driving transistor of the pixel in the j-th row, is inputted into the signal line 2515. Accordingly, an operation can be performed as if the two rows are selected at the same time in one gate selection period.

Note that details of such a driving method are mentioned in, for example, Japanese Patent Laid-Open No. 2001-324958 and the like, which can be applied in combination with the present application.

Although FIG. 32, FIG. 33, and FIG. 34 each show an example of providing a plurality of scanning lines, a plurality of signal lines may also be provided, or a plurality of power supply lines corresponding to the first power supply lines in FIG. 32, FIG. 33, and FIG. 34 may also be provided.

Note that the timing charts, pixel configurations, and driving methods that are shown in this embodiment mode are each one example, and the present invention is not limited thereto. The present invention can be applied to various timing charts, pixel configurations, and driving methods. In addition, polarity of a transistor is not limited to the one in the pixel configurations shown in this embodiment mode.

Note that a lighting period, a signal writing period, and a non-lighting period are arranged in one frame in this embodiment mode; however, the present invention is not limited thereto and other operation periods may also be arranged. For example, a period where a voltage of opposite polarity to normal polarity is applied to a light-emitting element, a so-called reverse bias period may be provided. By providing the reverse bias period, the reliability of a light-emitting element is improved in some cases.

Note that the content described in this embodiment mode can be implemented by being arbitrarily combined with the content described in Embodiment Mode 1.

(Embodiment Mode 3)

Figure 35:
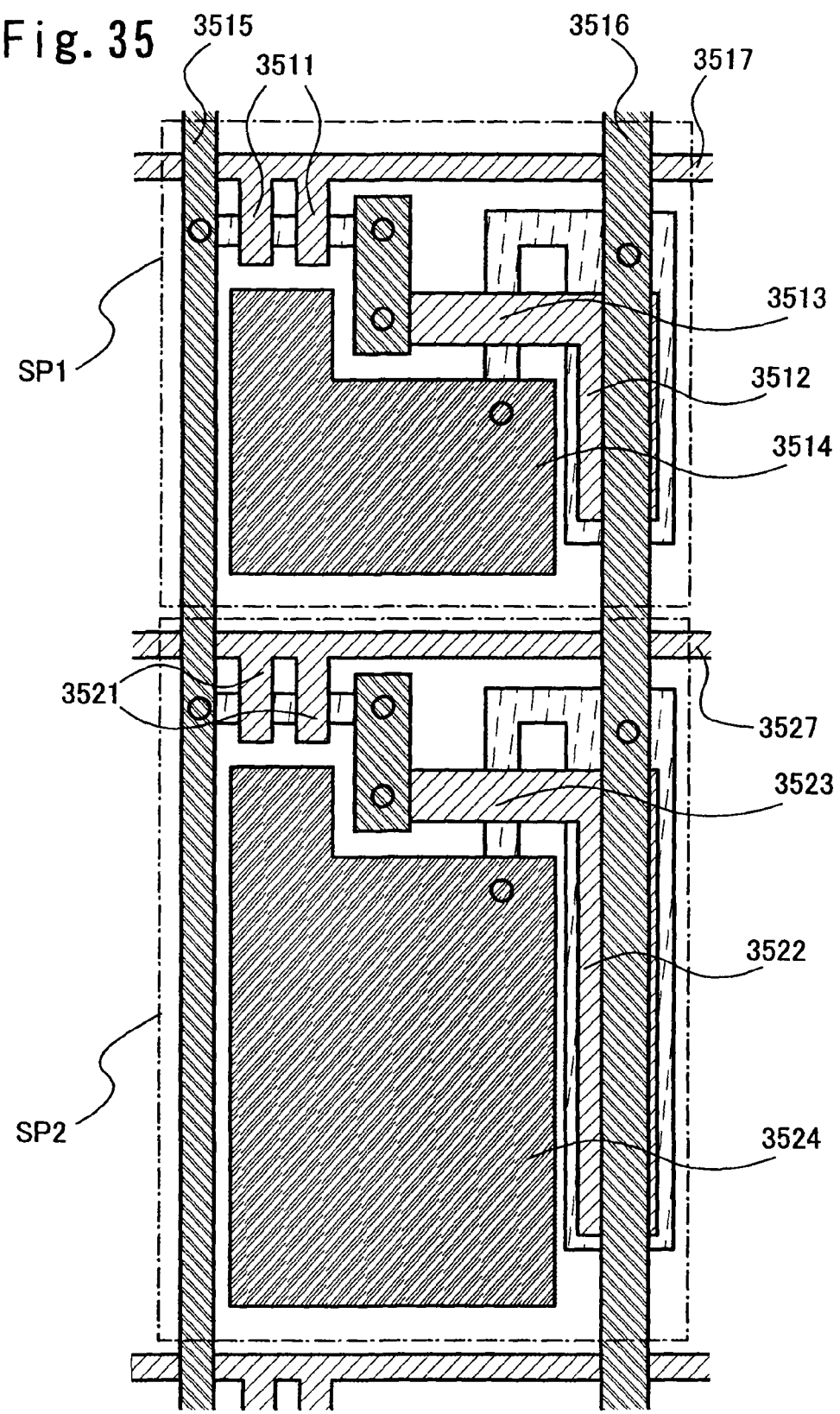
FIG. 35 is a diagram showing one example of a pixel portion layout of a display device using a driving method according to the present invention.

This embodiment mode will describe a layout of a pixel in a display device according to the present invention. As an example, FIG. 35 shows a layout diagram of the circuit diagram shown in FIG. 25. Note that the circuit diagram and the layout diagram are not limited to FIG. 25 and FIG. 35.

First and second select transistors 3511 and 3521, first and second driving transistors 3513 and 3523, first and second holding capacitors 3512 and 3522, electrodes 3514 and 3524 of first and second light-emitting elements, a signal line 3515, a power supply line 3516, and first and second scanning lines 3517 and 3527 are arranged in FIG. 35. As for a sub-pixel 1 (SP1), a source electrode and a drain electrode of the first select transistor 3511 are each connected to the signal line 3515 and a gate electrode of the first driving transistor 3513. A gate electrode of the first select transistor 3511 is connected to the first scanning line 3517. A source electrode and a drain electrode of the first driving transistor 3513 are each connected to the power supply line 3516 and the electrode 3514 of the first light-emitting element. The first holding capacitor 3512 is connected between the gate electrode of the first driving transistor 3513 and the power supply line 3516. There are the same connection relations also as for a sub-pixel 2 (SP2). Then, the electrodes 3514 and 3524 of first and second light-emitting elements have an area ratio of 1:2.

The signal line 3515 and the power supply line 3516 are each formed of a second wiring, whereas the first and second scanning lines 3517 and 3527 are each formed of a first wiring.

Figure 36:
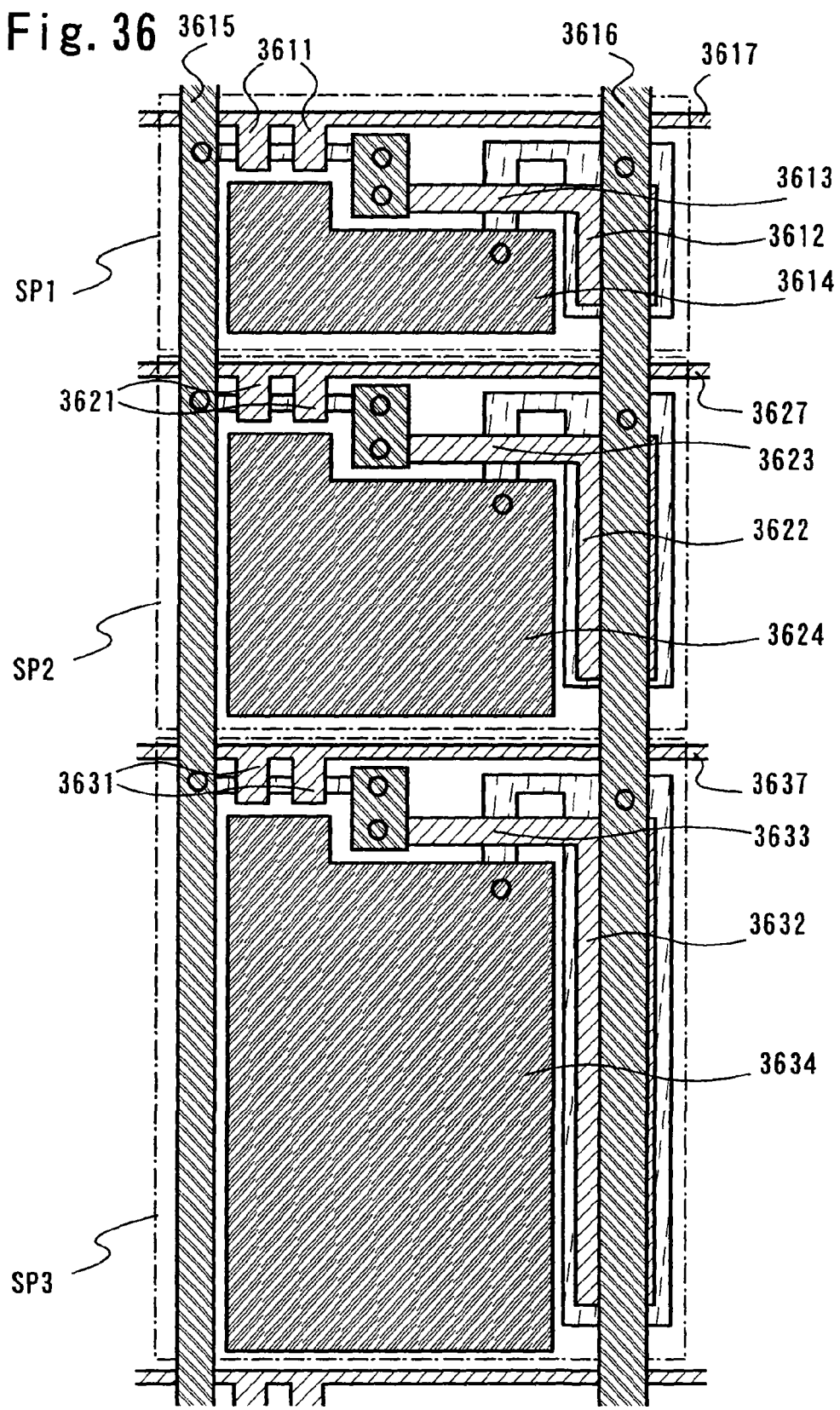
FIG. 36 is a diagram showing one example of a pixel portion layout of a display device using a driving method according to the present invention.

FIG. 36 shows a layout diagram in a case where the sub-pixels have an area ratio of 1:2:4. First, second, and third select transistors 3611 3621, and 3631, first, second, and third driving transistors 3613, 3623, and 3633, first, second, and third holding capacitors 3612, 3622, and 3632, electrodes 3614, 3624, and 3634 of first, second, and third light-emitting elements, a signal line 3615, a power supply line 3616, and first, second, and third scanning lines 3617, 3627, and 3637 are arranged in FIG. 36. Then, the electrodes 3614, 3624, and 3634 of the first, second, and third light-emitting elements have an area ratio of 1:2:4.

In a case of a top gate structure, films are formed in the order of a substrate, a semiconductor layer, a gate insulating film, a first wiring, an interlayer insulating film, and a second wiring. In a case of a bottom gate structure, films are formed in the order of a substrate, a first wiring, a gate insulating film, a semiconductor layer, an interlayer insulating film, and a second wiring.

Figure 37:
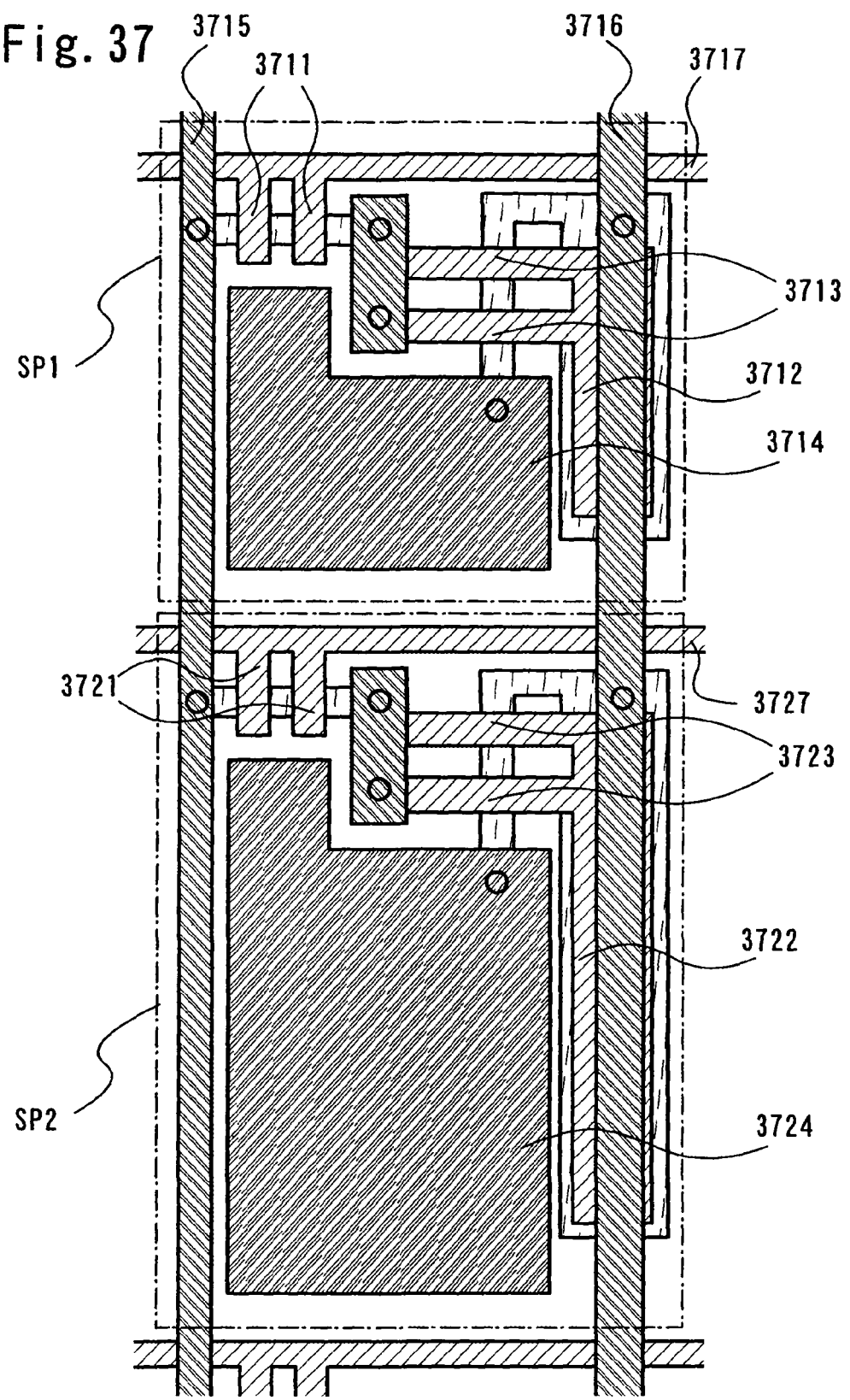
FIG. 37 is a diagram showing one example of a pixel portion layout of a display device using a driving method according to the present invention.

Although the driving transistors in this embodiment mode each have a single-gate structure, a multi-gate structure may also be employed. FIG. 37 shows a layout diagram where the driving transistors 3513 and 3523 in FIG. 35 each have a double-gate structure. In addition, as for a channel region, either a single-channel structure or a multi-channel structure may be employed.

Figure 38:
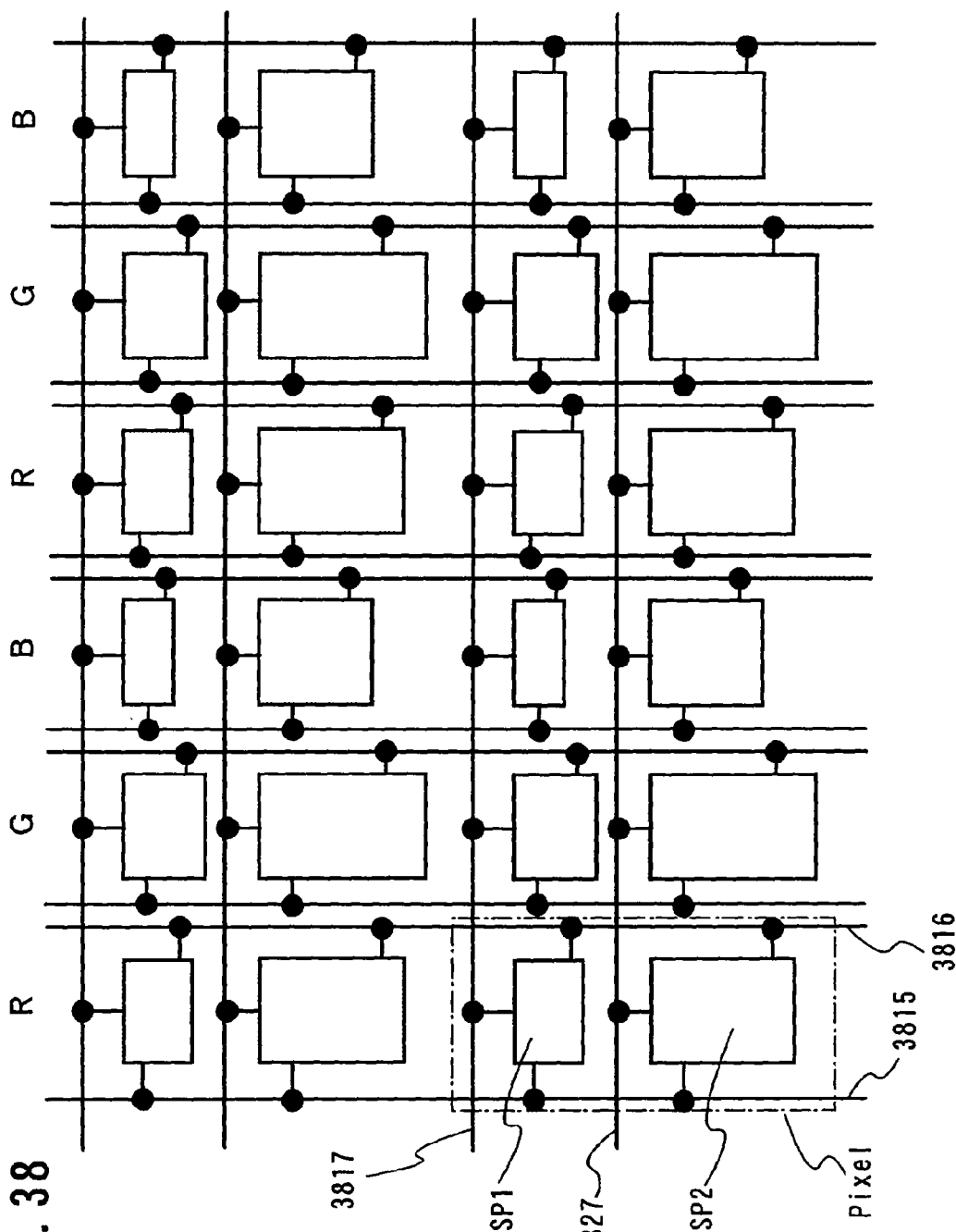
FIG. 38 is a diagram showing one example of a pixel portion layout of a display device using a driving method according to the present invention.

Note that a total light emission area of a pixel may be changed in each pixel of R (red), G (green), and B (blue). FIG. 38 shows an embodiment mode of this case. In FIG. 38, the order of a total light-emission area of a pixel, from largest to smallest, is G, R, and B. Accordingly, appropriate color balance of R, G, and B can be realized; thus, it is possible to perform color display with higher resolution.

Figure 39:
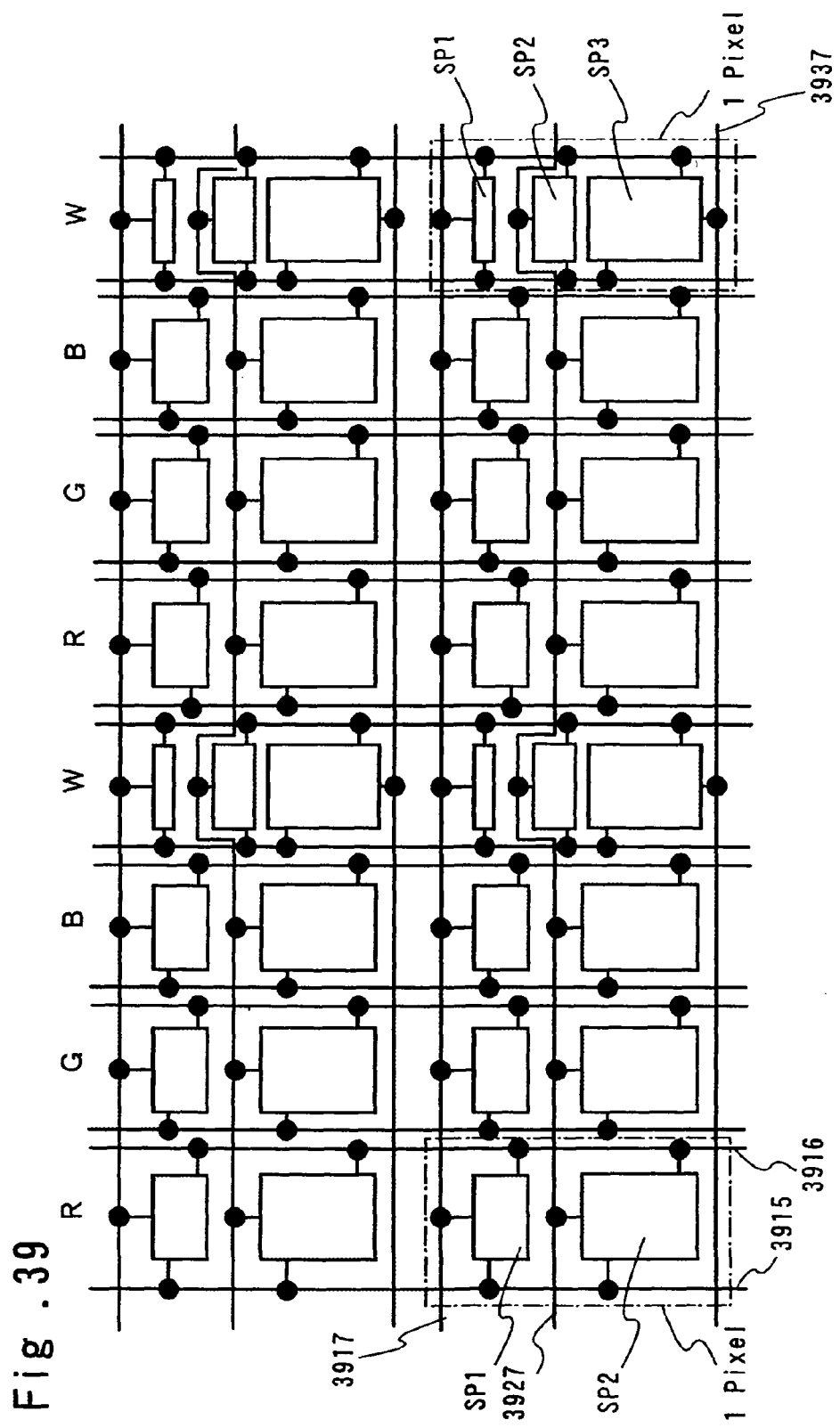
FIG. 39 is a diagram showing one example of a pixel portion layout of a display device using a driving method according to the present invention.

In addition, in a structure of R, G, B, and W (white), the number of sub-pixels in the RGB portion and the number of sub-pixels in the W portion may be different. FIG. 39 shows an embodiment mode of this case. In FIG. 39, the RGB portion is divided into two sub-pixels, and the W portion is divided into three sub-pixels. Accordingly, it is possible to perform white color display with higher resolution.

Note that the content described in this embodiment mode can be implemented by being arbitrarily combined with the content described in Embodiment Modes 1 and 2

(Embodiment Mode 4)

This embodiment mode will explain a display device and a structure and an operation of a signal line driver circuit, scanning line driver circuit, and the like. This embodiment mode will explain an example in a case where one pixel is divided into two sub-pixels (SP1 and SP2).

For example, a case of employing a type of providing a plurality of scanning lines is considered as a pixel configuration. First, in a case where a period in which a signal is written to a pixel and a lighting period are separated, a display device has a pixel portion 4001, first and second scanning line driver circuits 4002 and 4003, and a signal line driver circuit 4004, as shown in FIG. 40A. As one example, the pixel configuration of this case is as shown in FIG. 25.

First, the scanning line driver circuits will be explained. The first and second scanning line driver circuits 4002 and 4003 sequentially output select signals to the pixel portion 4001. FIG. 40B shows one example of a configuration of the first and second scanning line driver circuits 4002 and 4003. The scanning line driver circuits each include a shift register 4005, a buffer circuit 4006, and the like.

Then, operations of the first and second scanning line driver circuits 4002 and 4003 shown in FIG. 40B will be briefly explained. A clock signal (G-CLK), a start pulse (G-SP), and a clock inverted signal (G-CLKB) are inputted into the shift register 4005, and sampling pulses are sequentially outputted in accordance with the timing of these signals. The outputted sampling pulses are amplified in the buffer circuit 4006 and inputted into the pixel portion 4001 from each scanning line.

Note that a level shifter circuit may be provided as a configuration of the buffer circuit 4006. In addition, a pulse width control circuit and the like may be arranged besides the shift register 4005 and the buffer circuit 4006 in the scanning line driver circuit 4002.

Here, the first scanning line driver circuit 4002 is a driver circuit for sequentially outputting the select signals to a scanning line connected to the sub-pixel 1 (SP1), and the second scanning line driver circuit 4003 is a driver circuit for sequentially outputting the select signals to a scanning line connected to the sub-pixel 2 (SP2). Note that, generally, in a case of dividing one pixel into m (m is an integer number of m≥2) of sub-pixels, m of scanning line driver circuits may be provided.

Next, the signal line driver circuit will be explained. The signal line driver circuit 4004 sequentially outputs a video signal to the pixel portion 4001. An image is displayed in the pixel portion 4001 by controlling a state of light in accordance with the video signal. A video signal that is inputted into the pixel portion 4001 from the signal line driver circuit 4004 is a voltage in many cases. In other words, states of a light-emitting element arranged in each pixel and an element that control the light-emitting element are changed by the video signal (voltage) inputted from the signal line driver circuit 4004. As an example of the light-emitting element arranged in a pixel, an EL element, an element used for an FED (Field Emission Display), a liquid crystal, a DMD (Digital Micromirror Device), and the like can be given.

FIG. 40B shows one example of a configuration of the signal line driver circuit 4004. The signal line driver circuit 4004 includes a shift register 4007, a first latch circuit (LAT1) 4008, a second latch circuit (LAT2) 4009, an amplifier circuit 4010, and the like. Note that, as a configuration of the amplifier circuit 4010, a buffer circuit may be provided, a level shifter circuit may be provided, a circuit having a function of converting a digital signal into an analog signal may be provided, or a circuit having a function of performing gamma correction may be provided.

In addition, the pixel includes a light-emitting element such as an EL element. The light-emitting element is provided with a circuit for outputting a current (a video signal), that is, a current source circuit in some cases.

Here, an operation of the signal line driver circuit 4004 will be will be briefly explained. A clock signal (S-CLK), a start pulse (SP), and a clock inverted signal (S-CLKB) are inputted into the shift register 4007, and sampling pulses are sequentially outputted in accordance with the timing of these signals.

The sampling pulse outputted from the shift register 4007 is inputted into the first latch circuit (LAT1) 4008. Since a video signal is inputted into the first latch circuit (LAT1) 4008 from a video signal line 4011, the video signal is held in each column in accordance with the timing when the sampling pulses are inputted.

After holding of the video signal is completed up to the last column in the first latch circuit (LAT1) 4008, a latch pulse (Latch Pulse) is inputted from a latch control line 4012, and the video signal which has been held in the first latch circuit (LAT1) 4008 is transferred to the second latch circuit (LAT2) 4009 at once in a horizontal retrace period. Thereafter, the video signals of one row, which have been held in the second latch circuit (LAT2) 4009, are inputted into the amplifier circuit 4010 all at once. A signal which is outputted from the amplifier circuit 4010 is inputted into the pixel portion 4001.

The video signal which has been held in the second latch circuit (LAT2) 4009 is inputted into the amplifier circuit 4010, and while the video signal is inputted into the pixel portion 4001, the shift register 4007 outputs a sampling pulse again. In other words, two operations are performed at the same time. Accordingly, a line sequential driving can be realized. Hereafter, the above operation is repeated.

Note that the signal line driver circuit or part thereof (such as the current source circuit or the amplifier circuit) may be formed using, for example, an external IC chip instead of being provided over the same substrate as the pixel portion 4001.

By using the scanning line driver circuits and the signal line driver circuit as described above, it is possible to realize the driving in the case where a period in which a signal is written to a pixel and a lighting period are separated.

Figure 41:
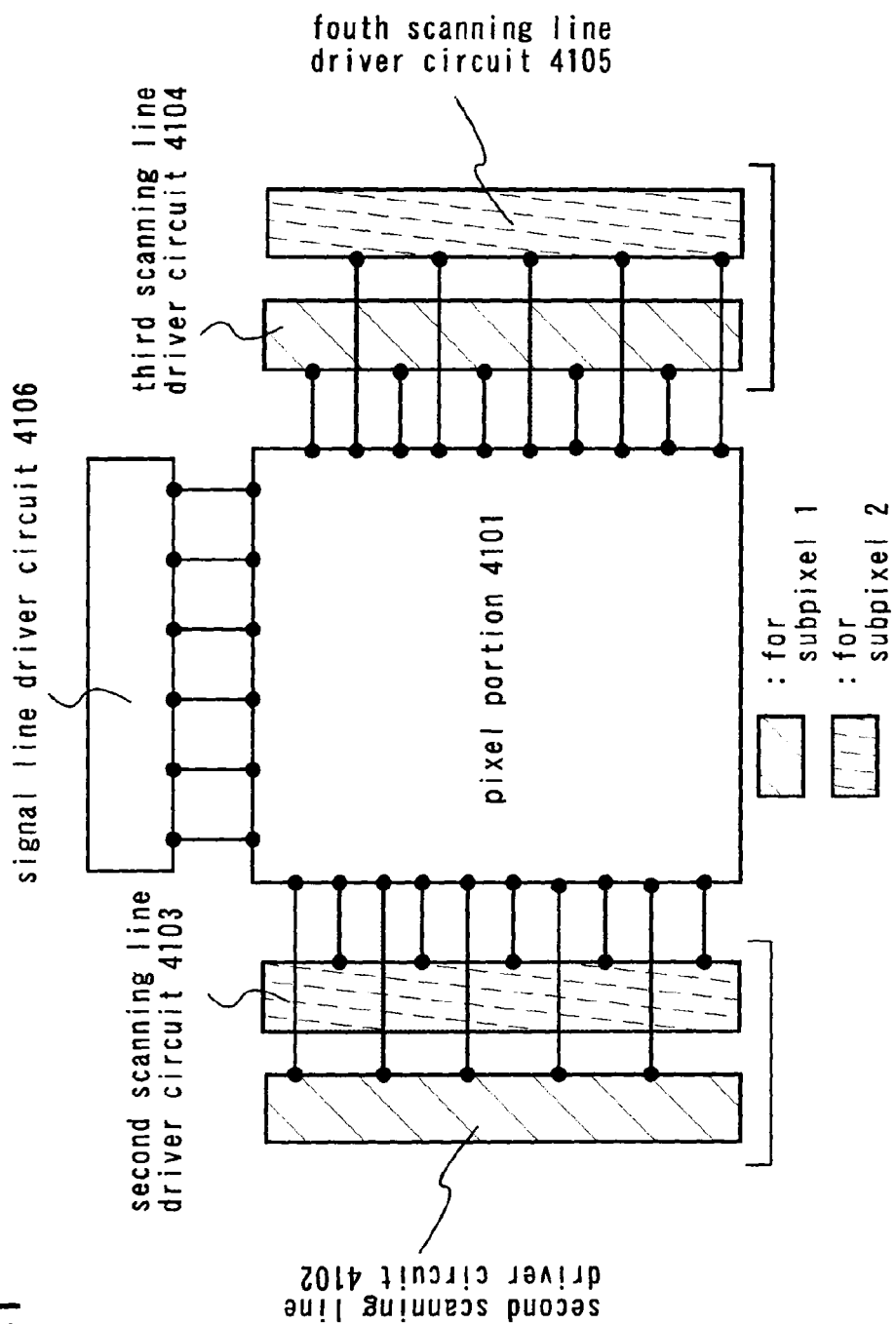
FIG. 41 is a diagram showing one example of a display device using a driving method according to the present invention.

Then, in a case of performing an operation of erasing a signal of a pixel, a display device includes a pixel portion 4101, first, second, third, and fourth scanning line driver circuits 4102, 4103, 4104, and 4105, and a signal line driver circuit 4106, as shown in FIG. 41. As one example, a pixel configuration of this case is as shown in FIG. 32. Note that the configuration of the scanning line driver circuits and the signal line driver circuit is the same as that explained in FIG. 40; thus, the explanation is omitted.

Here, the first and third scanning line driver circuits 4102 and 4104 are each a circuit for driving a scanning line connected to the sub-pixel 1. Here, the first scanning line driver circuit 4102 sequentially outputs select signals to a first scanning line (a scanning line to which a select transistor is connected) connected to the sub-pixel 1. On the other hand, the third scanning line driver circuit 4104 sequentially outputs erase signals to a second scanning line (a scanning line to which an erase transistor is connected) connected to the sub-pixel 1. Accordingly, the select signals or the erase signals are written in the sub-pixel 1.

In the same manner, the second and fourth scanning line driver circuits 4103 and 4105 are each a circuit for driving a scanning line connected to the sub-pixel 2. Here, the second scanning line driver circuit 4103 sequentially outputs select signals to a third scanning line connected to the sub-pixel 2. On the other hand, the fourth scanning line driver circuit 4105 sequentially outputs erase signals to a fourth scanning line connected to the sub-pixel 2. Accordingly, the select signals and the erase signal are written in the sub-pixel 2.

By using the scanning line driver circuits and the signal line driver circuit as described above, it is possible to realize the driving in the case of an operation of erasing a signal of a pixel.

Although this embodiment mode explains the case of employing a type of providing a plurality of scanning lines as a pixel configuration, a signal line driver circuit corresponding to each sub-pixel may be provided in a case of employing a type of providing a plurality of signal lines as a pixel configuration.

Figure 42:
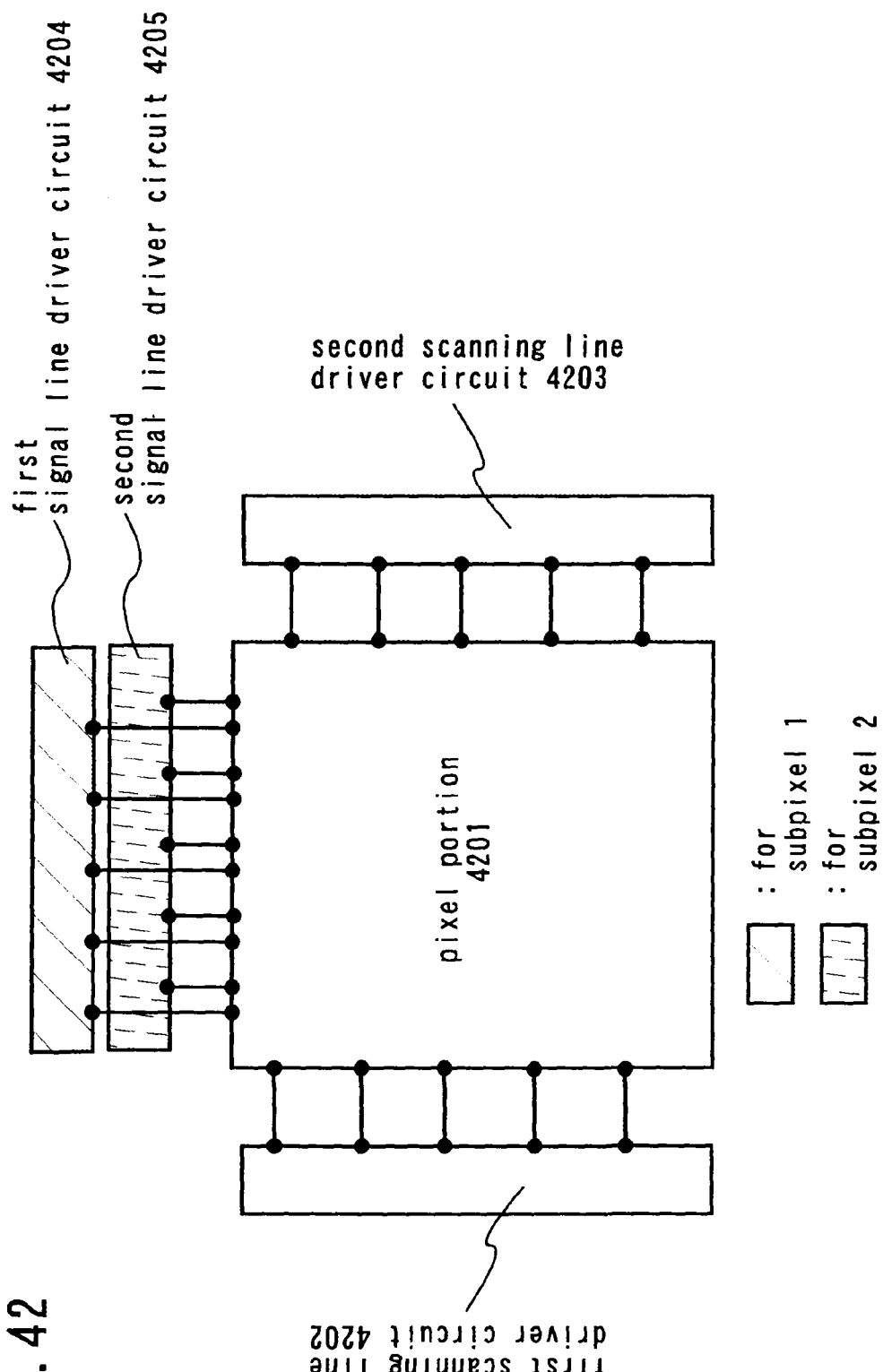
FIG. 42 is a diagram showing one example of a display device using a driving method according to the present invention.

For example, in a case of performing an operation of erasing a signal of a pixel, a display device has a pixel portion 4201, first and second scanning line driver circuits 4202 and 4203, and first and second signal line driver circuits 4204 and 4205, as shown in FIG. 42. Note that the configuration of the scanning line driver circuits and the signal line driver circuits is the same as that explained in FIG. 40; thus, the explanation is omitted.

Here, the first scanning line driver circuit 4202 is a driver circuit for sequentially outputting select signals to a first scanning line (a scanning line to which a select transistor is connected), and the second scanning line driver circuit 4003 is a driver circuit for sequentially outputting erase signals to a second scanning line (a scanning line to which an erase transistor is connected).

In addition, the first signal line driver circuit 4204 is a driver circuit for sequentially outputting video signals to a signal line connected to the sub-pixel 1 (SP1), and the second signal line driver circuit 4205 is a driver circuit for sequentially outputting video signals to a signal line connected to the sub-pixel 2 (SP2). Note that, generally, in a case of dividing one pixel into m (m is an integer number of m≥2) of sub-pixels, m of scanning line driver circuits may be provided.

By using the scanning line driver circuits and the signal line driver circuit as described above, it is possible to realize the driving in the case of an operation of erasing a signal of a pixel.

Note that the configuration of the signal line driver circuits, the scanning line driver circuits, and the like is not limited to those in FIG. 40, FIG. 41, and FIG. 42.

Note that a transistor according to the present invention may be any type of transistor, and formed over any substrate. Therefore, all the circuits as shown in FIG. 40, FIG. 41, and FIG. 42 may be formed over any substrate including a glass substrate, a plastic substrate, a single-crystalline substrate, and an SOI substrate. Alternatively, part of the circuits in FIG. 40, FIG. 41, and FIG. 42 may be formed over a certain substrate, and another part of the circuits in FIG. 40, FIG. 41, and FIG. 42 may be formed over another substrate. In other words, all the circuits in FIG. 40, FIG. 41, and FIG. 42 are not required to be formed over the same substrate. For example, in FIG. 40, FIG. 41, and FIG. 42, the pixel portion and the scanning line driver circuits may be formed over a glass substrate using transistors, and the signal line driver circuit (or part thereof) may be formed over a single-crystalline substrate as an IC chip, and then the IC chip may be mounted on the glass substrate by connecting by COG (Chip On Glass). Alternatively, the IC chip may be connected to the glass substrate by TAB (Tape Auto Bonding) or using a printed substrate.

Note that the content described in this embodiment mode corresponds to that using the content explained in Embodiment Modes 1 to 3. Therefore, the content explained in Embodiment Modes 1 to 3 can also be applied to this embodiment mode.

(Embodiment Mode 5)

This embodiment mode will explain a structure of a transistor constituting a display device of the present invention. This embodiment mode will explain a case of using an amorphous silicon (a-Si:H) film as a semiconductor layer of a transistor. FIGS. 43A and 43B each show a case of a top-gate transistor, and FIGS. 44A and 44B and FIGS. 45A and 45B each show a case of a bottom-gate transistor.

FIG. 43A shows a cross-sectional view of a top-gate transistor using amorphous silicon as its semiconductor layer. As shown in FIG. 60A, a base film 4302 is formed over a substrate 4301. Further, a pixel electrode 4303 is formed over the base film 4302. In addition, a first electrode 4304 is formed in the same layer formed from the same material as the pixel electrode 4303.

As the substrate, a glass substrate, a quartz substrate, a ceramic substrate, or the like can be used. The base film 4302 can be formed using a single layer of aluminum nitride (AlN), silicon oxide (SiO$_2$), silicon oxynitride (SiO$_X$N$_Y$), or the like, or a stacked layer thereof.

Wirings 4305 and 4306 are formed over the base film 4302, and an end portion of the pixel electrode 4303 is covered with the wiring 4305. Over the wirings 4305 and 4306, N-type semiconductor layers 4307 and 4308 each having N-type conductivity are formed. In addition, a semiconductor layer 4309 is formed over the base film 4302, between the wirings 4305 and 4306, which is partially extended to over the N-type semiconductor layers 4307 and 4308. Note that this semiconductor layer is formed using an amorphous semiconductor film such as amorphous silicon (a-Si:H) film or a microcrystalline semiconductor (μ-Si:H) film. Then, a gate insulating film 4310 is formed over the semiconductor layer 4309, and an insulating film 4311 is formed in the same layer formed from the same material as the gate insulating film 4310, also over the first electrode 4304. Note that a silicon oxide film, a silicon nitride film, or the like is used as the gate insulating film 4310.

Over the gate insulating film 4310, a gate electrode 4312 is formed. In addition, a second electrode 4313 is formed in the same layer formed from the same material as the gate electrode, over the first electrode 4304 with the insulating film 4311 interposed therebetween. A capacitor element 4319 is formed by sandwiching the insulating film 4311 between the first electrode 4304 and the second electrode 4313. An interlayer insulating film 4314 is formed to cover end portions of the pixel electrode 4303, a driving transistor 12818, and the capacitor element 4319.

Over the interlayer insulating film 4314 and the pixel electrode 4303 located in an opening of the interlayer insulating film 4314, a layer 4315 containing an organic compound and an opposite electrode 4316 are formed. A light-emitting element 4317 is formed in a region where the layer 4315 containing an organic compound is sandwiched between the pixel electrode 4303 and the opposite electrode 4316.

The first electrode 4304 shown in FIG. 43A may be a first electrode 4320 as shown in FIG. 43B. The first electrode 4320 is formed in the same layer formed from the same material as the wirings 4305 and 4306.

FIGS. 44A and 44B are partial cross-sectional views of a panel of a display device provided with a bottom-gate transistor using amorphous silicon for its semiconductor layer.

A gate electrode 4403 is formed over a substrate 4401. In addition, a first electrode 4404 is formed in the same layer formed from the same material as the gate electrode. As a material for the gate electrode 4403, polycrystalline silicon to which phosphorus is added can be used. Other than polycrystalline silicon, silicide that is a compound of metal and silicon may be used as well.

Then, a gate insulating film 4405 is formed to cover the gate electrode 4403 and the first electrode 4404. The gate insulating film 4405 is formed using a silicon oxide film, a silicon nitride film, or the like.

A semiconductor layer 4406 is formed over the gate insulating film 4405. In addition, a semiconductor layer 4407 is formed in the same layer formed from the same material as the semiconductor layer 4406.

N-type semiconductor layers 4408 and 4409 each having N-type conductivity are formed over the semiconductor layer 4406, and an N-type semiconductor layer 4410 is formed over the semiconductor layer 4407.

Wirings 4411 and 4412 are formed over the N-type semiconductor layers 4408, 4409, and 4410, respectively, and a conductive layer 4413 is formed in the same layer formed from the same material as the wirings 4411 and 4412, over the N-type semiconductor layer 4410.

Thus, a second electrode formed of the semiconductor layer 4407, the N-type semiconductor layer 4410, and the conductive layer 4413 are formed. Note that a capacitor element 4420 is formed in which the gate insulating film 4405 is sandwiched between the second electrode and the first electrode 4404.

One end portion of the wiring 4411 is extended, and a pixel electrode 4414 is formed over the extended wiring 4411.

An insulator 4415 is formed to cover end portions of the pixel electrode 4414, a driving transistor 4419, and the capacitor element 4420.

Then, a layer 4416 containing an organic compound and an opposite electrode 4417 are formed over the pixel electrode 4414 and the insulator 4415. A light-emitting element 4418 is formed in a region where the layer 4416 containing an organic compound is sandwiched between the pixel electrode 4414 and the opposite electrode 4417.

The semiconductor layer 4407 and the N-type semiconductor layer 4410 which are part of the second electrode of the capacitor element need not necessarily be provided. In other words, the second electrode may be constituted only by the conductive layer 4413, so that the capacitor element may have a structure in which the gate insulating film is sandwiched between the first electrode 4404 and the conductive layer 4413.

Note that the pixel electrode 4414 may be formed before forming the wiring 4411 in FIG. 44A, so that a capacitor element 4422 can be formed in which the gate insulating film 4405 is sandwiched between a second electrode 4421 formed of the pixel electrode 4414 and the first electrode 4404 as shown in FIG. 44B.

Note that FIGS. 44A and 44B show inverted-staggered channel-etch type transistors; however, a channel protective type transistor may also be used. A case of a channel protective type transistor will be explained with reference to FIGS. 45A and 45B.

A channel protective type transistor shown in FIG. 45A is different from the channel-etch type driving transistor 4419 shown in FIG. 44A in that an insulator 4501 serving as an etching mask is provided over the channel formation region in the semiconductor layer 4406. The other common portions are denoted by the same reference numerals.

Similarly, a channel-protective type transistor shown in FIG. 45B is different from the channel-etch type driving transistor 4419 shown in FIG. 44B in that the insulator 4501 serving as an etching mask is provided over the channel formation region in the semiconductor layer 4406. The other common portions are denoted by the same reference numerals.

It is possible to reduce manufacturing cost by using an amorphous semiconductor film as a semiconductor layer (such as a channel formation region, a source region, and a drain region) of a transistor included in the pixel of the present invention.

Note that structures of a transistor and a capacitor element, to which the pixel configuration of the present invention can be applied, are not limited to the above structures, and various structures of a transistor and a capacitor element can be used.

Note that the content described in this embodiment mode can be implemented by being arbitrarily combined with the content described in Embodiment Modes 1 to 4.

(Embodiment Mode 6)

This embodiment mode will explain a method for manufacturing a display device using plasma treatment as a method for manufacturing a display device including a transistor.

Figure 46A:
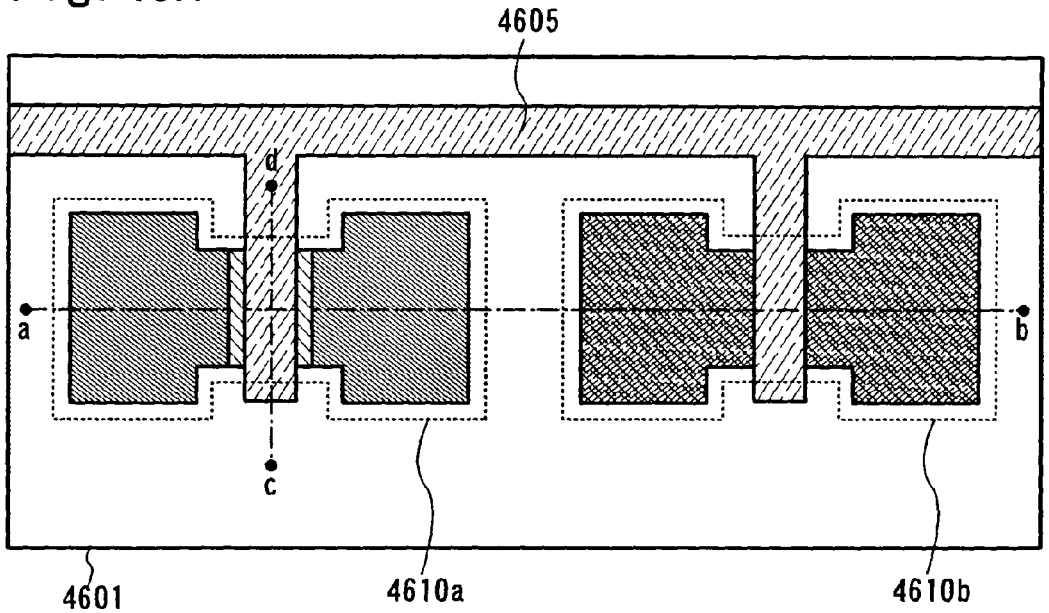
FIGS. 46A to 46C are views each showing a structure of a transistor used for a display device according to the present invention.
Figure 46B:
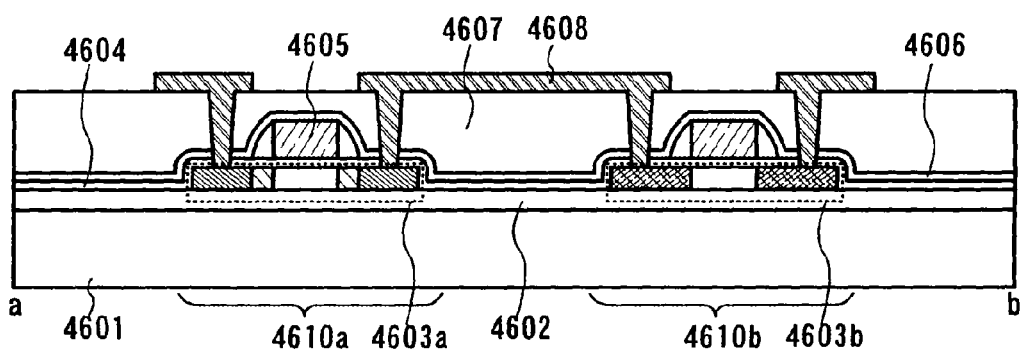
Figure 46C:
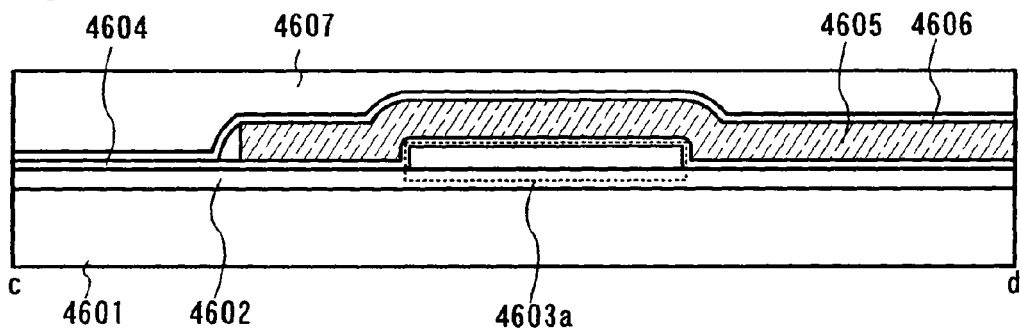

FIGS. 46A to 46C are views each showing a structure example of a display device including a transistor. Note that, in FIGS. 46A to 46C, FIG. 46B corresponds to a cross-sectional view taken along a-b of FIG. 46A, and FIG. 46C corresponds to a cross-sectional view taken along c-d of FIG. 46A.

A display device shown in FIGS. 46A to 46C includes semiconductor films 4603a and 4603b provided over a substrate 4601 with an insulating film 4602 interposed therebetween, a gate electrode 4605 provided over the semiconductor films 4603a and 4603b with a gate insulating film 4604 interposed therebetween, insulating films 4606 and 4607 provided to cover the gate electrode, and a conductive film 4608 which is electrically connected to source or drain region of the semiconductor films 4603a and 4603b and provided over the insulating film 4607. Note that FIGS. 46A to 46C each show a case of providing an N-channel transistor 4610a using part of the semiconductor film 4603a as a channel region and a P-channel transistor 4610b using part of the semiconductor film 4603b as a channel region; however, the present invention is not limited to this structure. For example, in FIGS. 46A to 46C, although an LDD region is provided in the N-channel transistor 4610a but not in the P-channel transistor 4610b, an LDD region can be provided in both of the transistors or neither of the transistors.

Note that, in this embodiment mode, a display device shown in FIGS. 46A to 46C is manufactured by oxidizing or nitriding at least one of the substrate 4601, the insulating film 4602, the semiconductor films 4603a and 4603b, the gate insulating film 4604, the insulating film 4606, and the insulating film 4607 by plasma treatment, so that the semiconductor film or the insulating film is oxidized or nitrided. In this manner, by oxidizing or nitriding the semiconductor film or the insulating film by plasma treatment, the surface of the semiconductor film or the insulating film is modified. Consequently, a denser insulating film can be formed as compared to an insulating film formed by a CVD method or a sputtering method. Therefore, a defect such as a pinhole can be suppressed and the characteristics or the like of a display device can be improved.

In this embodiment mode, a method for manufacturing a display device by performing plasma treatment to the semiconductor film 4603a, the semiconductor film 4603b, or the gate insulating film 4604 in the above FIGS. 46A to 46C and oxidizing or nitriding the semiconductor film 4603a, the semiconductor film 4603b, or the gate insulating film 4604 will be explained with reference to the drawings.

Initially, the edge portions of an island-shaped semiconductor film provided over a substrate are formed almost vertically.

First, the island-shaped semiconductor films 4603a and 4603b are formed over the substrate 4601 (FIG. 47A). The island-shaped semiconductor films 4603a and 4603b are formed by forming an amorphous semiconductor film with the use of a material containing silicon (Si) as a main component over the insulating film 4602, which is formed in advance over the substrate 4601, by a sputtering method, an LPCVD method, a plasma CVD method, or the like, and then the amorphous semiconductor film is crystallized and selectively etched. Note that the amorphous semiconductor film can be crystallized by a crystallization method such as a laser crystallization method, a thermal crystallization method using RTA or an annealing furnace, a thermal crystallization method using a metal element which promotes crystallization, or a method using these methods in combination. Note that, in FIGS. 47A to 47D, the edge portions of the island-shaped semiconductor films 4603a and 4603b are formed almost vertically ($\theta$=85 to 100°).

Next, the semiconductor films 4603a and 4603b are oxidized or nitrided by plasma treatment to form oxide films or nitride films 4621a and 4621b (hereinafter, also referred to as insulating films 4621a and 4621b) over the surfaces of the semiconductor films 4603a and 4603b, respectively (FIG. 47B). In a case of using Si for the semiconductor films 4603a and 4603b, for example, silicon oxide ($SiO_x$) or silicon nitride ($SiN_x$) is formed as the insulating films 4621a and 4621b. In addition, after oxidizing the semiconductor films 4603a and 4603b by plasma treatment, they may be nitrided by plasma treatment again. In this case, silicon oxide ($SiO_x$) is formed in contact with the semiconductor films 4603a and 4603b and silicon nitride oxide ($SiN_xO_y$) (x>y) is formed over the surface of the silicon oxide. Note that, in the case of oxidizing the semiconductor films by plasma treatment, plasma treatment is performed under an oxygen atmosphere (for example, under an atmosphere containing oxygen ($O_2$) and a rare gas (at least one of He, Ne, Ar, Kr, and Xe), an atmosphere containing oxygen, hydrogen ($H_2$), and a rare gas, or an atmosphere containing dinitrogen monoxide and a rare gas). On the other hand, in the case of nitriding the semiconductor films by plasma treatment, plasma treatment is performed under a nitrogen atmosphere (for example, under an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As a rare gas, for example, Ar can be used. A gas in which Ar and Kr are mixed may also be used as well. Accordingly, the insulating films 4621a and 4621b contain the rare gas (containing at least one of He, Ne, Ar, Kr, and Xe) used for the plasma treatment. When Ar is used, the insulating films 4621a and 4621b contain Ar.

In addition, the plasma treatment is performed with an electron density of $1 \times 10^{11}$ or more and $1 \times 10^{13}$ cm$^{-3}$ or less and an electron temperature of plasma of 0.5 or more 1.5 eV or less in the atmosphere containing the gas described above. The electron density of plasma is high and the electron temperature around an object (here, the semiconductor films 4603a and 4603b) formed over the substrate 4601 is low. Thus, plasma damages to the object can be avoided. In addition, since the electron density of plasma is $1 \times 10^{11}$ cm$^{-3}$ or more, the oxide film or the nitride film formed by oxidizing or nitriding the object by the plasma treatment has a superior evenness in film thickness as compared to a film formed by a CVD method, a sputtering method, or the like, and thus, can be a dense film. Moreover, since the electron temperature of plasma is 1 eV or lower, the oxidation treatment or the nitriding treatment can be performed at a lower temperature than conventional plasma treatment or a thermal oxidation method. For example, the oxidation treatment or the nitriding treatment can be performed sufficiently even when the plasma treatment is performed at a lower temperature by at least 100° C. than a distortion point of a glass substrate. As the frequency for producing plasma, a high frequency wave such as a microwave (2.45 GHz) can be employed. Hereinafter, the plasma treatment is performed with the above conditions unless specifically referred.

Next, the gate insulating film 4604 is formed to cover the insulating films 4621a and 4621b (FIG. 47C). The gate insulating film 4604 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) by a sputtering method, an LPD method, a plasma CVD method, or the like. For example, when Si is used for the semiconductor films 4603a and 4603b, and silicon is oxidized by the plasma treatment, silicon oxide is formed as the insulating films 4621a and 4621b over the surfaces of the semiconductor films 4603a and 4603b. In this case, silicon oxide ($SiO_x$) is formed as the gate insulating film over the insulating films 4621a and 4621b. In addition, when the thickness is made thinner, in FIG. 47B, it is possible that the insulating films 4621a and 4621b which are formed by oxidizing or nitriding the semiconductor films 4603a and 4603b by the plasma treatment, are used as the gate insulating films.

Then, by forming the gate electrode 4605 or the like over the gate insulating film 4604, it is possible to manufacture a display device having the N-channel transistor 4610a and the P-channel transistor 4610b each using the island-shaped semiconductor films 4603a and 4603b as channel regions (FIG. 47D).

Before forming the gate insulating film 4604 over the semiconductor films 4603a and 4603b, the surface of each of the semiconductor films 4603a and 4603b is oxidized or nitrided by the plasma treatment. Consequently, a short-circuit or the like between the gate electrode and the semiconductor film due to a coverage defect of the gate insulating film 4604 in end portions 4651a and 4651b of the channel regions can be prevented. In other words, in a case where the angles of the end portions of the island-shaped semiconductor films are formed almost vertical ($\theta$=85 to 100°), when the gate insulating film is formed to cover the semiconductor films by a CVD method, a sputtering method or the like, there is a risk of a coverage defect due to breakage of the gate insulating film, or the like at the end portions of the semiconductor films. However, when the plasma treatment is performed to the surface of the semiconductor film to oxide or nitride the surface, coverage defects and the like of the gate insulating film at the end portion of the semiconductor film can be prevented.

In FIGS. 47A to 47D, the gate insulating film 4604 may be oxidized or nitrided by performing plasma treatment after forming the gate insulating film 4604. In this case, the gate insulating film 4604 is formed to cover the semiconductor films 4603a and 4603b (FIG. 48A), and plasma treatment is performed to the gate insulating film 4604 to oxidize or nitride the gate insulating film 4604; therefore, an oxide film or a nitride film 4623 (hereinafter also referred to as an insulating film 4623) is formed over the surface of the gate insulating film 4604 (FIG. 48B). The conditions for the plasma treatment can be similar to those of FIG. 47B. In addition, the insulating film 4623 contains a rare gas used in the plasma treatment, for example, in a case of using Ar, Ar is contained in the insulating film 4623.

In FIG. 48B, after the plasma treatment is performed in an atmosphere containing oxygen to oxidize the gate insulating film 4604, plasma treatment may be performed again in an atmosphere containing nitrogen to nitride the gate insulating film 4604. In this case, silicon oxide ($SiO_x$) or silicon oxynitride ($SiO_xN_y$) (x>y) is formed over the semiconductor films 4603a and 4603b, and silicon nitride oxide ($SiN_xO_y$) (x>y) is formed in contact with the gate electrode 4605. Thereafter, by forming the gate electrode 4605 or the like over the insulating film 4623, it is possible to manufacture a display device having the N-channel transistor 4610a and the P-channel transistor 4610b each using the island-shaped semiconductor films 4603a and 4603b as channel regions (FIG. 48C). In this manner, by performing the plasma treatment to the gate insulating film, the surface of the gate insulating film is oxidized or nitrided to be enhanced in its film quality. Thus, a dense film can be obtained. The insulating film obtained by the plasma treatment is denser and has fewer defects such as pinholes as compared to an insulating film formed by a CVD method or a sputtering method, and thus, the characteristics of a thin film transistor can be enhanced.

In FIGS. 48A to 48C, the case is described, where the plasma treatment is performed to the semiconductor films 4603a and 4603b in advance, and the surfaces of the semiconductor films 4603a and 4603b is oxidized or nitrided. However, a method may be employed, in which plasma treatment is performed after forming the gate insulating film 4604 without performing the plasma treatment to the semiconductor films 4603a and 4603b. In this manner, by performing the plasma treatment before forming the gate electrode, even when coverage defects due to breakage of the gate insulating film occurs at the end portions of the semiconductor films, the semiconductor film exposed due to the coverage defects can be oxidized or nitrided, and thus, a short-circuit between the gate electrode and the semiconductor film caused by the coverage defect of the gate insulating film at the end portions of the semiconductor films, or the like can be prevented.

Even when the end portions of the island-shaped semiconductor films are formed almost vertical, the plasma treatment is performed to the semiconductor films or the gate insulating film to oxidize or nitride the semiconductor films or the gate insulating film, thereby avoiding a short-circuit between the gate electrode and the semiconductor films caused by coverage defects of the gate insulating film at the end portions of the semiconductor films.

Next, a case will be described where the end portion of the island-semiconductor film has a tapered shape ($\theta$=30 to 85°) in the island-shaped semiconductor film provided over the substrate.

First, the island-shaped semiconductor films 4603a and 4603b are formed over the substrate 4601 (FIG. 49A). As for the island-shaped semiconductor films 4603a and 4603b, an amorphous semiconductor film is formed using a material mainly containing silicon (Si) (for example, $Si_xGe_{1-x}$, or the like) over an insulating film 4602 which have been formed over the substrate 4601, by a sputtering method, an LPCVD method, a plasma CVD method, or the like. Then, the amorphous semiconductor film is crystallized by a crystallization method such as a laser crystallization method, a thermal crystallization method using RTA or an annealing furnace, or a thermal crystallization method using a metal element promoting crystallization. Then, the semiconductor film is selectively etched and removed. In FIGS. 49A to 49D, the end portions of the island-shaped semiconductor films 4603a and 4603b are tapered ($\theta$=30 to 85°).

Next, a gate insulating film 4604 is formed to cover the semiconductor films 4603a and 4603b (FIG. 49B). The gate insulating film 4604 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) by a sputtering method, an LPCVD method, a plasma CVD method, or the like.

Then, the gate insulating film 4604 is oxidized or nitrided by plasma treatment, and thus, an oxide film or a nitride film 4624 (hereinafter also referred to as an insulating film 4624)

is formed over the surface of the gate insulating film 4604 (FIG. 49C). Note that the conditions for the plasma treatment can be similar to those described above. For example, when silicon oxide ($SiO_x$) or silicon oxynitride ($SiO_xN_y$) (x>y) is used as the gate insulating film 4604, plasma treatment is performed in an atmosphere containing oxygen to oxidize the gate insulating film 4604. The film obtained over the surface of the gate insulating film by the plasma treatment is dense and has fewer defects such as pinholes as compared with a gate insulating film formed by a CVD method, a sputtering method, or the like. On the other hand, plasma treatment is performed in an atmosphere containing nitrogen to nitride the gate insulating film 4604, silicon nitride oxide ($SiN_xO_y$) (x>y) can be provided as the insulating film 4624 over the surface of the gate insulating film 4604. In addition, after plasma treatment is performed in an atmosphere containing oxygen to oxidize the gate insulating film 4604, plasma treatment may be performed again in an atmosphere containing nitrogen to nitride the gate insulating film 4604. In addition, the insulating film 4624 contains a rare gas used in the plasma treatment, for example, in a case of using Ar, Ar is contained in the insulating film 4624.

Next, by forming the gate electrode 4605 or the like over the gate insulating film 4604, it is possible to manufacture a display device having the N-channel transistor 4610a and the P-channel transistor 4610b each using the island-shaped semiconductor films 4603a and 4603b as channel regions (FIG. 49D).

In this manner, by performing the plasma treatment to the gate insulating film, an insulating film formed of an oxide film or a nitride film is formed over the surface of the gate insulating film, and the surface of the gate insulating film can be enhanced in its film quality. The oxidized or nitrided insulating film by the plasma treatment is denser and has fewer defects such as pinholes as compared to a gate insulating film formed by a CVD method or a sputtering method, and thus, the characteristics of a thin film transistor can be enhanced. Further, it is possible to prevent a short-circuit between the gate electrode and the semiconductor film caused by the coverage defect of the gate insulating film or the like at the end portion of the semiconductor film by forming the end portion of the semiconductor film into a tapered shape. However, by performing the plasma treatment after forming the gate insulating film, a short-circuit between the gate electrode and the semiconductor film, or the like can further be prevented.

A manufacturing method of a semiconductor device which is different from that in FIGS. 49A to 49D will be explained with reference to the drawings. Specifically, a case is described where plasma treatment is selectively conducted to an end portion of a semiconductor film having a tapered shape.

First, the island-shaped semiconductor films 4603a and 4603b are formed over the substrate 4601 (FIG. 50A). As for the island-shaped semiconductor films 4603a and 4603b, an amorphous semiconductor film is formed using a material mainly containing silicon (Si) (e.g., $Si_xGe_{1-x}$ etc.) over an insulating film 4602 which have been formed over the substrate 4601 by a sputtering method, an LPCVD method, a plasma CVD method, or the like. Then, the amorphous semiconductor film is crystallized and the semiconductor film is selectively etched using resists 4625a and 4625b as masks. A crystallization method such as a laser crystallization method, a thermal crystallization method using RTA or an annealing furnace, a thermal crystallization method using a metal element promoting crystallization, or a combination of the methods can be adopted to crystallize the amorphous semiconductor film.

Next, before removing the resists 4625a and 4625b used for etching the semiconductor film, plasma treatment is performed to selectively oxidize or nitride the end portions of the island-shaped semiconductor films 4603a and 4603b. An oxide film or a nitride film 4626 (hereinafter, also referred to as an insulating film 4626) is formed at each end portion of the semiconductor films 4603a and 4603b (FIG. 50B). The plasma treatment is performed with the above conditions. In addition, the insulating film 4626 contains a rare gas used in the plasma treatment.

Then, a gate insulating film 4604 is formed to cover the semiconductor films 4603a and 4603b (FIG. 50C). The gate insulating film 4604 can be formed similarly as described above.

Next, by forming the gate electrode 4605 or the like over the gate insulating film 4604, it is possible to manufacture a display device having the N-channel transistor 4610a and the P-channel transistor 4610b each using the island-shaped semiconductor films 4603a and 4603b as channel regions (FIG. 50D).

When the end portions of the semiconductor films 4603a and 4603b are tapered, end portions 4652a and 4652b of the channel regions formed in part of the semiconductor films 4603a and 4603b are also tapered. Thus, the thickness of the semiconductor film or the gate insulating film varies as compared to the center portion, and there is a risk that the characteristics of a thin film transistor are affected. Thus, by selectively oxidizing or nitriding the end portions of the channel regions by the plasma treatment, an insulating film is formed in the semiconductor film which becomes the end portions of the channel region. Thus, the effect on the thin film transistor due to the end portions of the channel region can be reduced.

FIGS. 50A to 50D show an example in which the plasma treatment is performed to only the end portions of the semiconductor films 4603a and 4603b for oxidation or nitriding. Needless to say, the plasma treatment can also be performed to the gate insulating film 4604 for oxidation or nitriding as shown in FIGS. 49A to 49D (FIG. 52A).

Next, a manufacturing method of a display device will be explained with reference to the drawings. The method is different from the method described above. Specifically, plasma treatment is applied to a semiconductor film having a tapered shape.

First, island-shaped semiconductor films 4603a and 4603b are formed over the substrate 4601 similarly as described above (FIG. 51A).

Next, plasma treatment is performed to the semiconductor films 4603a and 4603b to oxidize or nitride the semiconductor films 4603a and 4603b, oxide films or nitride films 4627a and 4627b (hereinafter, also referred to as insulating films 4627a and 4627b) are formed (FIG. 51B). The plasma treatment can be performed with the above conditions. For example, when Si is used for the semiconductor films 4603a and 4603b, silicon oxide ($SiO_x$) or silicon nitride ($SiN_x$) is formed as the insulating films 4627a and 4627b. In addition, after oxidizing the semiconductor films 4603a and 4603b by plasma treatment, plasma treatment may be performed again to nitride the semiconductor films 4603a and 4603b. In this case, silicon oxide ($SiO_x$) or silicon oxynitride ($SiO_xN_y$) (x>y) is formed in contact with the semiconductor films 4603a and 4603b, and silicon nitride oxide ($SiN_xO_y$) (x>y) is formed over the surface of the silicon oxide. Therefore, the insulating films 4627a and 4627b contain a rare gas used for the plasma treatment. By the plasma treatment, the end portions of the semiconductor films 4603a and 4603b are oxidized or nitrided at the same time.

Then, a gate insulating film 4604 is formed to cover the insulating films 4627a and 4627b (FIG. 51C). As the gate insulating film 4604, a single layer structure or a stacked-layer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) can be employed by a sputtering method, an LPCVD method, a plasma CVD method, or the like. For example, in a case where the semiconductor films 4603a and 4603b using Si are oxidized by plasma treatment to form silicon oxide as the insulating films 4627a and 4627b over the surface of the semiconductor films 4603a and 4603b, silicon oxide ($SiO_x$) is formed as the gate insulating film over the insulating film 4627a and 4627b.

Next, by forming the gate electrode 4605 or the like over the gate insulating film 4604, it is possible to manufacture a display device having the N-channel transistor 4610a and the P-channel transistor 4610b each using the island-shaped semiconductor films 4603a and 4603b as channel regions (FIG. 51D).

When the end portions of the semiconductor films are tapered, end portions 4653a and 4653b of the channel regions formed in a portion of the semiconductor films are also tapered. Thus, there is a risk that the characteristics of a semiconductor element are affected. By oxidizing or nitriding the end portions of the channel regions as a result of oxidizing or nitriding the semiconductor films by the plasma treatment, the effect on a semiconductor element can be reduced.

In FIGS. 51A to 51D, the example is shown in which only the semiconductor films 4603a and 4603b are subjected to oxidization or nitriding by plasma treatment; however, the plasma treatment can be performed to the gate insulating film 4604 for oxidation or nitriding as shown in FIGS. 49A to 49D (FIG. 52B). In this case, after the plasma treatment is performed in an atmosphere containing oxygen to oxide the gate insulating film 4604, plasma treatment may be performed again in an atmosphere containing nitrogen to nitride the gate insulating film 4604. In this case, silicon oxide ($SiO_x$) or silicon oxynitride ($SiO_xN_y$) (x>y) is formed in the semiconductor films 4603a and 4603b, and silicon nitride oxide ($SiN_xO_y$) (x>y) is formed in contact with the gate electrode 4605.

Figure 53A:
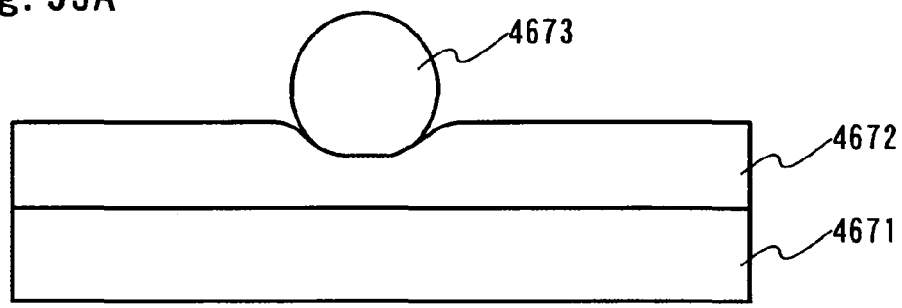
FIGS. 53A and 53B are views explaining a manufacturing method of a transistor used for a display device according to the present invention.
Figure 53B:
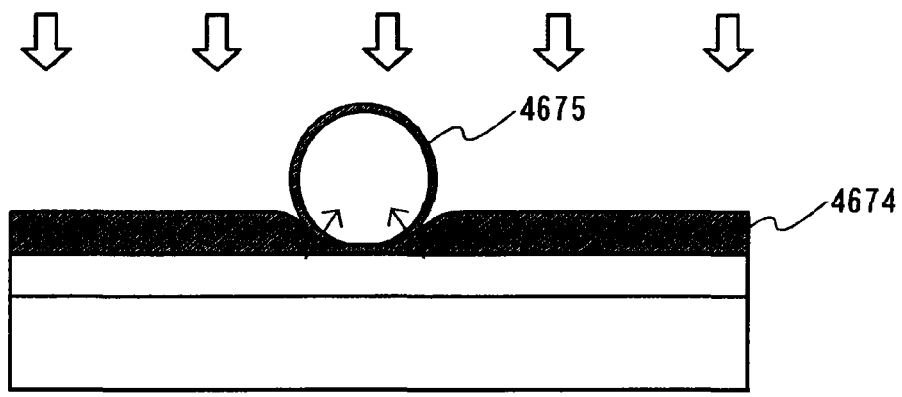

By performing the plasma treatment in this manner, impurities such as dusts attached to the semiconductor film or the insulating film can be easily removed. In general, in some cases, dusts (also referred to as particles) are attached to the film formed by a CVD method, a sputtering method, or the like. For example, as shown in FIG. 53A, a dust 4673 is formed over an insulating film 4672 formed by a CVD method, a sputtering method, or the like, which is formed over a film 4671 such as an insulating film, a conductive film, or a semiconductor film. In such a case, the insulating film 4672 is oxidized or nitrided by the plasma treatment and an oxide film or a nitride film 4674 (hereinafter, also referred to as an insulating film 4674) is formed over the surface of the insulating film 4672. As for the insulating film 4674, a portion under the dust 4673 as well as a portion in which the dust 4673 does not exist are oxidized or nitrided, and thus the volume of the insulating film 4674 is increased. The surface of the dust 4673 is also oxidized or nitrided by the plasma treatment to form an insulating film 4675, and as a result, the volume of the dust 4673 is also increased (FIG. 53B).

At this time, the dust 4673 can be easily removed from the surface of the insulating film 4674 by simple cleaning such as brush cleaning. In this manner, by the plasma treatment, even a minute dust attached to the insulating film or a semiconductor film can be removed easily. It is noted that this is an effect obtained by performing the plasma treatment, and this is true to other embodiment modes as well as this embodiment mode.

As described above, by improving the film quality of the surface of the semiconductor film or the gate insulating film by oxidation or nitriding by the plasma treatment, a dense insulating film having good film quality can be formed. In addition, dusts or the like attached to the surface of the insulating film can be removed easily by cleaning. Consequently, even when the insulating film is formed thinner, defects such as pinholes can be avoided, and miniaturization and higher performance of a semiconductor element such as a thin film transistor can be realized.

Note that, in this embodiment mode, plasma treatment is performed to the semiconductor films 4603a and 4603b or the gate insulating film 4604 in the above FIGS. 46A to 46C to oxidize or nitride the semiconductor films 4603a and 4603b or the gate insulating film 4604; however, a layer that is oxidized or nitrided by plasma treatment is not limited thereto. For example, plasma treatment may be performed to the substrate 4601 or the insulating film 4602, or plasma treatment may be performed to the insulating film 4606 or 4607.

Note that the content described in this embodiment mode can be implemented by being arbitrarily combined with the content described in Embodiment Modes 1 to 5.

(Embodiment Mode 7)

This embodiment mode will explain a half-tone method as a process of manufacturing a display device including a transistor.

Figure 54:
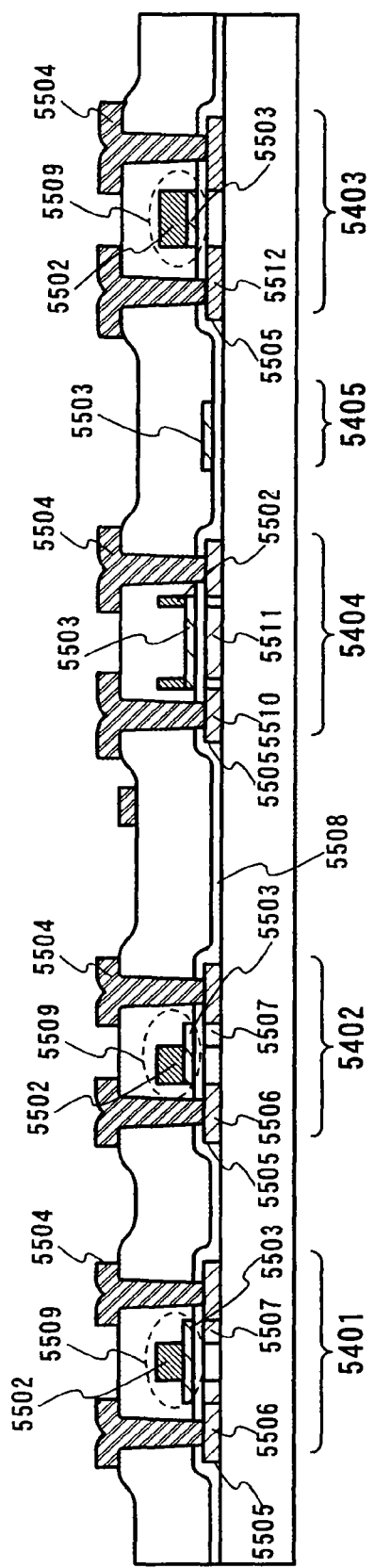
FIG. 54 is a view showing a cross-sectional structure of a transistor used for a display device according to the present invention.

FIG. 54 is a view showing a cross-sectional structure of a display device including a transistor, a capacitor element, and a resistive element. FIG. 54 shows N-channel transistors 5401 and 5402, a capacitor element 5404, a resistive element 5405, and a P-channel transistor 5403. Each transistor is provided with a semiconductor layer 5505, an insulating film 5508, and a gate electrode 5509. The gate electrode 5509 is formed in a stacked structure of first and second conductive layers 5503 and 5502. In addition, FIGS. 55A to 55E are each a top view corresponding to the transistors, capacitor element, and resistive element shown in FIG. 54, which can be referred to as well.

In FIG. 54, the N-channel transistor 5401 has impurity regions 5507 formed in the semiconductor layer 5505 on either side of the gate electrode in the channel length direction (the direction in which carriers flow), which are also referred to as lightly doped drains (LDDs) and are doped to have a concentration lower than the impurity concentration of impurity regions 5506 forming source and drain regions in contact with wirings 5504. In a case of arranging the N-channel transistor 5401, the impurity regions 5506 and 5507 are doped with phosphorus or the like as an impurity imparting N-type conductivity. The LDDs are formed as a means of suppressing hot electron degradation and short channel effect.

Figure 55A:
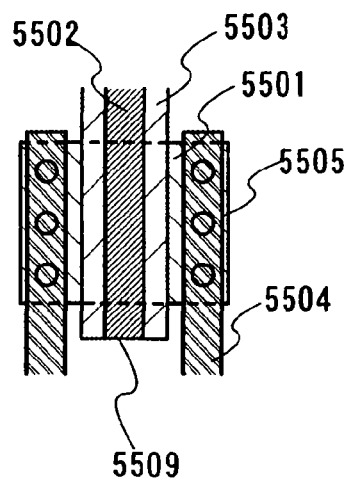
FIGS. 55A to 55E are each a top view of a transistor used for a display device according to the present invention.

As shown in FIG. 55A, the gate electrode 5509 of the N-channel transistor 5401 has the first conductive layer 5503 formed to extend on either side of the second conductive layer 5502. In this case, the first conductive layer 5503 is formed to have a thinner film thickness than the second conductive layer. The first conductive layer 5503 is formed to have a thickness that allows ion species accelerated by an electric field of 10 to 100 kV to pass. The impurity regions 5507 are formed to overlap with the first conductive layer 5503 of the gate electrode 5509, that is, form LDD regions overlapping with the gate electrode 5509. In this structure, the impurity regions 5507 are formed in a self-aligned manner by doping with one conductivity-type impurity through the first conductive layer 5503 of the gate electrode 5509 with the second conductive layer 5502 thereof used as a mask. In other words, the LDD overlapping with the gate electrode is formed in a self-aligned manner.

Figure 55B:
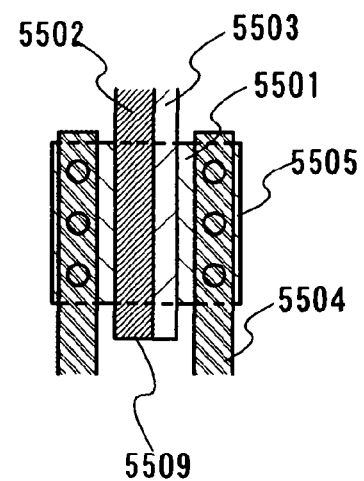

In FIG. 54, the N-channel transistor 5402 has the impurity region 5507 formed in the semiconductor layer 5505 on one side of the gate electrode, which is doped to have a concentration lower than the impurity concentration of impurity regions 5506. As shown in FIG. 55B, the gate electrode 5509 of the N-channel transistor 5402 has the first conductive layer 5503 formed to extend on one side of the second conductive layer 5502. In this case, also, the LDD can be formed in a self-aligned manner by doping with one conductivity-type impurity through the first conductive layer 5503 with the second conductive layer 5502 used as a mask.

The transistor with the LDD on one side may be applied to a transistor where only positive voltage or negative voltage is applied between source and drain electrodes, and specifically may be applied to a transistor constituting a logic gate such as an inverter circuit, a NAND circuit, a NOR circuit, or a latch circuit, and to a transistor constituting an analog circuit such as a sense amplifier, a constant voltage generation circuit, or a VCO.

Figure 55C:
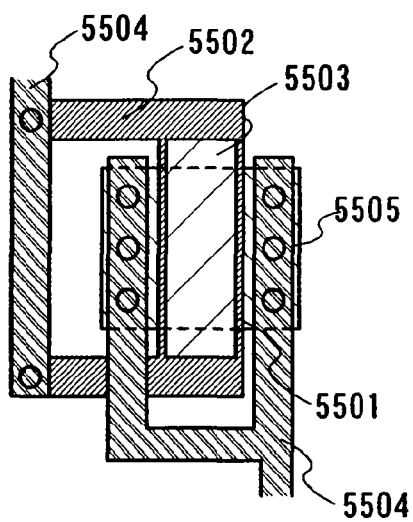
Figure 55D:
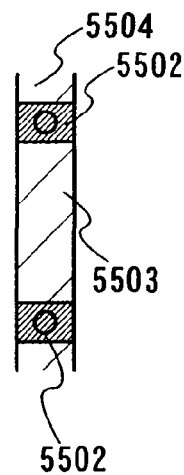

In FIG. 54, the capacitor element 5404 is formed to have the insulating film 5508 sandwiched between the first conductive layer 5503 and the semiconductor layer 5505. The semiconductor layer 5505 forming the capacitor element 5404 includes impurity regions 5510 and an impurity region 5511. The impurity region 5511 is formed in positions overlapping with the first conductive layer 5503 in the semiconductor layer 5505. In addition, the impurity regions 5510 are in contact with the wirings 5504. Since the impurity region 5511 can be doped with one conductivity-type impurity through the first conductive layer 5503, the concentration of the impurity included in the impurity regions 5510 can be the same as or different from the concentration of the impurity included in the impurity region 5511. In any case, since the semiconductor layer 5505 is made to function as an electrode in the capacitor element 5404, it is preferable that the semiconductor layer 5505 be doped with one conductivity-type impurity to make the resistance lower. In addition, the first conductive layer 5503 can be made to function sufficiently as an electrode by using the second conductive layer 5502 as an auxiliary electrode as shown in FIG. 55C. In this manner, the capacitor element 5404 can be formed in a self-aligned manner by using a composite electrode structure of the first and second conductive layers 5503 and 5502 combined.

In FIG. 54, the resistive element 5405 is formed with the first conductive layer 5503. Since the first conductive layer 5503 is formed to have a thickness of approximately 30 to 150 nm, the width and length thereof can be appropriately set to arrange the resistive element.

Figure 55E:
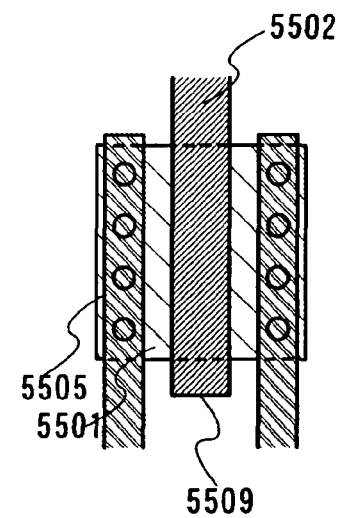

The resistive element may be made up of a semiconductor layer including an impurity element at a high concentration or a metal layer that has a thin film thickness. While the resistance of the semiconductor layer depends on the film thickness, the film quality, the impurity concentration, the activation rate, or the like, the metal layer is preferable because the resistance of the metal layer is determined by the film thickness and the film quality and thus less variable. FIG. 55E shows a top view of the resistive element 5405.

In FIG. 54, the P-channel transistor 5403 has the semiconductor layer 5505 including impurity regions 5512. These impurity regions 5512 form source and drain regions in contact with the wirings 5504. The gate electrode 5509 has a structure of the first and second conductive layers 5503 and 5502 overlapped with each other. The P-channel transistor 5403 is a transistor that has a single drain structure without an LDD. In the case of forming the P-channel transistor 5403, the impurity regions 5512 are doped with boron or the like as an impurity imparting P-type conductivity. On the other hand, when the impurity regions 5512 are doped with phosphorus, an N-channel transistor having a single drain structure can be formed. FIG. 55E shows a top view of the P-channel transistor 5403.

One or both of the semiconductor layer 5505 and the insulating layer 5508 may be subjected to an oxidation or nitriding treatment by a microwave-excited high-density plasma treatment that has an electron temperature of 2 eV or less, ion energy of 5 eV or less, and an electron density on the order of $10^{11}$ to $10^{13}/cm^3$. In this case, the defect level at the interface between the semiconductor layer 5505 and the insulating film 5508 can be reduced by performing the treatment at a substrate temperature of 300 to 450° C. in an oxidizing atmosphere ($O_2$, $N_2O$, or the like) or a nitriding atmosphere ($N_2$, $NH_3$, or the like). By performing this treatment for the insulating film 5508, this insulating film can be made dense. In other words, generation of a charged defect can be prevented to prevent fluctuation in the threshold voltage of the transistor. In addition, in a case of driving the transistor at a voltage of 3 V or less, an insulating film oxidized or nitrided by this plasma treatment can be applied as the insulating film 5508. Alternatively, in a case where the driving voltage of the transistor is 3 V or more, an insulating film formed by this treatment on the surface of the semiconductor layer 5505 and an insulating film deposited by a CVD method (a plasma CVD method or a thermal CVD method) can be combined to form the insulating film 5508. Also, this insulating film can be used as the dielectric layer of the capacitor element 5404. In this case, a capacitor element with a large charge capacity can be formed because this insulating film formed by this plasma treatment has a thickness of 1 to 10 nm and is a dense film.

As explained with reference to FIG. 54 and FIGS. 55A to 55E, elements that have various structures can be formed by combining conductive layers that are different in film thickness. A region where only the first conductive layer is formed and a region where the first conductive layer and the second conductive layer are stacked can be formed by using a photomask or a reticle provided with an assist pattern that is composed of a diffraction grating pattern or a semitransparent film and has a function of reducing a light intensity, In other words, when a photoresist is exposed to light in a photolithography process, the amount of light transmitted through the photomask is controlled to provide different thicknesses for a developed resist mask. In this case, the photomask or reticle provided with slits of the resolution limit or less may be used to form a resist that has the complicated shape described above. In addition, baking at about 200° C. may be performed after the development to change the shape of the mask pattern formed from a photoresist material.

In addition, a region where only the first conductive layer is formed and a region where the first conductive layer and the second conductive layer are stacked can be formed continuously by using a photomask or a reticle provided with an assist pattern that is composed of a diffraction grating pattern or a semi-transparent film and has a function of reducing a light intensity. As shown in FIG. 55A, the region where only the first conductive layer is formed can be formed selectively over the semiconductor layer. This region is effective over the semiconductor layer but not necessary in a region (a wiring region continued from the gate electrode) other than that. Since the use of this photomask or reticle need not to form the region where only the first conductive layer is formed, in the wiring region, the wiring density can be substantially increased.

In the case of FIG. 54 and FIGS. 55A to 55E, the first conductive layer is formed to have a thickness of 30 to 50 nm by using a high melting point metal such as tungsten (W), chromium (Cr), tantalum (Ta), tantalum nitride (TaN), or molybdenum (Mo), or an alloy or compound including the high melting point metal as its main component. In addition, the second conductive layer is formed to have a thickness of 300 to 600 nm by using a high melting point metal such as tungsten (W), chromium (Cr), tantalum (Ta), tantalum nitride (TaN), or molybdenum (Mo), or an alloy or compound including the high melting point metal as its main component. For example, different conductive materials are used for the respective first and second conductive layers to result in a difference in etching rate in an etching process to be performed subsequently. As an example, TaN can be used for the first conductive layer, and a tungsten film can be used as the second conductive layer.

This embodiment mode shows that transistors that have different electrode structures, a capacitor element, and a resistive element can be formed all together in the same patterning process by using a photomask or a reticle provided with an assist pattern that is composed of a diffraction grating pattern or a semi-transparent film and has a function of reducing a light intensity. This allows elements in different modes to be formed and integrated depending on circuit characteristics without increasing the number of steps.

Note that the content described in this embodiment mode can be implemented by being arbitrarily combined with the content described in Embodiment Modes 1 to 6.

(Embodiment Mode 8)

This embodiment mode will explain an example of a mask pattern in manufacturing a display device including a transistor with reference to FIGS. 56A and 56B, FIGS. 57A and 57B, and FIGS. 58A and 68B.

Figure 56A:
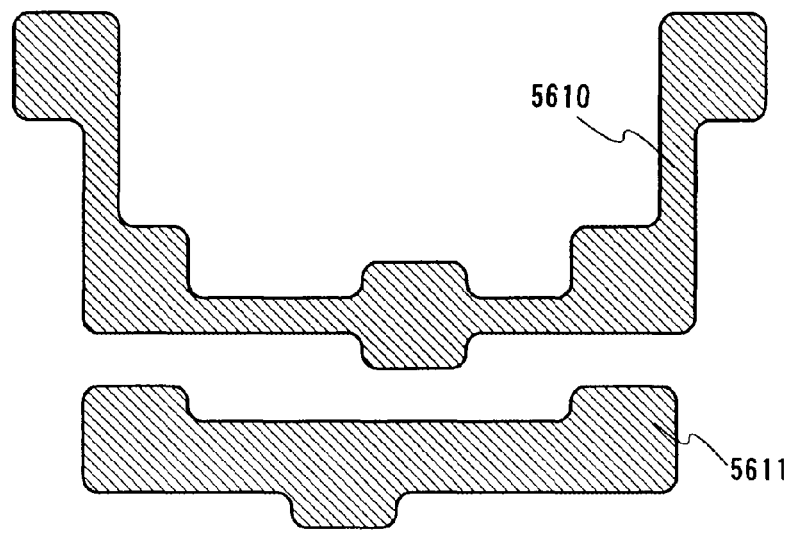
FIGS. 56A and 56B are views each showing one example of a mask pattern of a transistor used for a display device according to the present invention.

It is preferable to form semiconductor layers 5610 and 5611 shown in FIG. 56A with silicon or a crystalline semiconductor containing silicon as its component. For example, as the semiconductor layers 5610 and 5611, polycrystalline silicon, single crystal silicon, or the like that is a silicon film crystallized by laser annealing or the like is applied. Besides, it is also possible to apply a metal-oxide semiconductor, amorphous silicon, or an organic semiconductor that shows semiconductor characteristics.

In either case, the semiconductor layer to be formed first is formed over an entire surface or part (a region having an area larger than a region determined as a semiconductor region of a transistor) of a substrate having an insulating surface. Then, a mask pattern is formed over the semiconductor layer by a photolithography technique. Island-shaped semiconductor layers 5610 and 5611 in a specific shape including source and drain regions and a channel formation region of a transistor are formed by performing etching treatment of the semiconductor layers with the use of the mask pattern.

Figure 56B:
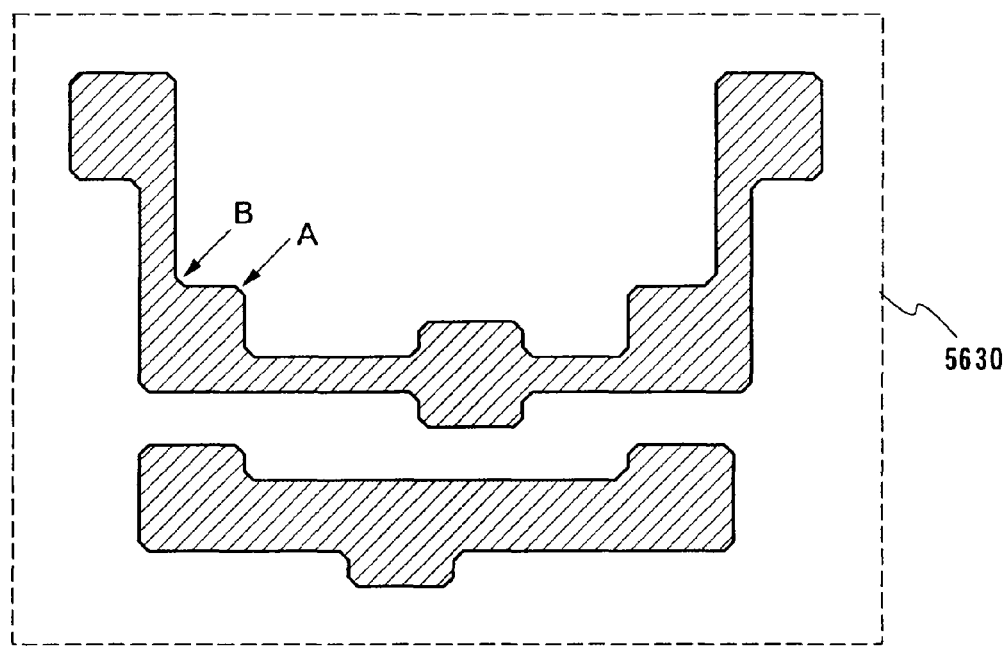

A photomask for forming the semiconductor layers 5610 and 5611 shown in FIG. 56A is provided with a mask pattern 5630 shown in FIG. 56B. The mask pattern 5630 differs depending on whether a resist used for a photolithography step is a positive type or a negative type. In the case where the positive resist is used, the mask pattern 5630 shown in FIG. 56B is manufactured as a light shielding portion. The mask pattern 5630 has a shape identical to a polygon the top portion A of which is removed. The photomask pattern is chamfered so as to cut off a rectangular triangle one side of which is 10 μm or less at a corner, for example. In addition, a bent portion B has a shape that the corner is bended so as not to be orthogonal. When the bent portion B is enlarged, there is a shape bended over a plurality of levels.

The shape of the mask pattern 5630 shown in FIG. 56B is reflected in the semiconductor layers 5610 and 5611 shown in FIG. 56A. In this case, a shape similar to the mask pattern 5630 may be transferred or may be transferred so that the corner of the mask pattern 5630 is further rounded. In other words, a rounded portion where a pattern shape is smoothed much more than the mask pattern 5630 may also be provided.

Figure 57A:
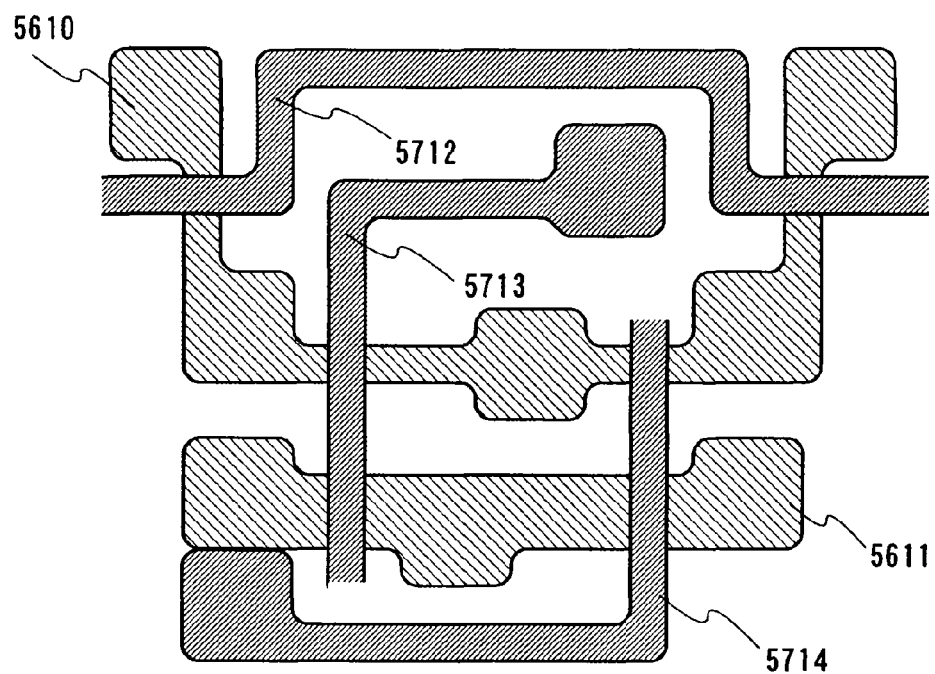
FIGS. 57A and 57B are views each showing one example of a mask pattern of a transistor used for a display device according to the present invention.

An insulating layer partially containing at least silicon oxide or silicon nitride is formed over the semiconductor layers 5610 and 5611. One of the objects to form the insulating layer is a gate insulating layer. Then, as shown in FIG. 57A, gate wirings 5712, 5713, and 5714 are formed so that part thereof overlaps with the semiconductor layers. The gate wiring 5712 is formed corresponding to the semiconductor layer 5610. The gate wiring 5713 is formed corresponding to the semiconductor layers 5610 and 5611. In addition, the gate wiring 5714 is formed corresponding to the semiconductor layers 5610 and 5611. By forming a metal layer or a semiconductor layer having high conductivity, the shape of the gate wirings is formed over the insulating layer by a photolithography technique.

Figure 57B:
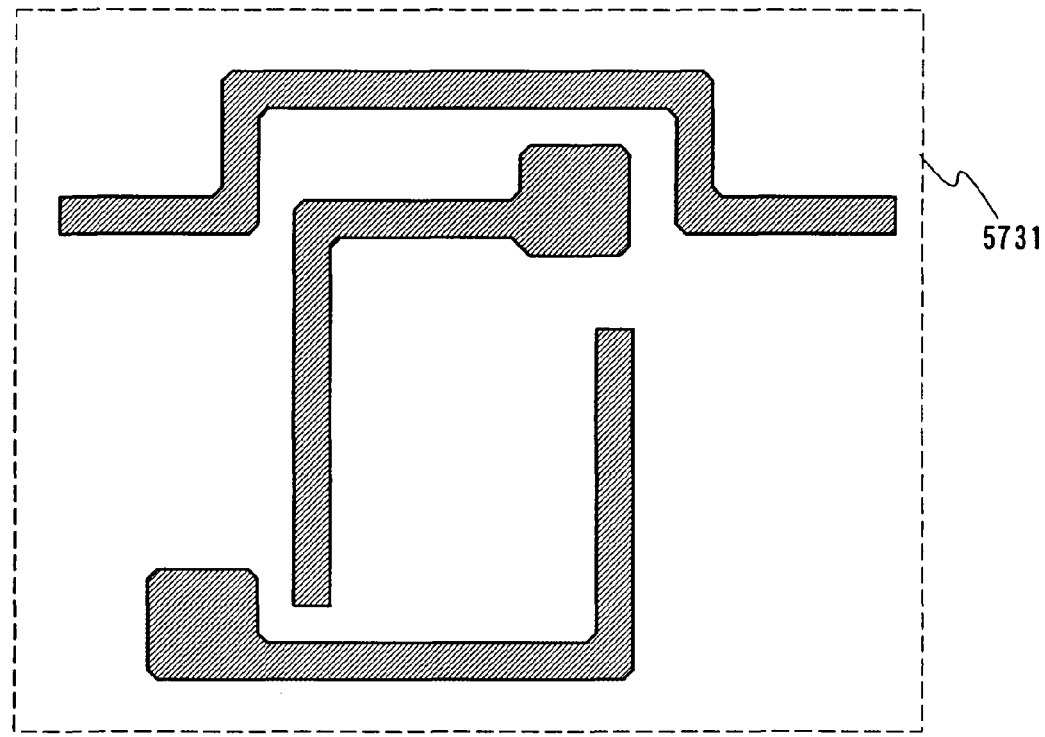

A photomask for forming these gate wirings is provided with a mask pattern 5731 shown in FIG. 57B. The mask pattern 5731 has a pattern where a corner that is a right triangle in each edge bent into an L shape is removed so that one side of the triangle is 10 μm or less, or equal to or longer than one-fifth the width of the mask pattern 5731 and equal to or shorter than half the width of the mask pattern 5731; therefore, the edge is rounded. In other words, the circumference of the mask pattern 5731 in the edge is curved when seen from above. Specifically, in order to form a round circumference of the edge, part of the mask pattern 5731 is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the mask pattern 5731. At this time, the mask pattern 5731 is preferably etched by appropriately adjusting the etching conditions and/or a mask design so that a curved line in contact with the first straight line and the second straight line is formed in each obtuse angle portion. Note that the length of the two sides of the isosceles right triangle, which are equal to each other, is equal to or longer than one-fifth the width of the mask pattern 5731 and equal to or shorter than half the width of the mask pattern 5731. In addition, the inner circumference of the edge is also made curved in accordance with the circumference of edge. The shape of the mask pattern 5731 shown in FIG. 57B is reflected in the gate wirings 5712, 5713, and 5714 shown in FIG. 57A. In this case, a shape similar to the mask pattern 5731 may be transferred or may be transferred so that the corner of the mask pattern 5731 is further rounded. In other words, a rounded portion where a pattern shape is smoothed much more than the mask pattern 5731 may also be provided. Specifically, the corners of the gate wirings 5712, 5713, and 5714 may be rounded. Generation of fine particles due to overdischarge can be suppressed in a convex portion when dry etching is performed by plasma, and in a concave portion, fine particles that likely to gather at the corner can be washed away even if the fine particles are generated at the time of cleaning. Consequently, there is an effect that improvement of yield can be fully expected.

An interlayer insulating layer is a layer that is formed next to the gate wirings 5712, 5713, and 5714. The interlayer insulating layer is formed using an inorganic insulating material such as silicon oxide or an organic insulating material using polyimide, acrylic resin, or the like. An insulating layer such as silicon nitride or silicon nitride oxide may be interposed between the interlayer insulating layer and the gate wirings 5712, 5713, and 5714. In addition, an insulating layer such as silicon nitride or silicon nitride oxide may be provided over the interlayer insulating layer. The insulating layer can prevent the semiconductor layers and the gate insulating layer from being contaminated with impurities such as exogenous metal ion or moisture that is not preferable for a transistor.

Figure 58A:
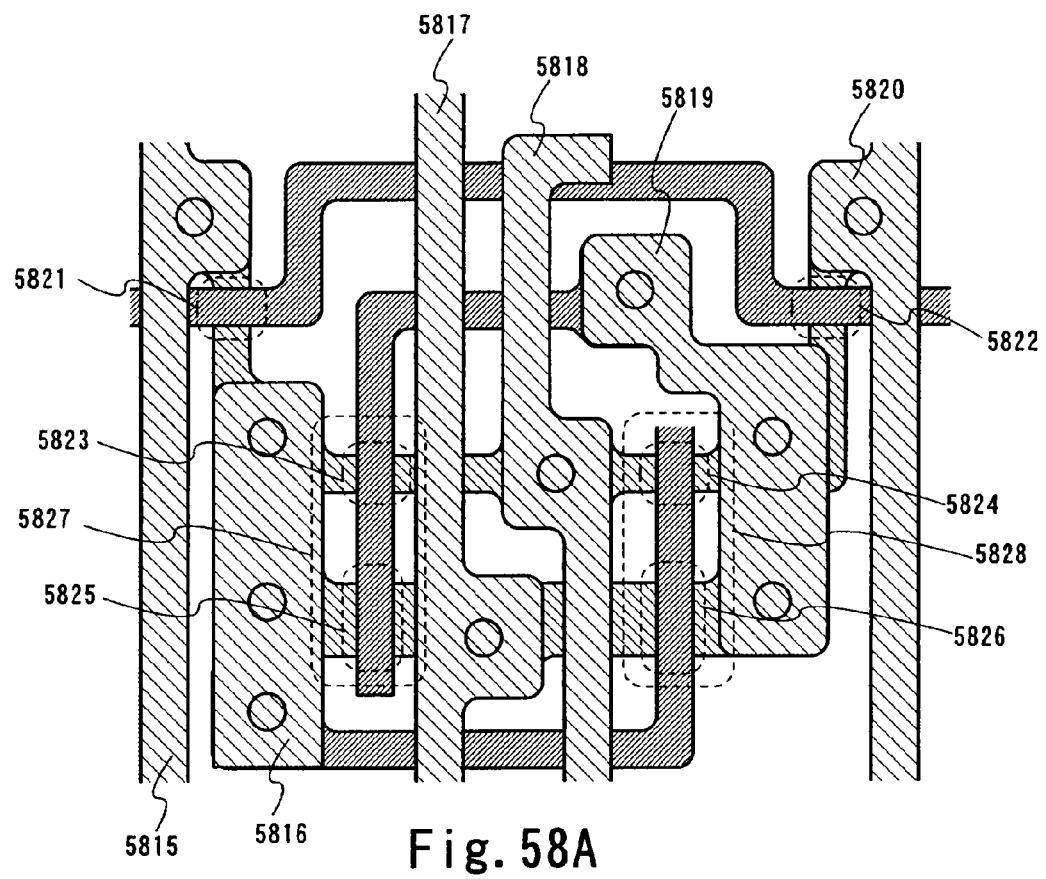
FIGS. 58A and 58B are views each showing one example of a mask pattern of a transistor used for a display device according to the present invention.

An opening is formed in a predetermined position of the interlayer insulating layer. For example, the opening is provided corresponding to the gate wiring in the lower layer and the semiconductor layer. In a wiring layer formed of a layer or a plurality of layers of metal or a metal compound, a mask pattern thereof is formed by a photolithography technique and a predetermined pattern is formed by etching processing. Then, as shown in FIG. 58A, wirings 5815 to 5820 are formed so that parts thereof are overlapped with semiconductor layers. Specific elements are connected therebetween by the wirings. The wirings do not connect the specific elements therebetween in a straight line but a bent portion is included with limitation of the layout. In addition, a width of the wirings is changed in a contact portion with other wirings or other regions. When the size of a contact hole is the same or larger than a width of the wirings, the width of the wirings is changed to expand in the contact portion.

Figure 58B:
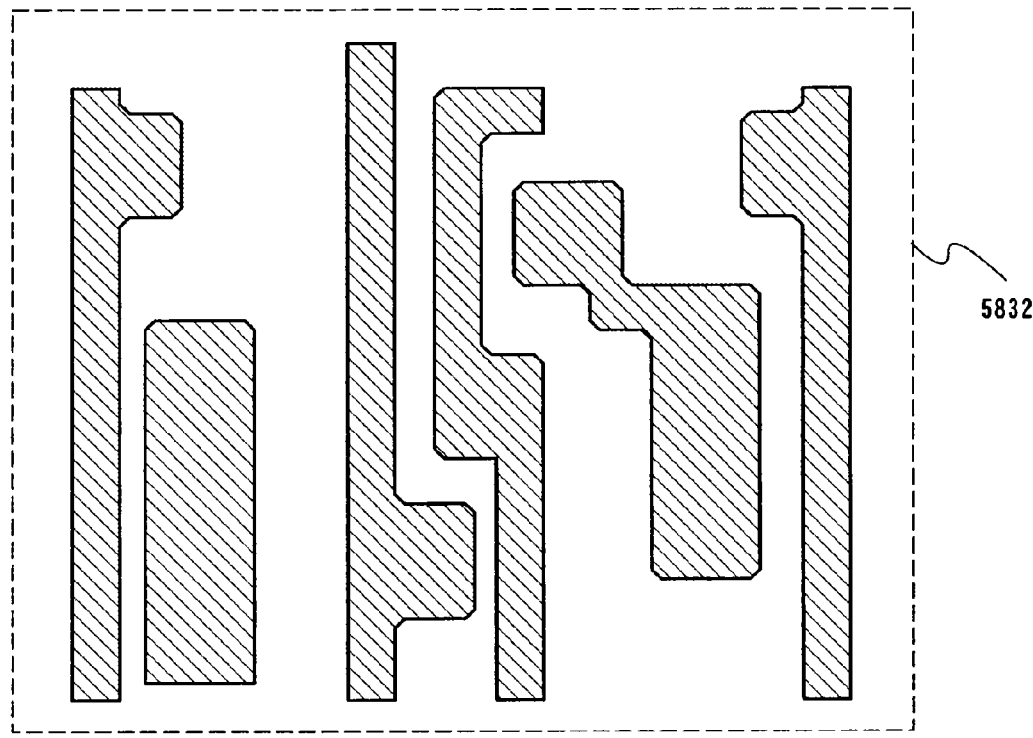

A photomask for forming these wirings 5815 to 5820 is provided with a mask pattern 5832 shown in FIG. 58B. In this case also, the wirings each have a pattern where a corner that is a right triangle in each edge bent into an L shape is removed so that one side of the triangle is 10 µm or less, or equal to or longer than one-fifth the width of the wiring and equal to or shorter than half the width of the wiring; therefore, the edge is rounded. In other words, the circumference of the wiring in the edge is curved when seen from above. Specifically, in order to form a round circumference of the edge, part of the wiring is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the wiring. At this time, the wiring is preferably etched by appropriately adjusting the etching conditions and/or a mask design so that a curved line in contact with the first straight line and the second straight line is formed in each obtuse angle portion. Note that the length of the two sides of the isosceles right triangle, which are equal to each other, is equal to or longer than one-fifth the width of the wiring and equal to or shorter than half the width of the wiring. In addition, the inner circumference of the edge is also made curved in accordance with the circumference of edge. In such wirings, generation of fine particles due to overdischarge can be suppressed in a convex portion when dry etching is performed by plasma, and in a concave portion, fine particles that likely to gather at the corner can be washed away even if the fine particles are generated at the time of cleaning. Consequently, there is an effect that improvement of yield can be fully expected. It can be expected that electrical conduction of the wirings can be made preferable by having the corners of the wirings rounded. In addition, it is extremely advantageous in washing dust away to use the wirings with the rounded corners in a structure where a number of wirings are provided in parallel.

In FIG. 58A, N-channel transistors 5821 to 5824, and P-channel transistors 5825 and 5826 are formed. The N-channel transistor 5823 and the P-channel transistor 5825 are included in an inverter 27. The N-channel transistor 5824 and the P-channel transistor 5826 are included in an inverter 28. Circuits including these six transistors form a SRAM. An insulating layer such as silicon nitride or silicon oxide may be formed in the upper layer of these transistors.

Note that the content described in this embodiment mode can be implemented by being arbitrarily combined with the content described in Embodiment Modes 1 to 7.

(Embodiment Mode 9)

This embodiment mode will explain an evaporation apparatus that is used when a display device using an electroluminescence element (EL element) as a pixel is manufactured, with reference to the drawings.

A display panel is manufactured by forming an EL layer over an element substrate over which a pixel circuit and/or a driver circuit are/is formed by a transistor. The EL layer is formed by at least partially containing a material that exhibits electroluminescence. The EL may be formed of a plurality of layers which are different in function. In this case, there is a case where the EL layer has a structure of combining layers different in function, which are also referred to as a hole injection transport layer, a light-emitting layer, an electron injection transport layer, and the like.

Figure 69:
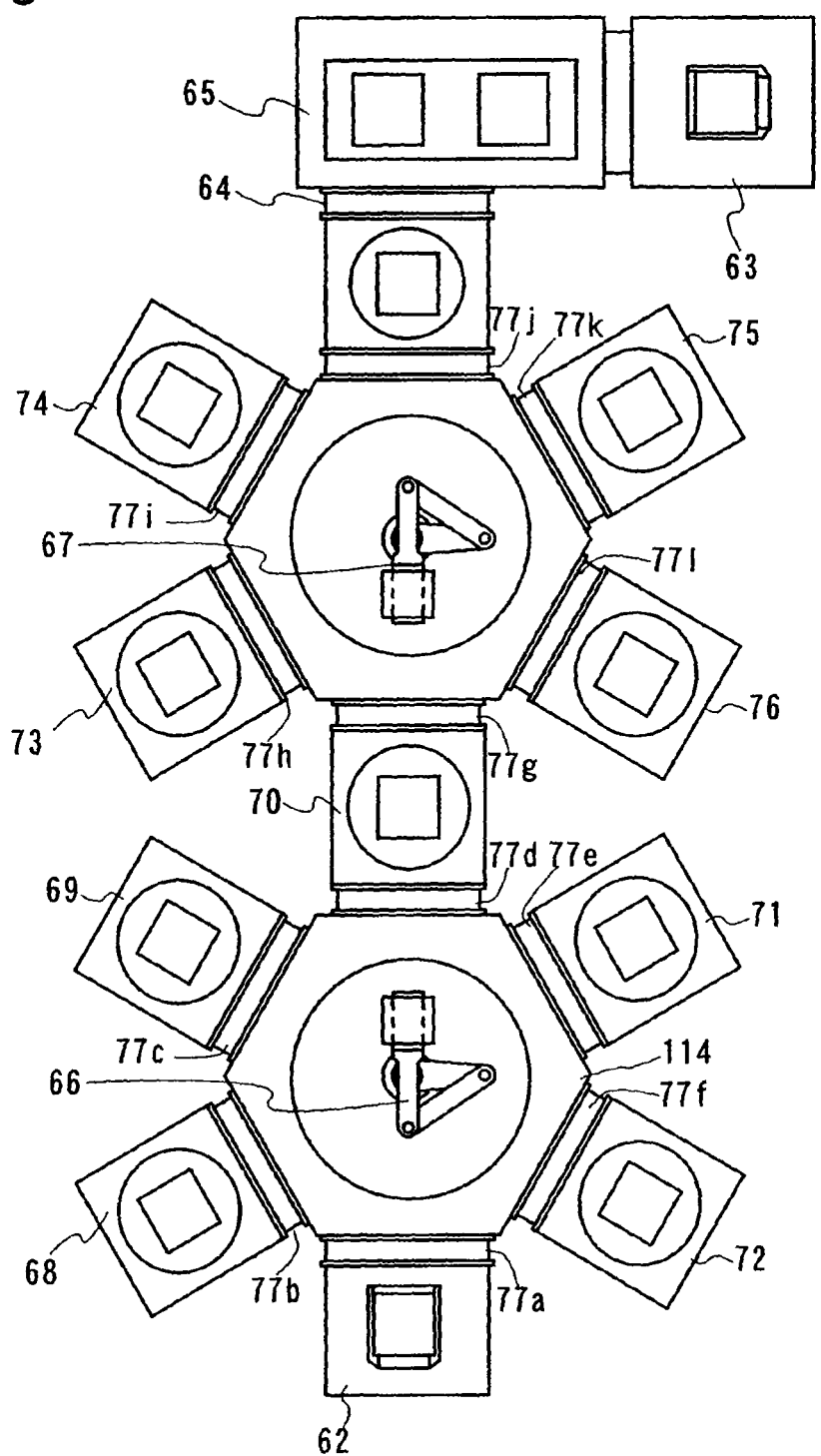
FIG. 69 is a view showing a structure of an evaporation apparatus for forming an EL layer.

FIG. 69 shows a structure of an evaporation apparatus for forming an EL layer over an element substrate over which a transistor is formed. In the evaporation apparatus, a plurality of treatment chambers is connected to transfer chambers 60 and 61. The treatment chambers include a lode chamber 62 for supplying a substrate and an unload chamber 62 for collecting a substrate, as well as a heat treatment chamber 68, a film formation treatment chambers 69 to 75 for evaporating an EL material, and a film formation treatment chamber 76 for forming aluminum or a conductive film containing aluminum as its main component as one electrode of an EL element. In addition, gate valves 77a to 77l are provided between the transfer chambers and each treatment chamber, and a pressure in each treatment chamber can be controlled independently, which prevents cross contamination between the treatment chambers.

A substrate that is introduced into the transfer chamber 60 from the lode chamber 62 is transferred to a predetermined treatment chamber by an arm type transfer means 66 which is provided to be rotated freely. In addition, the substrate is transferred to other treatment chamber from a certain treatment chamber by the transfer means 66. The transfer chambers 60 and 61 are connected to each other by the film formation treatment chamber 70, and the substrate is delivered by the transfer means 66 and a transfer means 67.

Each treat chamber connected to the transfer chambers 60 and 61 is kept in a reduced pressure state. Therefore, in the evaporation apparatus, film formation process of an EL layer is performed continuously without exposing a substrate to an atmosphere. There is a case where a display panel in which film formation process of an EL layer is completed is deteriorated due to water vapor or the like. Therefore, in order to maintain quality, a sealing treatment chamber 65 for performing sealing treatment before exposing a substrate to an atmosphere is connected to the transfer chamber 61 in the evaporation apparatus. The sealing treatment chamber 65 is put in an atmospheric pressure or a pressure similar thereto; therefore, an intermediate treatment chamber 64 is also provided between the transfer chamber 61 and the sealing treatment chamber 65. The intermediate treatment chamber 64 is provided to deliver a substrate and to buffer the pressure between the chambers.

The load chamber, the unload chamber, the transfer chambers, and the film formation chambers are each provided with a vacuum means for keeping the chambers in a reduced pressure. As the vacuum means, various vacuum pumps such as a dry pump, a turbo-molecular pump, and a diffusion pump can be used.

In the evaporation apparatus in FIG. 69, the number of treatment chambers connected to the transfer chambers 60 and 61 and structures thereof can be appropriately combined depending on a stacked structure of an EL element. Hereinafter, an example of the combination will be shown.

In the heat treatment chamber 68, first, a substrate over which a lower electrode, an insulating partition, and the like are formed is heated to perform degasification treatment. In, the film formation chamber 72, a base with an electrode surface is treated with a rare gas or oxygen plasma. The plasma treatment is performed to clean a surface, stabilize the state of a surface, and to stabilize a physical or chemical state (for example, a work function or the like) of a surface.

The film formation treatment chamber 69 is a treatment chamber to form an electrode buffer layer in contact with one electrode of an EL element. The electrode buffer layer has carrier injectability (hole injection or electron injection), which is a layer that suppresses generation of a short-circuit or a black spot defect of an EL element. Typically, the electrode buffer layer is formed from an organic and inorganic mixed material, the resistivity of which is $5\times10^4$ to $1\times10^6$ Ωcm, to have a thickness of 30 to 300 nm. In addition, the film formation chamber 71 is a treatment chamber for forming a hole transport layer.

A light-emitting layer in an EL element has a different structure between a case of emitting monochromatic light and a case of emitting white light. It is preferable to provide a film formation treatment chamber in the evaporation apparatus depending on a structure in a case of emitting monochromatic light or white light. For example, in a case of forming three kinds of EL elements, the light-emission colors of which are different, in a display panel, it is necessary to form light-emitting layers corresponding to each light-emission color. In this case, the film formation treatment chamber 70 can be used for forming a first light-emitting layer, the film formation treatment chamber 73 can be used for forming a second light-emitting layer, and the film formation treatment chamber 74 can be used for forming a third light-emitting layer. By separating the film formation treatment chambers for light-emitting layer, it is possible to prevent cross contamination due to different light-emitting materials; thus, the throughput of film formation process can be improved.

In addition, the three kinds of EL materials, the light-emission colors of which are different, may be sequentially evaporated in the film formation treatment chambers 70, 73, and 74, respectively. In this case, with the use of a shadow mask, the materials are to be evaporated by moving the mask depending on evaporated regions.

In a case of forming an EL element that emits white light, the EL element is formed by stacking light-emitting layers longwise, the light-emission colors of which are different. Also in this case, light-emitting layers can be formed in each light-emitting layer by sequentially moving the element substrate through the film formation treatment chamber. In addition, different light-emitting layers can be formed continuously in the same film formation treatment chamber.

An electrode is formed over an EL layer in the film formation treatment chamber 76. Although it is possible to apply an electron beam evaporation method or a sputtering method to form the electrode, it is preferable to use a resistance heating evaporation method.

An element substrate over which up to the electrode is formed is transferred to the sealing treatment chamber 65 through the intermediate treatment chamber 64. The sealing treatment chamber 65 is filled with an inert gas such as helium, argon, neon, or nitrogen, and a sealing substrate is attached under the atmosphere to a side where an EL layer of an element substrate is formed, for sealing. In a sealed state, the inert gas or a resin material may be filled between the element substrate and the sealing substrate. The sealing treatment chamber 65 is equipped with a mechanical element such as a dispenser that draws a sealant, a fixing stage that fixes the sealing substrate to face the element substrate, or an arm, a dispenser that fill a resin material, or a spin coater.

Figure 70:
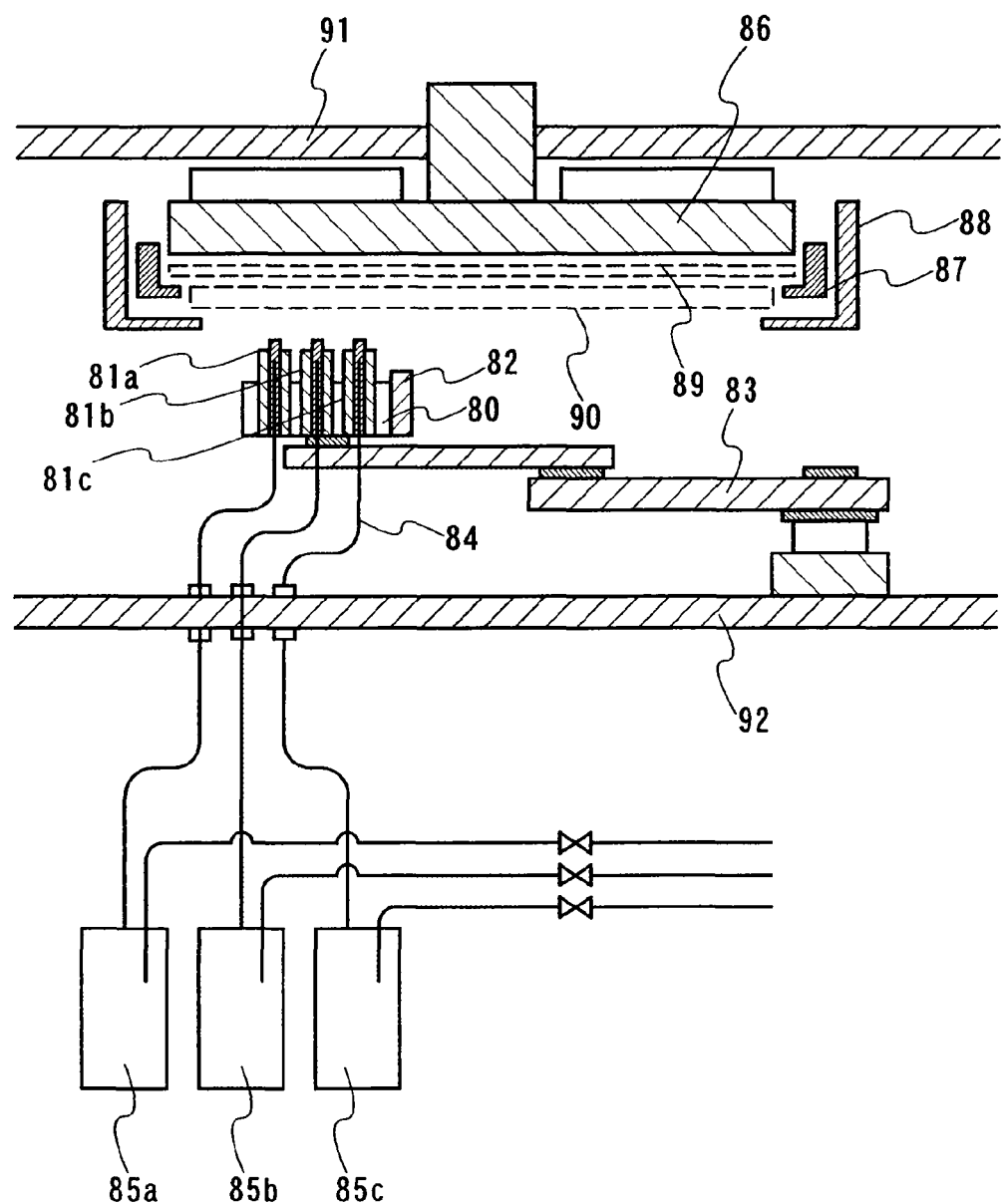
FIG. 70 is a view showing a structure of an evaporation apparatus for forming an EL layer.

FIG. 70 shows an internal structure of the film formation treatment chambers. The film formation treatment chambers are kept under a reduced pressure, and in FIG. 70, the inside sandwiched between a top board 91 and a bottom board 92 is an inner chamber and an inner chamber that is kept in a reduced pressure state is shown.

In each treatment chamber, one or a plurality of evaporation sources is provided. This is because it is preferable to provide a plurality of evaporation sources in a case of forming a plurality of layers different in composition or in a case of co-evaporating different materials. In FIG. 70, evaporation sources 81a, 81b, and 81c is provided in a vapor source holder 80. The evaporation source holder 80 is held by a multi-jointed arm 83. The position of the evaporation source holder 80 can be moved freely within the movable range by telescopic motion of the joint of the multi-jointed arm 83. In addition, the evaporation source holder 80 may be provided with a distance sensor 82 to monitor distance between evaporation sources 81a to 81c and a substrate 89 and to control optimum distance at the time of evaporation. In this case, a multi-jointed arm that is displaced in upper and lower direction (a Z direction) can be employed as the multi-jointed arm 83.

A substrate stage 86 and a substrate chuck 87 fix the substrate 89 as a pair. The substrate stage 86 may have a structure in which a heater is installed so that the substrate 89 can be heated. The substrate 89 is fixed to the substrate stage 86 and transferred away and in by tightening and loosening the substrate chuck 87. At the time of evaporation, it is also possible to use a shadow mask 90 provided with an opening to correspond to a pattern to be evaporated, if necessary. In this case, the shadow mask 90 is made to be provided between the substrate 89 and the evaporation sources 81a to 81c. The shadow mask 90 is fixed to the substrate 89 with adhesiveness or with a certain gap by a mask chuck 88. When alignment of the shadow mask 90 is necessary, the alignment is performed by providing a camera in a treatment chamber and providing the mask chuck 88 with a positioning means that moves slightly in an X-Y-θ direction.

The evaporation sources 81 are added with a means for supplying an evaporation material, which continuously supplies the evaporation sources with an evaporation material. The means for supplying an evaporation material has evaporation material supply sources 85a, 85b, and 85c that are placed at a separate position from the evaporation sources 81, and material supply tubes 84 that connects the evaporation sources and the evaporation material supply sources. Typically, the evaporation material supply sources 85a, 85b, and 85c are provided corresponding to the evaporation sources 81. In the case of FIG. 70, the evaporation material supply source 85a corresponds to the evaporation source 81a, and the same can be said for the evaporation material supply sources 85b and the evaporation source 81b, and the evaporation material supply source 85c and the evaporation source 81c.

As a supply method of an evaporation material, an airflow transfer method, an aerosol method, or the like can be applied. An airflow transfer method is to transfer impalpable powder of an evaporation material on airflow, by which an evaporation material is transferred to the evaporation sources 81 by using an inert gas or the like. An aerosol method is evaporation performed by transferring a raw material solution in which an evaporation material is dissolved or dispersed in a solvent, being made to be aerosol by an atomizer, and vaporizing the solvent in the aerosol. In either case, the evaporation sources 81, which are provided with a heating means, vaporize the transferred evaporation material to form a film over the substrate 89. In the case of FIG. 70, the material supply tube 84 can be bent flexibly, which is formed of a thin tube that has enough rigidity not to be transformed even under a reduced pressure state.

In a case of applying an airflow transfer method or an aerosol method, film formation may be performed when inside of the film formation treatment chambers are under an atmospheric pressure or less, preferably under a reduced pressure of 133 Pa to 13300 Pa. The pressure in the film formation treatment chambers can be adjusted by filling an inert gas such as helium, argon, neon, krypton, xenon, or nitrogen, or supplying the gas (by simultaneously exhausting the gas). In addition, in the film formation treatment chamber where an oxide film is formed, an oxidation atmosphere may be made by introducing a gas such as oxygen or nitrous oxide. Moreover, inside of the film formation treatment chamber where an organic material is evaporated may be made to be a reducing atmosphere by introducing a gas such as hydrogen.

As another supply method of an evaporation material, a structure in which an evaporation material is continuously ejected toward the evaporation sources by providing a screw in the material supply tube 84.

In accordance with the evaporation apparatus of this embodiment mode, film formation can be continuously performed uniformly even in a case of a display panel having a large-sized screen. In addition, every time an evaporation material is used up in the vapor sources, it is not necessary to supply the vapor sources with an evaporation material; thus, throughput can be improved.

(Embodiment Mode 10)

This embodiment mode will make description on hardware for controlling the driving methods described in Embodiment Modes 1 to 4.

Figure 59:
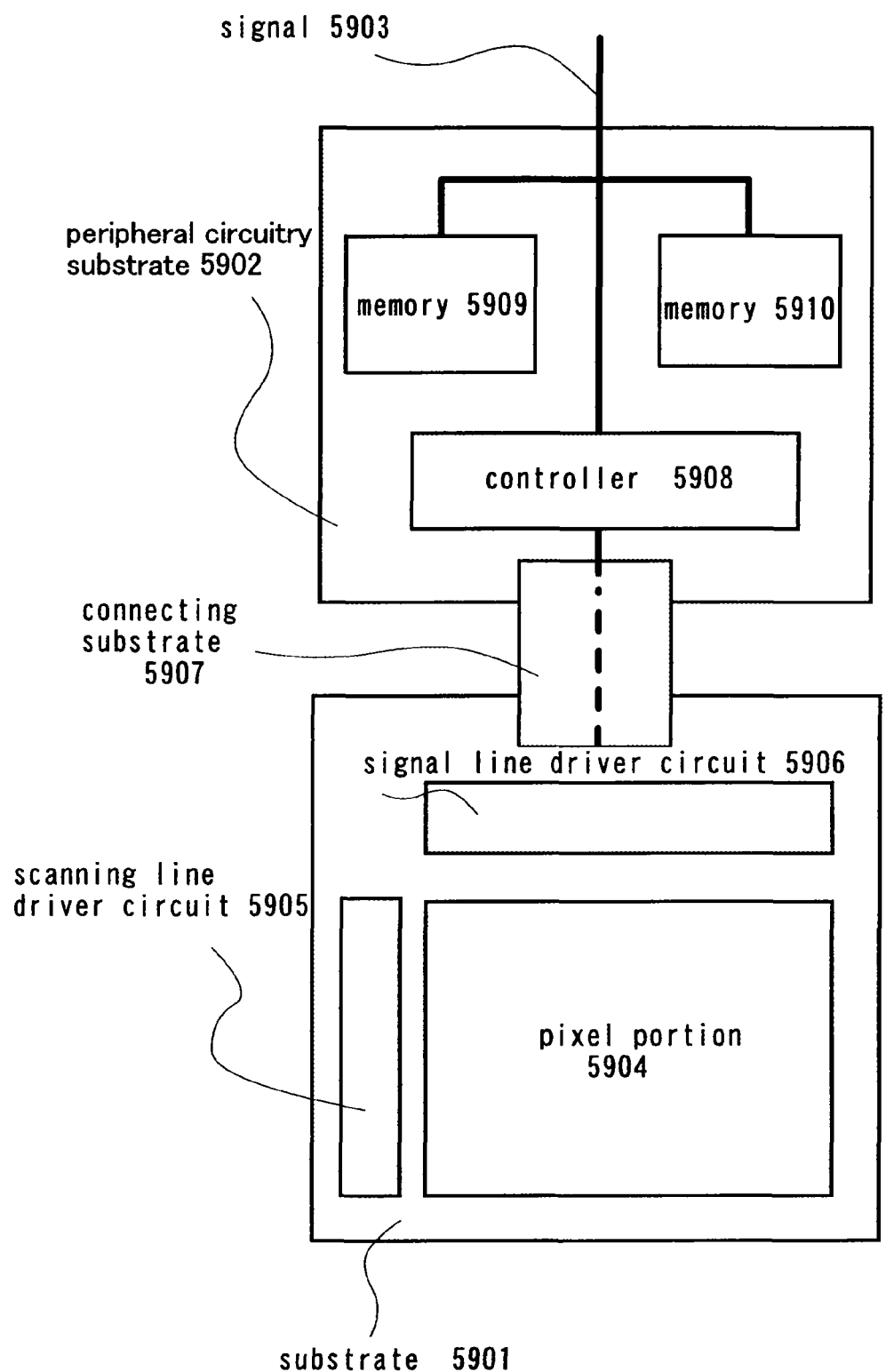
FIG. 59 is a diagram showing one example of hardware for controlling a driving method according to the present invention.

FIG. 59 shows a rough configuration diagram. A pixel portion 5904, a signal line driver circuit 5906, and a scanning line driver circuit 5905 are arranged over a substrate 5901. Besides, a power supply circuit, a pre-charge circuit, a timing generation circuit, or the like may be arranged. There is also a case where the signal line driver circuit 5906 and the scanning line driver circuit 5905 are not arranged. In this case, a circuit which is not provided over the substrate 5901 may be formed on an IC. The IC may be formed on the substrate 5901 by COG (Chip On Glass). Alternatively, the IC may be formed on a connecting substrate 2707 which connects a peripheral circuit substrate 5902 and the substrate 5901.

A signal 5903 is inputted into the peripheral circuit substrate 5902, and a controller 5908 performs control to store the signal in a memory 5909, a memory 5910, or the like. In a case where the signal 5903 is an analog signal, the signal is stored in the memory 5909, the memory 5910, or the like in many cases after analog-digital conversion is performed. Then, the controller 5908 outputs a signal to the substrate 5901 by using the signal stored in the memory 5909, the memory 5910, or the like.

In order to realize the driving methods described in Embodiment Modes 1 to 4, the controller 5908 controls the appearance order of sub-frames or the like and outputs a signal to the substrate 5901.

Note that the content described in this embodiment mode can be implemented by being arbitrarily combined with the content described in Embodiment Modes 1 to 9.

(Embodiment Mode 11)

This embodiment mode will explain a structure example of an EL module and an EL television receiver using a display device according to the present invention.

Figure 60:
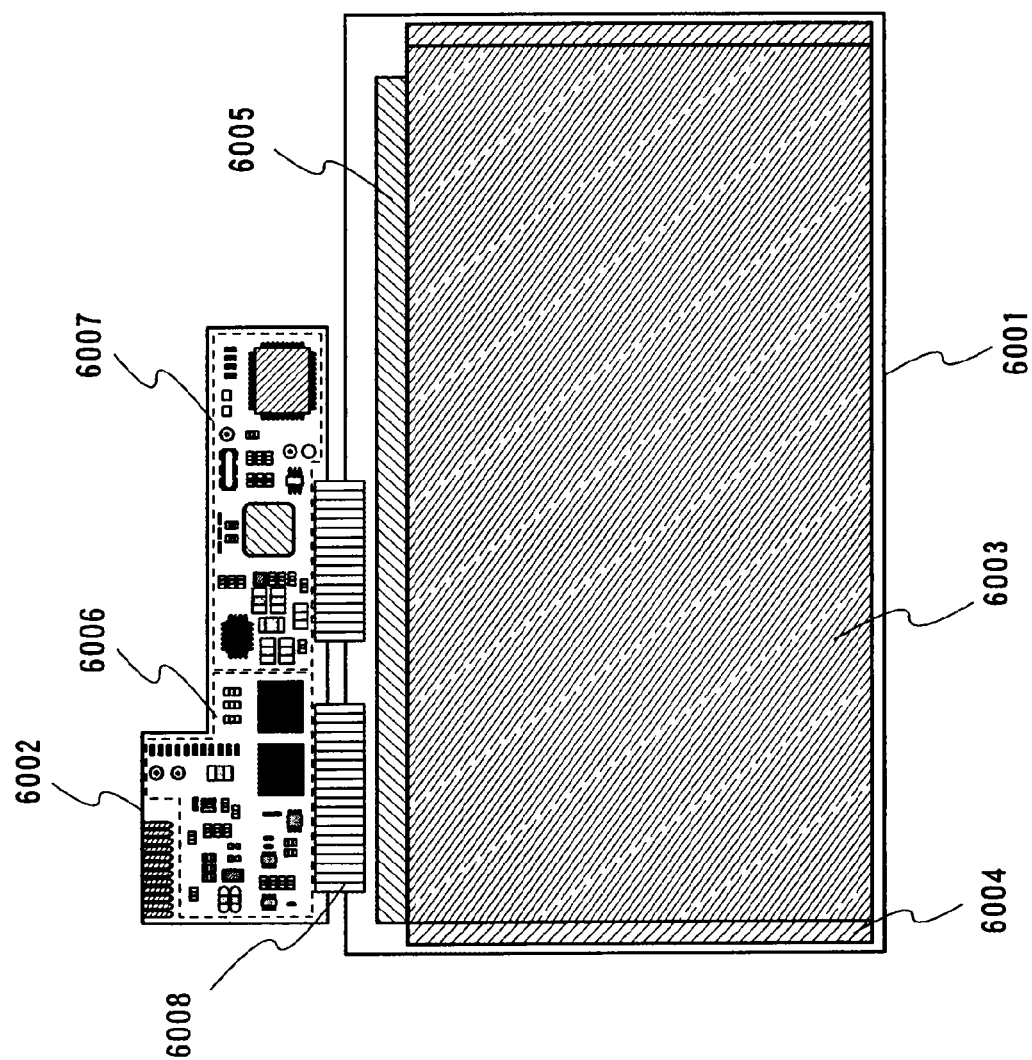
FIG. 60 is a view showing one example of an EL module using a driving method according to the present invention.

FIG. 60 shows an EL module in which a display panel 6001 and a circuit board 6002 are combined. The display panel 6001 includes a pixel portion 6003, a scanning line driver circuit 6004, and a signal line driver circuit 6005. Over the circuit board 6002, for example, a control circuit 6006, a signal dividing circuit 6007, and the like are formed. The display panel 6001 and the circuit board 6002 are connected to each other by a connection wiring 6008. As the connection wiring, an FPC or the like can be used.

The control circuit 6006 corresponds to the controller 5908, the memory 5909, the memory 5910, or the like in Embodiment Mode 9. Mainly in the control circuit 6006, the appearance order of sub-frames or the like is controlled.

In the display panel 6001, the pixel portion and part of peripheral driver circuits (a driver circuit having a low operation frequency among a plurality of driver circuits) may be formed using TFTs in an integrated manner over a substrate, and another part of the peripheral driver circuits (a driver circuit having a high operation frequency among the plurality of driver circuits) may be formed on an IC chip. The IC chip may be mounted on the display panel 6001 by COG (Chip On Glass) or the like. The IC chip may alternatively be mounted on the display panel 6001 by using TAB (Tape Automated Bonding) or a printed wiring board.

In addition, by converting the impedance of a signal set to a scanning line or a signal line by using a buffer, a write period for pixels of each row can be shortened. Accordingly, a high-definition display device can be provided.

Moreover, in order to further reduce power consumption, a pixel portion may be formed using transistors over a glass substrate, and all signal line driver circuits may be formed on an IC chip, which may be mounted on a display panel by COG (Chip On Glass) or the like.

Figure 61:
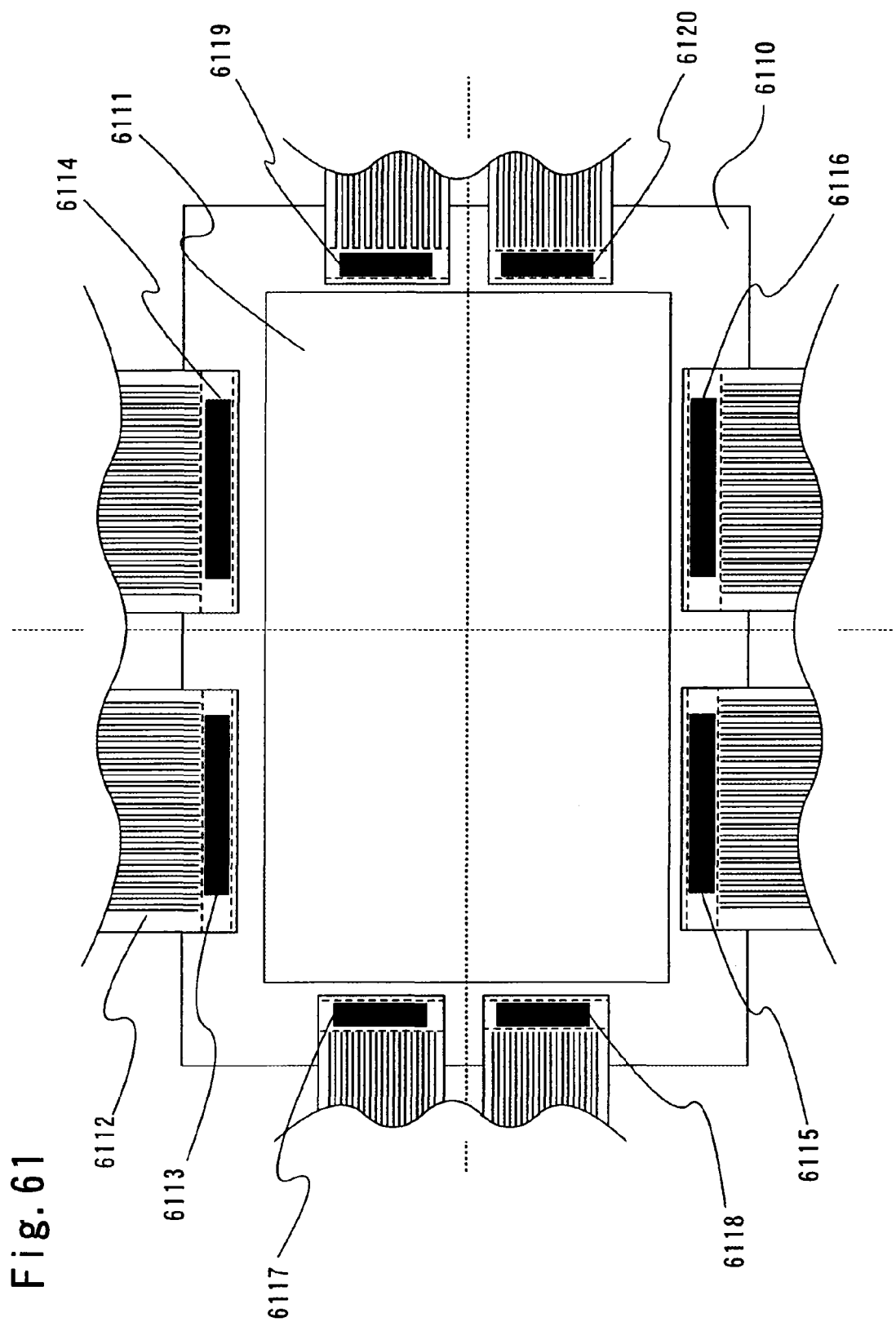
FIG. 61 is a view showing a structure example of a display panel using a driving method according to the present invention.

For example, the entire screen of the display panel may be divided into several regions, and an IC chip where part or all of the peripheral driver circuits (the signal line driver circuit, the scanning line driver circuit, and the like) are formed may be arranged in each region to be mounted on the display panel by COG (Chip On Glass). FIG. 61 shows a structure of the display panel of this case.

FIG. 61 shows an example of driving by dividing the entire screen into four regions and using eight IC chips. A display panel includes, as its structure, a substrate 6110, a pixel portion 6111, an FPC 6112, and IC chips 6113 to 6120. Among the eight IC chips, a signal line driver circuit is formed in each of the IC chips 6113, 6114, 6115, and 6116, and a scanning line driver circuit is formed in each of the IC chips 6117, 6118, 6119, and 6120. Then, it becomes possible to drive only an arbitrary screen region of the four screen regions by driving arbitrary IC chips. For example, when only the IC chips 6113 and 6117 are driven, only the upper left region of the four screen regions can be driven. Accordingly, it is possible to reduce power consumption.

Figure 71:
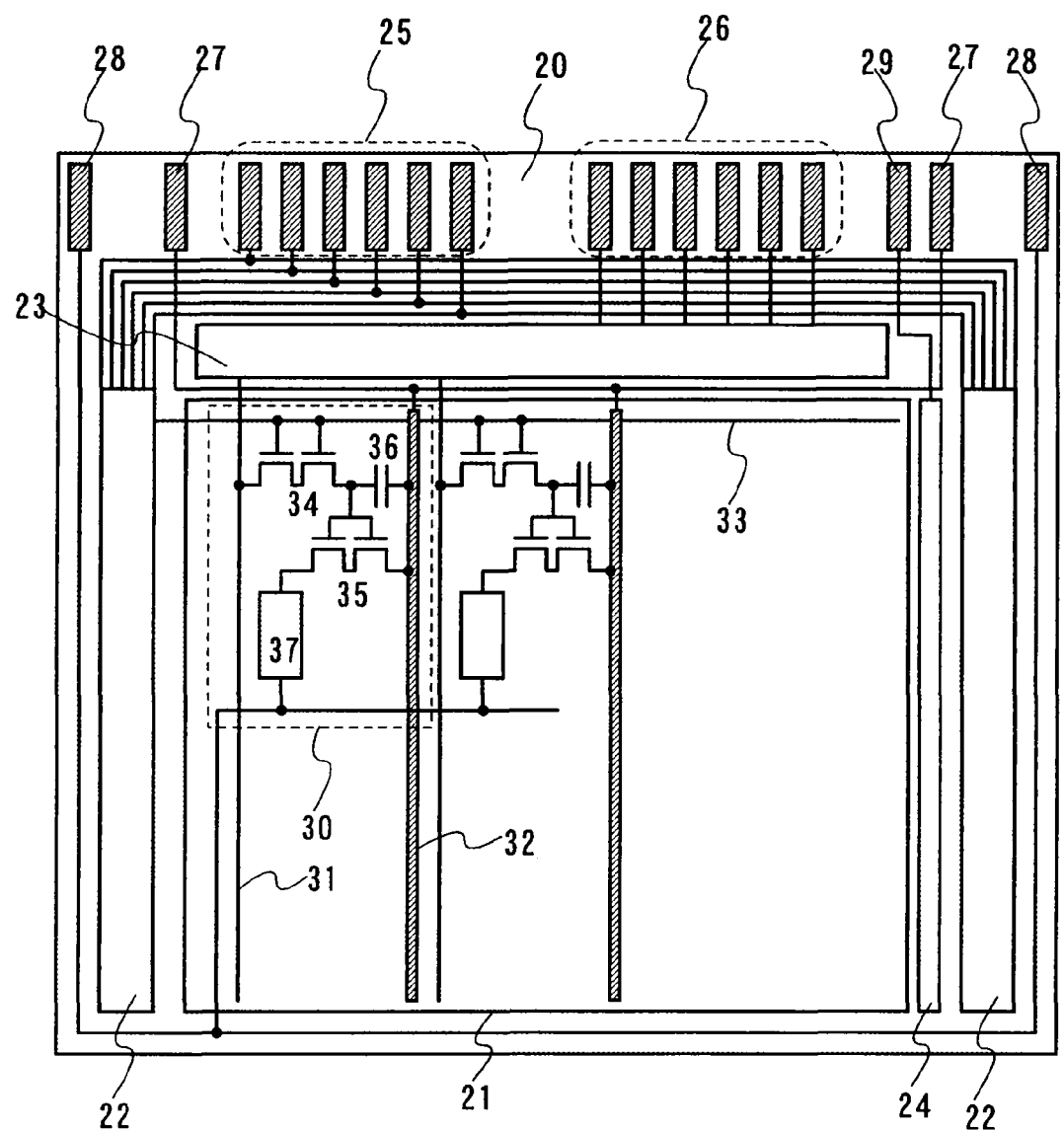
FIG. 71 is a diagram showing a structure example of a display panel using a driving method according to the present invention.

A display panel of FIG. 71 has a pixel portion 21 where a plurality of sub-pixels 30 is arranged, a scanning line driver circuit 22 that controls a signal of a scanning line 33, and a data line driver circuit 23 that controls a signal of a data line 31 over a substrate 20. In addition, a monitor circuit 24 to correct changes in luminance of a light-emitting element 37 included in the sub-pixel 30 may also be provided. The light-emitting element 37 and a light-emitting element included in the monitor circuit 24 have the same structure. The light-emitting element 37 has a structure in which a layer containing a material that exhibits electroluminescence is sandwiched between a pair of electrodes.

The peripheral portion of the substrate 20 has an input terminal 25 to input a signal from an external circuit to the scanning line driver circuit 22, an input terminal 26 to input a signal from an external circuit to the data line driver circuit 23, and an input terminal 29 to input a signal to the monitor circuit 24.

The sub-pixel 30 includes a transistor 34 connected to the data line 31 and a transistor 35 connected by being inserted in series between a power supply line 32 and the light-emitting element 37. A gate of the transistor 34 is connected to the scanning line 33, and a signal of the data line 31 is inputted into the sub-pixel 30 when the sub-pixel is selected by a scanning signal. The inputted signal is given to a gate of the transistor 35 and a holding capacitor portion 36 is charged. In accordance with the signal, the power supply line 32 and the light-emitting element 37 are in a conductive state; thus, the light-emitting element 37 emits light.

It is necessary to supply power from an external circuit to make the light-emitting element 37, which is provided in the sub-pixel 30, emit light. The power supply line 32 provided in the pixel portion 21 is connected with an external circuit through an input terminal 27. Resistance loss occurs in the power supply line 32 due to the length of a lead wiring; therefore, a plurality of the input terminals 27 is preferably provided in the peripheral portion of the substrate 20. The input terminals 27 are provided on the both sides of the substrate 20 and arranged so that luminance unevenness is inconspicuous at the surface of the pixel portion 21. In other words, this prevents that one side in the screen becomes blight, whereas the opposite side becomes dark. In addition, an electrode on the opposite side of an electrode connected to the power supply line 32, which is the light-emitting element 37 provided with a pair of electrodes, is formed as a common electrode that is shared among a plurality of the sub-pixels 30. However, a plurality of terminals 28 is provided to reduce resistance loss of the electrode.

In such a display panel, a power supply line is formed from a low resistance material such as Cu and is especially effective when a screen size is increased. For example, in a case where a screen size is a 13-inch-class, the length of a diagonal line is 340 mm, whereas 1500 mm or more in a case of 60-inch-class. In such a case, since wiring resistance cannot be ignored, it is preferable to use a low resistance material such as Cu for a wiring. In addition, in consideration of wiring delay, a data line or a scanning line may be formed in the same manner.

Figure 62:
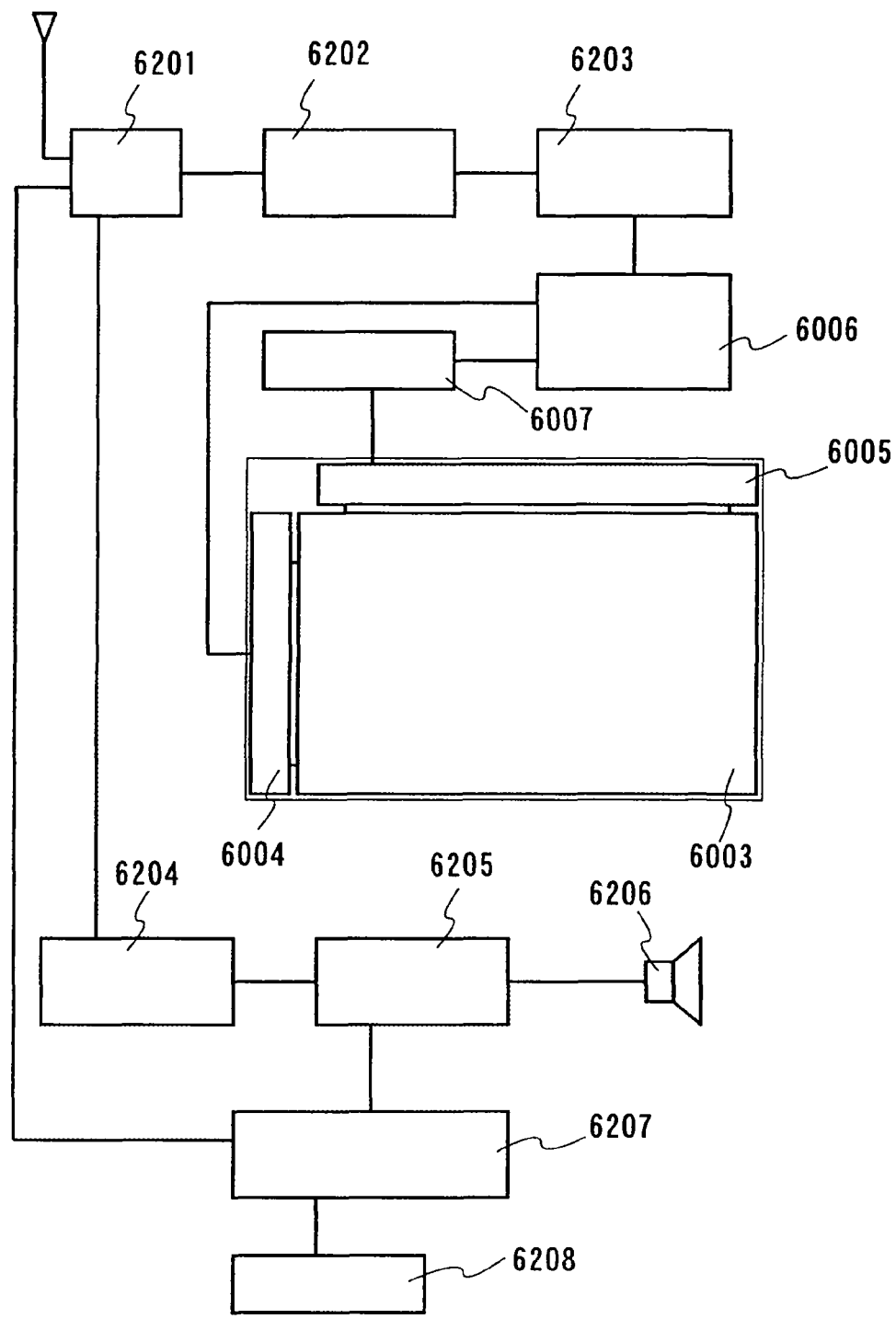
FIG. 62 is a diagram showing one example of an EL television receiver using a driving method according to the present invention.
Figure 65:
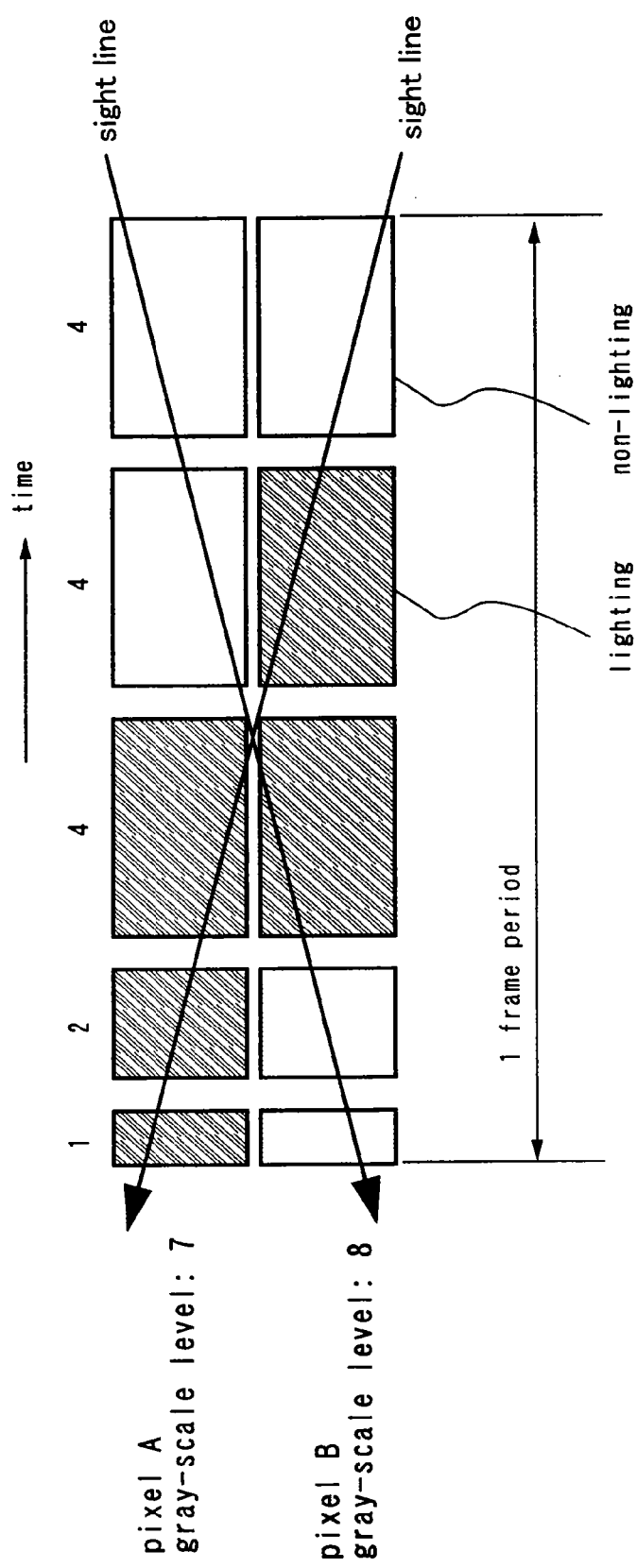
FIG. 65 is a diagram showing a cause that a pseudo contour is caused in a conventional driving method.

With such an EL module provided with the panel structure as described above, an EL television receiver can be completed. FIG. 62 is a block diagram showing the main configuration of an EL television receiver. A tuner 6201 receives video signals and audio signals. The video signals are processed by a video signal amplifier circuit 6202, a video signal processing circuit 6203 for converting a signal outputted from the video signal amplifier circuit 6202 into a color signal corresponding to each color of red, green, and blue, and a control circuit 6006 for converting the video signal to be inputted into a driver circuit. The control circuit 6006 outputs signals to each of the scanning line side and the signal line side. In a case of performing digital drive, a signal dividing circuit 6007 may be provided on the signal line side, so as to divide an input digital signal into m signals before being supplied to a pixel portion.

Among the signals received at the tuner 6201, audio signals are transmitted to an audio signal amplifier circuit 6204, and an output thereof is supplied to a speaker 6206 through an audio signal processing circuit 6205. A control circuit 6207 receives control data on a receiving station (reception frequency) or sound volume from an input portion 6208 and transmits signals to the tuner 6201 as well as the audio signal processing circuit 6205.

By incorporating the EL module into a housing, a television receiver can be completed. A display portion of the television receiver is formed with such an EL module. In addition, a speaker, a video input terminal, and the like are appropriately provided.

It is needless to mention that the present invention is not limited to the television receiver, and can be applied to various objects as a display medium such as a monitor of a personal computer, an information display board at the train station, airport, or the like, or an advertisement display board on the street.

By using a display device and a driving method thereof according to the present invention, clear images can be displayed with reduced pseudo contour. Accordingly, even an image having subtle changes in gray scales such as human skin can be displayed clearly.

Note that the content described in this embodiment mode can be implemented by being arbitrarily combined with the content described in Embodiment Modes 1 to 10.

(Embodiment Mode 12)

As an exemplary electronic device using a display device according to the present invention, the following can be given: a camera such as a video camera or digital camera, a goggle display (a head-mounted display), a navigation system, an audio reproducing device (a car audio, an audio component, or the like), a computer, a game machine, a portable information terminal (a mobile computer, a cellular phone, a portable game machine, an electronic book, or the like), an image reproducing device provided with a recording medium (specifically, a device which can reproduce a recording medium such as a digital versatile disc (DVD) and includes a display capable of displaying the image), and the like. FIGS. 63A to 63H show specific examples of such electronic devices.

FIG. 63A shows a light-emitting device, which includes a housing 6301, a supporting stand 6302, a display portion 6303, a speaker portion 6304, a video input terminal 6305, and the like. The present invention can be used for a display device which constitutes the display portion 6303. In addition, according to the present invention, clear images can be displayed with reduced pseudo contour, and the light-emitting device shown in FIG. 63A is completed. Since the light-emitting device is a self-luminous type, no backlight is required, and a display portion thinner than a liquid crystal display can be obtained. Note that the light-emitting device includes all display devices for information display, for example, for a personal computer, for TV broadcast reception, or for advertisement display.

FIG. 63B shows a digital still camera, which includes a main body 6306, a display portion 6307, an image receiving portion 6308, operation keys 6309, an external connection port 6310, a shutter 6311, and the like. The present invention can be used for a display device which constitutes the display portion 6307. In addition, according to the present invention, clear images can be displayed with reduced pseudo contour, and the digital still camera shown in FIG. 63B is completed.

FIG. 63C shows a laptop computer, which includes a main body 6312, a housing 6313, a display portion 6314, a keyboard 6315, an external connection port 6316, a pointing mouse 6317, and the like. The present invention can be used for a display device which constitutes the display portion 6314. In addition, according to the present invention, clear images can be displayed with reduced pseudo contour, and the laptop computer shown in FIG. 63C is completed.

FIG. 63D shows a mobile computer, which includes a main body 6318, a display portion 6319, a switch 6320, operation keys 6321, an infrared port 6322, and the like. The present invention can be used for a display device which constitutes the display portion 6319. In addition, according to the present invention, clear images can be displayed with reduced pseudo contour, and the mobile computer shown in FIG. 63D is completed.

FIG. 63E shows a portable image reproducing device provided with a recording medium (specifically, a DVD reproducing device), which includes a main body 6323, a housing 6324, a display portion A 6325, a display portion B 6326, a recording medium (DVD or the like) reading portion 6327, an operation key 6328, a speaker portion 6329, and the like. The display portion A 6325 mainly displays image data, while the display portion B 6326 mainly displays text data. The present invention can be used for display devices which constitute the display portion A 6325 and the display portion B 6326. Note that the image reproducing device provided with a recording medium also includes a home-use game machine and the like. In addition, according to the present invention, clear images can be displayed with reduced pseudo contour, and the image reproducing device shown in FIG. 63E is completed.

FIG. 63F shows a goggle display (a head-mounted display), which includes a main body 6330, a display portion 6331, an arm portion 6332, and the like. The present invention can be used for a display device which constitutes the display portion 6331. In addition, according to the present invention, clear images can be displayed with reduced pseudo contour, and the goggle display shown in FIG. 63F is completed.

FIG. 63G shows a video camera, which includes a main body 6333, a display portion 6334, a housing 6335, an external connection port 6336, a remote control receiving portion 6337, an image receiving portion 6338, a battery 6339, an audio input portion 6340, operation keys 6341, and the like. The present invention can be used for a display device which constitutes the display portion 6334. In addition, according to the present invention, clear images can be displayed with reduced pseudo contour, and the video camera shown in FIG. 63G is completed.

FIG. 63H shows a cellular phone, which includes a main body 6342, a housing 6343, a display portion 6344, an audio input portion 6345, an audio output portion 6346, operation keys 6347, an external connection port 6348, an antenna 6349, and the like. The present invention can be used for a display device which constitutes the display portion 6344. Note that the current consumption of the cellular phone can be reduced if white text is displayed with a black background on the display portion 6344. In addition, according to the present invention, clear images can be displayed with reduced pseudo contour, and the cellular phone shown in FIG. 63H is completed.

Note that, if a light-emitting material with high luminance is used, the present invention can be applied to a front or rear projector which projects an image by magnifying the outputted image data with a lens or the like.

Moreover, the above electronic devices have often been used for displaying data distributed through telecommunication lines such as the Internet or a CATV (Cable TV), and in particular, opportunity to display moving image data has been increased. Since a light-emitting material has an extremely high response speed, a light-emitting device is suitable for displaying moving images.

Since a light-emitting device consumes power in its light-emitting portion, it is desirable to display data by utilizing as small a light-emitting portion as possible. Therefore, in a case of using a light-emitting device for a display portion of a portable information terminal which mainly displays text data, such as a cellular phone or an audio reproducing device in particular, it is desirable to drive the light-emitting device in such a manner that text data is displayed with a light-emitting portion while using a non-light-emitting portion as a background.

As described above, the applicable range of the present invention is so wide that the present invention can be applied to electronic devices of various fields. In addition, the electronic devices in this embodiment mode may employ a display device having any of the structures described in Embodiment Modes 1 to 11.

The present application is based on Japanese Patent Application serial No. 2005-194699 filed on Jul. 4, 2005 in Japanese Patent Office, the entire contents of which are hereby incorporated by reference.

What is claimed is:

1. A display device comprising:
   a pixel including a first sub-pixel and a second sub-pixel, each comprising:
      a select transistor comprising a gate, a first electrode and a second electrode,
      a driving transistor comprising a gate, a first electrode and a second electrode, wherein the gate of the driving transistor is electrically connected to the second electrode of the select transistor, and
      a pixel electrode electrically connected the second electrode of the driving transistor;
   a signal line extending along a first direction and electrically connected to the first electrode of the select transistor of each of the first sub-pixel and the second sub-pixel;
   a first scanning line electrically connected to the gate of the select transistor of the first sub-pixel;

a second scanning line electrically connected to the gate of the select transistor of the second sub-pixel, wherein each of the first scanning line and the second scanning line extends along a second direction orthogonal to the first direction;

a first power supply line electrically connected to the first electrode of the driving transistor of the first sub-pixel; and a second power supply line electrically connected to the first electrode of the driving transistor of the second sub-pixel, wherein each of the first power supply line and the second power supply line extends along the first direction, wherein the first sub-pixel and the second sub-pixel are arranged along the first direction, wherein a gap between the first power supply line and the second power supply line extends along the first direction, wherein an area of the first sub-pixel is different from an area of the second sub-pixel, and wherein the pixel electrode of the first sub-pixel is driven by power supplied by the first power supply line and the pixel electrode of the second sub-pixel is driven by power supplied by the second power supply line.

2. The display device according to claim 1, wherein the first sub-pixel and the second sub-pixel are for emitting light of a same color.

3. The display device according to claim 1, wherein each of the select transistor and the driving transistor in each of the first sub-pixel and the second sub-pixel comprises polycrystalline silicon.

4. The display device according to claim 1, wherein each of the select transistor and the driving transistor in each of the first sub-pixel and the second sub-pixel comprises InGaZnO.

5. A display device comprising:
a pixel including a first pixel and a second pixel, each comprising:
a select transistor comprising a gate, a first electrode and a second electrode,
a driving transistor comprising a gate, a first electrode and a second electrode, wherein the gate of the driving transistor is electrically connected to the second electrode of the select transistor, and
a pixel electrode electrically connected the second electrode of the driving transistor;

a signal line extending along a first direction and electrically connected to the first electrode of the select transistor of each of the first pixel and the second pixel;

a first scanning line electrically connected to the gate of the select transistor of the first pixel;

a second scanning line electrically connected to the gate of the select transistor of the second pixel, wherein each of the first scanning line and the second scanning line extends along a second direction orthogonal to the first direction;

a first power supply line electrically connected to the first electrode of the driving transistor of the first pixel; and a second power supply line electrically connected to the first electrode of the driving transistor of the second pixel, wherein each of the first power supply line and the second power supply line extends along the first direction, wherein the first pixel and the second pixel are arranged along the first direction, wherein a gap between the first power supply line and the second power supply line extends along the first direction, wherein an area of the first pixel is different from an area of the second pixel, and wherein the pixel electrode of the first pixel is driven by power supplied by the first power supply line and the pixel electrode of the second pixel is driven by power supplied by the second power supply line.

6. The display device according to claim 5, wherein the first pixel and the second pixel are for emitting light of a same color.

7. The display device according to claim 5, wherein each of the select transistor and the driving transistor in each of the first pixel and the second pixel comprises polycrystalline silicon.

8. The display device according to claim 5, wherein each of the select transistor and the driving transistor in each of the first pixel and the second pixel comprises InGaZnO.

* * * * *